US012019373B2

(12) United States Patent
Lee et al.

(10) Patent No.: US 12,019,373 B2
(45) Date of Patent: Jun. 25, 2024

(54) PHOTOSENSITIVE RESIN COMPOSITION, FILM, AND ELECTRONIC DEVICE

(71) Applicant: DUKSAN TECHOPIA CO. LTD., Cheonan-si (KR)

(72) Inventors: Dae Won Lee, Uiwang-si (KR); Chung Youl Yoo, Daejeon (KR); Sun Hee Heo, Asan-si (KR); Yong Jeong Jo, Anyang-si (KR); Jun Hwan Kim, Cheonan-si (KR); Sang Yeob Ahn, Cheonan-si (KR); Seul Ki Lee, Cheonan-si (KR); Jun Ki Kim, Anseong-si (KR); Jun Bae, Cheonan-si (KR)

(73) Assignee: DUKSAN TECHOPIA CO. LTD. (KR)

( * ) Notice: Subject to any disclaimer, the term of this patent is extended or adjusted under 35 U.S.C. 154(b) by 312 days.

(21) Appl. No.: 17/297,528

(22) PCT Filed: Oct. 24, 2019

(86) PCT No.: PCT/KR2019/014103

§ 371 (c)(1),
(2) Date: May 27, 2021

(87) PCT Pub. No.: WO2020/111522

PCT Pub. Date: Jun. 4, 2020

(65) Prior Publication Data

US 2022/0019144 A1 Jan. 20, 2022

(30) Foreign Application Priority Data

Nov. 28, 2018 (KR) ........................ 10-2018-0150063

(51) Int. Cl.

| | |
|---|---|
| ***G03F 7/038*** | (2006.01) |
| ***C08G 69/26*** | (2006.01) |
| ***G03F 7/028*** | (2006.01) |
| ***G03F 7/033*** | (2006.01) |
| ***H10K 71/20*** | (2023.01) |
| ***H10K 85/10*** | (2023.01) |

(52) U.S. Cl.
CPC ............ *G03F 7/0387* (2013.01); *G03F 7/028* (2013.01); *G03F 7/033* (2013.01); *H10K 71/233* (2023.02); *H10K 85/111* (2023.02)

(58) Field of Classification Search
CPC ...... G03F 7/0387; G03F 7/0388; C08G 69/26
See application file for complete search history.

(56) References Cited

U.S. PATENT DOCUMENTS

| | | | | |
|---|---|---|---|---|
| 6,071,667 | A * | 6/2000 | Hagiwara | G03F 7/0387 430/283.1 |
| 7,638,254 | B2 * | 12/2009 | Hattori | G03F 7/0233 430/192 |
| 8,932,801 | B2 * | 1/2015 | Chou | C08G 73/126 430/287.1 |
| 10,216,085 | B2 | 2/2019 | Takemura et al. | |
| 10,538,627 | B2 | 1/2020 | Kawabata et al. | |
| 2005/0244739 | A1 * | 11/2005 | Kanatani | G03F 7/035 430/270.1 |

FOREIGN PATENT DOCUMENTS

| | | | |
|---|---|---|---|
| JP | 2014041264 | A | 3/2014 |
| KR | 1020170139624 | A | 12/2017 |
| KR | 1020180011729 | A | 2/2018 |
| KR | 1020180061572 | A | 6/2018 |

OTHER PUBLICATIONS

Nader, A.E. et al. Synthesis and characterization of a low stress photosensitive polymide. Polymer Engineering & Science, 1992, vol. 32, No. 21, pp. 1613-1617. See entire document.
International Search Report (in English and Korean) and Written Opinion of the ISA (in Korean) issued in PCT/KR2019/014103, dated Jan. 29, 2020; ISA/KR.

* cited by examiner

*Primary Examiner* — John S Chu
(74) *Attorney, Agent, or Firm* — Harness, Dickey & Pierce, P.L.C.

(57) ABSTRACT

The present disclosure can provide a photosensitive resin composition, film, and electronic device having excellent high-resolution patterning at low light intensity, excellent pattern adhesion, fine patterning, and excellent cured film properties.

10 Claims, No Drawings

PHOTOSENSITIVE RESIN COMPOSITION, FILM, AND ELECTRONIC DEVICE

CROSS-REFERENCE TO RELATED APPLICATIONS

This application is a U.S. National Phase Application under 35 U.S.C. 371 of International Application No. PCT/KR2019/014103, filed Oct. 24, 2019, which claims priority from Korean Patent Application No. 10-2018-0150063, filed on Nov. 28, 2018. The entire disclosures of the above applications are incorporated by reference for all purposes as if fully set forth herein.

BACKGROUND

1. Field of the Invention

The present disclosure relates to a photosensitive resin composition, a film, and an electronic device.

2. Description of the Related Art

There are various materials for an organic insulating film used in a color filter or a pixel portion of an organic EL (electro-Luminescence) device. Photosensitive polyimide is well known as a material having photosensitivity and heat resistance.

It is used in the form of a photosensitive polyimide precursor composition. It is easy to apply, and after applying the polyimide precursor composition onto a semiconductor device, patterning by ultraviolet irradiation, development and thermal imidization treatment are performed, so that a surface protective film and an interlayer insulating film can be easily formed.

The photosensitive polyimide materials have the advantage of reducing the number of manufacturing processes required when patterning a non-photosensitive material because the material itself has photosensitivity, and it can be expected to improve productivity, such as that the yield is improved. In addition, it is attracting attention because it becomes a process with a low environmental load, such as reducing the amount of solvent used.

The photosensitive characteristic can be divided into a negative type and a positive type. In the negative type, the photosensitive material in the portion irradiated with light is insolubilized. By removing a soluble portion (non-photosensitive portion) with an organic solvent of a developer and performing heat treatment, a resin film with a pattern formed thereon is obtained. When the positive type is used, the portion irradiated with light is soluble in the developer. As in the case of the negative type, when a portion soluble in the developer is removed and subjected to heat treatment, a patterned resin film is obtained. As a developer used for the negative and positive types, an aqueous alkali solution is generally used.

As a method of forming a photosensitive organic insulating film, a method of forming a photosensitive resin composition by applying a photosensitive resin composition to a substrate by a photolithography technique is known.

Conventionally, the photosensitive resin composition is applied using a spin coating method. As substrates become larger, coating by the spin coating method becomes difficult, and a coating method by the slit coating method has been proposed.

When the photosensitive composition is applied to the surface of the substrate by the slit coating method, it may vary depending on the application rate, but the viscosity of the photosensitive resin composition is preferably less than 3.5 mPas in order to obtain good uniformity of the film thickness. When the viscosity of the photosensitive resin composition is high, the photosensitive resin composition is not smoothly supplied from the slit nozzle due to the high viscosity, resulting in a portion not coated on the surface of the substrate.

In addition, when the photosensitive resin composition is applied by the slit coating method, a process of washing the solidified photosensitive resin composition adhered to or remaining on the slit nozzle while repeating the application is required. When the solidified material has low resolubility in the photosensitive resin composition, the solidified material remaining in the nozzle portion remains as a protrusion, and streaks occur in the direction of the nozzle when the photosensitive resin composition is applied to the substrate. And the solidified material falls on the substrate and adheres to the substrate, thereby lowering the yield.

The negative type resin composition is mainly used in the color filter process, and the positive type resin composition is mainly used in the TFT process.

It is common to arrange a grid-like black pattern called a black matrix between pixels of a color filter for the purpose of improving the contrast. In the conventional method of forming a black matrix, a pattern was formed by depositing and etching chromium (Cr) as a pigment on the entire glass substrate. However, the above method requires high cost in the process, and problems such as high reflectance of chromium and environmental pollution due to chromium waste liquid have occurred.

For this reason, studies on a black matrix formed by a pigment dispersion method capable of fine processing have been actively conducted. In addition, research is being conducted to prepare a black composition with a colored pigment other than carbon black. However, since colored pigments other than carbon black have poor light-shielding properties, the amount of the colored pigments to be blended must be increased to an extremely large amount. As a result, there is a problem that the viscosity of the composition increases, making it difficult to handle, or remarkably lowering the strength of the formed film or adhesion to the substrate.

Currently, the industry is conducting a lot of research on the photosensitive resin composition in response to the demand for continuous performance improvement. For example, a color filter composition to which a newly developed binder is applied to improve sensitivity; A black matrix resin composition having improved sensitivity using a high-sensitivity photopolymerization initiator; And a black matrix resin composition in which sensitivity is improved by introducing a photopolymerization initiator and an organic phosphoric acid compound into the composition.

SUMMARY

Embodiments of the present disclosure provide a photosensitive resin composition, a film, and an electronic device having excellent high-resolution patterning at low light intensity, excellent pattern adhesion, fine patterning, and excellent cured film properties.

According to an aspect of the present disclosure, the present disclosure provides a photosensitive resin composition comprising a compound represented by the following formula (1).

[Formula 1]

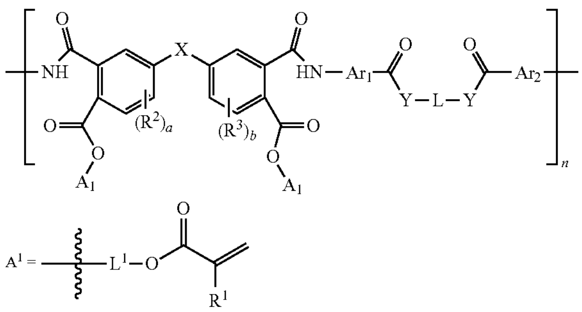

In another aspect, the present disclosure provides a film that is a cured product of the photosensitive resin composition and an electronic device including the same.

The photosensitive resin composition, film, and electronic device according to the present disclosure not only have excellent pattern adhesion, but also have excellent process characteristics and pattern formation.

DETAILED DESCRIPTION

Hereinafter, embodiments of the present disclosure will be described in detail with reference to the accompanying drawings.

In adding reference numerals to elements of each drawing, it should be noted that even though the same elements are indicated on different drawings, the same reference numerals are assigned as much as possible. In addition, in describing the present disclosure, when it is determined that a detailed description of a related known configuration or function may obscure the subject matter of the present disclosure, a detailed description thereof is omitted.

Terms, such as "first", "second", "A", "B", "(A)", or "(B)" may be used herein to describe elements of the present disclosure. Each of these terms is not used to define essence, order, sequence, or number of elements etc., but is used merely to distinguish the corresponding element from other elements. When it is mentioned that a first element "is connected or coupled to", "contacts or overlaps" etc. a second element, it should be interpreted that, not only can the first element "be directly connected or coupled to" or "directly contact or overlap" the second element, but a third element can also be "interposed" between the first and second elements, or the first and second elements can "be connected or coupled to", "contact or overlap", etc. each other via a fourth element.

When a component such as a layer, a film, a region, or a plate is said to be "on" or "on" another component, this is not only the case when the component is "directly above" the other component It should be understood that other components may be between any of the components and the other components. Conversely, it should be understood that when a component is "directly above" another part, it means that there is no other component in the middle of the component and the another component.

Unless otherwise stated, terms used in the specification and in the appended claims are as follows.

Unless otherwise stated, the term "halo" or "halogen" as used herein includes fluorine (F), chlorine (Cl), bromine (Br), and iodine (I).

Unless otherwise stated, the term "alkyl" or "alkyl group" as used herein has 1 to 60 carbons connected by a single bond, and means aliphatic functional radicals including a straight-chain alkyl group, a branched-chain alkyl group, a cycloalkyl (alicyclic) group, an alkyl substituted cycloalkyl group and a cycloalkyl-substituted alkyl group.

Unless otherwise stated, the term "haloalkyl group" or "halogenalkyl group" as used herein refers to an alkyl group substituted with halogen.

Unless otherwise stated, the terms "alkenyl" or "alkynyl" as used herein each have a double bond or a triple bond, include a straight or branched chain group, and have a carbon number of 2 to 60, and is not limited to thereto.

The term "cycloalkyl" as used herein refers to an alkyl forming a ring having 3 to 60 carbon atoms unless otherwise specified, and is not limited thereto.

Unless otherwise stated, the term "alkoxy group" or "alkyloxy group" as used herein refers to an alkyl group to which an oxygen radical is bonded, and has a carbon number of 1 to 60, but is not limited thereto.

The terms "alkenyl group", "alkenoxy group", "alkenyloxy group", or "alkenyloxy group" as used herein refers to an alkenyl group to which an oxygen radical is attached, unless otherwise stated it has a carbon number of 2 to 60, but is not limited thereto.

As used herein, the terms "aryl group" and "arylene group" each have 6 to 60 carbon atoms, but are not limited thereto. In the present disclosure, the aryl group or the arylene group includes a monocyclic type, a ring assemblies, a conjugated multiple ring compound, and the like. For example, the aryl group may refer to a phenyl group, a monovalent functional group of biphenyl, a monovalent functional group of naphthalene, a fluorenyl group, and a substituted fluorenyl group.

The terms "fluorenyl group" or "fluorenylene group" as used herein means a monovalent or divalent functional group of fluorene, respectively, unless otherwise specified, and "substituted fluorenyl group" or "Substituted fluorenylene group" refers to a monovalent or divalent functional group of substituted fluorene, and "substituted fluorene" refers to fluorene at least one of the following substituents R, R', R", and R"' is a functional group other than hydrogen, and it includes the case where R and R' are bonded to each other to form a spiro compound with the carbon to which they are bonded.

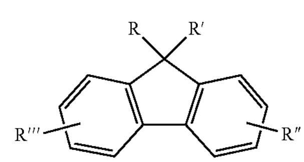

In addition, the R, R', R" and R"' may each independently be an alkyl group having 1 to 20 carbon atoms, an alkenyl group having 1 to 20 carbon atoms, and an aryl group having 6 to 30 carbon atoms, a heterocyclic group having 3 to 30 carbon atoms, for example, the aryl group may be phenyl, biphenyl, naphthalene, anthracene or phenanthrene, and the heterocyclic group may be pyrrole, furan, thiophene, pyrazole, Imidazole, triazole, pyridine, pyrimidine, pyridazine, pyrazine, triazine, indole, benzofuran, quinazoline or quinoxaline. For example, the substituted fluorenyl group and the fluorenylene group, respectively may be a monovalent or divalent functional group of 9,9-dimethylfluorene, 9,9-diphenylfluorene and 9,9'-spirobi[9H-fluorene].

The term "ring assemblies" as used herein refers to two or more ring systems (single ring or fused ring system) being directly connected to each other through a single bond or a double bond, and the number of direct links between the ring systems is one less than the total number of ring systems in this compound. In the ring assemblies, the same or different ring systems may be directly linked to each other through a single bond or a double bond.

In the present disclosure, since the aryl group includes a ring assemblies, the aryl group includes biphenyl and terphenyl in which the benzene ring, which is a single aromatic ring, is connected by a single bond. In addition, since the aryl group also includes a compound in which the aromatic ring system conjugated to the aromatic single ring is connected by a single bond, for example, fluorene, the aromatic ring system conjugated to the benzene ring, which is an aromatic single ring, is conjugated by a single bond. It also includes compounds linked to form a conjugated pi electron system.

The term "conjugated multiple ring systems" as used herein refers to a fused ring form sharing at least two atoms, and a form in which a ring system of two or more hydrocarbons is fused and a from at least one heterocylcic system including at least one heteroatom is conjugated. Several such fused ring systems may be an aromatic ring, a heteroaromatic ring, an aliphatic ring, or a combination of these rings.

As used herein, the term "spiro compound" has a 'spiro union', and the spiro union refers to a connection made by two rings sharing only one atom. At this time, the atoms shared in the two rings are referred to as 'spiro atoms', and depending on the number of spiro atoms in one compound, these are respectively referred to as 'monospiro-', 'dispiro-', and 'trispyro-'.

The term "heterocyclic group" as used herein includes not only an aromatic ring such as a "heteroaryl group" or a "heteroarylene group", but also a non-aromatic ring, and unless otherwise stated, it refers to a ring having 2 to 60 carbon atoms including one or more heteroatoms, but is not limited thereto. The term "heteroatom" as used herein refers to N, O, S, P, or Si unless otherwise specified, and the heterocyclic group refers to a monocyclic type including a heteroatom, a ring assemblies, conjugated multiple ring systems, spiro and the like.

In addition, the "heterocyclic group" may also include a ring including $SO_2$ instead of carbon forming a ring. For example, "heterocyclic group" includes the following compounds.

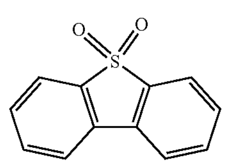 [SMILES: O=S1(=O)c2ccccc2-c2ccccc21]

The term "ring" as used herein includes monocyclic and polycyclic rings, including hydrocarbon rings as well as heterocycles including at least one heteroatom, and includes aromatic and non-aromatic rings.

The term "polycyclic" as used herein includes ring assemblies such as biphenyl and terphenyl, fused multiple ring systems, and spiro compounds. In addition, it includes not only aromatic but also non-aromatic, and includes not only a hydrocarbon ring, but also a heterocycle including at least one heteroatom.

In addition, when the prefixes are named subsequently, it means that the substituents are listed in the order described first. For example, an arylalkoxy group means an alkoxy group substituted with an aryl group, alkoxycarbonyl group means a carbonyl group substituted with an alkoxy group, and an arylcarbonylalkenyl group means an alkenyl group substituted with an arylcarbonyl group, where the arylcarbonyl group is a carbonyl group substituted with an aryl group.

In addition, unless expressly stated, the term "substituted" of "substituted or unsubstituted" used herein refers to "substituted" means substituted with one selected from the group consisting of a deuterium, a halogen, an amino group, a nitrile group, a nitro group, a $C_1$-$C_{20}$ alkyl group, a $C_1$-$C_{20}$ alkoxy group, a $C_1$-$C_{20}$ alkylamine group, a $C_1$-$C_{20}$ alkylthiophene group, a $C_6$-$C_{20}$ arylthiophene group, a $C_2$-$C_{20}$ alkenyl group, a $C_2$-$C_{20}$ alkynyl group, a $C_3$-$C_{20}$ cycloalkyl group, a $C_6$-$C_{20}$ aryl group, a $C_6$-$C_{20}$ aryl group substituted with deuterium, a $C_8$-$C_{20}$ arylalkenyl group, a silane group, a boron group, a germanium group, and a $C_2$-$C_{20}$ heterocyclic group containing at least one heteroatom of O, N, Si and P, and is not limited to these substituents.

In the present disclosure, the 'functional group name' corresponding to an aryl group, an arylene group, a heterocyclic group, etc. may be described as a radical name, but may not be described as a radical name. For example, in the case of 'phenanthrene', which is a kind of aryl group, the monovalent group is 'phenanthryl', and the divalent group is 'phenanthrylene'. It can also be described as 'phenanthrene', regardless of the valence. In the case of pyrimidine, it may also be described as 'pyrimidine', or in the case of monovalent, it may be described as 'pyrimidinyl' and in the case of divalent, 'pyrimidinylene'. Accordingly, in the present disclosure, when the type of the substituent is described, it may mean an n-valent 'group' formed by desorption of a hydrogen atom bonded to a carbon atom and/or a heteroatom.

In addition, unless there is an explicit description, the formulas used in this specification are defined as in the index definition of the substituent of the following Formula.

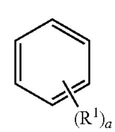

Wherein, when a is 0, the substituent $R^1$ is absent, when a is 1, one substituent $R^1$ is bonded to any one of carbons forming a benzene ring, and when a is 2 or 3, each are linked to the benzene ring as follows, $R^1$ may be the same or different from each other, and if a is an integer of 4 to 6, $R^1$ is bonded to the carbon of the benzene ring in a similar manner to that when a is 2 or 3, hydrogen atoms bonded to the carbon forming the benzene ring being not represented.

(a=2)

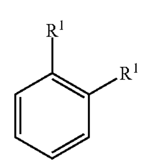

-continued (a=3)

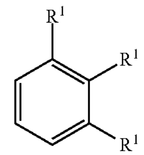

In the present disclosure, when the substituents are bonded to each other to form a ring, it means that a plurality of substituents bonded to each other sharing at least one atom selected from a carbon atom and a heteroatom of O, N, S, Si and P to form a saturated or unsaturated ring. For example, naphthalene is an unsaturated ring formed by sharing one carbon between an adjacent methyl group and a butadienyl group on a benzene ring, or, an unsaturated ring formed by a vinyl group and a propyleneyl group sharing one carbon. In addition, fluorene may be a compound in which two methyl groups substituted on a biphenyl group are bonded to each other to share one carbon to form a ring.

Photosensitive Resin Composition

The present disclosure provides a photosensitive resin composition comprising a polyamic ester compound represented by the following Formula 1.

[Formula 1]

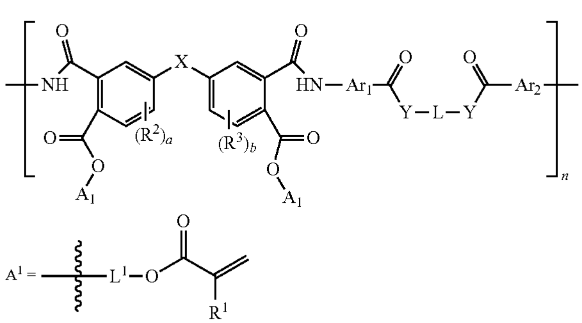

The following description relates to Formula 1.

X is selected from the group consisting of a single bond, O, S, $CR^aR^b$, NR, C═O, $SO_2$ and $C(CF_3)_2$.

Y is selected from the group consisting of a single bond, O, S and NR.

$R^a$ and $R^b$ are each independently selected from the group consisting of a hydrogen; a heavy hydrogen; a halogen; a $C_6$-$C_{60}$ aryl group; a $C_2$-$C_{60}$ heterocyclic group containing at least one heteroatom of O, N, S, Si, and P; a fused ring group of a $C_3$-$C_{60}$ aliphatic ring and a $C_6$-$C_{60}$ aromatic ring; a $C_1$-$C_{60}$ alkyl group; a $C_3$-$C_{60}$ cycloalkyl group; a $C_2$-$C_{60}$ alkenyl group; a $C_2$-$C_{60}$ alkynyl group; a $C_1$-$C_{60}$ alkoxy group; and a $C_6$-$C_{30}$ aryloxy group, $R^a$ and $R^b$ may be bonded to each other to form a spiro compound.

R is selected from the group consisting of a hydrogen; a heavy hydrogen; a halogen; a $C_6$-$C_{60}$ aryl group; a $C_2$-$C_{60}$ heterocyclic group containing at least one heteroatom of O, N, S, Si, and P; a fused ring group of a $C_3$-$C_{60}$ aliphatic ring and a $C_6$-$C_{60}$ aromatic ring; a $C_1$-$C_{60}$ alkyl group; a $C_3$-$C_{60}$ cycloalkyl group; a $C_2$-$C_{60}$ alkenyl group; a $C_2$-$C_{60}$ alkynyl group; a $C_1$-$C_{60}$ alkoxy group; and a $C_6$-$C_{30}$ aryloxy group.

$R^1$ is selected from the group consisting of a hydrogen; a heavy hydrogen; a halogen; a $C_6$-$C_{60}$ aryl group; a $C_2$-$C_{60}$ heterocyclic group containing at least one heteroatom of O, N, S, Si, and P; a fused ring group of a $C_3$-$C_{60}$ aliphatic ring and a $C_6$-$C_{60}$ aromatic ring; a $C_1$-$C_{60}$ alkyl group; a $C_3$-$C_{60}$ cycloalkyl group; a $C_2$-$C_{60}$ alkenyl group; a $C_2$-$C_{60}$ alkynyl group; a $C_1$-$C_{60}$ alkoxy group; a $C_6$-$C_{30}$ aryloxy group; ester group, ether group; and a hydroxy group.

$R^2$ and $R^3$ are each independently selected from the group consisting of a deuterium; a halogen; a $C_6$-$C_{60}$ aryl group; a $C_2$-$C_{60}$ heterocyclic group containing at least one heteroatom of 0, N, S, Si, and P; a fused ring group of a $C_3$-$C_{60}$ aliphatic ring and a $C_6$-$C_{60}$ aromatic ring; a $C_1$-$C_{60}$ alkyl group; a $C_3$-$C_{60}$ cycloalkyl group; a $C_2$-$C_{60}$ alkenyl group; a $C_2$-$C_{60}$ alkynyl group; a $C_1$-$C_{60}$ alkoxy group; and a $C_6$-$C_{30}$ aryloxy group.

$L^1$ is selected from the group consisting of a single bond; a $C_6$-$C_{60}$ arylene group; a fused ring group of a $C_3$-$C_{60}$ aliphatic ring and a $C_6$-$C_{60}$ aromatic ring; and a $C_2$-$C_{60}$ heterocyclic group containing at least one heteroatom of O, N, S, Si, and P; and a $C_1$-$C_{60}$ alkylene group.

$Ar^1$ and $Ar^2$ are each independently selected from the group consisting of a $C_6$-$C_{60}$ arylene group; a fused ring group of a $C_3$-$C_{60}$ aliphatic ring and a $C_6$-$C_{60}$ aromatic ring; a $C_1$-$C_{60}$ alkylene group; a $C_2$-$C_{60}$ alkenylene group; and a $C_2$-$C_{60}$ heterocyclic group containing at least one heteroatom of O, N, S, Si and P.

n is an integer from 2 to 1000.

a and b are each an integer of 1 to 3, and when a or b is 2 or more, a plurality of $R^2$s or a plurality of $R^3$s may be bonded to each other to form a ring.

L is selected from the group consisting of a single bond; a $C_6$-$C_{60}$ arylene group; a fused ring group of a $C_3$-$C_{60}$ aliphatic ring and a $C_6$-$C_{60}$ aromatic ring; and a $C_2$-$C_{60}$ heterocyclic group containing at least one heteroatom of O, N, S, Si, and P; a $C_1$-$C_{60}$ alkylene group; a $C_2$-$C_{60}$ alkenylene group; and the following Formulas 2-1 to 2-4.

[Formula 2-1]

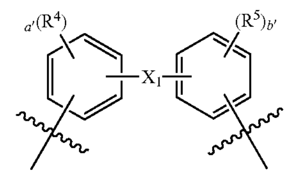

[Formula 2-2]

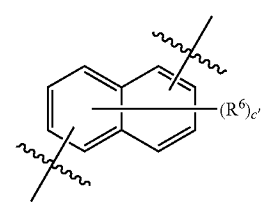

[Formula 2-3]

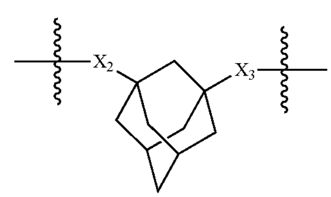

[Formula 2-4]

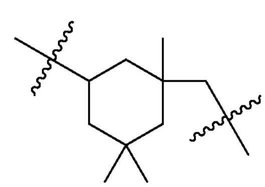

The following description relates to Formula 2-1 to 2-4.

$X_1$ to $X_3$ are each selected from the group consisting of a single bond, O, S, C═O, CR'R", and $SO_2$.

R' and R" are each independently selected from the group consisting of a hydrogen; a deuterium; a halogen; a $C_6$-$C_{60}$ aryl group; a $C_2$-$C_{60}$ heterocyclic group containing at least one heteroatom of O, N, S, Si and P; a fused ring group of a $C_3$-$C_{60}$ aliphatic ring and a $C_6$-$C_{60}$ aromatic ring; a $C_1$-$C_{60}$ alkyl group; a $C_3$-$C_{60}$ cycloalkyl group; a $C_2$-$C_{60}$ alkenyl group; a $C_2$-$C_{60}$ alkynyl group; a $C_1$-$C_{60}$ alkoxy group; a $C_6$-$C_{60}$ aryloxy group; and $CF_3$, and R' and R" may be bonded to each other to form a spiro compound.

$R^4$, $R^5$ and $R^6$ are each selected from the group consisting of a deuterium; a halogen; a $C_6$-$C_{60}$ aryl group; a $C_2$-$C_{60}$ heterocyclic group containing at least one heteroatom of O, N, S, Si, and P; a fused ring group of a $C_3$-$C_{60}$ aliphatic ring and a $C_6$-$C_{60}$ aromatic ring; a $C_1$-$C_{60}$ alkyl group; a $C_3$-$C_{60}$ cycloalkyl group; a $C_2$-$C_{60}$ alkenyl group; a $C_2$-$C_{60}$ alkynyl group; a $C_1$-$C_{60}$ alkoxy group; a $C_6$-$C_{60}$ aryloxy group; an ester group; an ether group; an amide group; an imide group; $CF_3$ and a cyano group.

a' and b' are each an integer of 1 to 4, and when a' or b' is 2 or more, a plurality of $R^4$s or a plurality of $R^5$s may be bonded to each other to form a ring.

c' is an integer of 1 to 6, and when c' is 2 or more, a plurality of $R^6$ may be bonded to each other to form a ring.

The aryl group may have 6 to 60, 6 to 40, or 6 to 30 carbon atoms. The heterocyclic group may have 2 to 60, 2 to 30, or 2 to 20 carbon atoms. The alkyl group may have 1 to 50, 1 to 30, 1 to 20, or 1 to 10 carbon atoms.

the aryl group, the heterocyclic group, the fused ring group, the alkyl group, the cycloalkyl group, the alkenyl group, the alkynyl group, the alkoxy group, the aryloxy group, the alkylene group, the arylene group, the alkylene group, the alkenylene group, the ester group, the ether group, the amide group and the imide group respectively may be substituted with one or more substituents selected from the group consisting of a deuterium; a halogen; a silane group; a siloxane group; a boron group; a cyano group; a $C_1$-$C_{20}$ alkylthio group; a $C_1$-$C_{20}$ alkoxy group; a $C_1$-$C_{20}$ alkyl group; a $C_2$-$C_{20}$ alkenyl group; a $C_2$-$C_{20}$ alkynyl group; a $C_6$-$C_{20}$ aryl group; a $C_6$-$C_{20}$ aryl group substituted with deuterium; a $C_2$-$C_{20}$ heterocyclic group; a $C_3$-$C_{20}$ cycloalkyl group; a $C_7$-$C_{20}$ arylalkyl group; a $C_8$-$C_{20}$ arylalkenyl group; a carbonyl group; an ether group; a $C_2$-$C_{20}$ alkoxylcarbonyl group; a $C_6$-$C_{30}$ aryloxy group; and a hydroxy group.

The compound represented by Formula 1 may be represented by any one of the following Formulas 3 to 10.

[Formula 3]

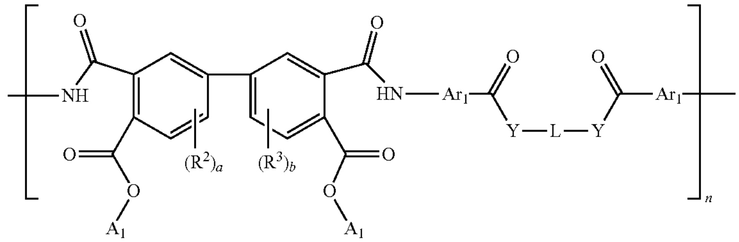

[Formula 4]

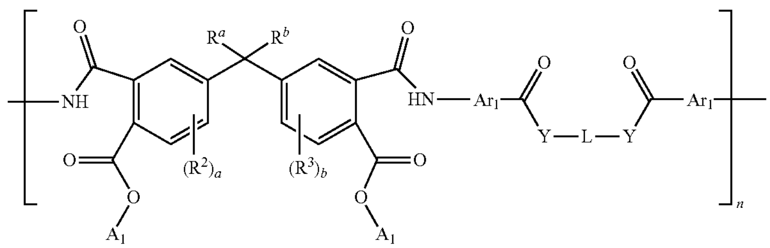

[Formula 5]

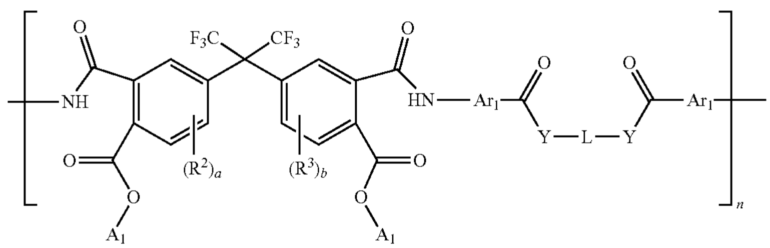

[Formula 6]

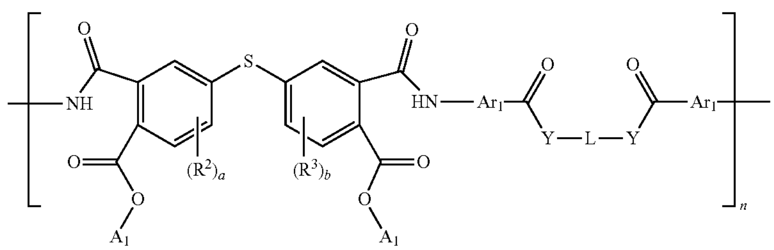

-continued
[Formula 7]
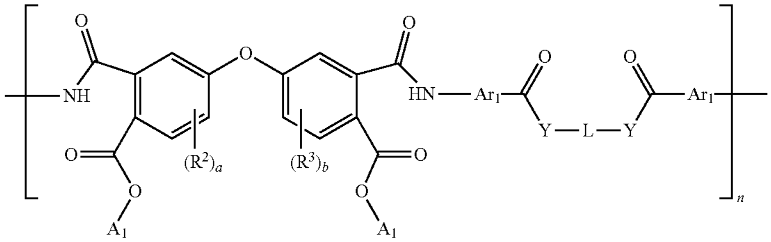
[Formula 8]
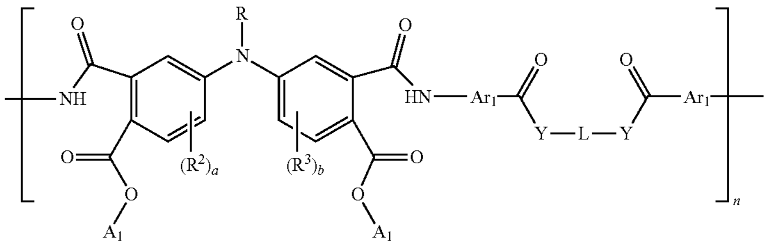
[Formula 9]
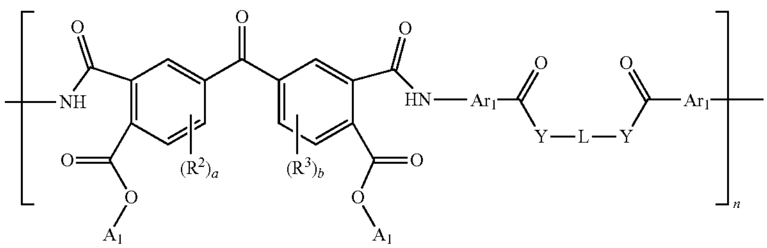
[Formula 10]
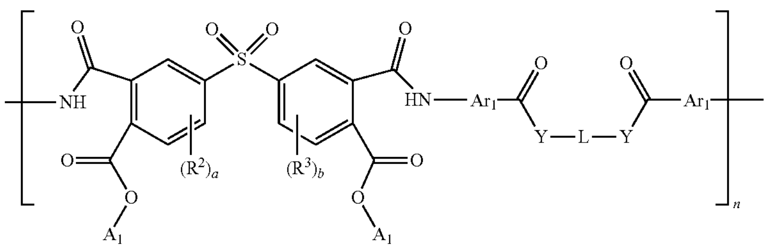
More specifically, the compound represented by Formula 1 may be any one of the following compounds, but is not limited to the following compounds.
P1-1
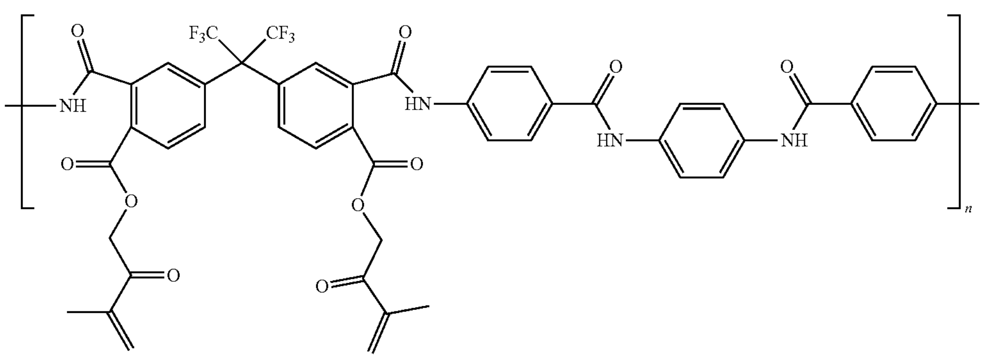

-continued
P1-2
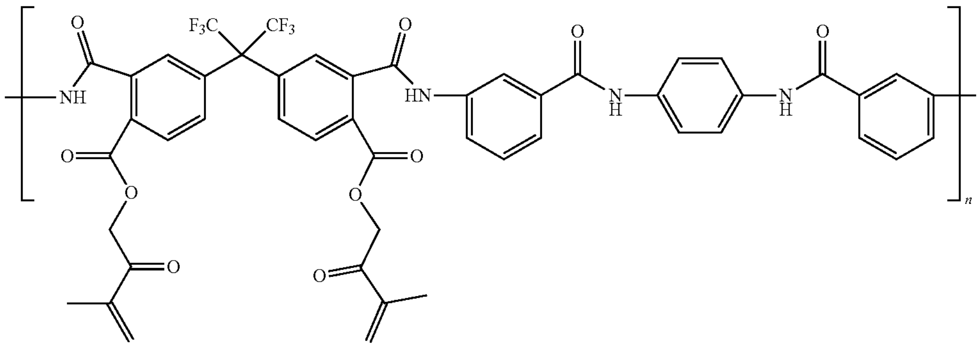
P1-3
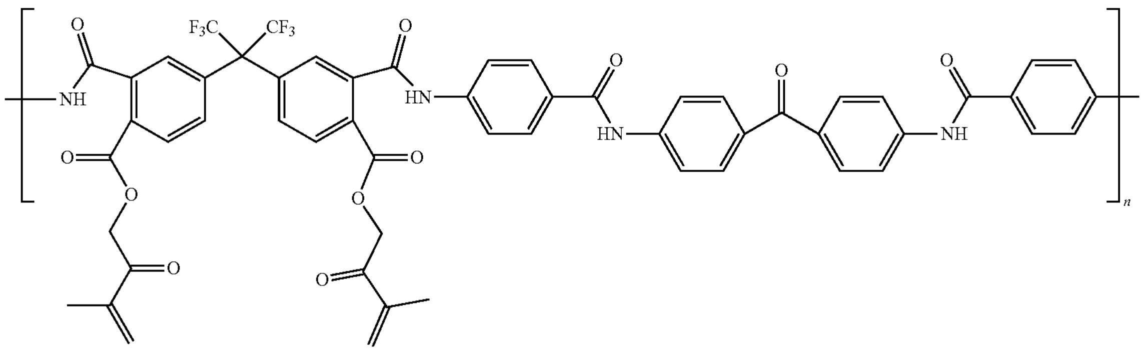
P1-4
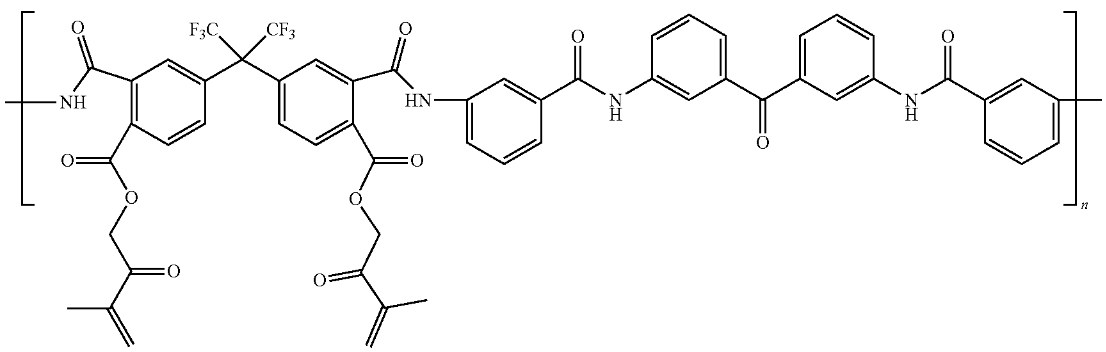
P1-5
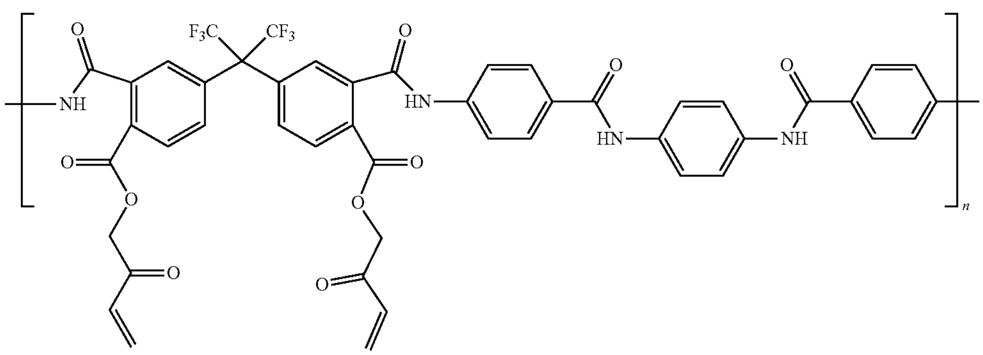

-continued
P1-6
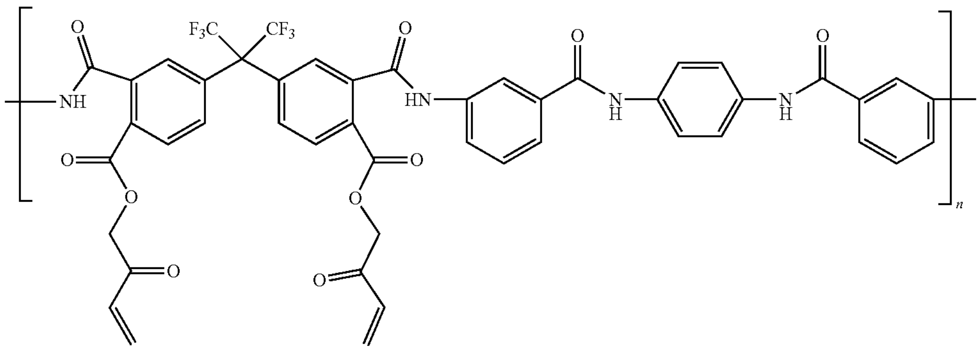
P1-7
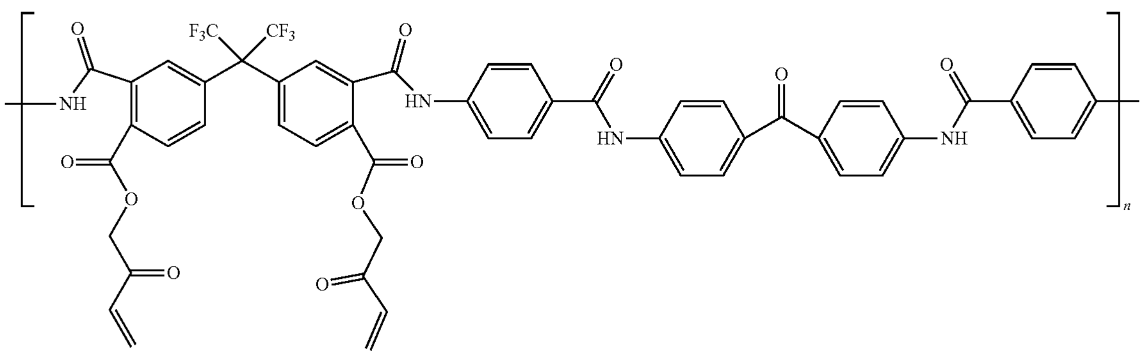
P1-8
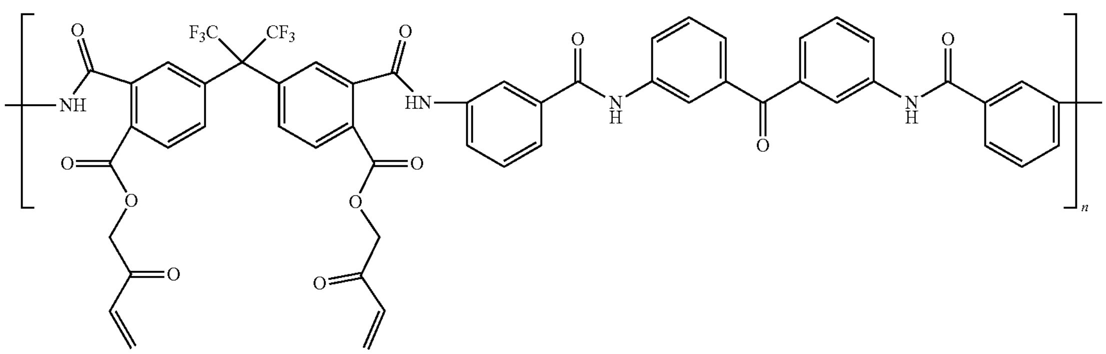
P1-9
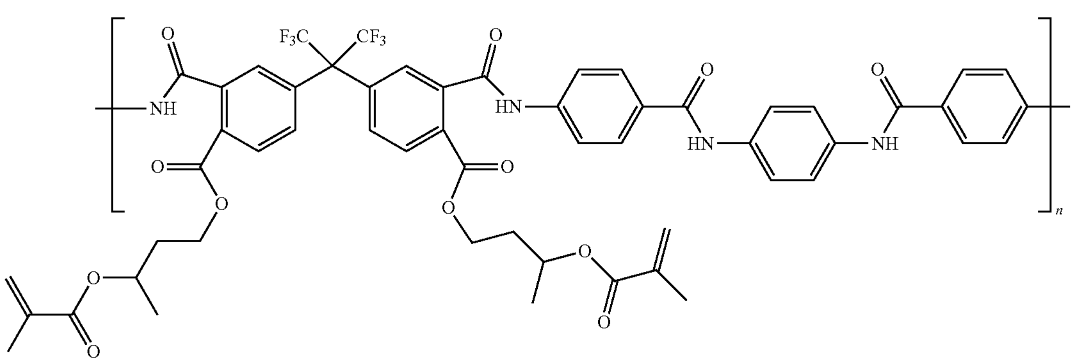

-continued
P1-10
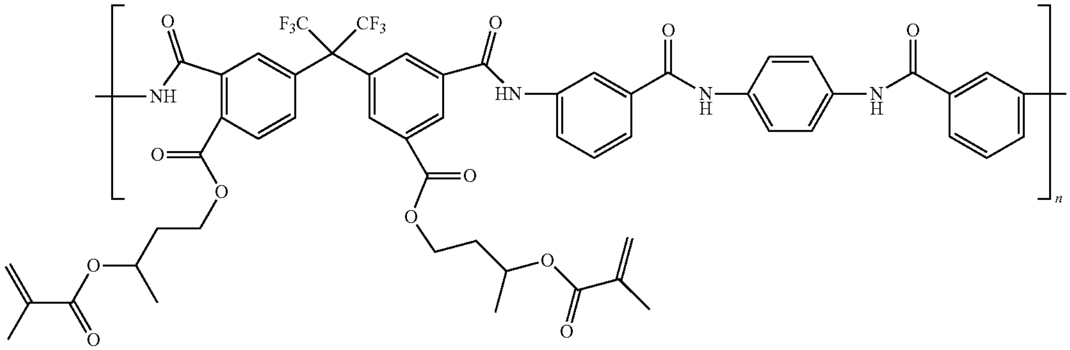
P1-11
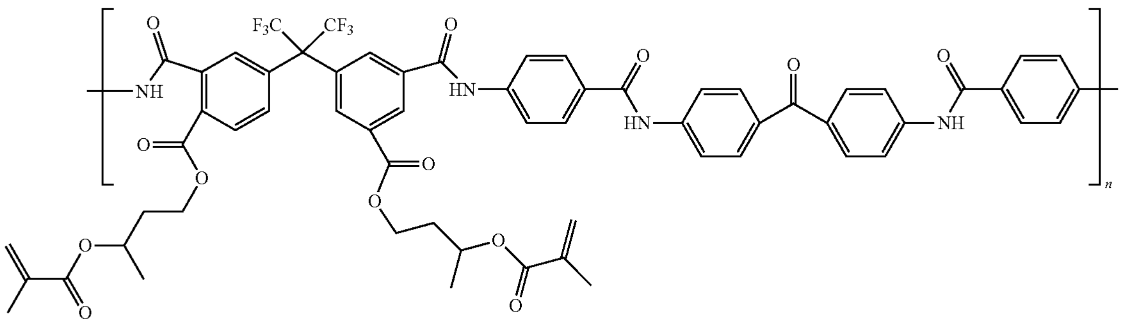
P1-12
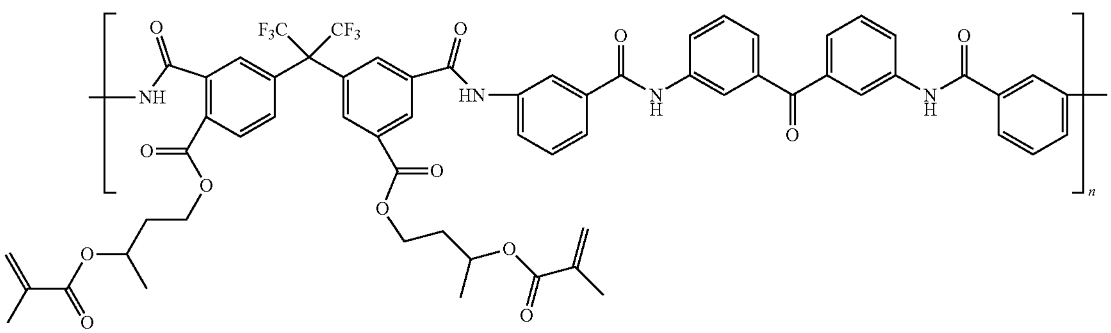
P1-13
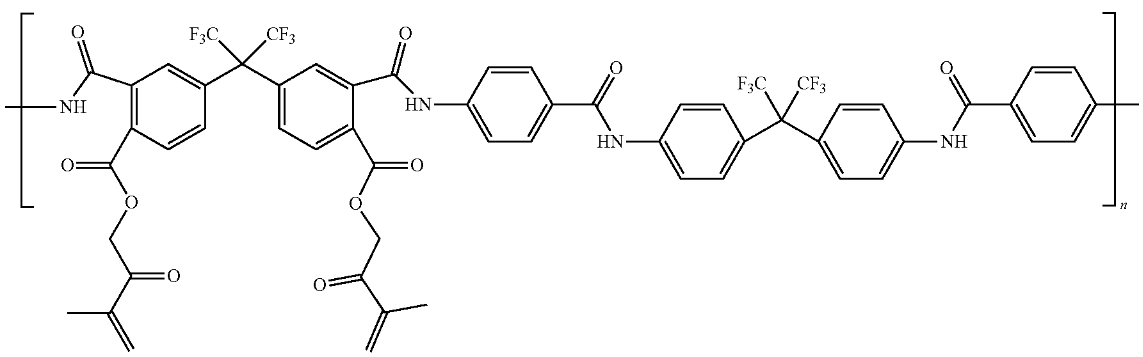

-continued
P1-14
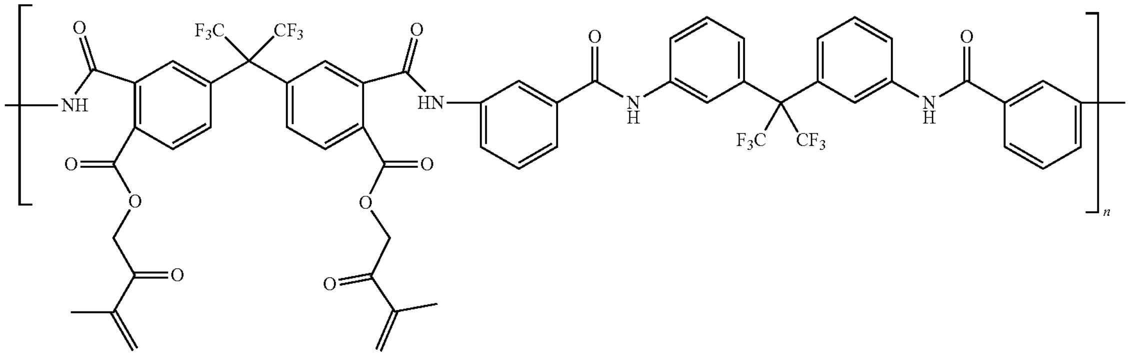
P1-15
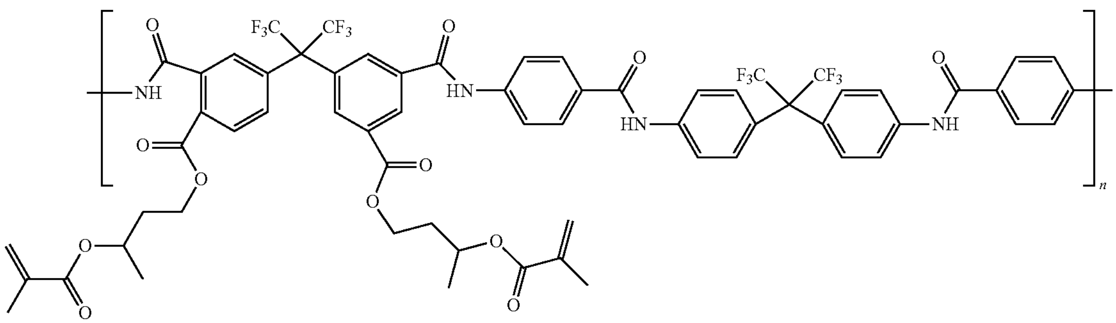
P1-16
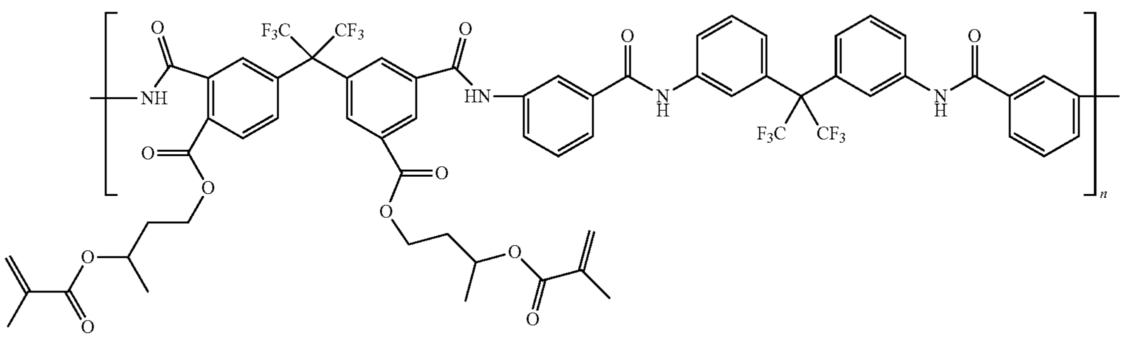
P1-17
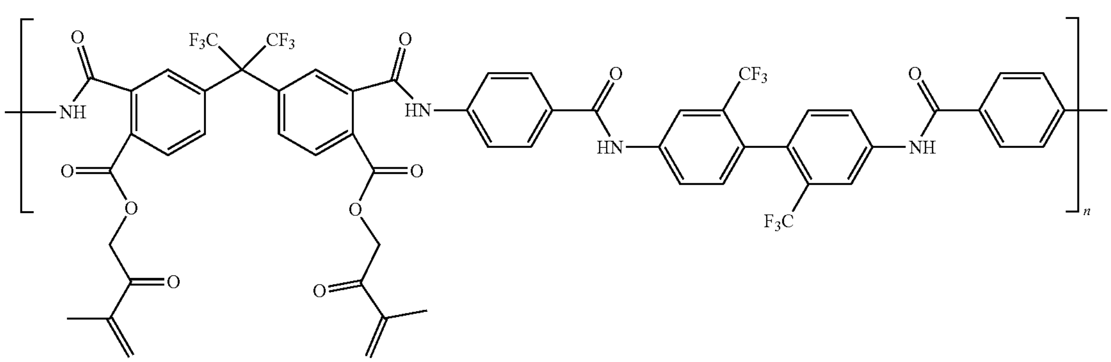

-continued
P1-18
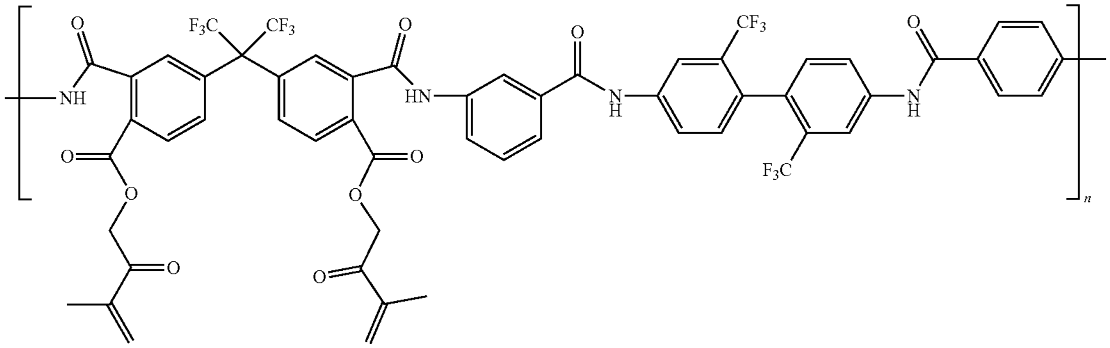
P1-19
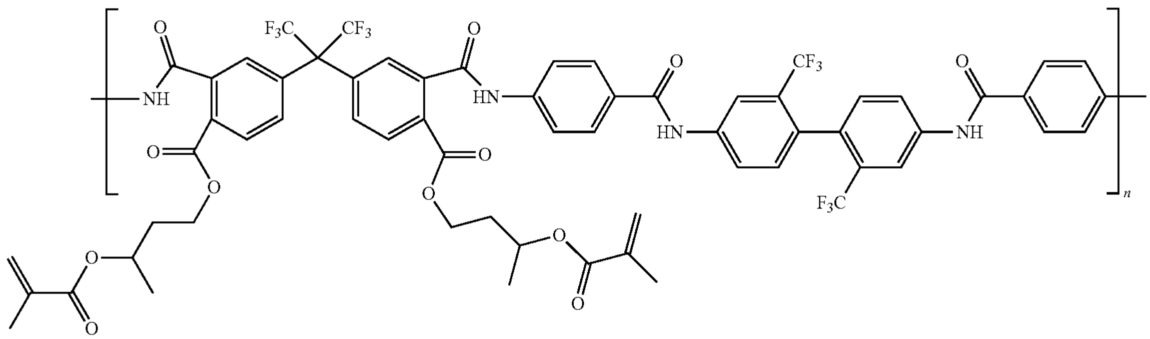
P1-20
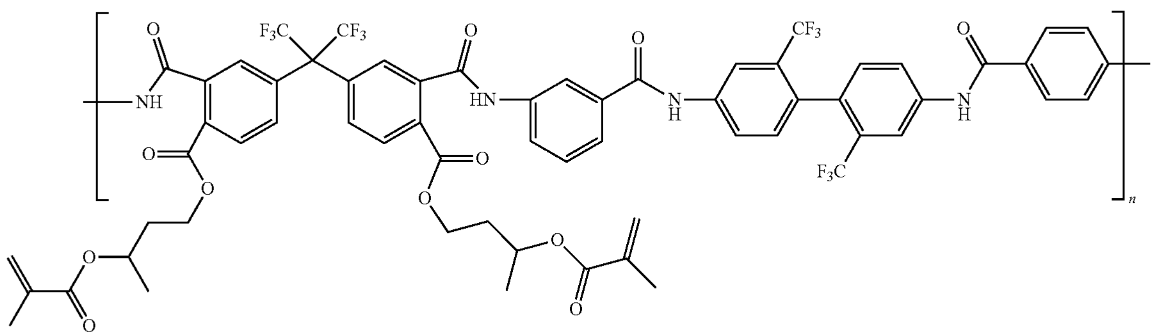
P1-21
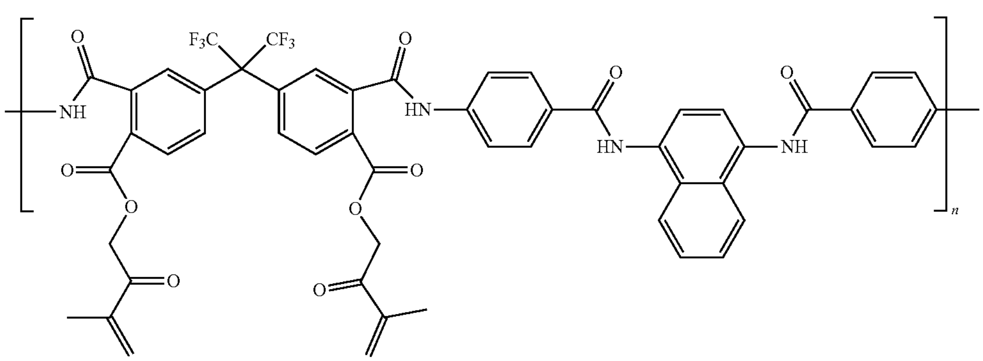

-continued
P1-22
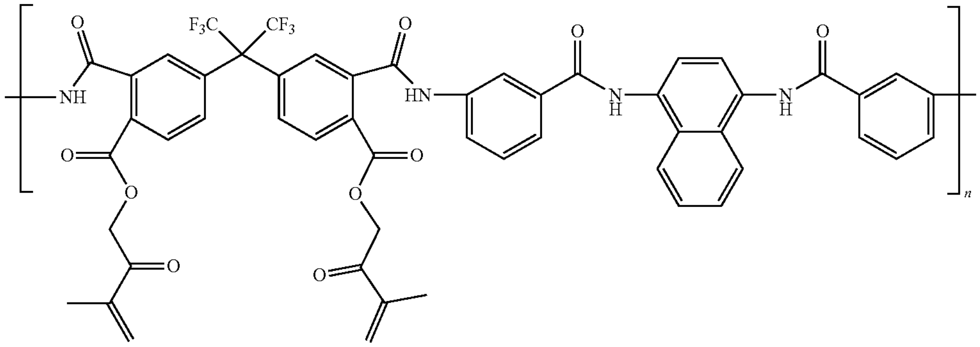
P1-23
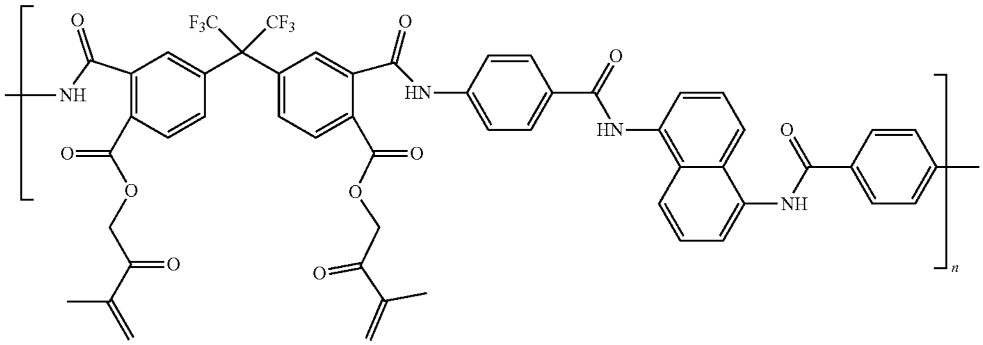
P1-24
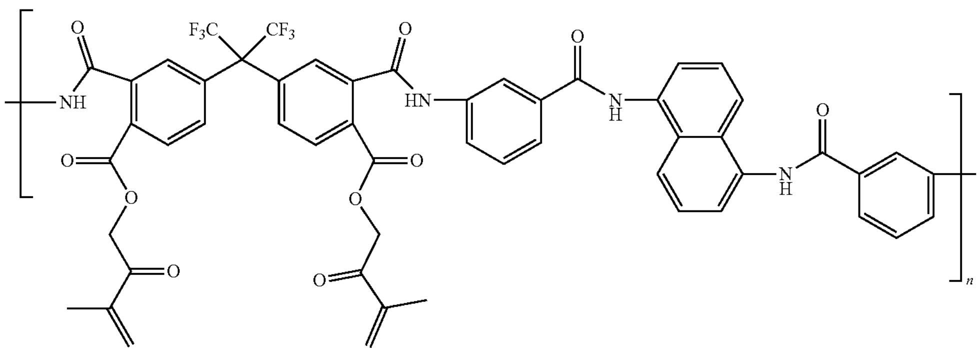
P1-25
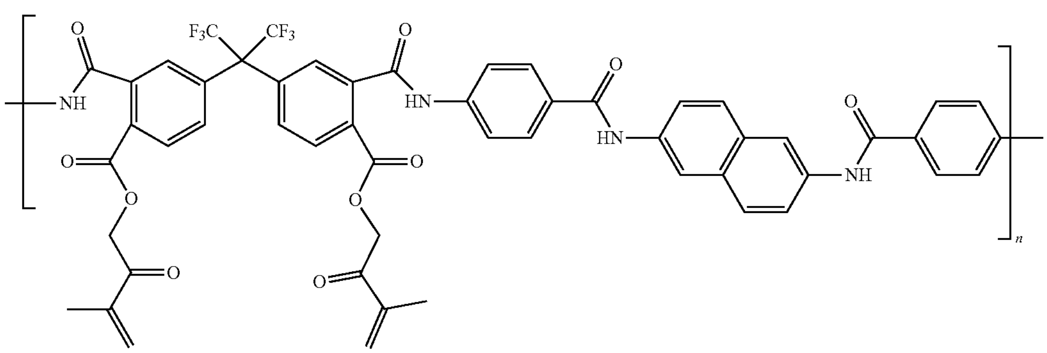

-continued
P1-26
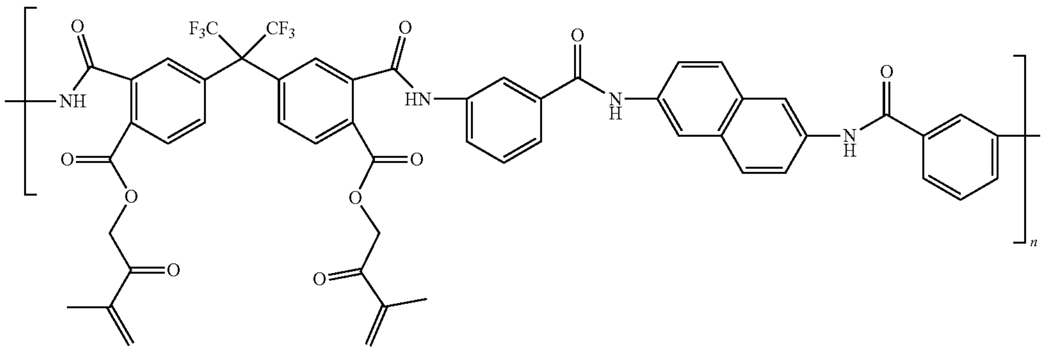
P1-27
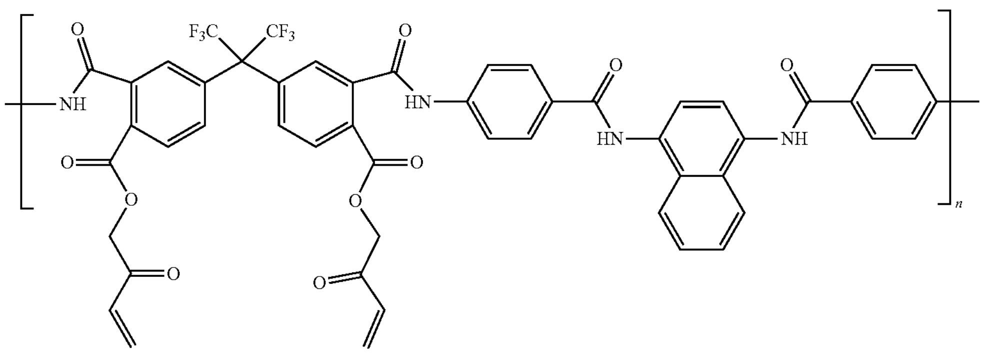
P1-28
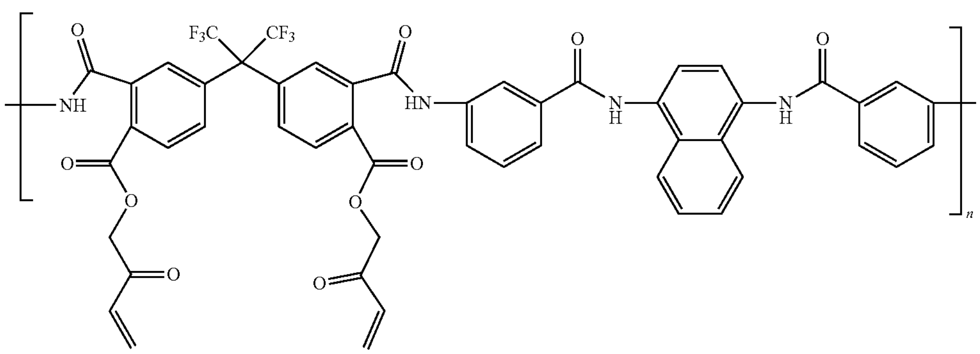
P1-29
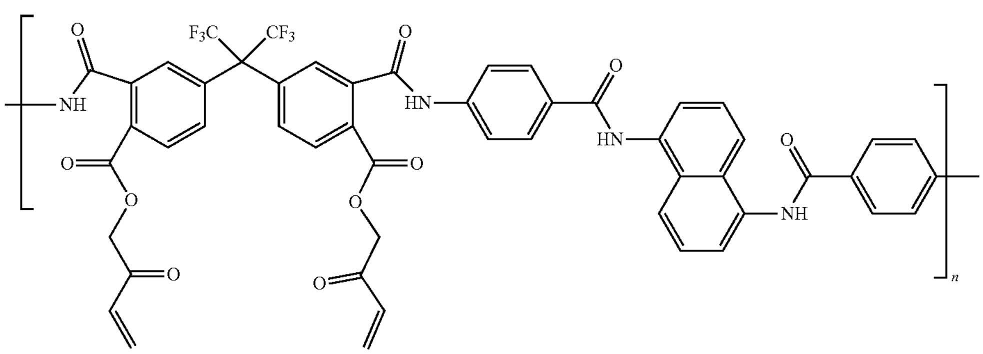

-continued
P1-30
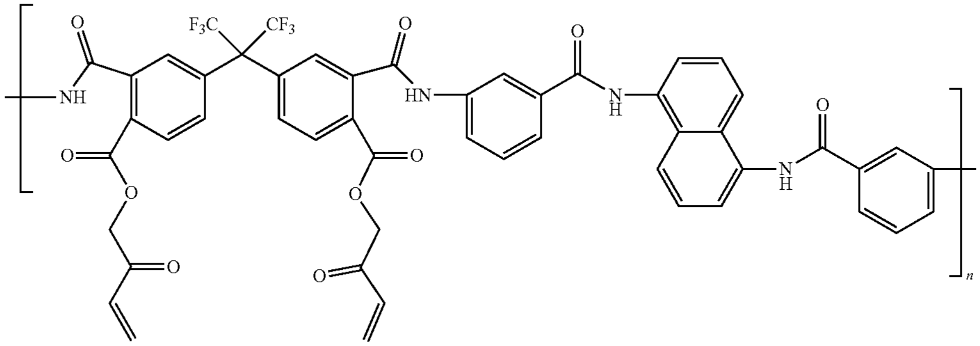
P1-31
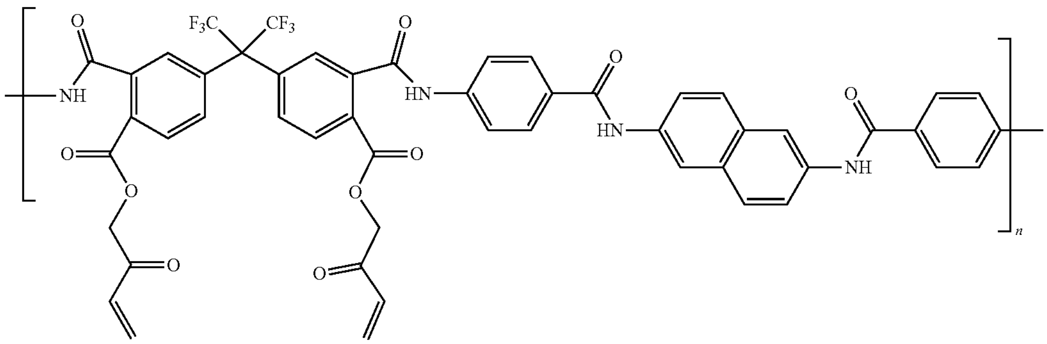
P1-32
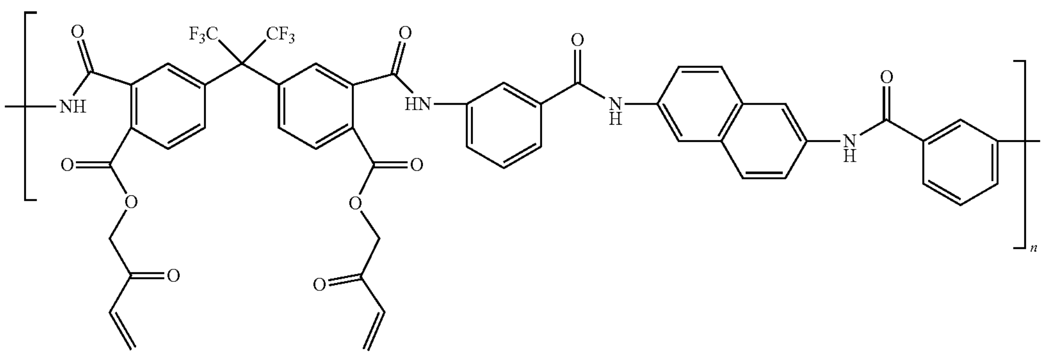
P1-33
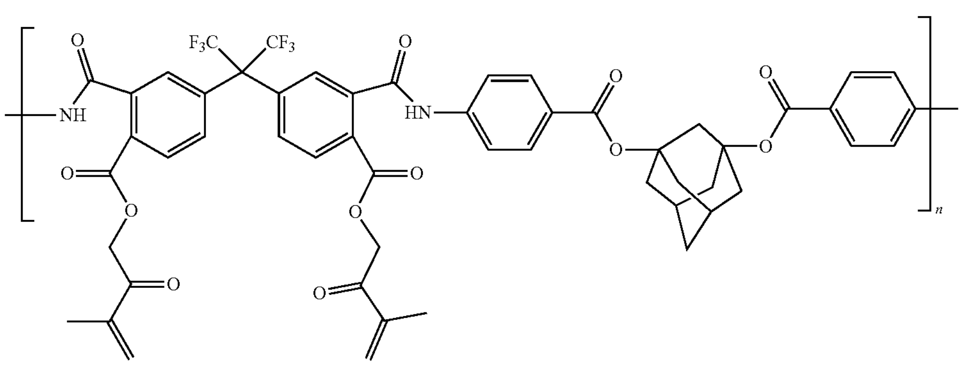

-continued
P1-34
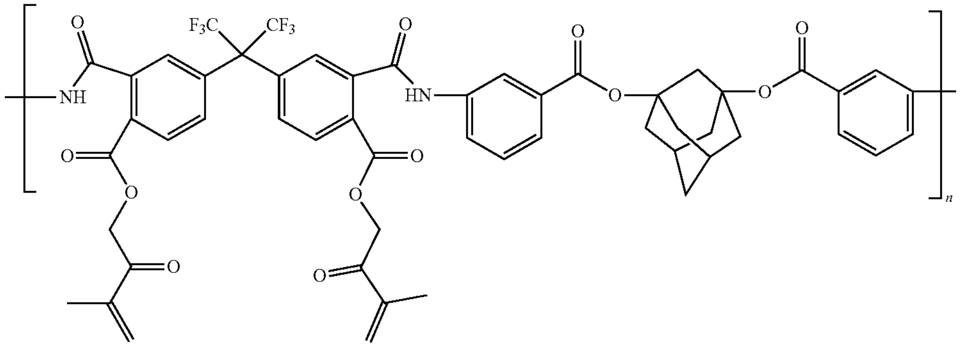
P1-35
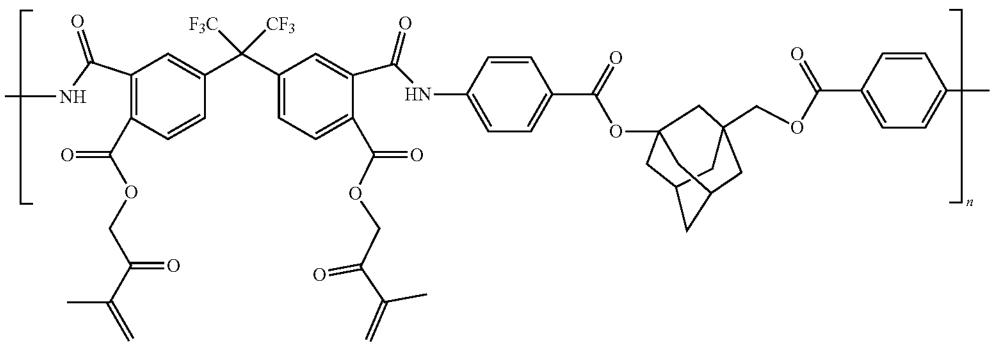
P1-36
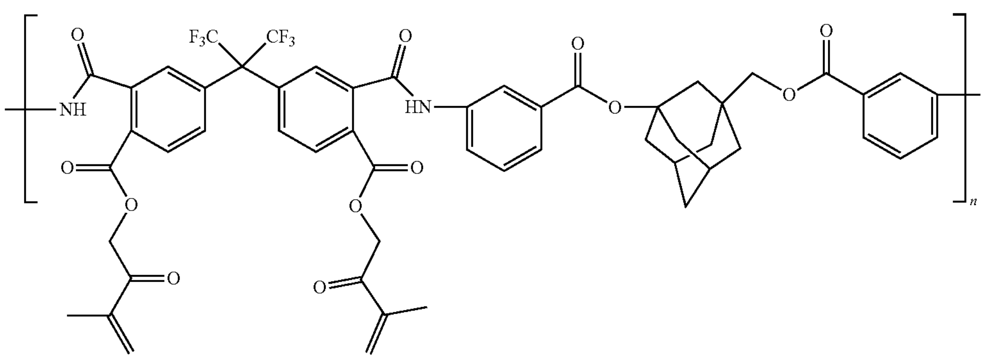
P1-37
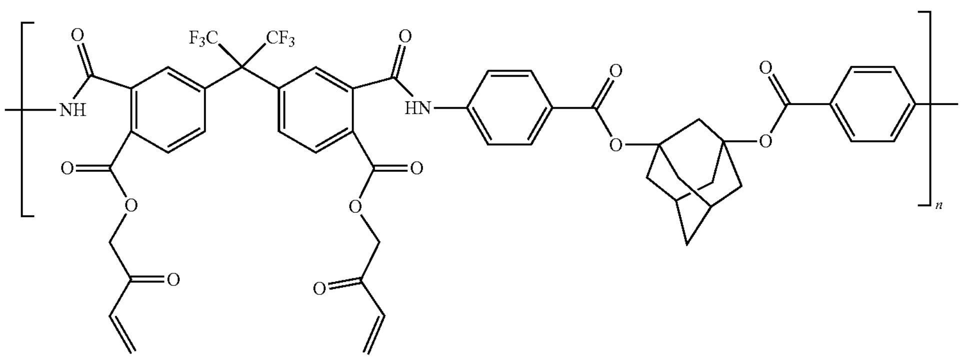

-continued
P1-38
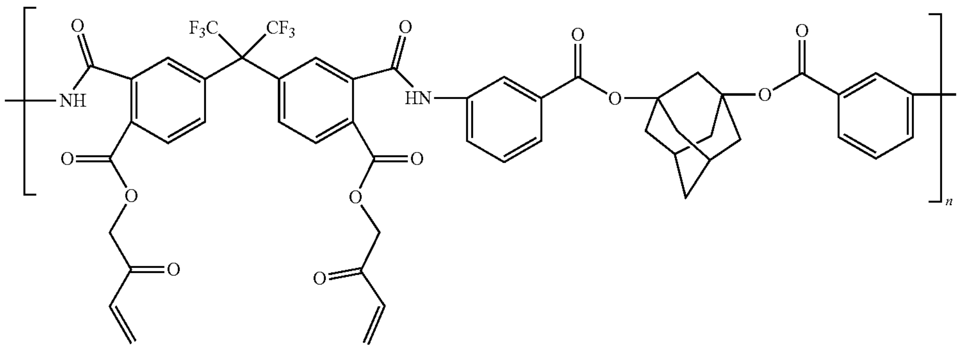
P1-39
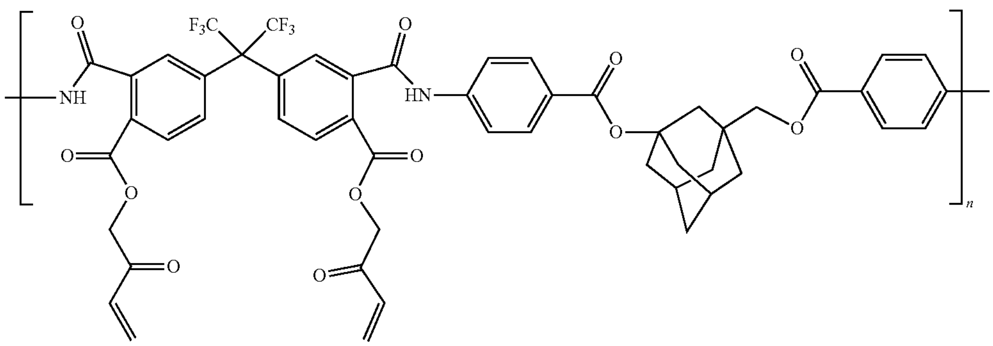
P1-40
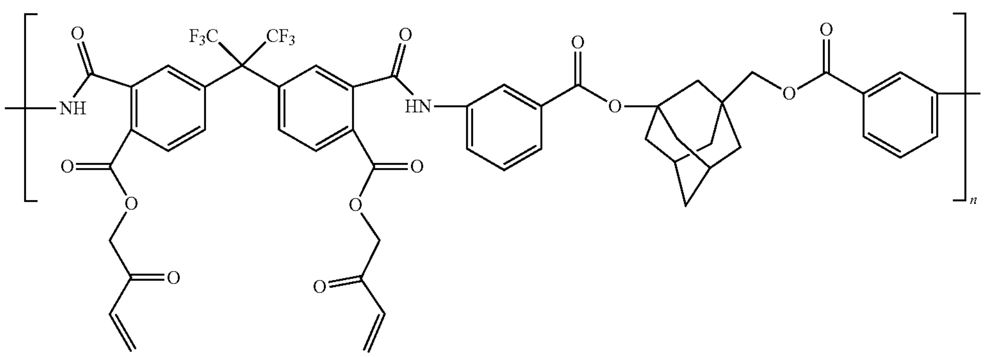
P1-41
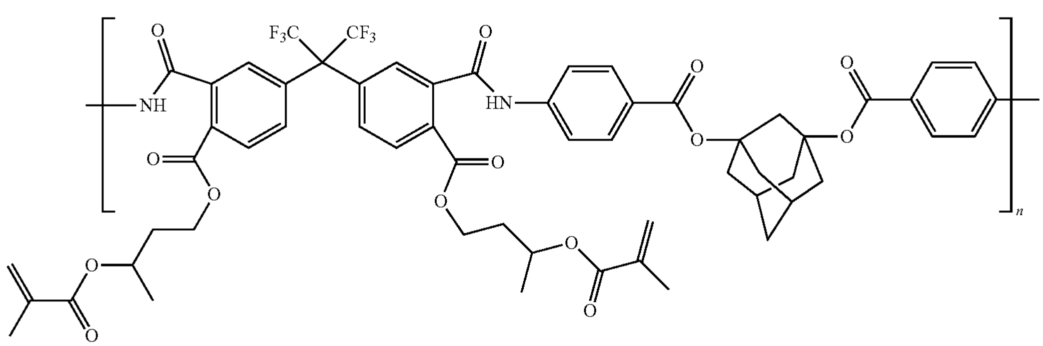

-continued
P1-42
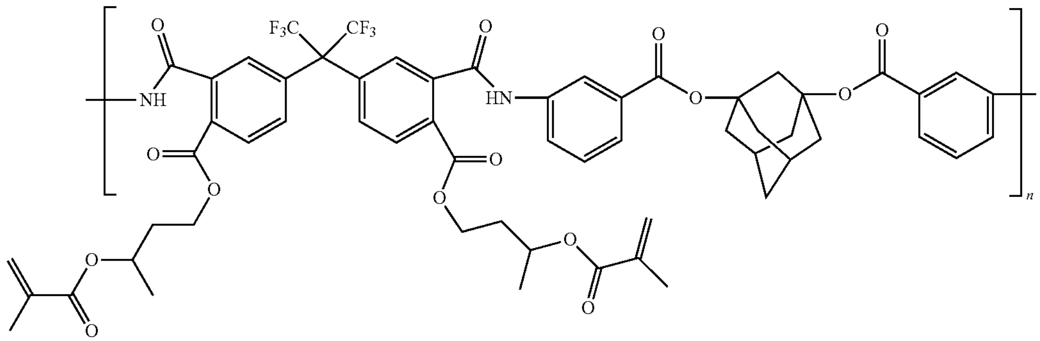
P1-43
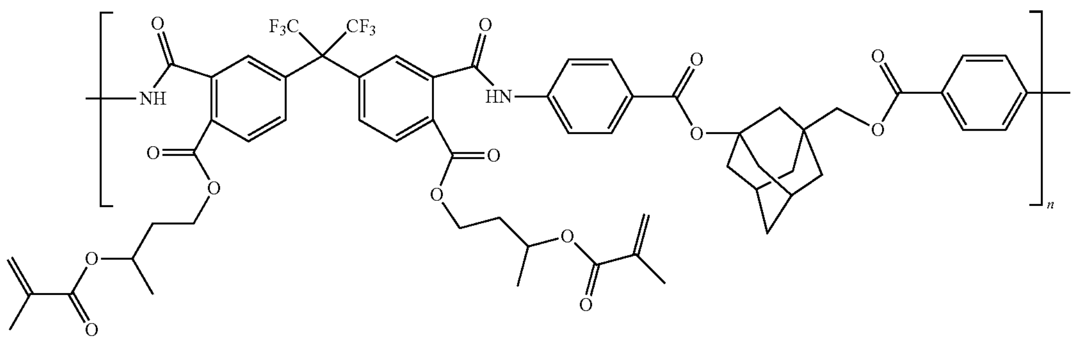
P1-44
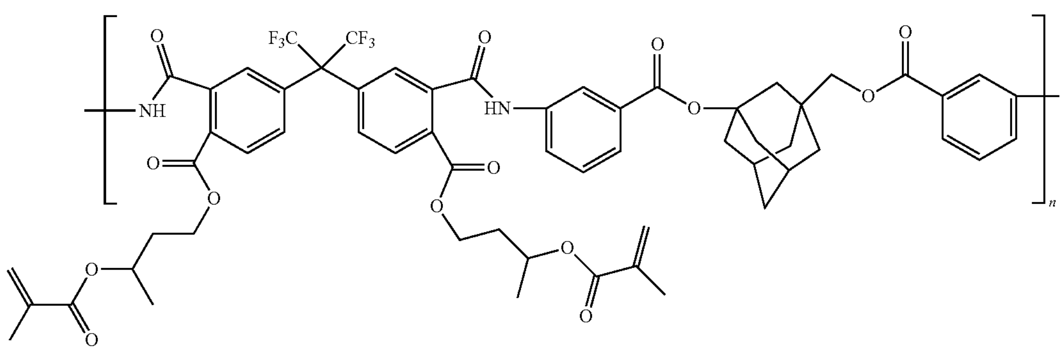
P1-45
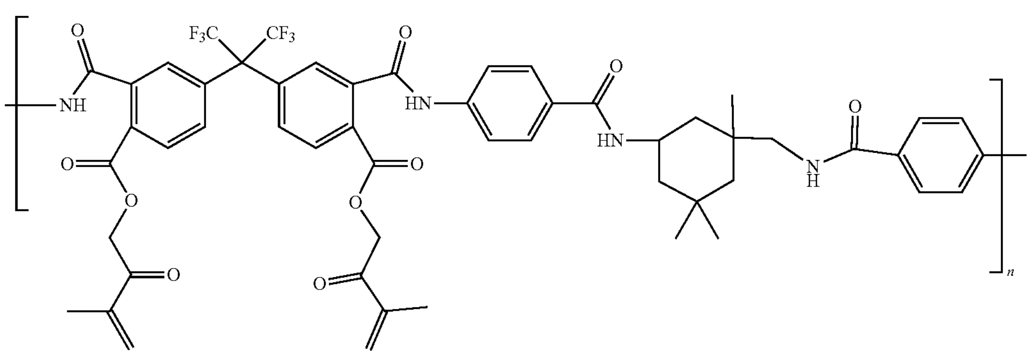

-continued
P1-46
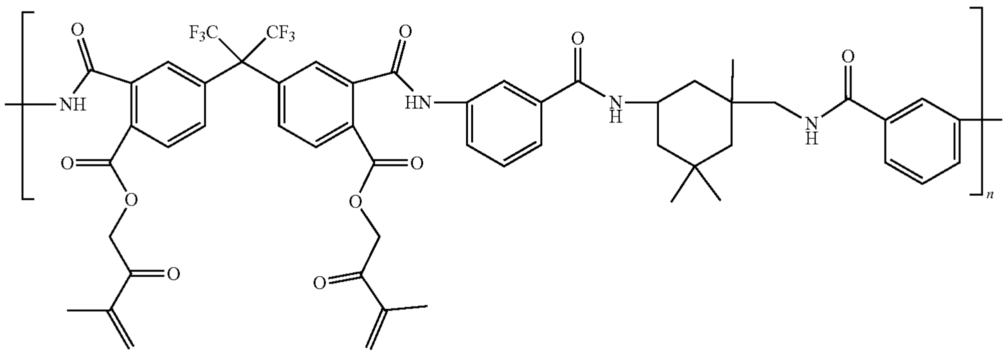
P1-47
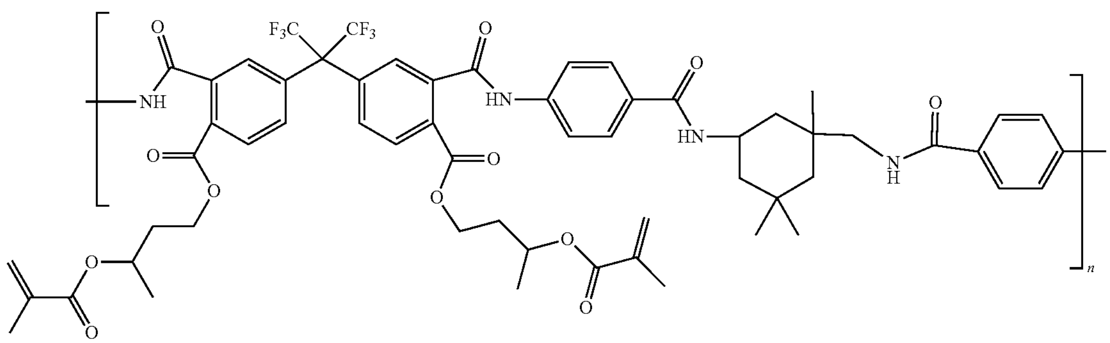
P1-48
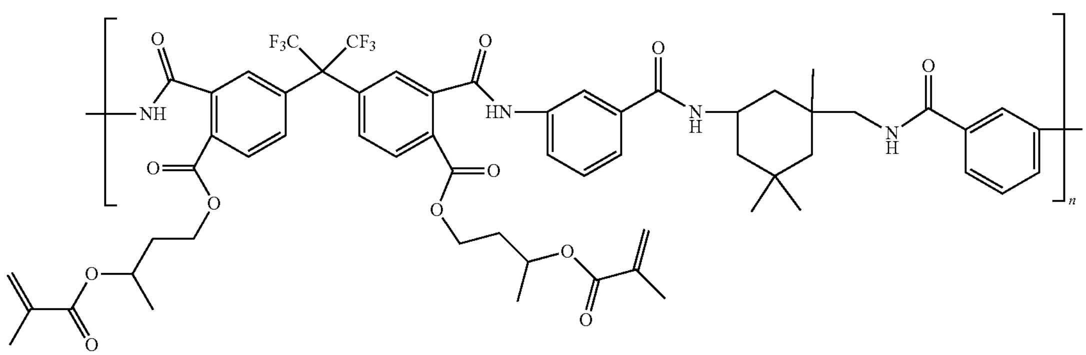
P1-49
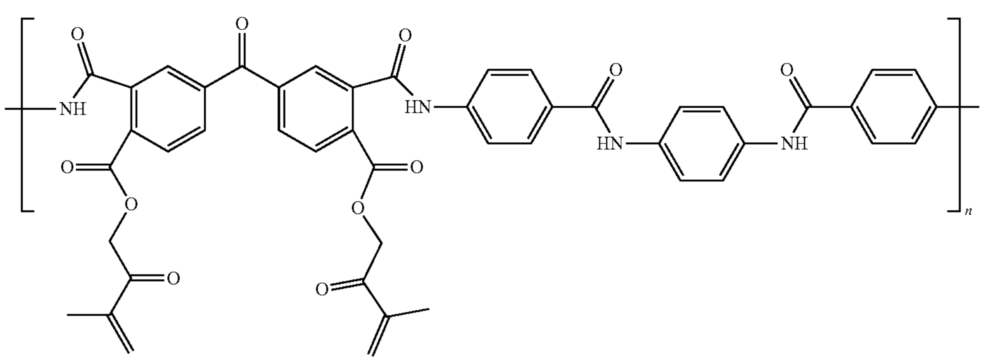

-continued
P1-50
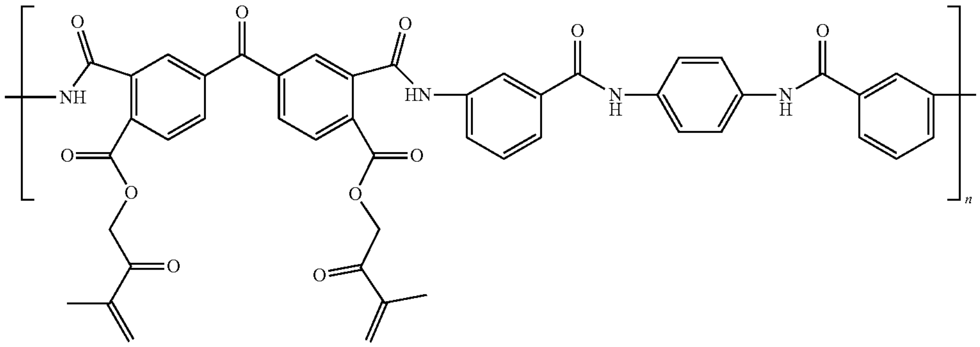
P1-51
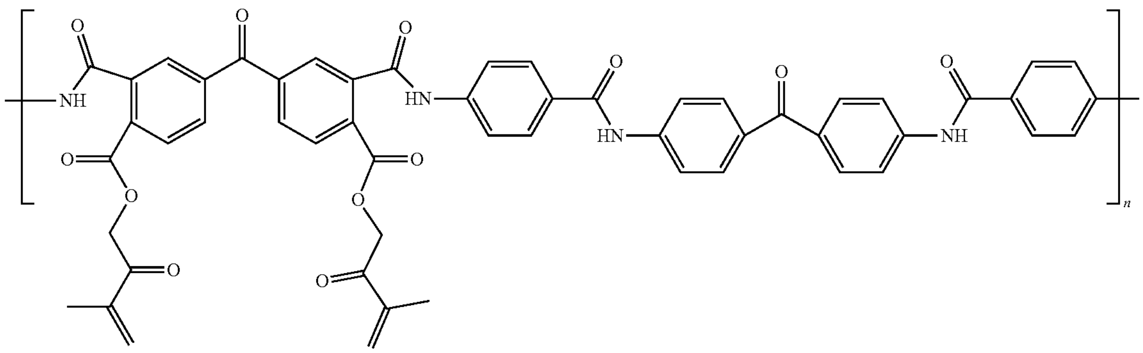
P1-52
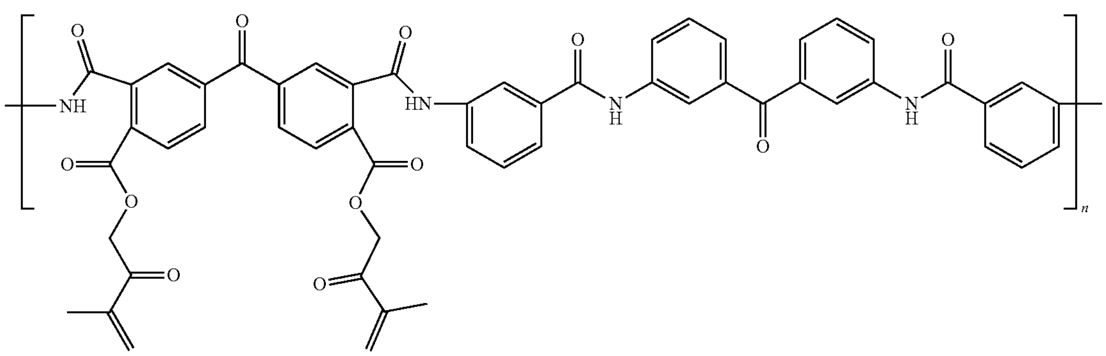
P1-53
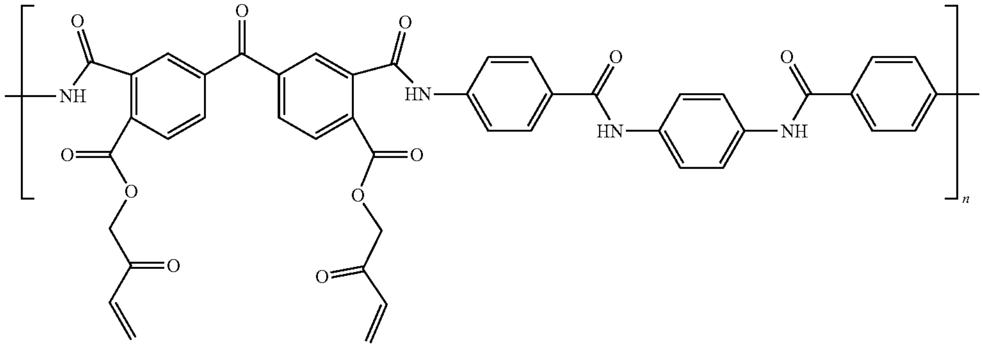

-continued
P1-54
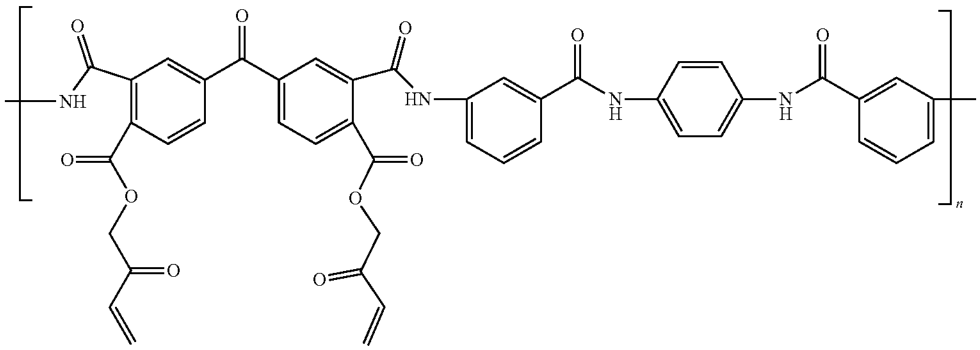
P1-55
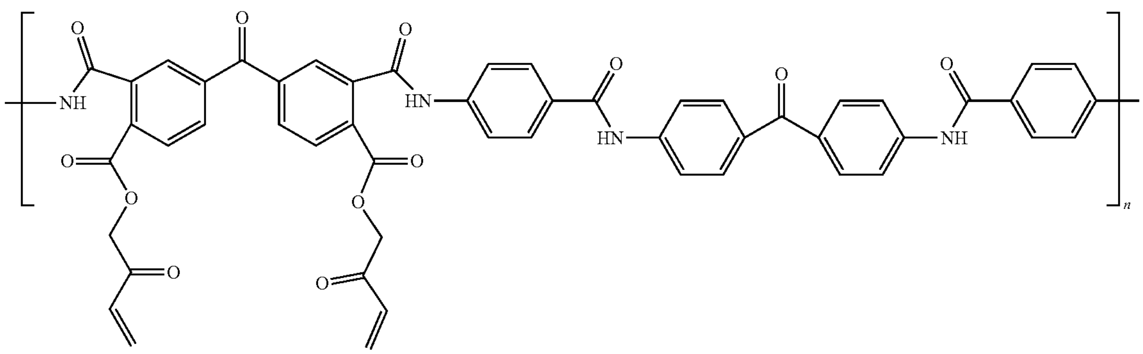
P1-56
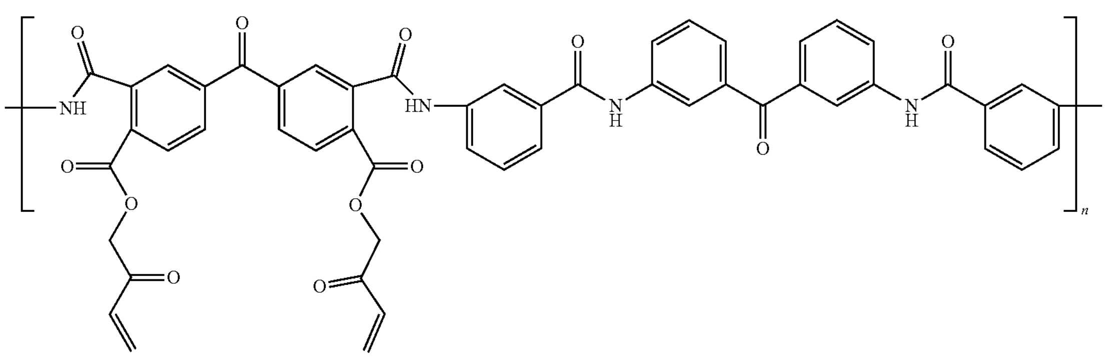
P1-57
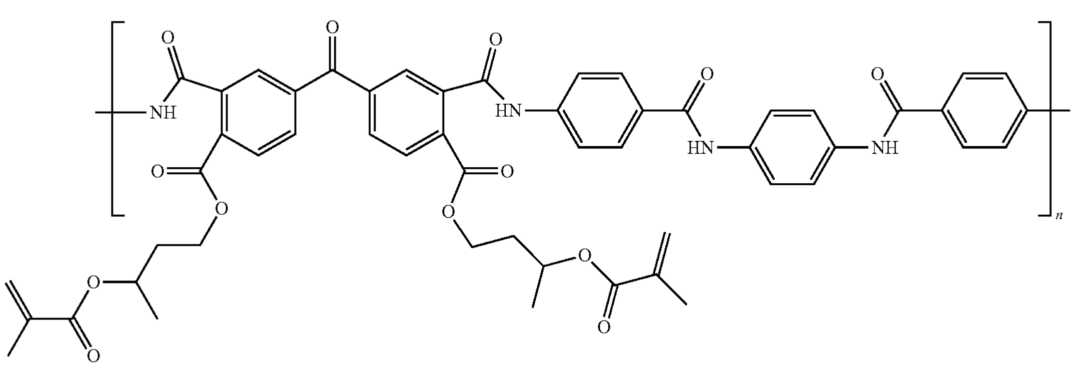

-continued
P1-58
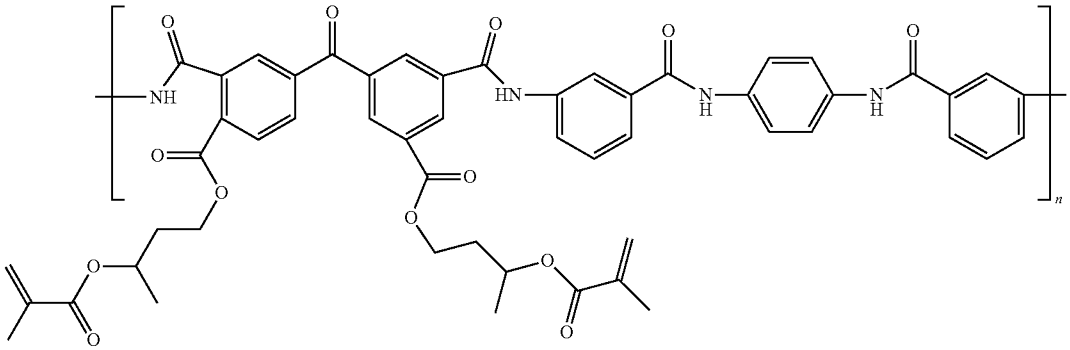
P1-59
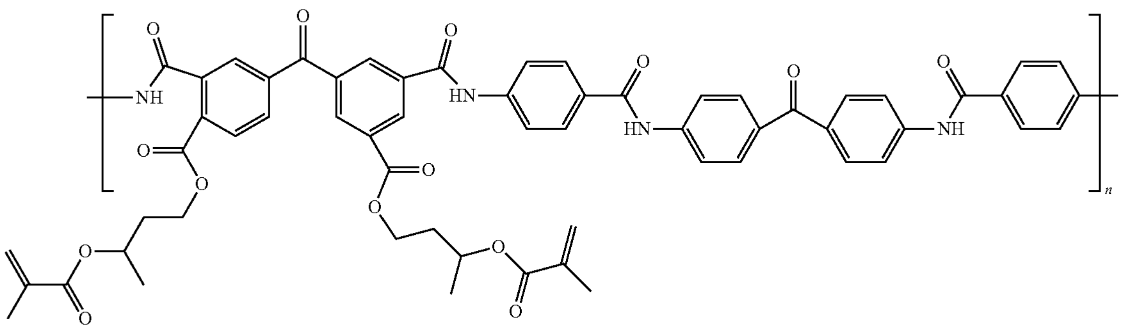
P1-60
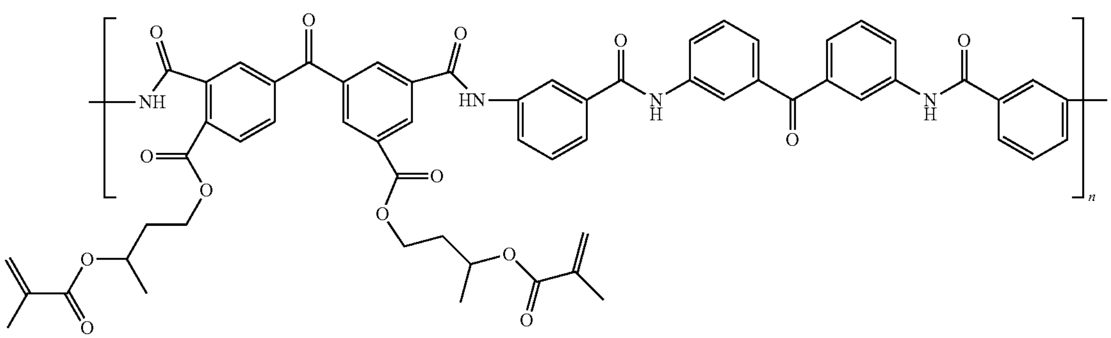
P1-61
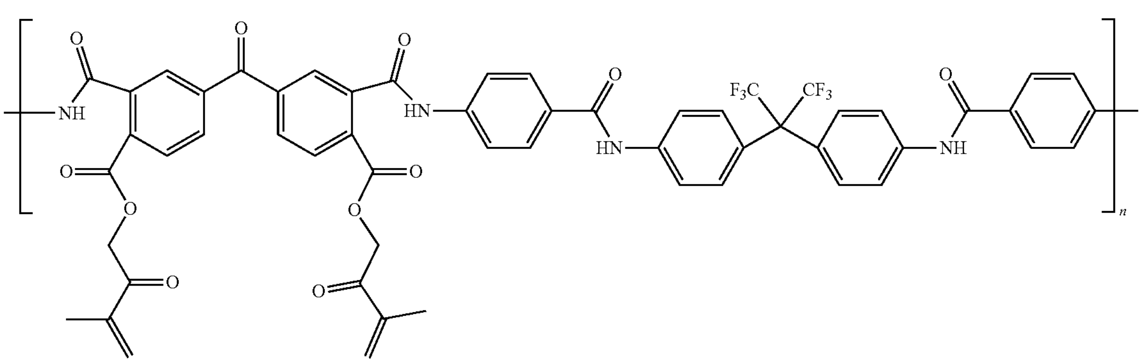

-continued
P1-62
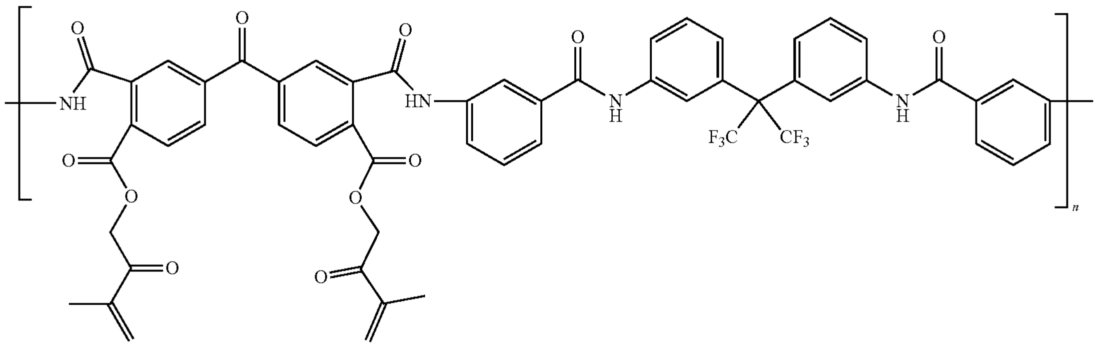
P1-63
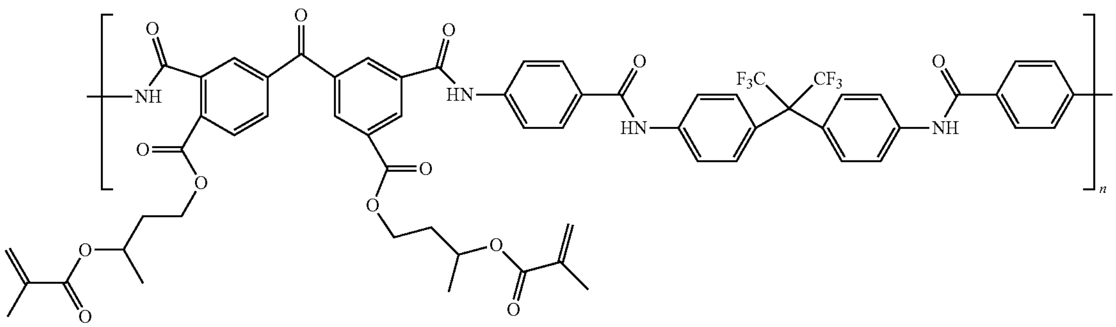
P1-64
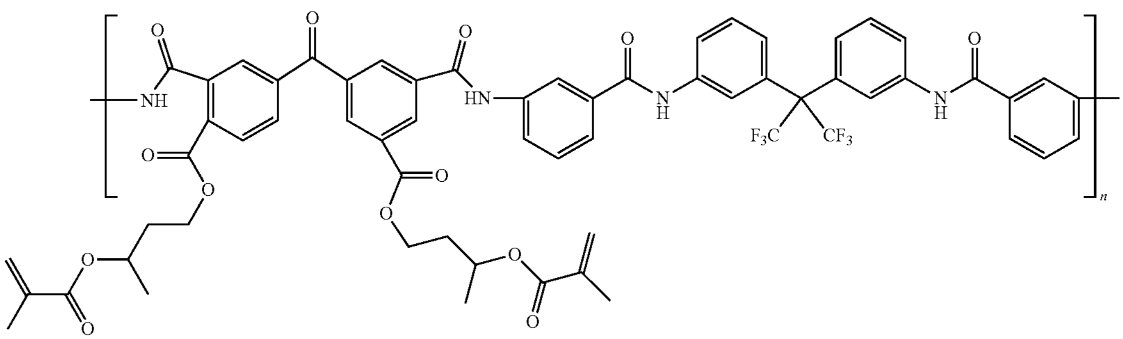
P1-65
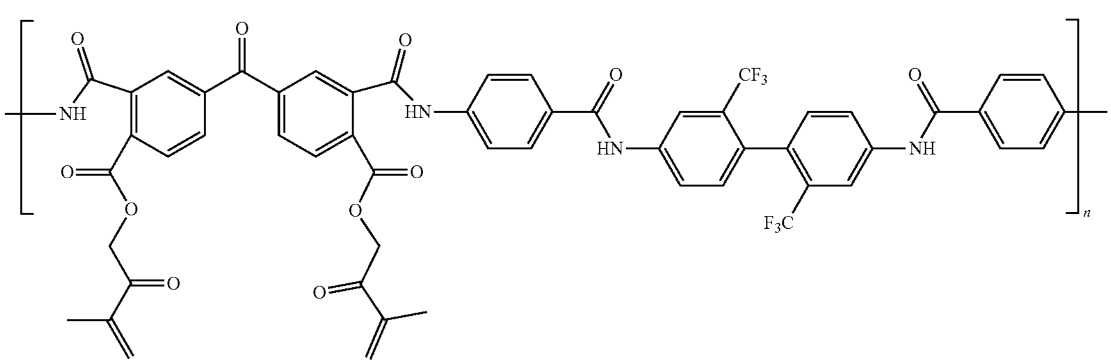

-continued
P1-66
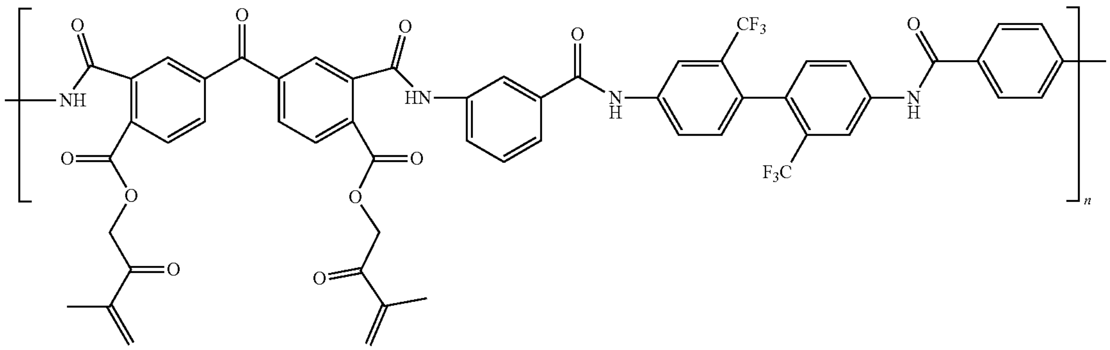
P1-67
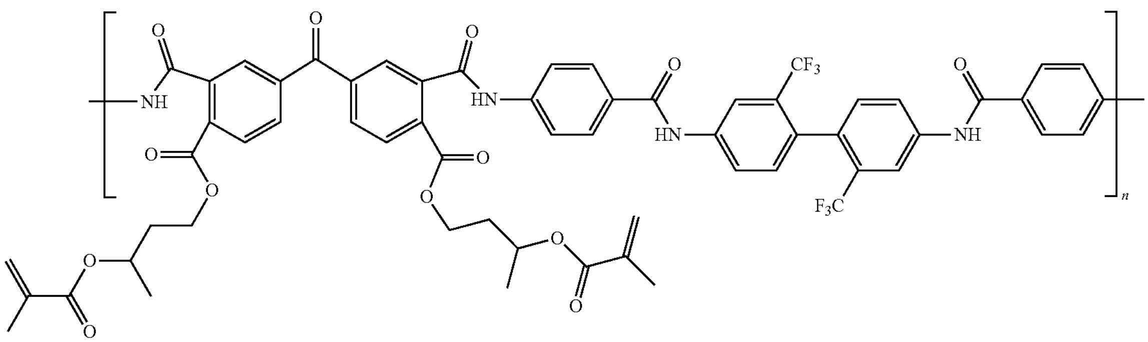
P1-68
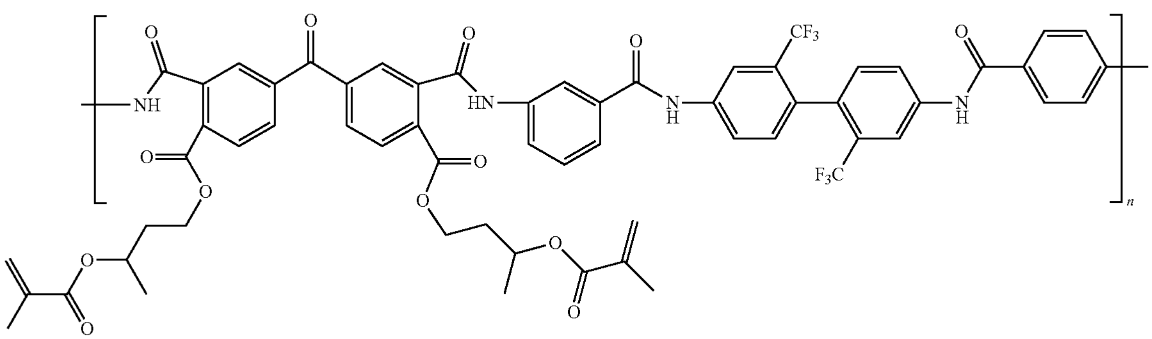
P1-69
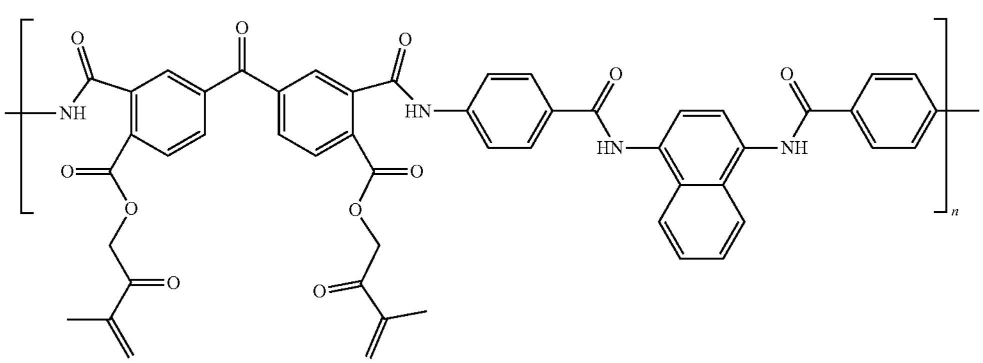

-continued
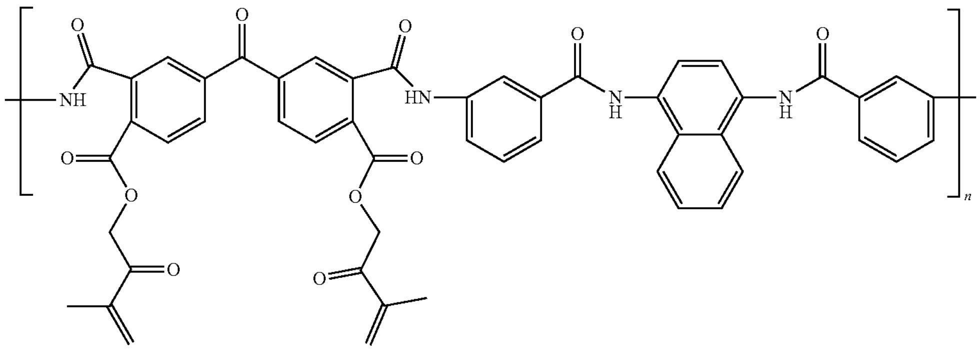
P1-70
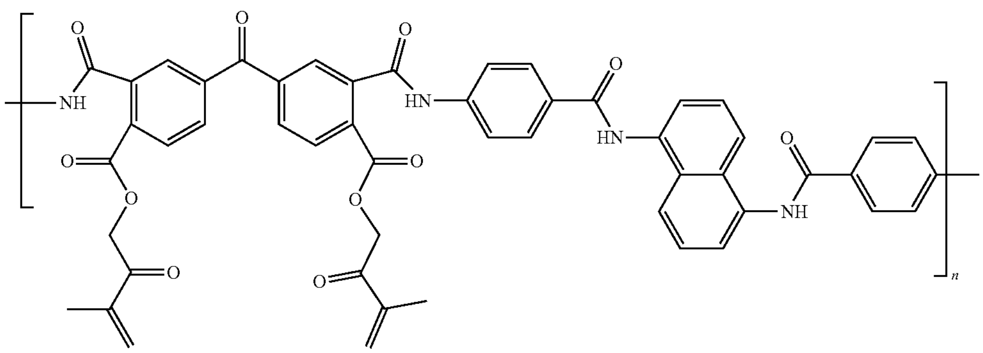
P1-71
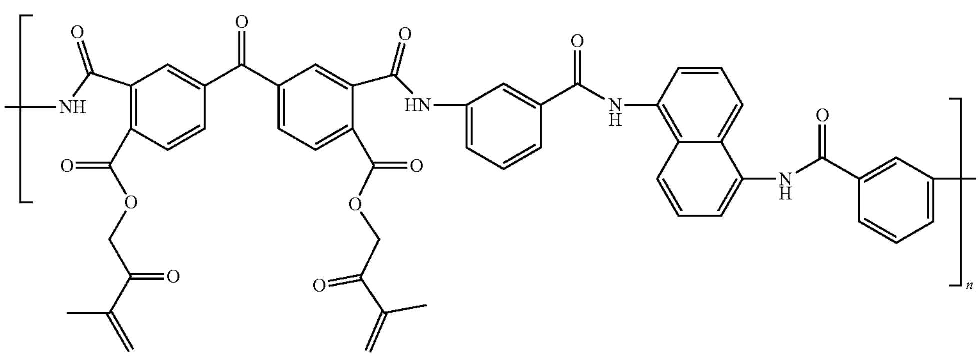
P1-72
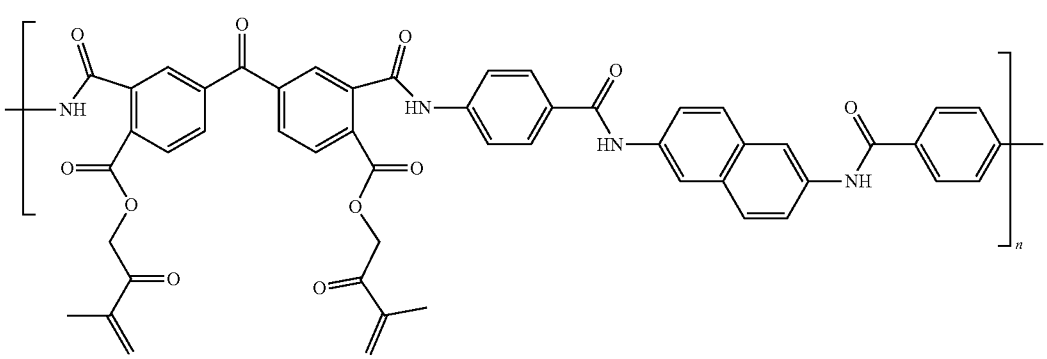
P1-73

-continued
P1-74
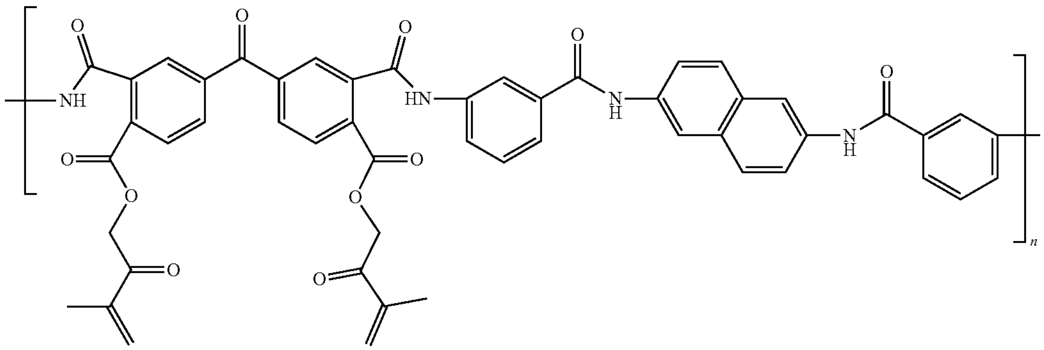
P1-75
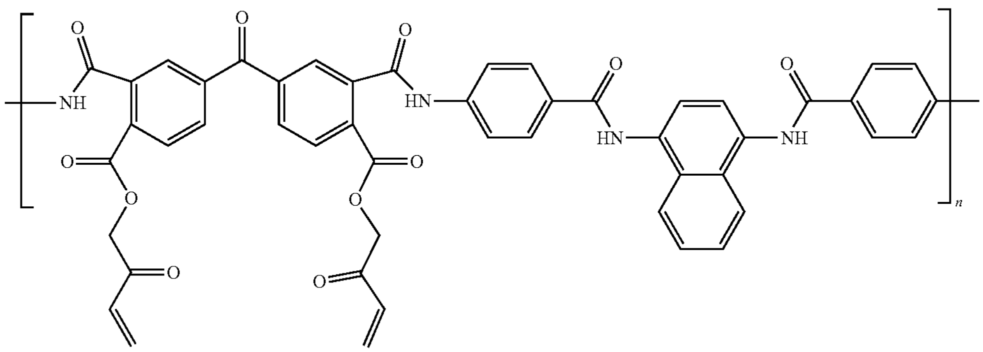
P1-76
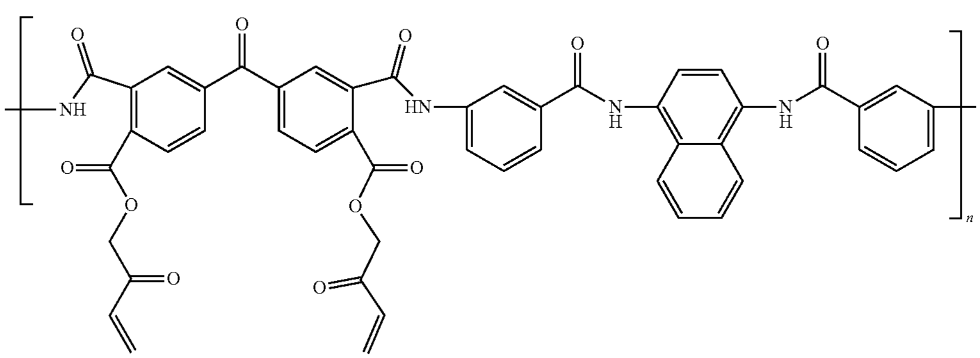
P1-77
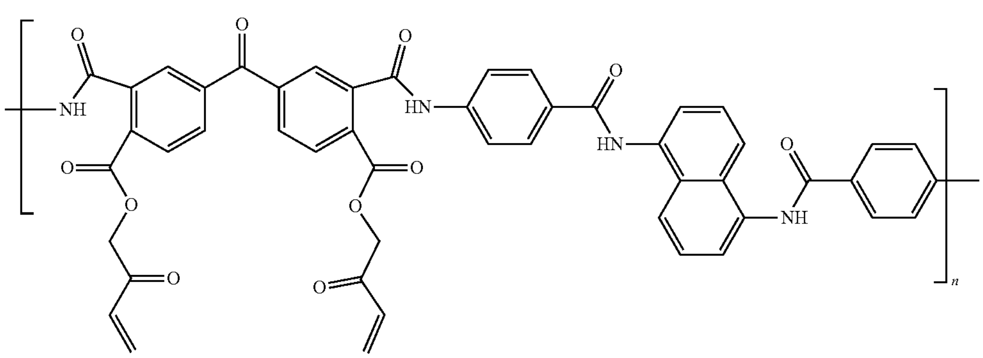

-continued
P1-78
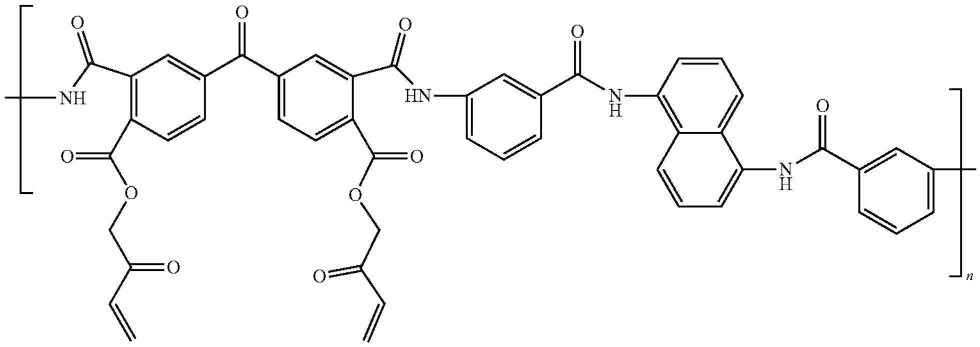
P1-79
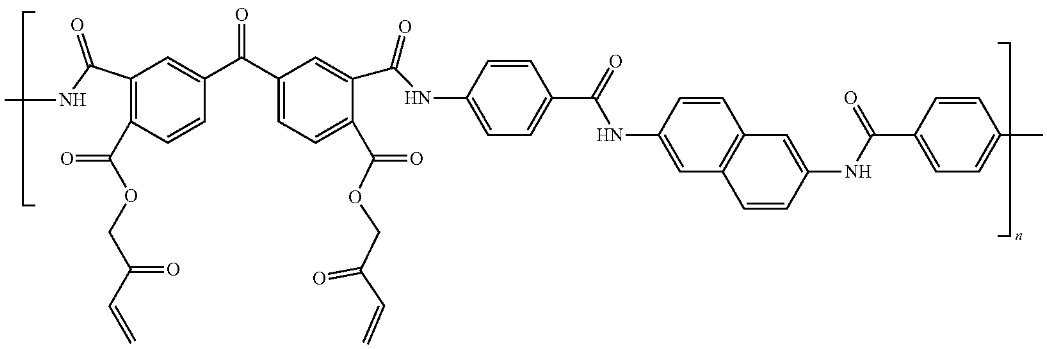
P1-80
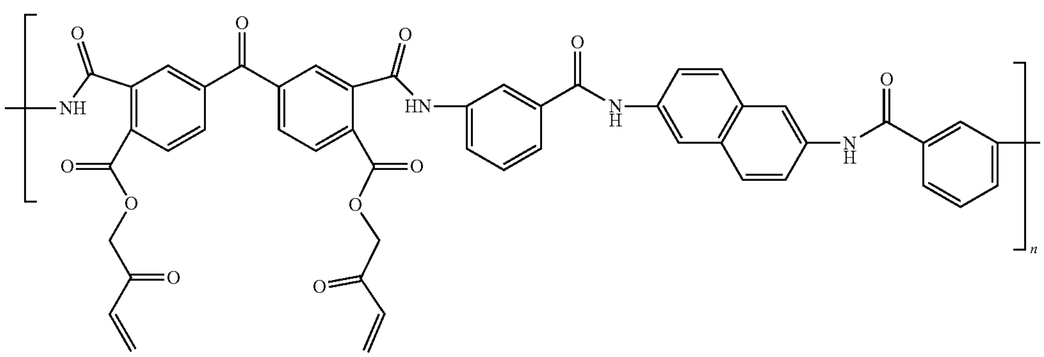
P1-81
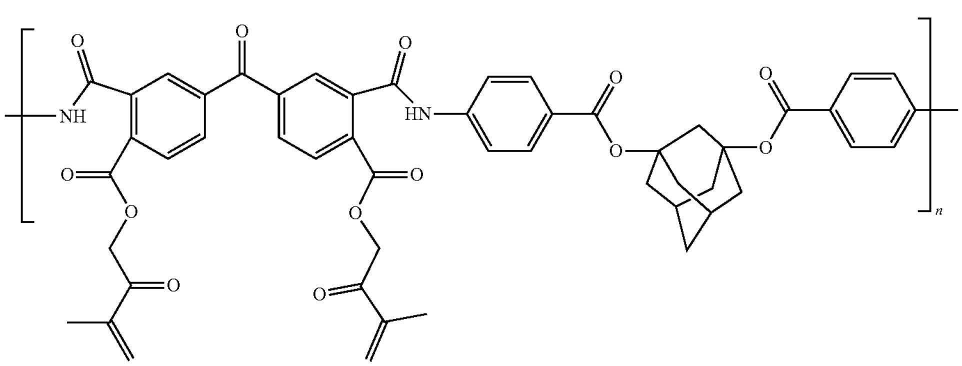

-continued
P1-82
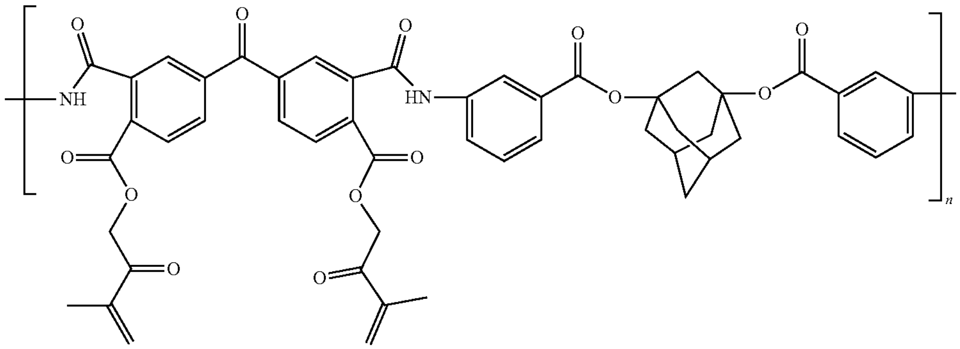
P1-83
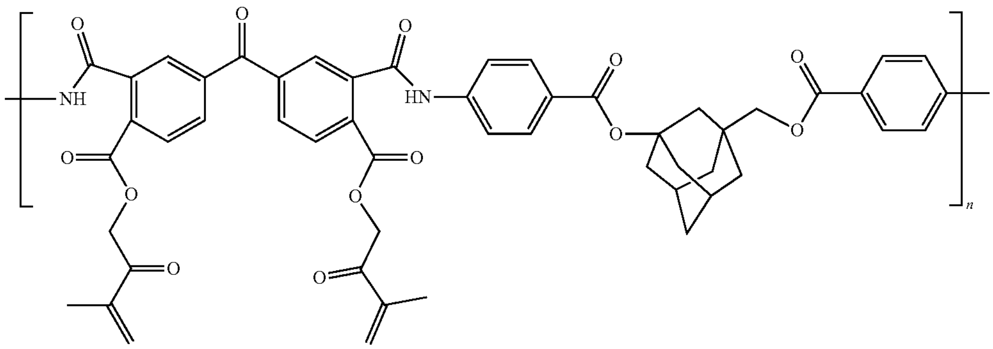
P1-84
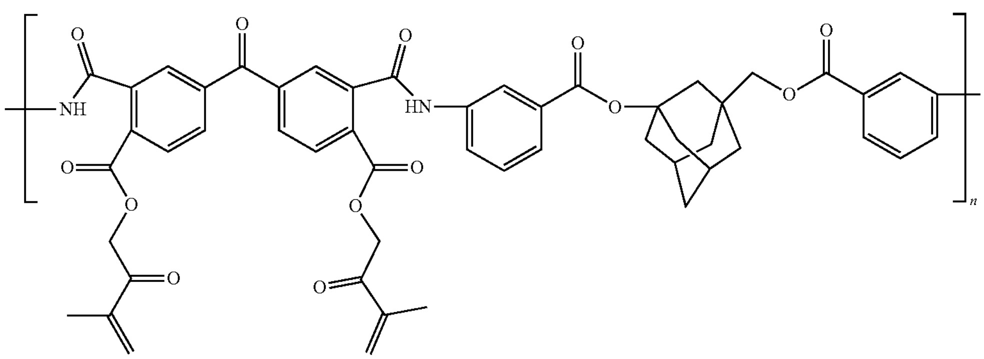
P1-85
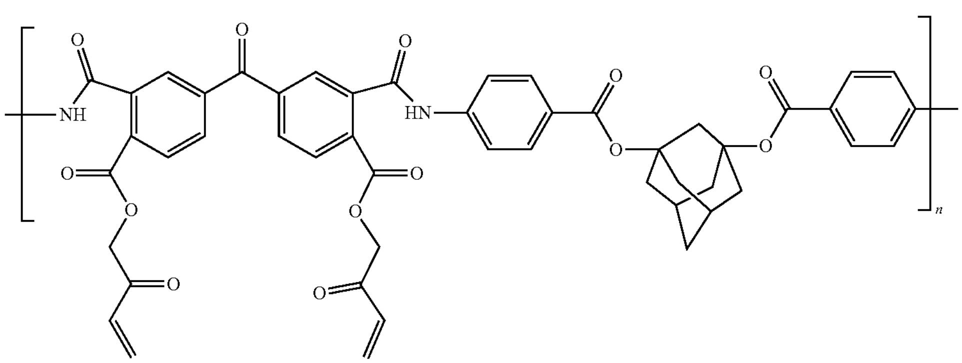

-continued
P1-86
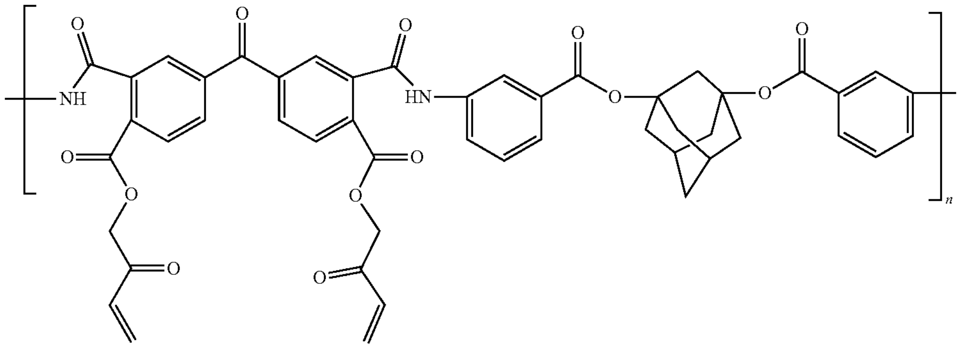
P1-87
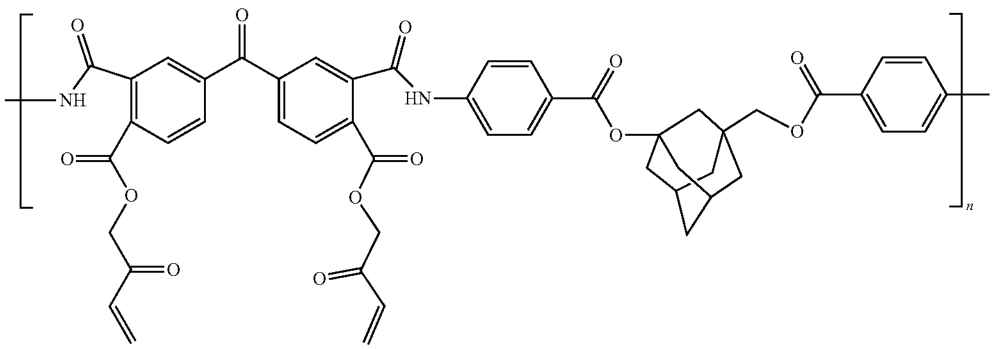
P1-88
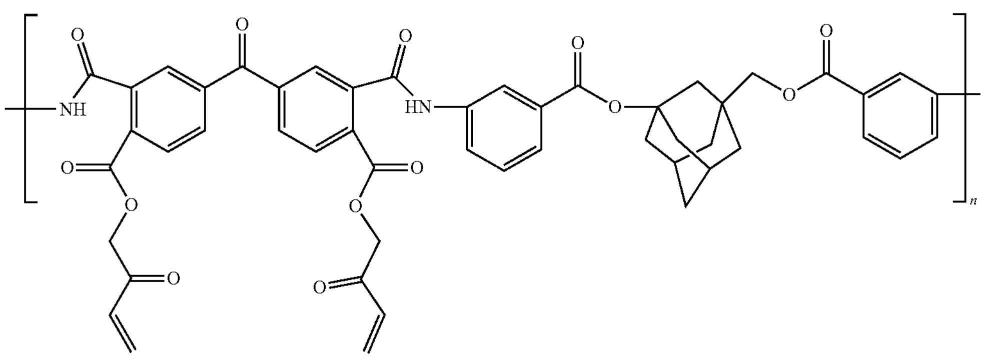
P1-89
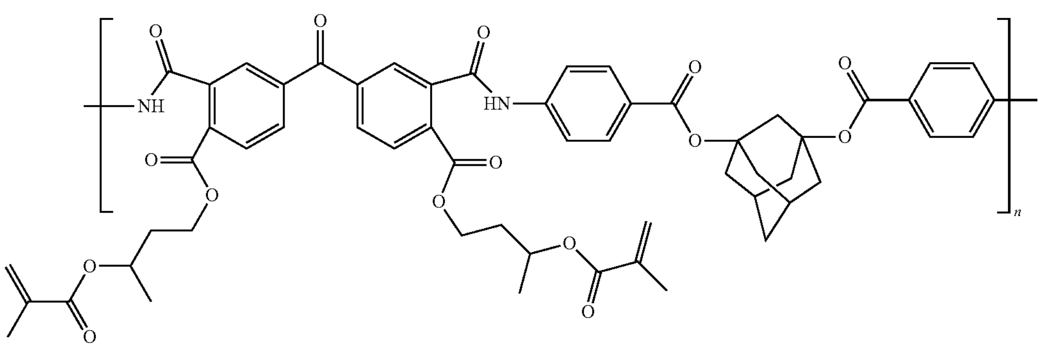

-continued
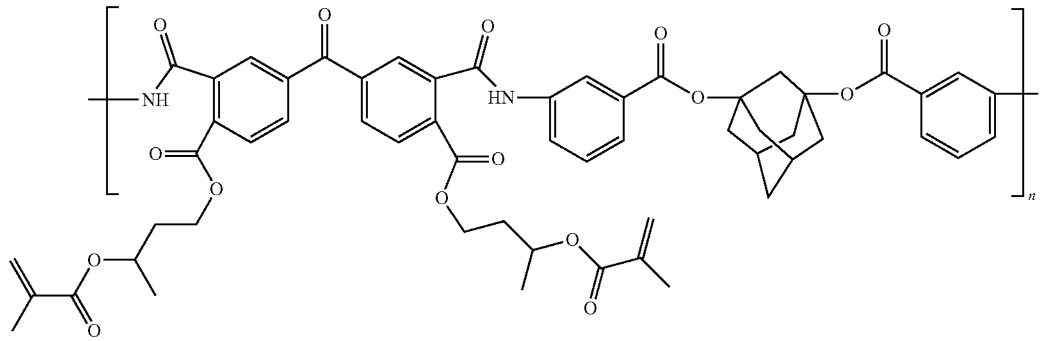
P1-90
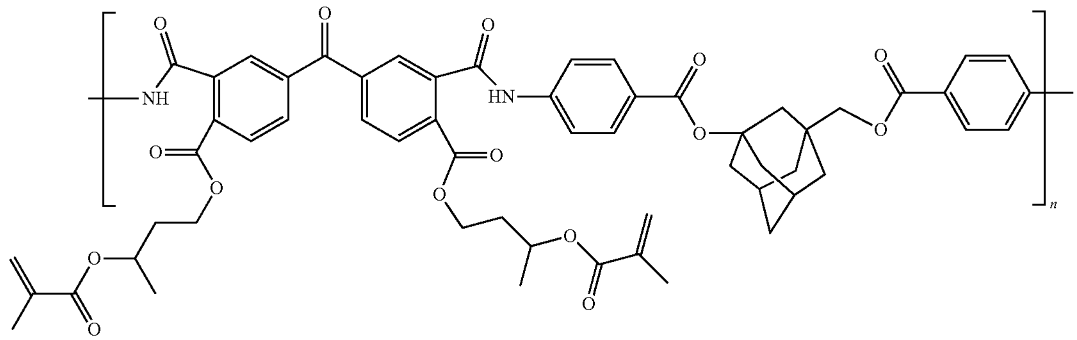
P1-91
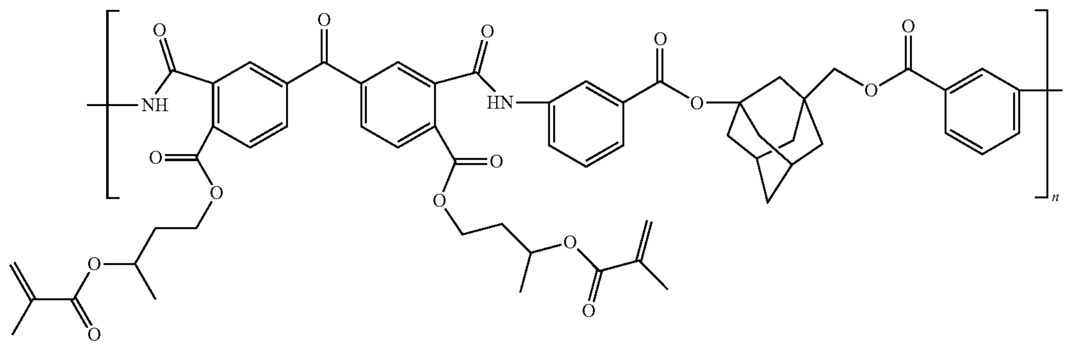
P1-92
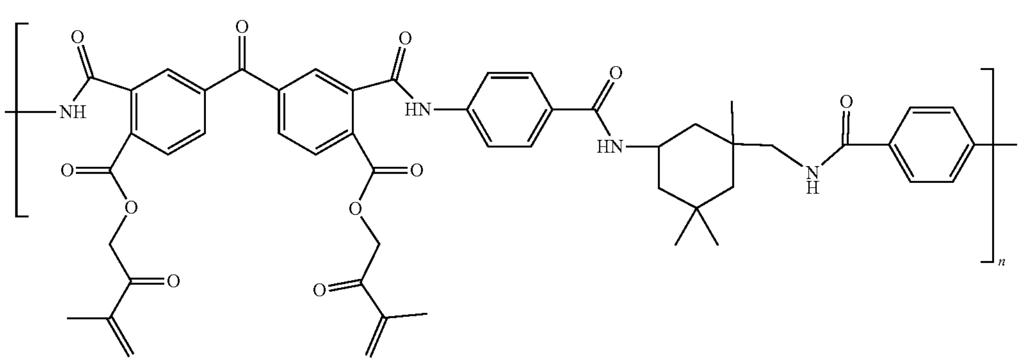
P1-93

-continued
P1-94
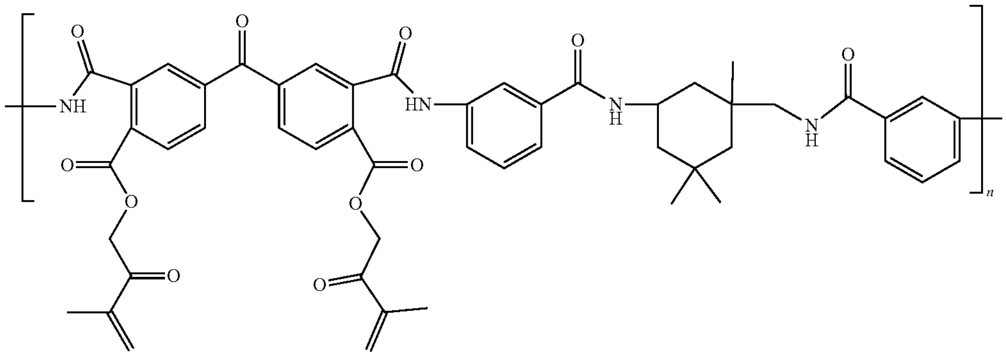
P1-95
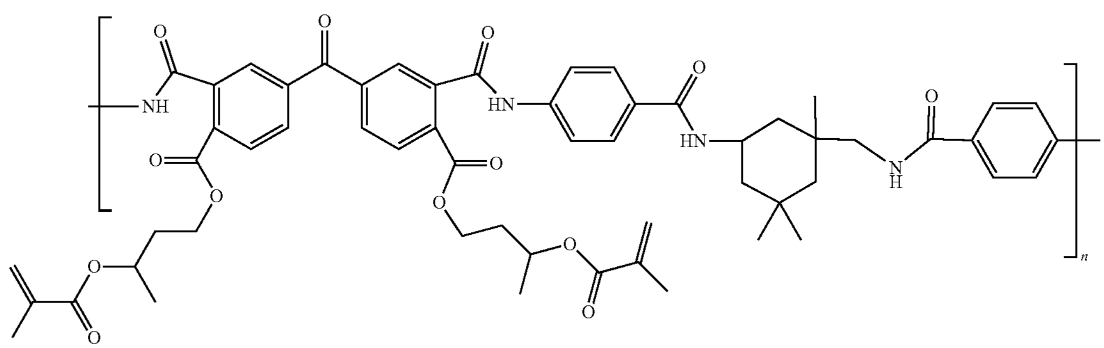
P1-96
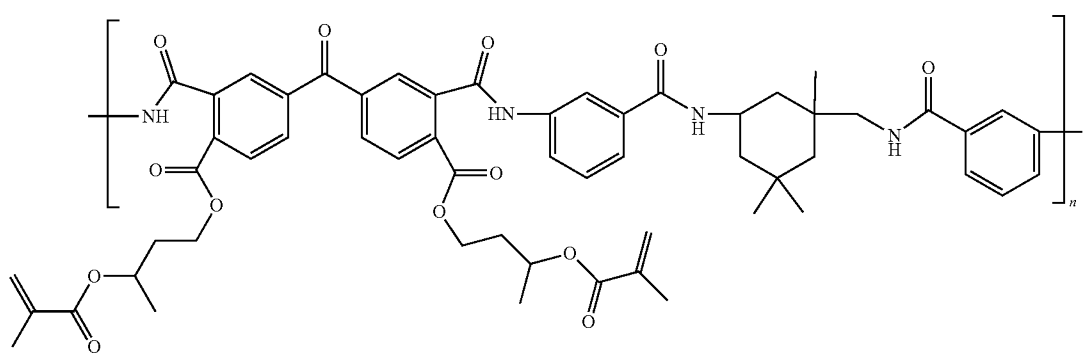
P1-97
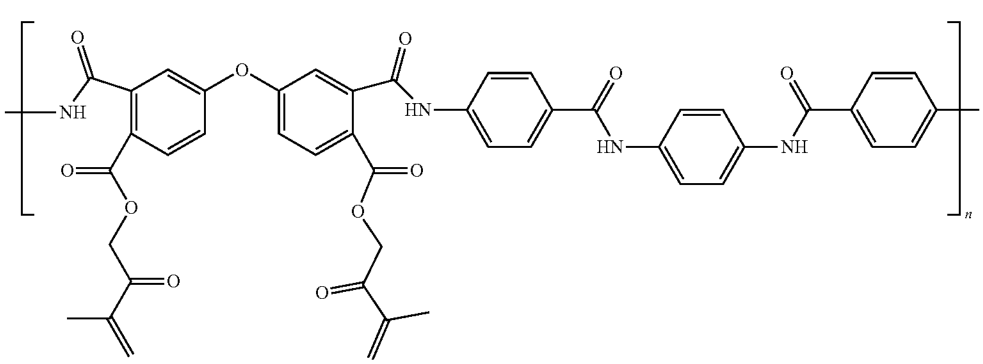

-continued
P1-98
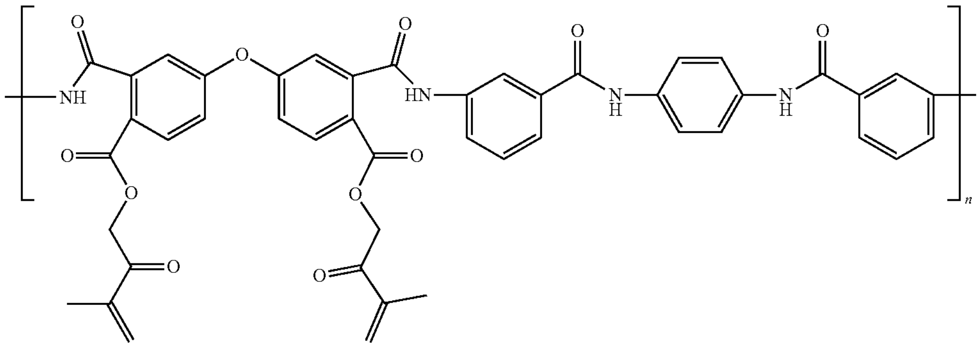
P1-99
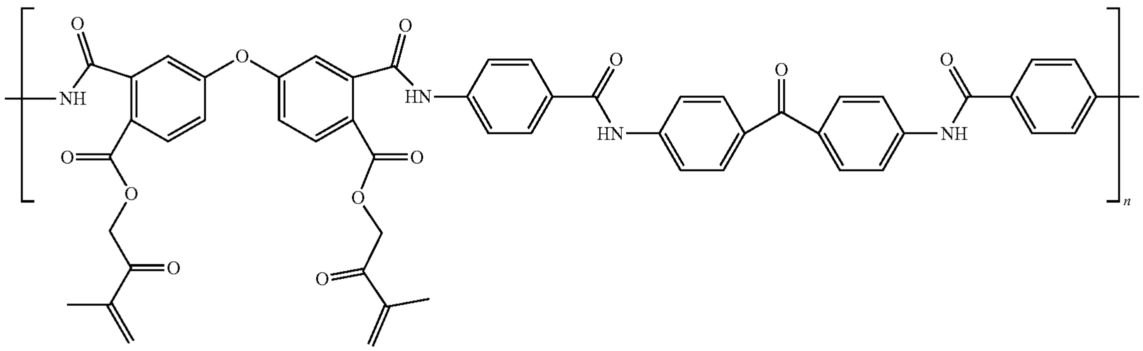
P1-100
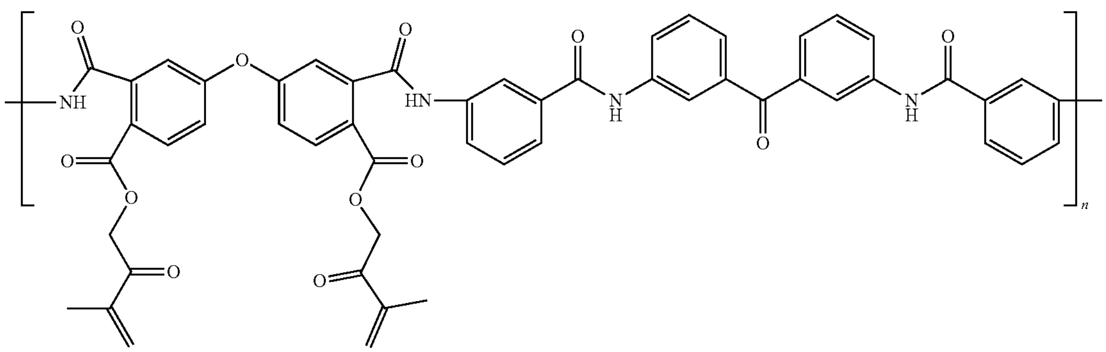
P1-101
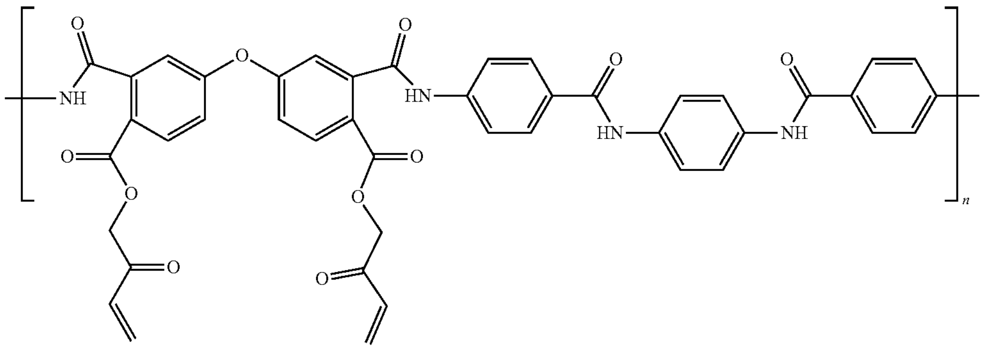

-continued
P1-102
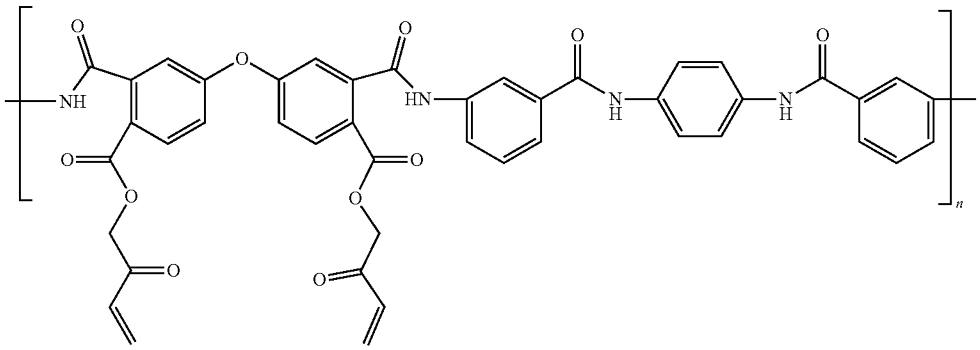
P1-103
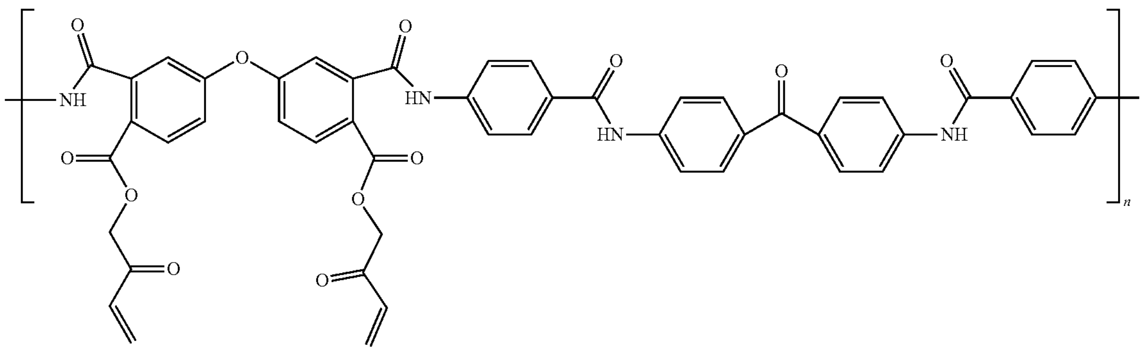
P1-104
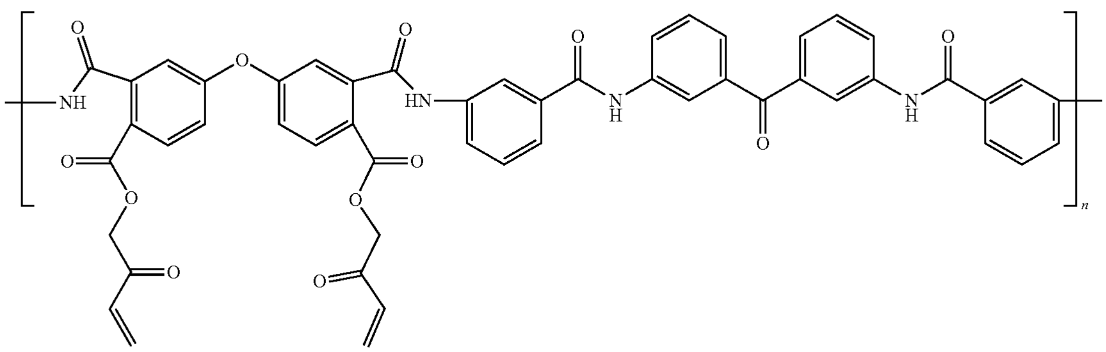
P1-105
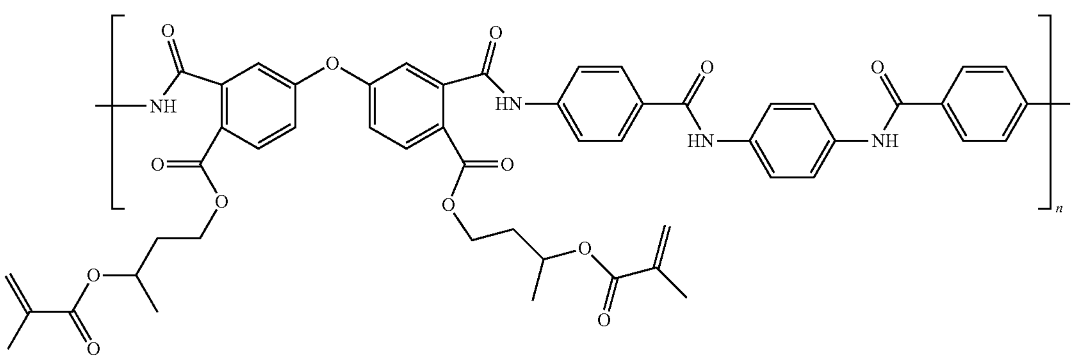

-continued
P1-106
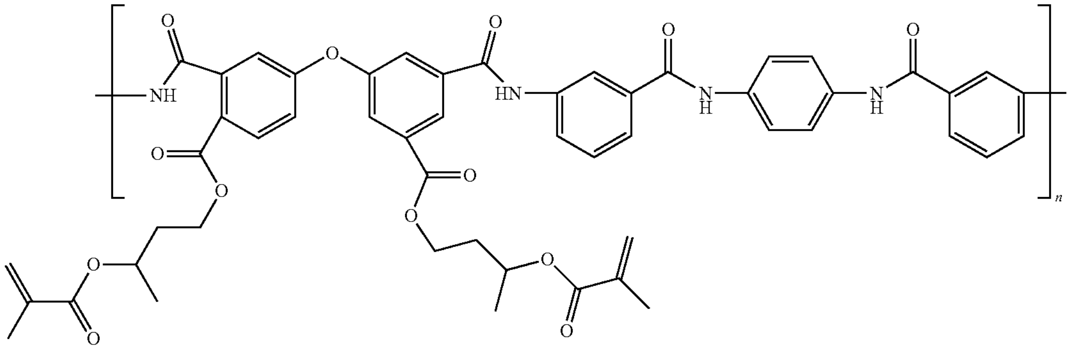
P1-107
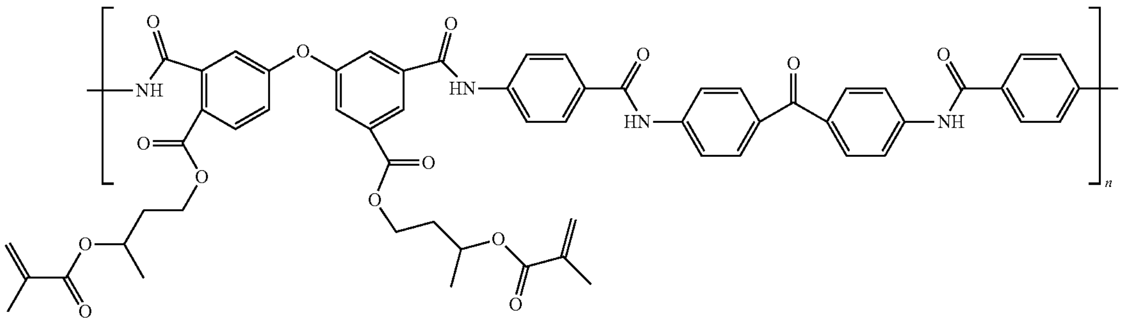
P1-108
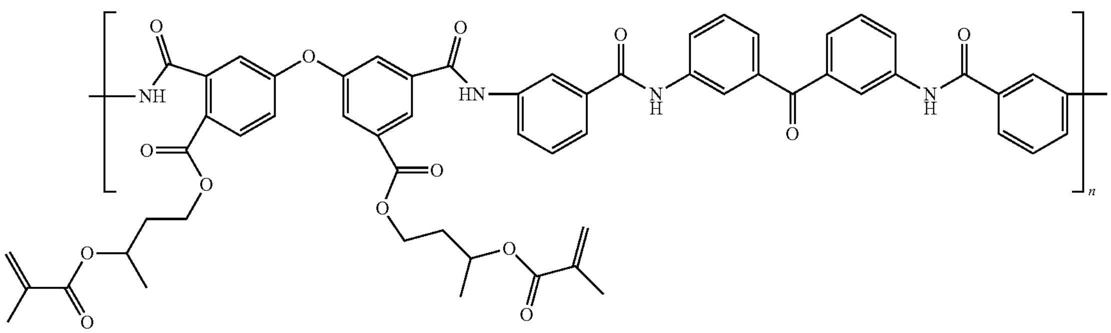
P1-109
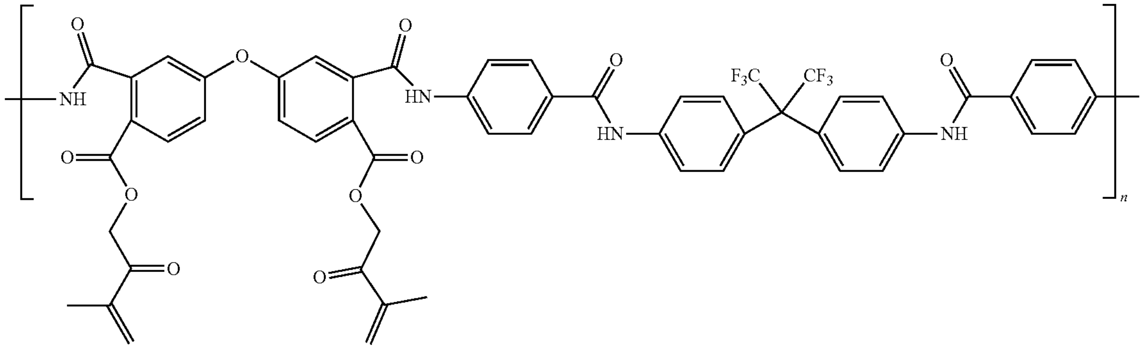

-continued
P1-110
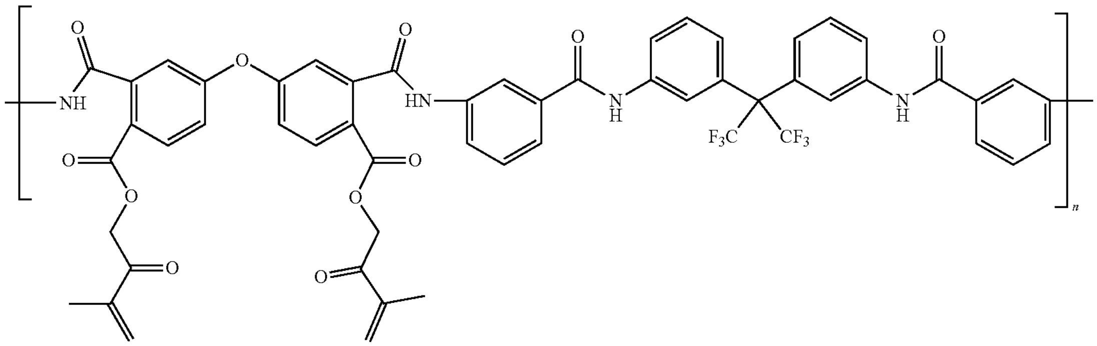
P1-111
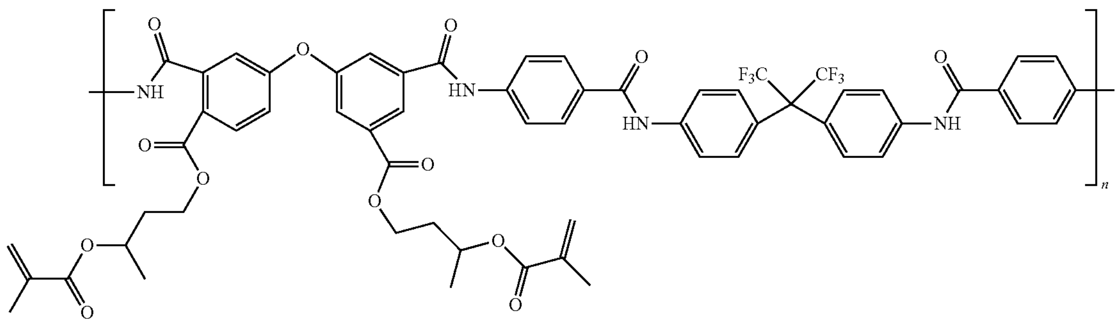
P1-112
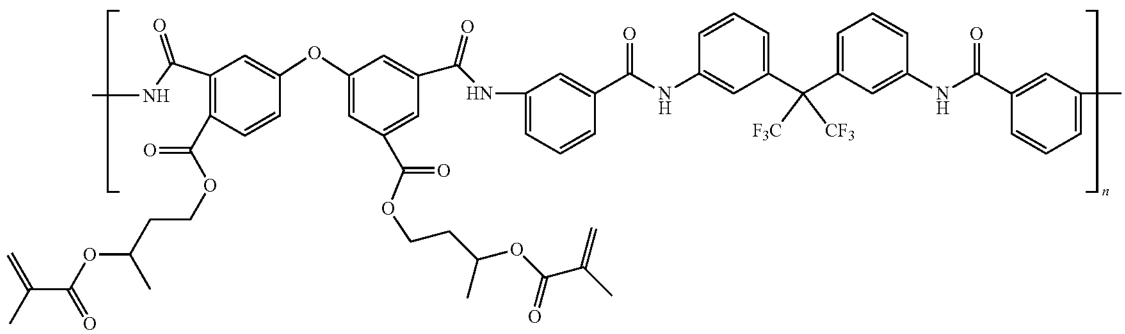
P1-113
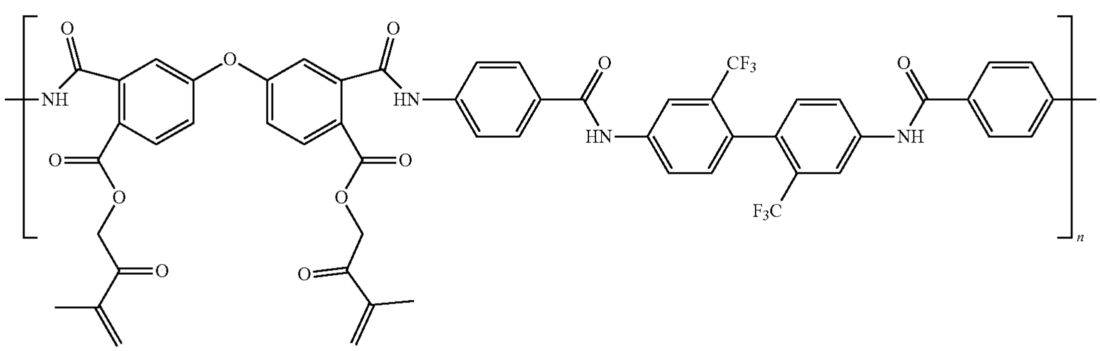

-continued
P1-114
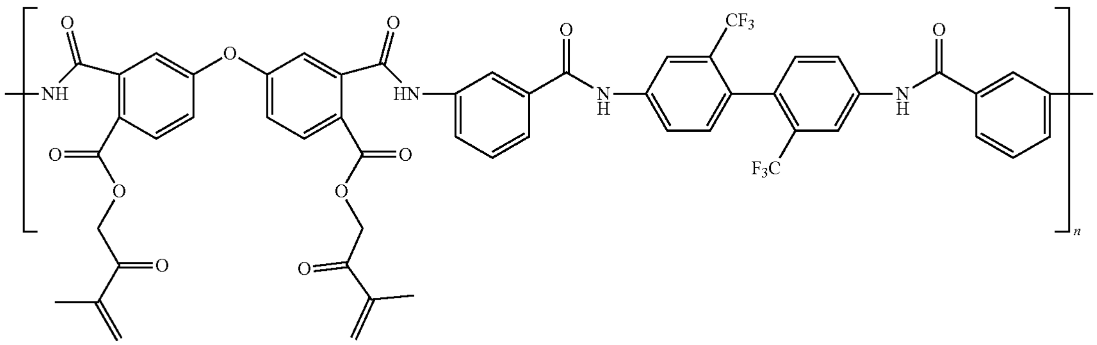
P1-115
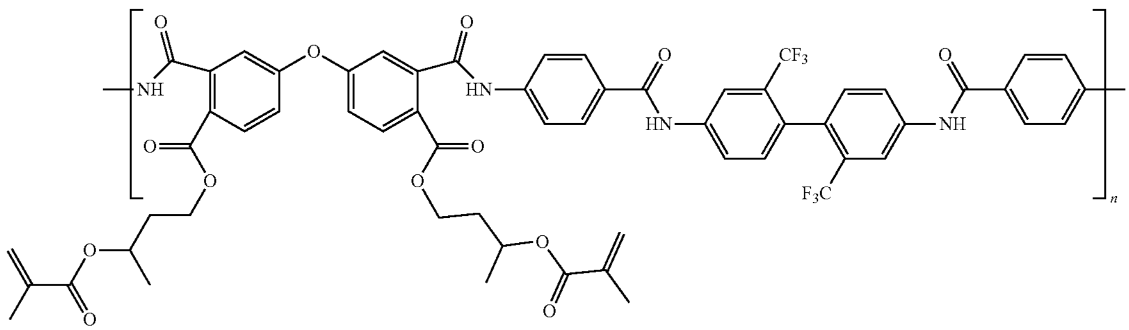
P1-116
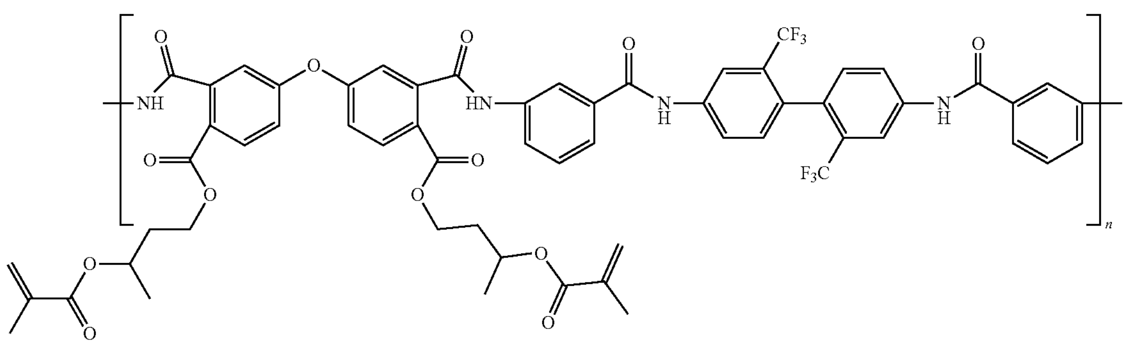
P1-117
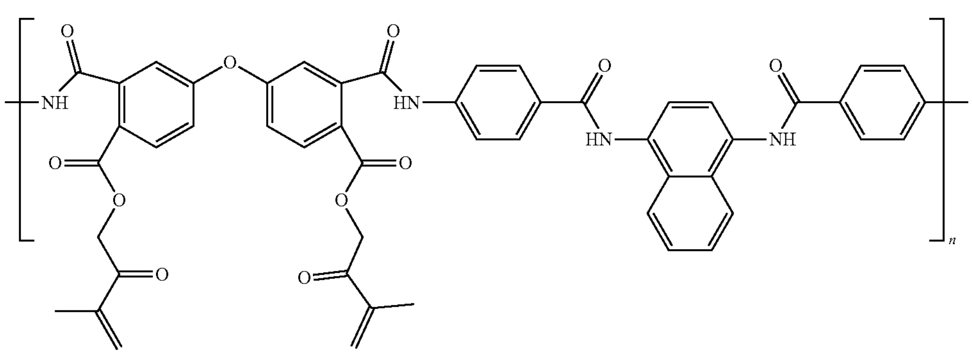

-continued
P1-118
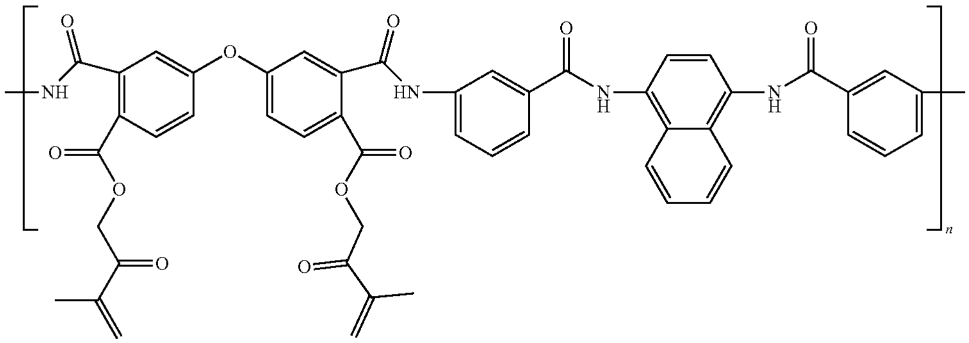
P1-119
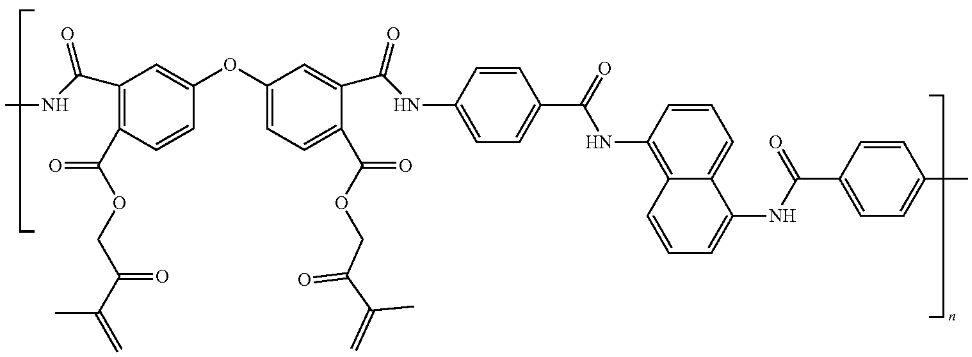
P1-120
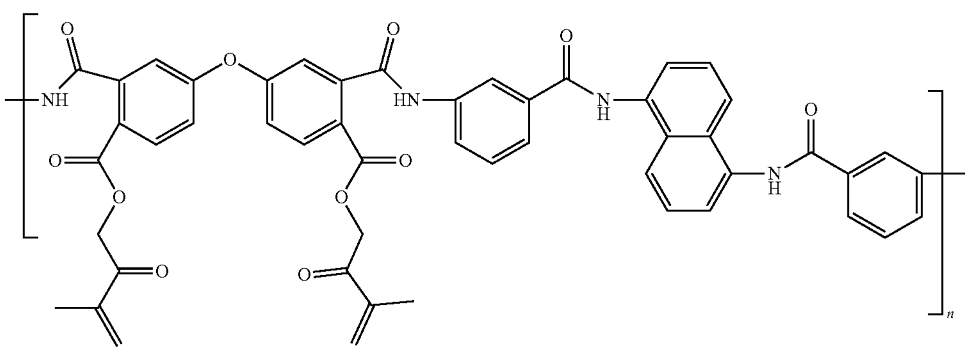
P1-121
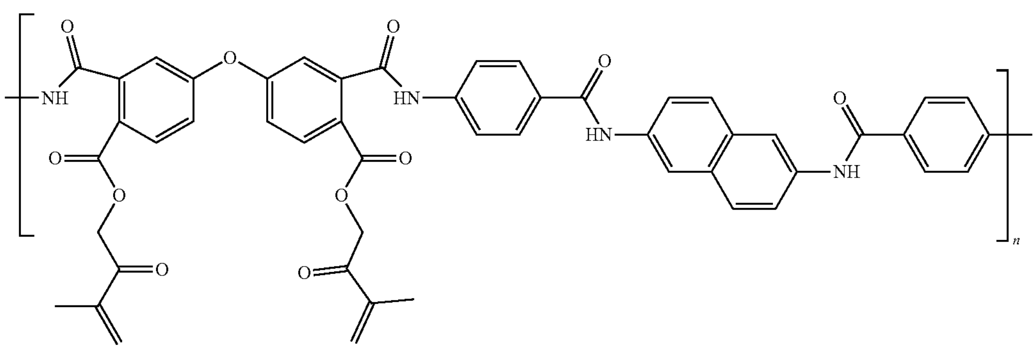

-continued
P1-122
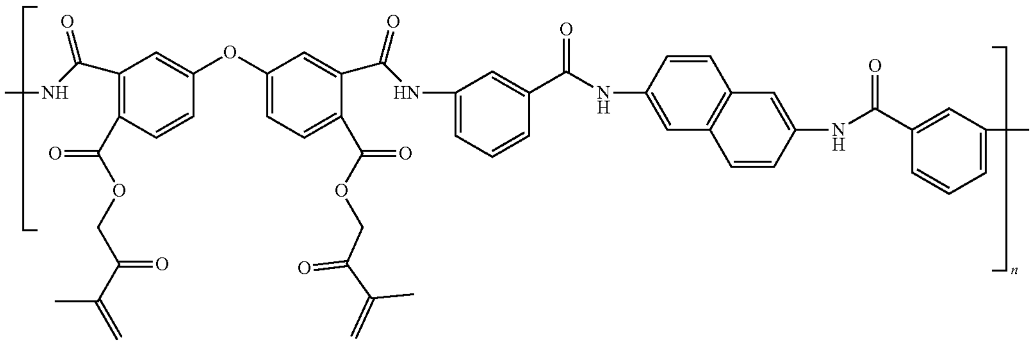
P1-123
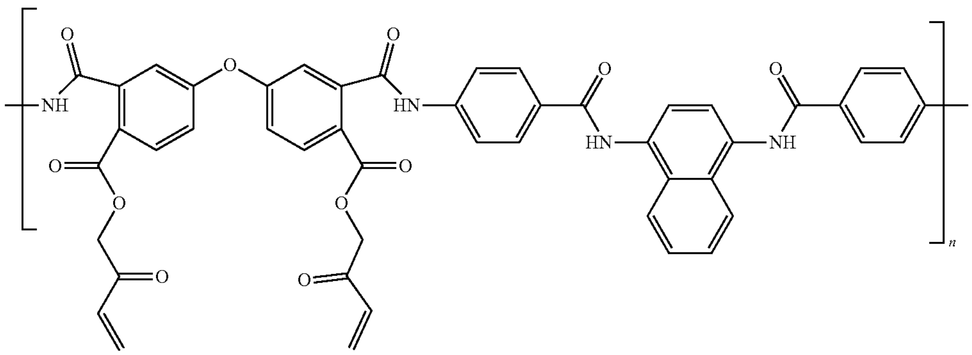
P1-124
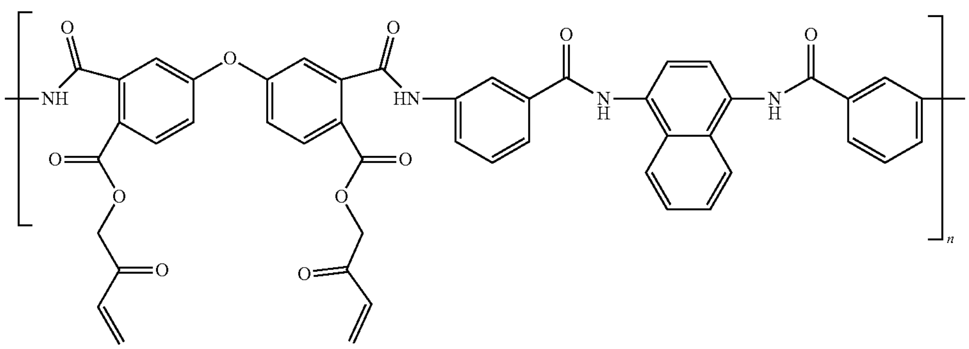
P1-125
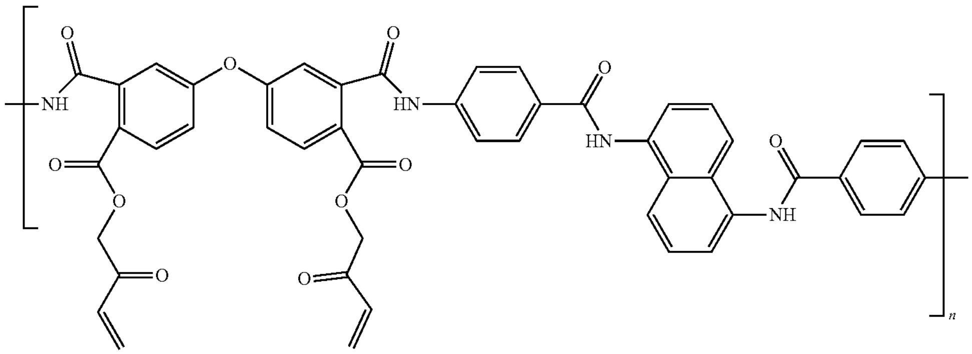

-continued
P1-126
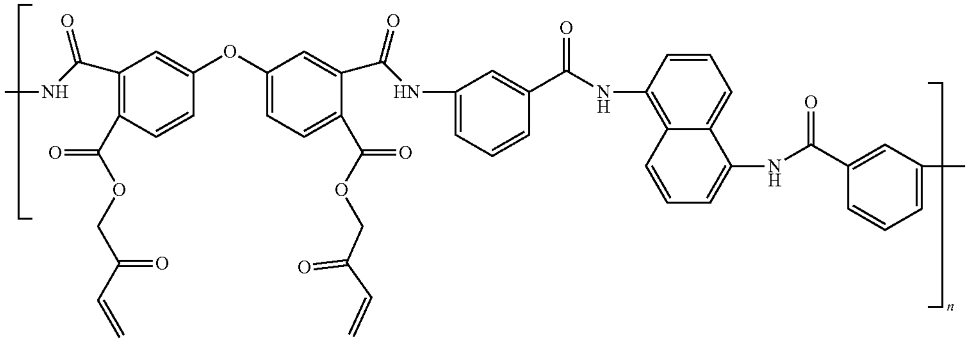
P1-127
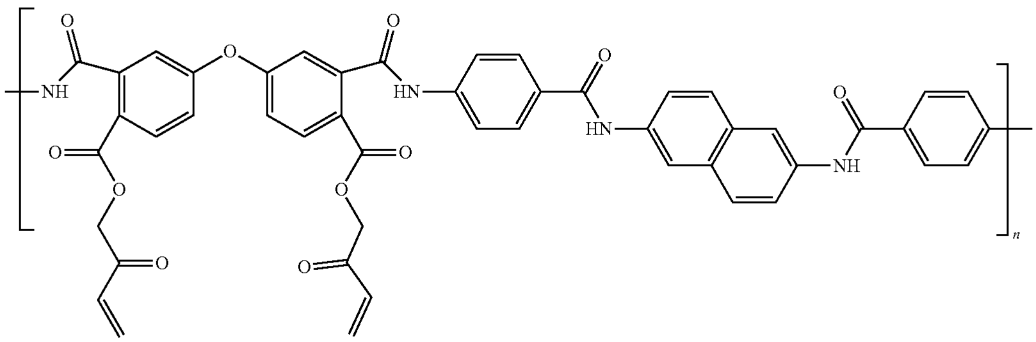
P1-128
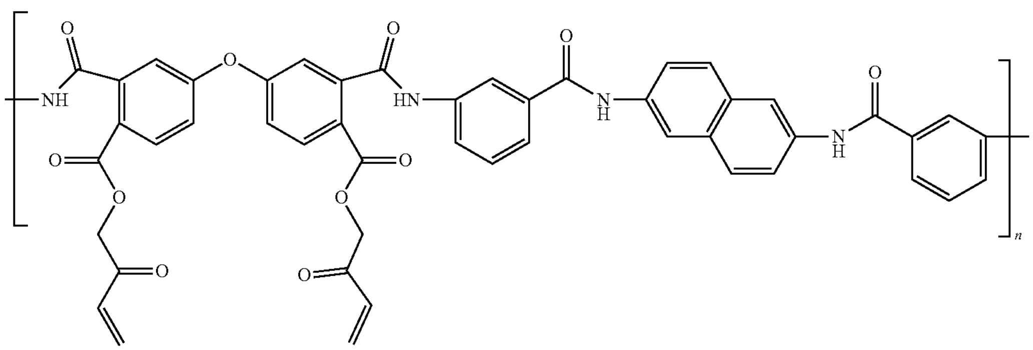
P1-129
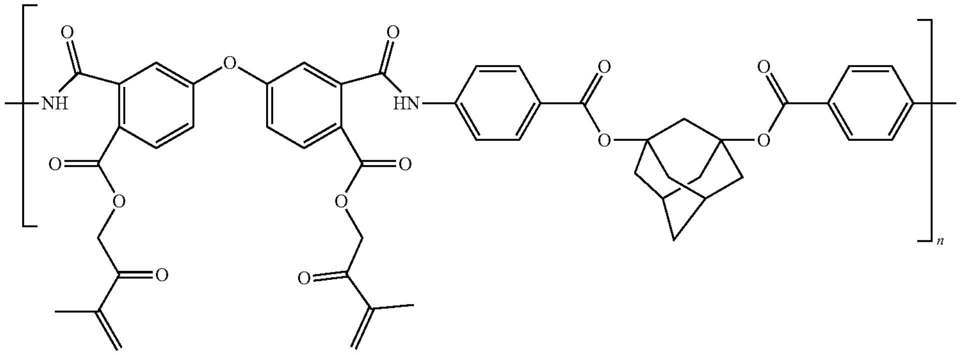

-continued
P1-130
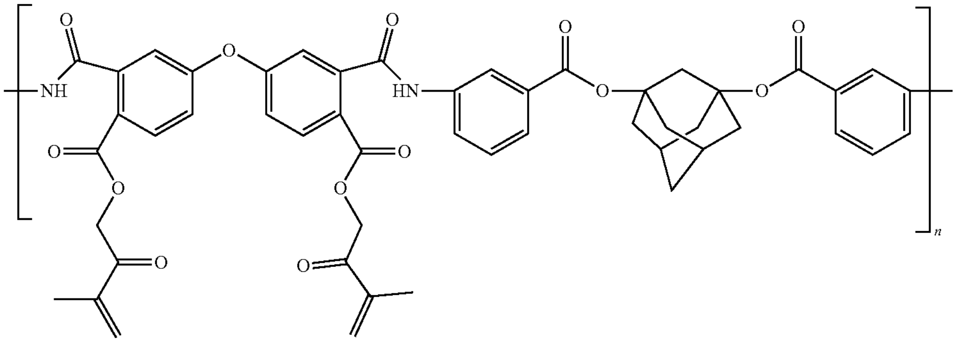
P1-131
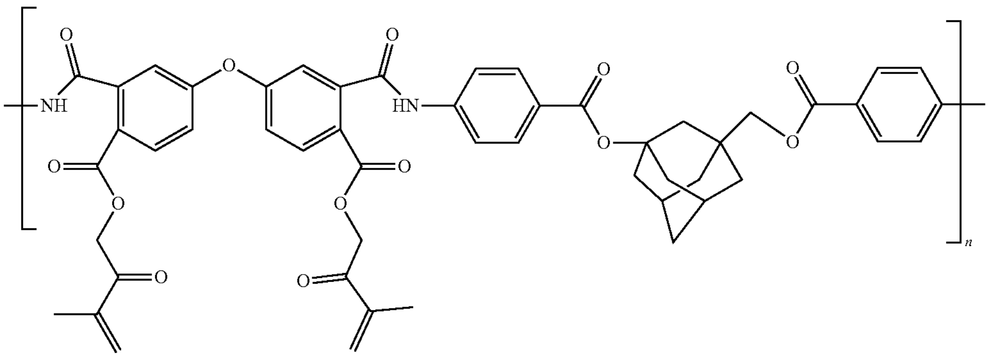
P1-132
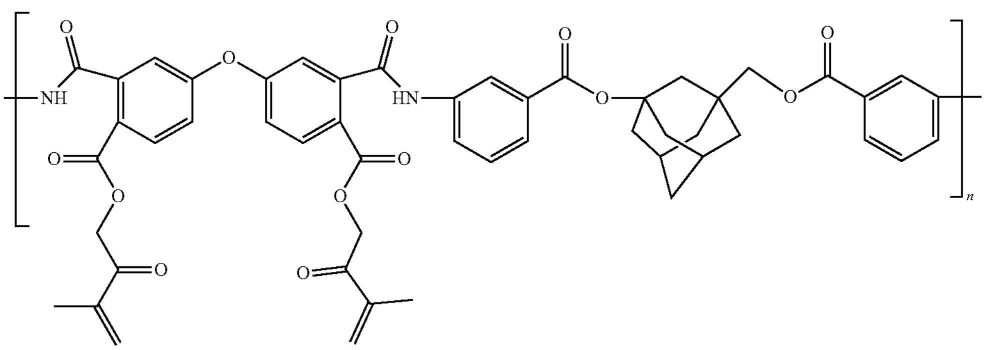
P1-133
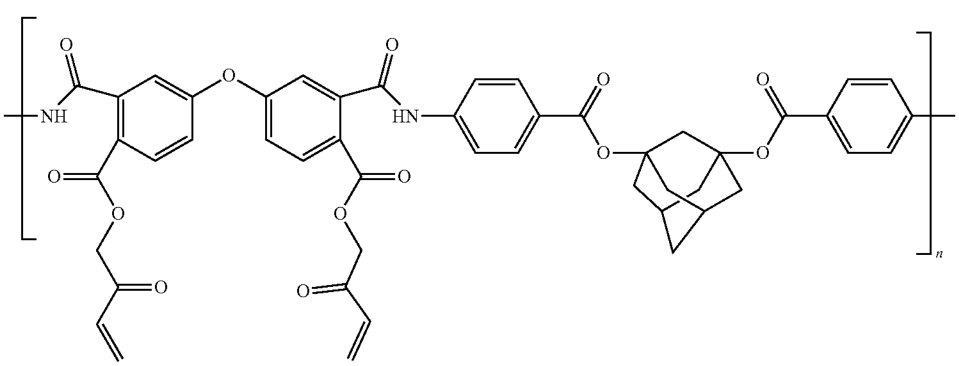

-continued
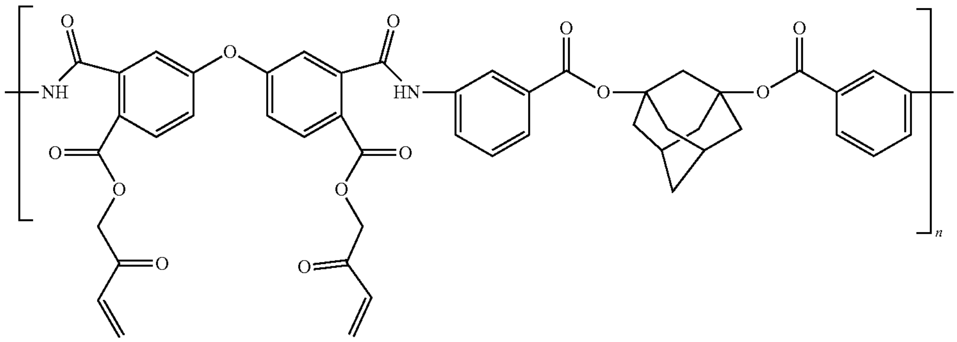
P1-134
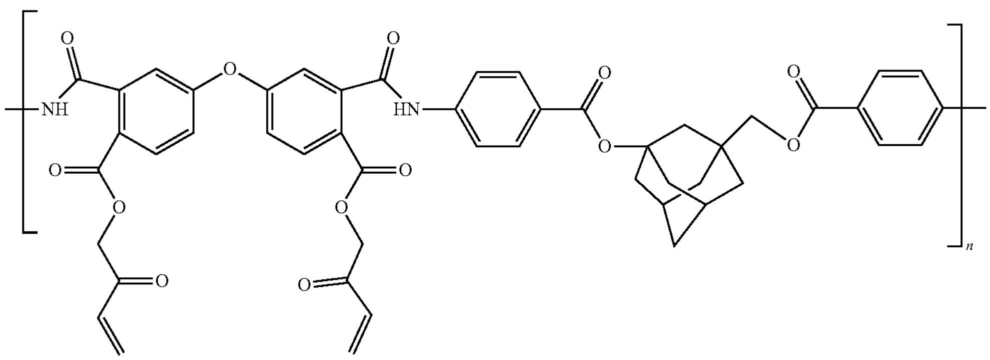
P1-135
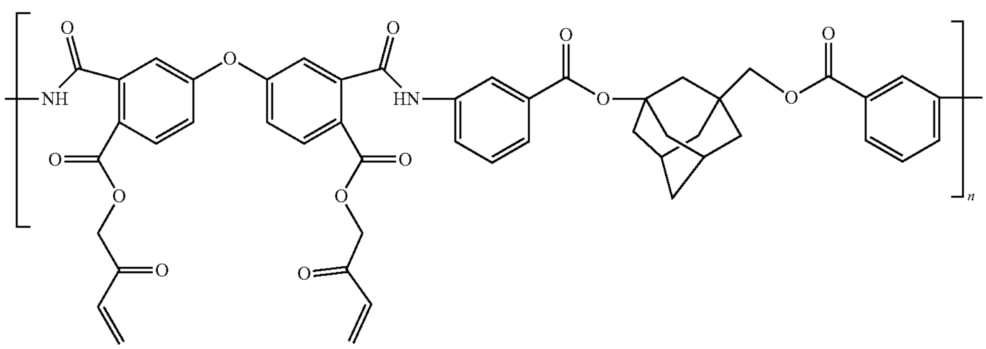
P1-136
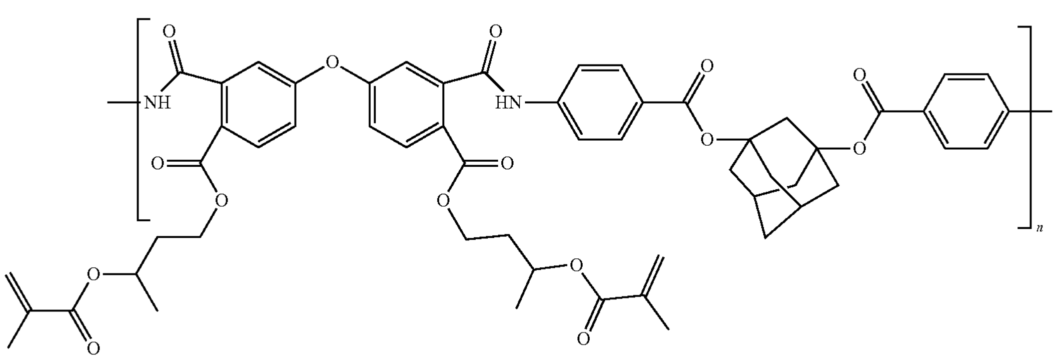
P1-137

-continued
P1-138
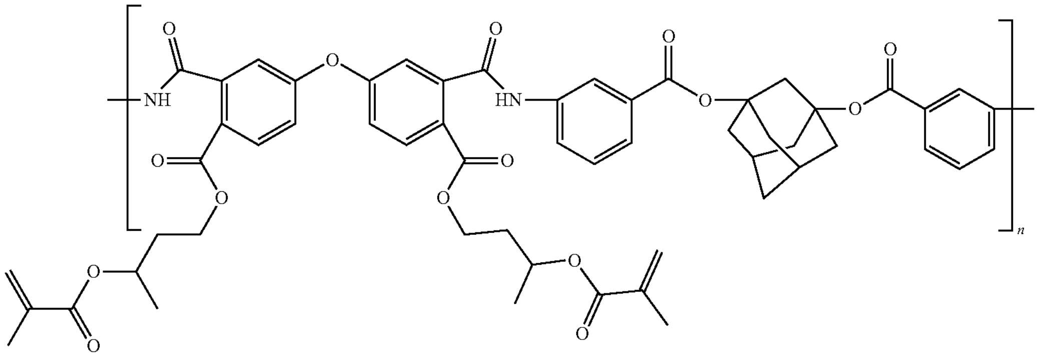
P1-139
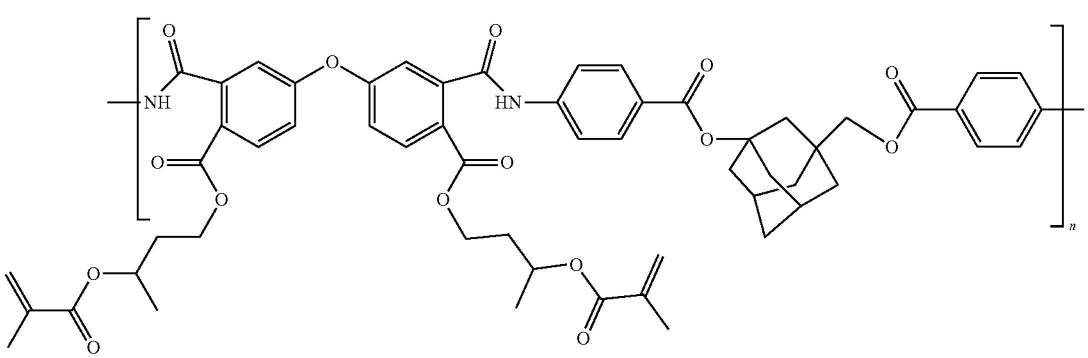
P1-140
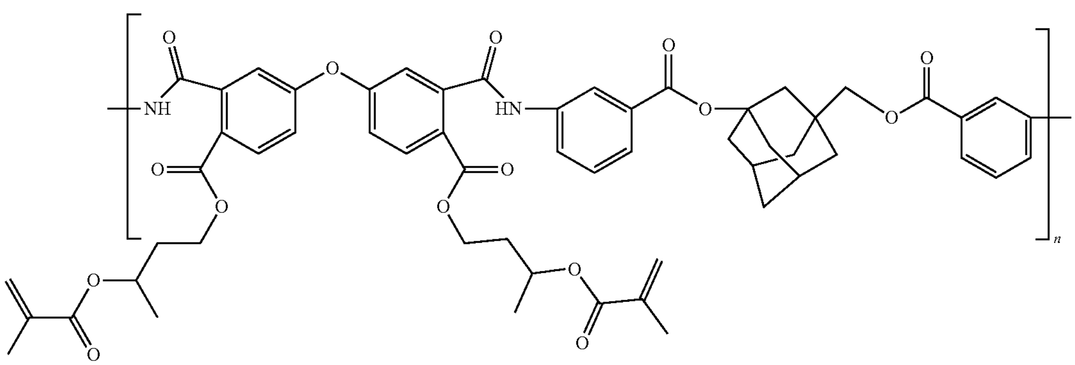
P1-141
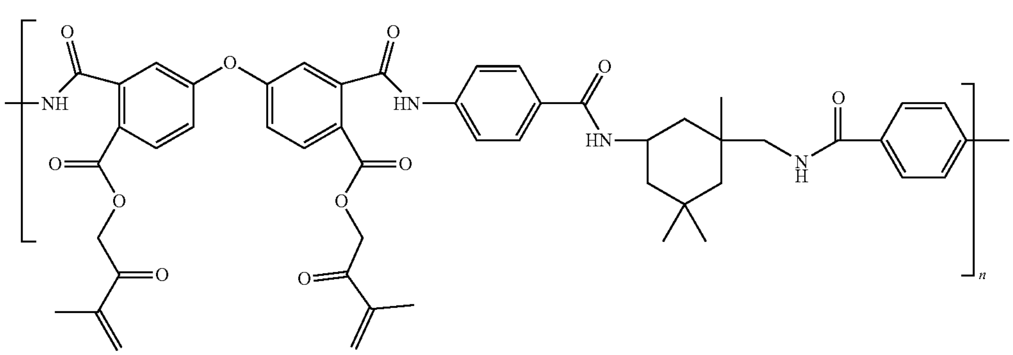

-continued
P1-142
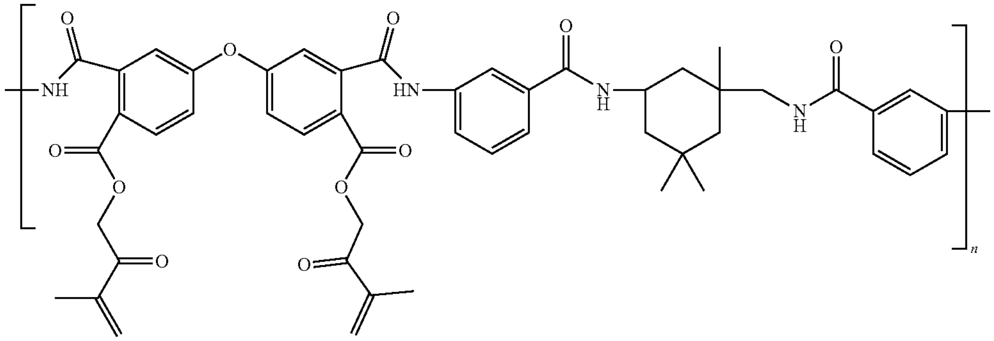
P1-143
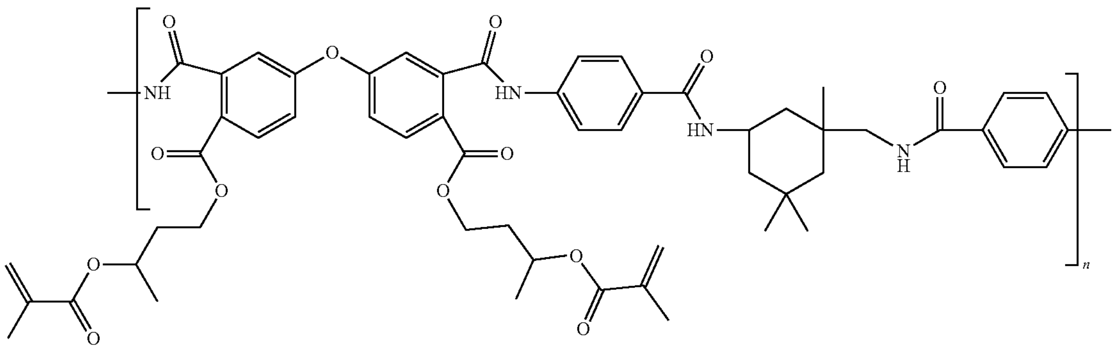
P1-144
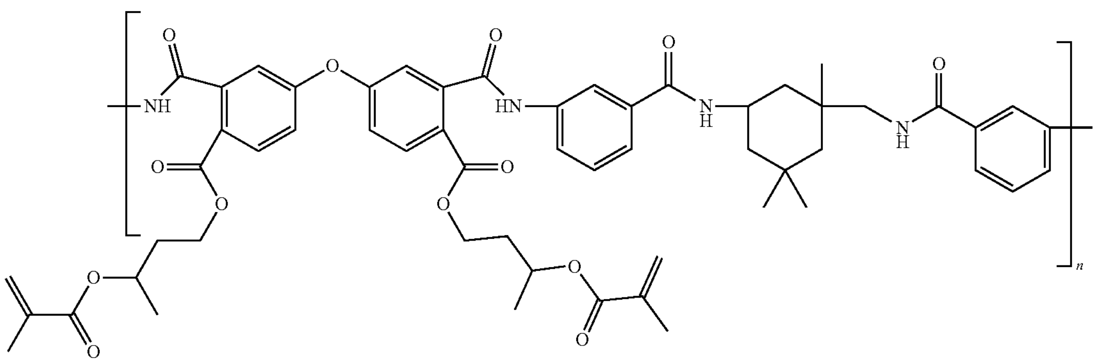
P1-145
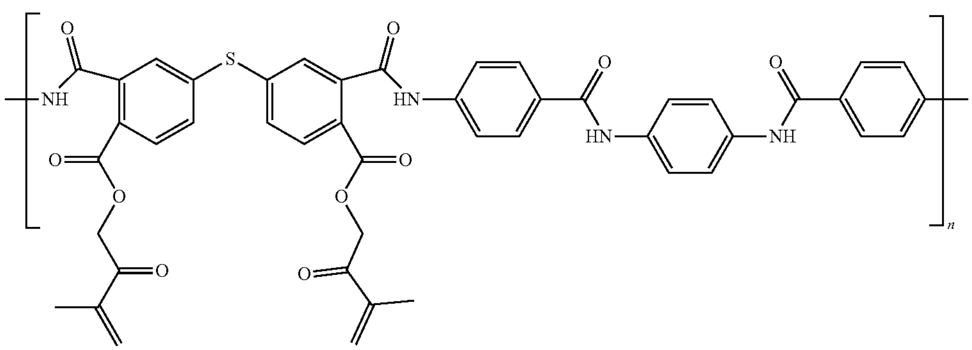

-continued
P1-146
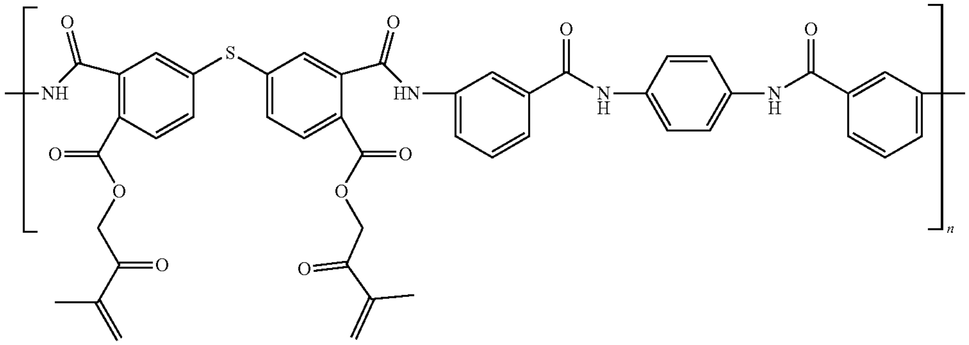
P1-147
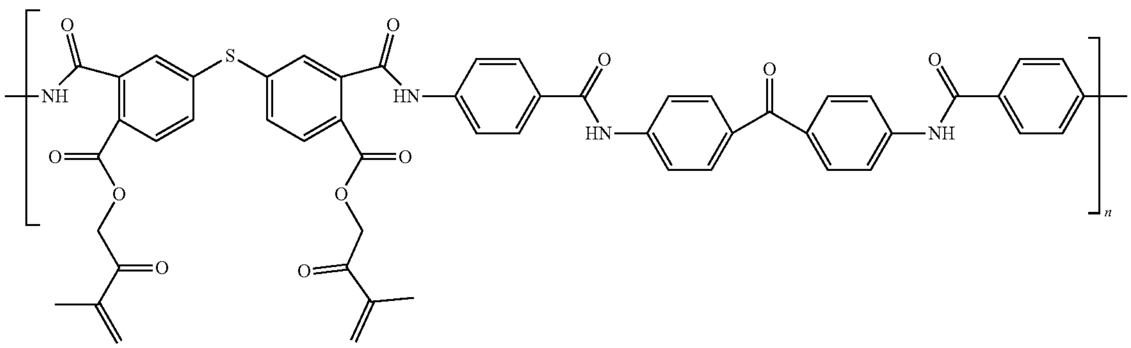
P1-148
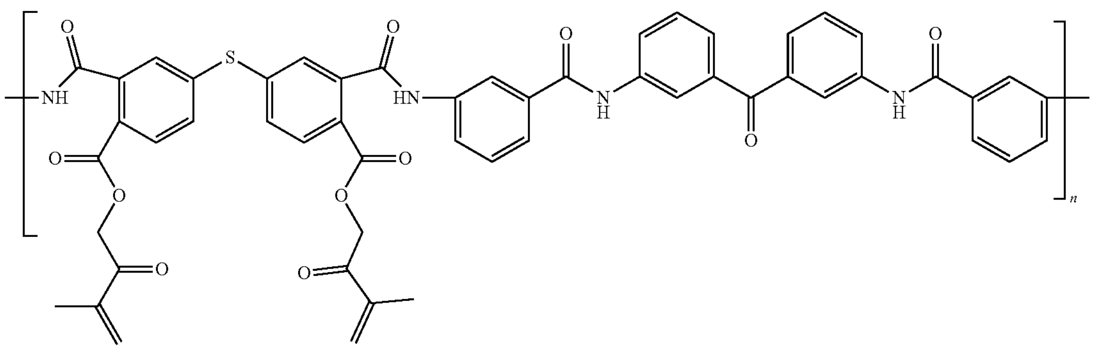
P1-149
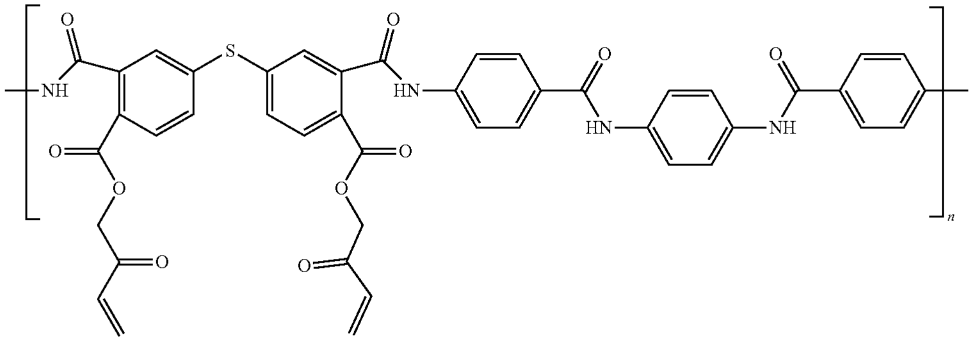

-continued
P1-150
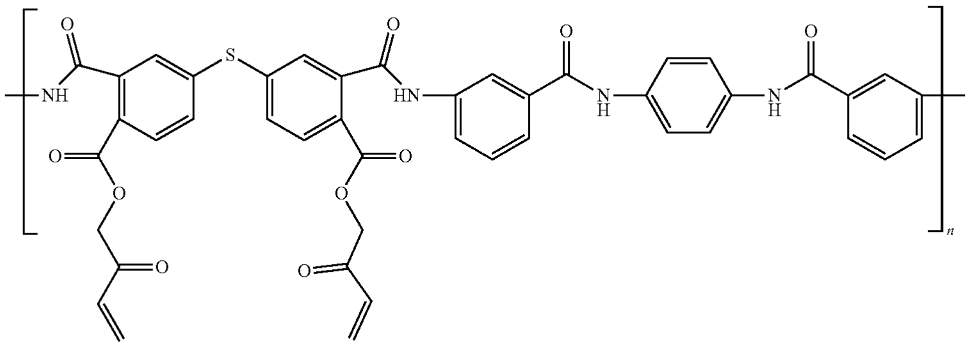
P1-151
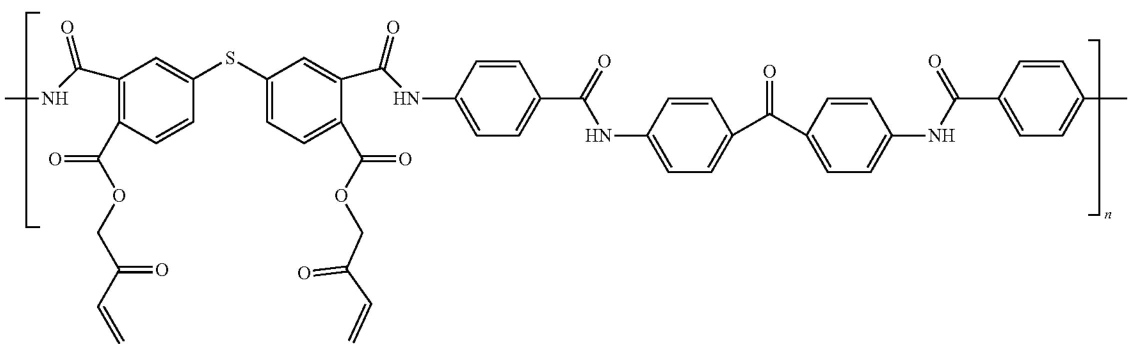
P1-152
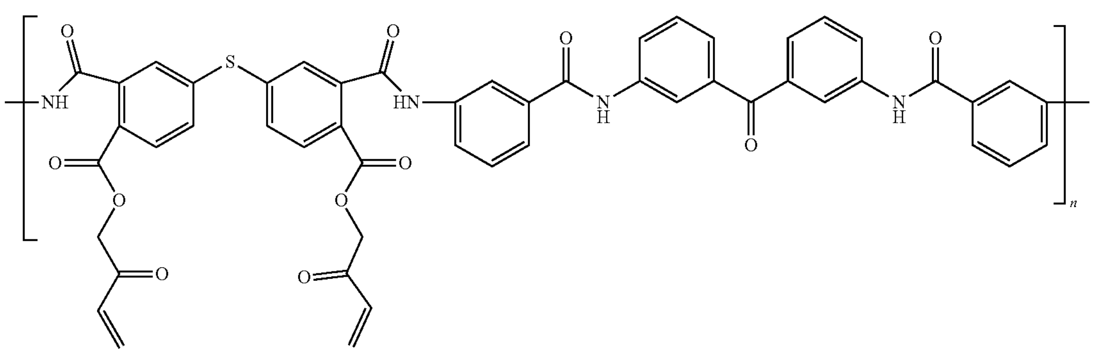
P1-153
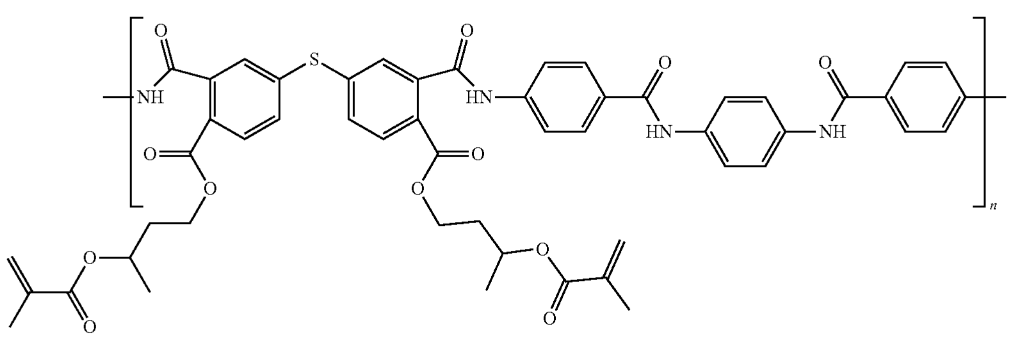

-continued
P1-154
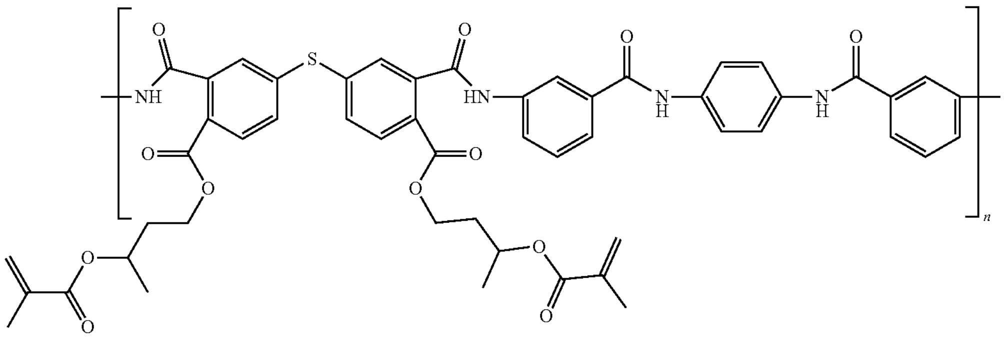
P1-155
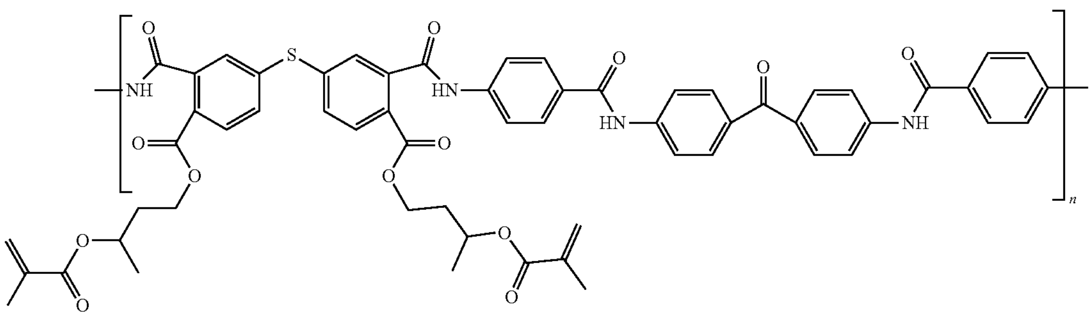
P1-156
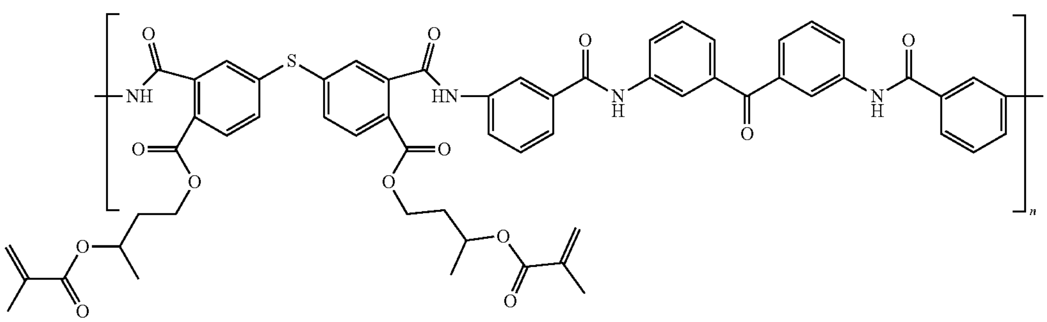
P1-157
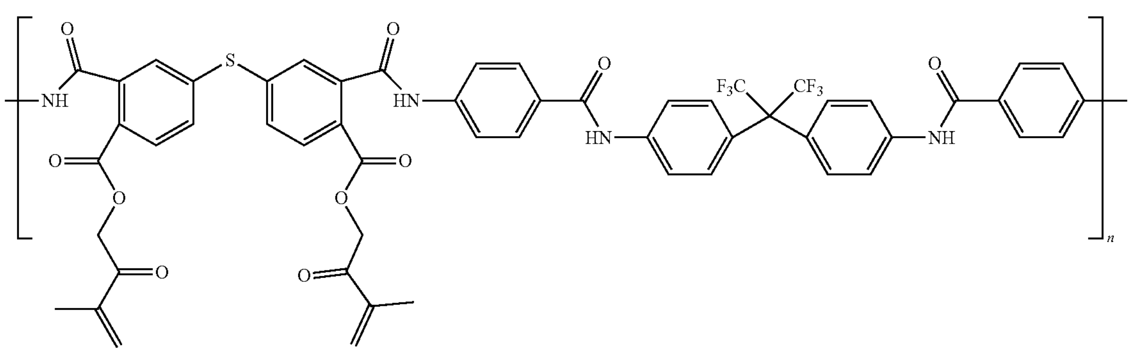

-continued
P1-158
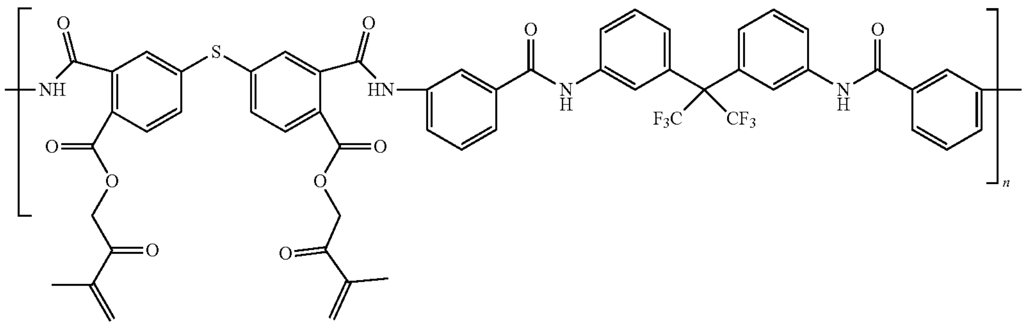
P1-159
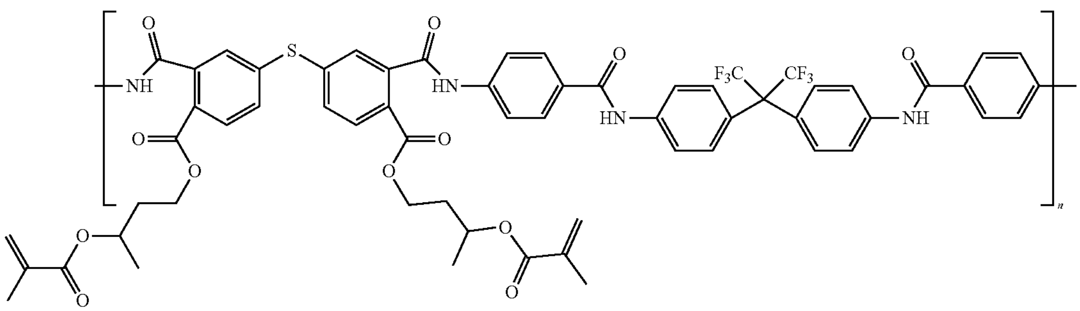
P1-160
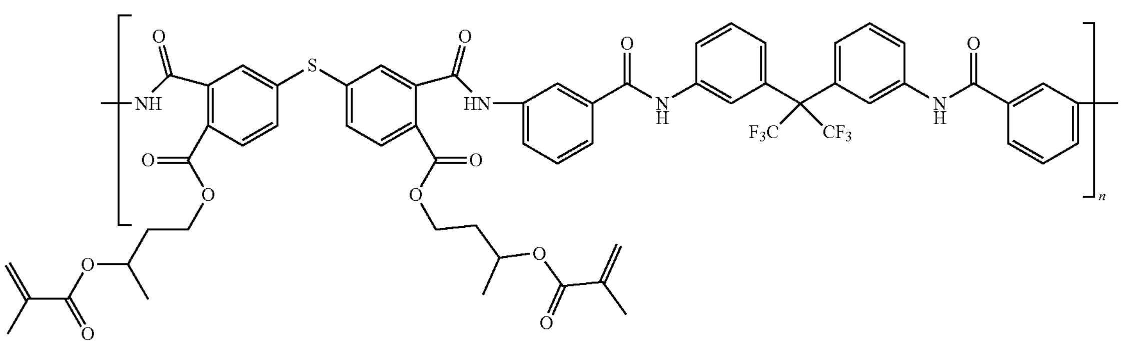
P1-161
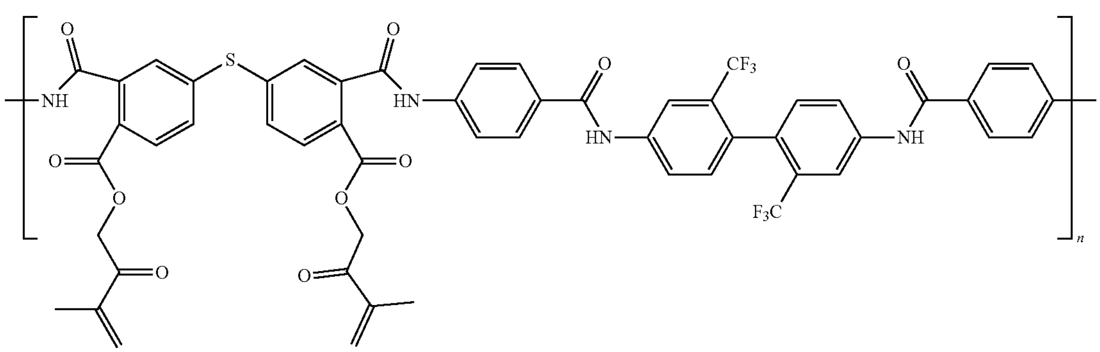

-continued
P1-162
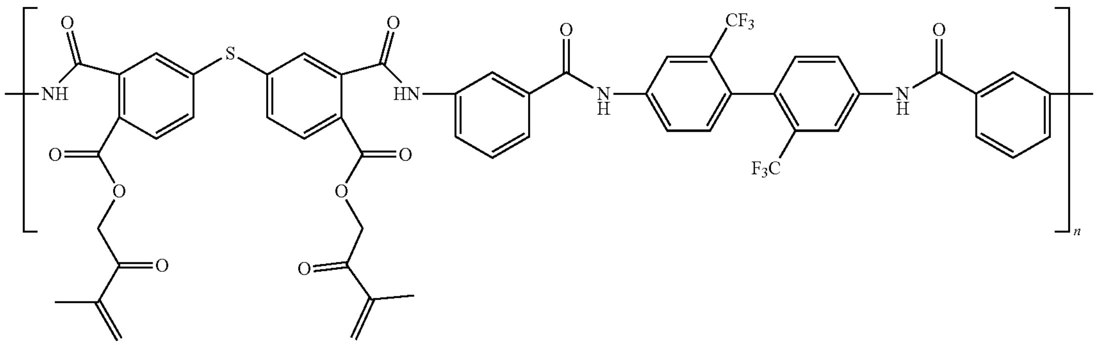
P1-163
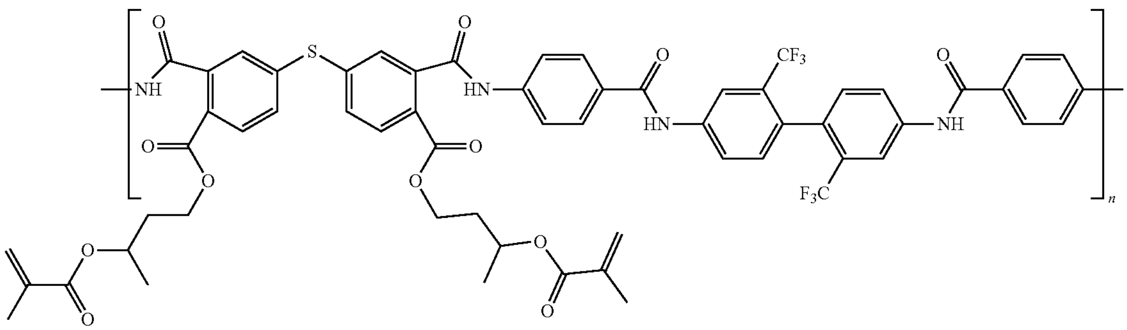
P1-164
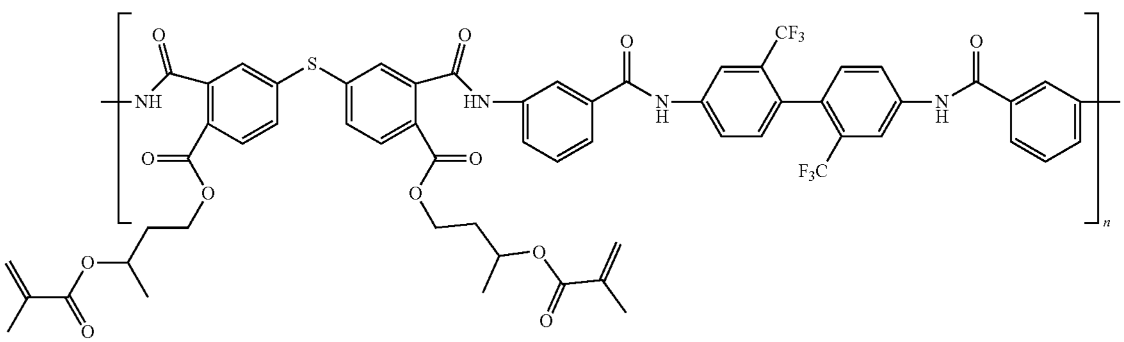
P1-165
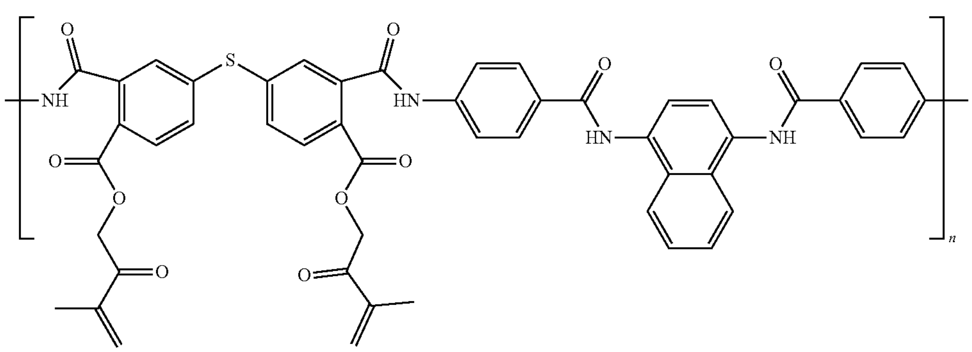

-continued
P1-166
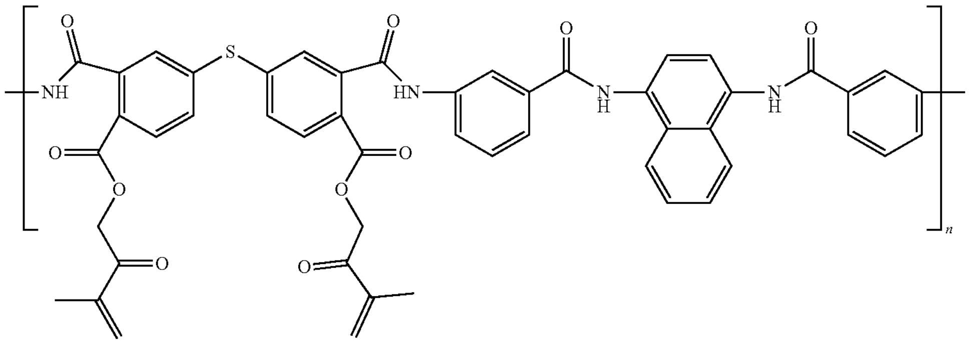
P1-167
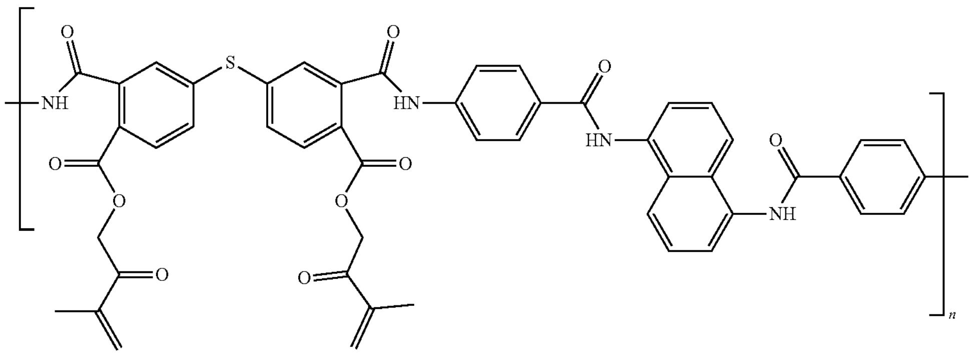
P1-168
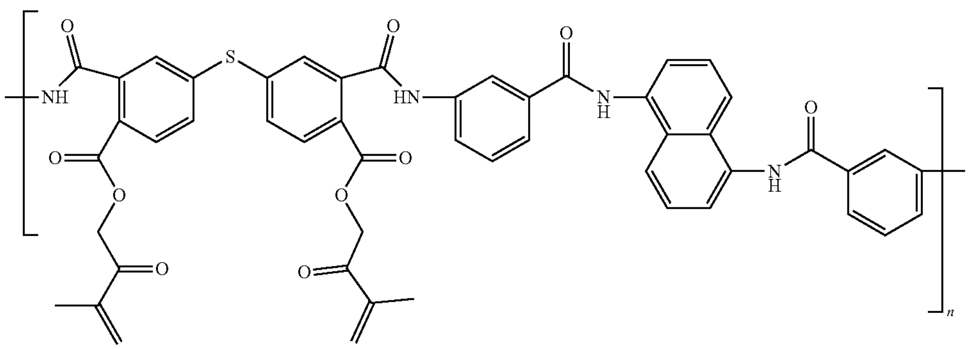
P1-169
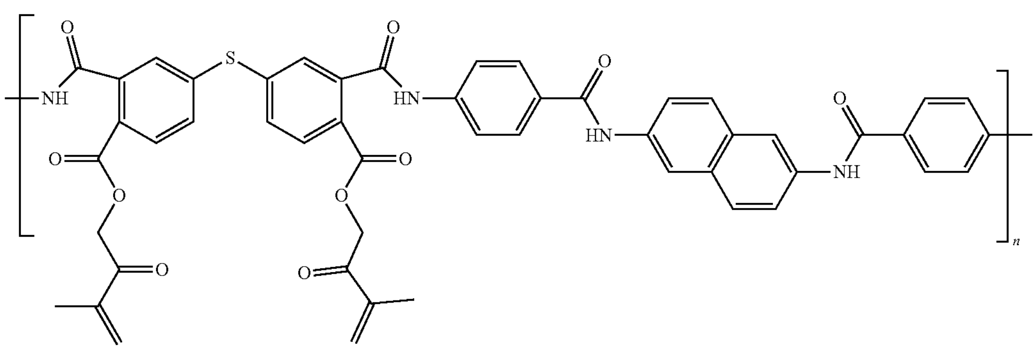

-continued
P1-170
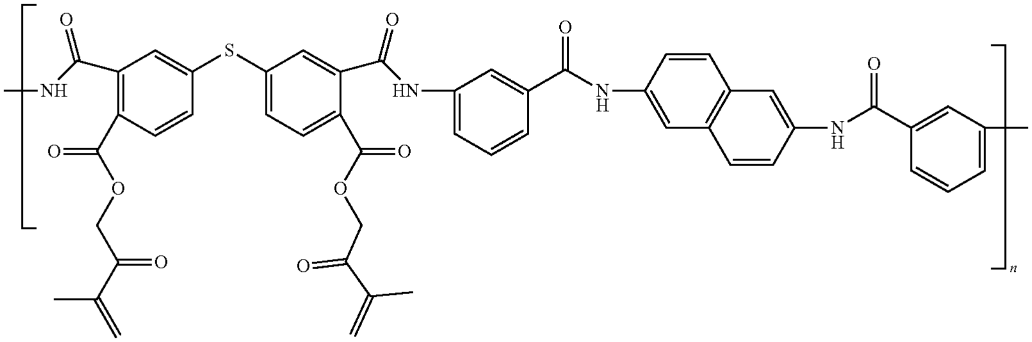
P1-171
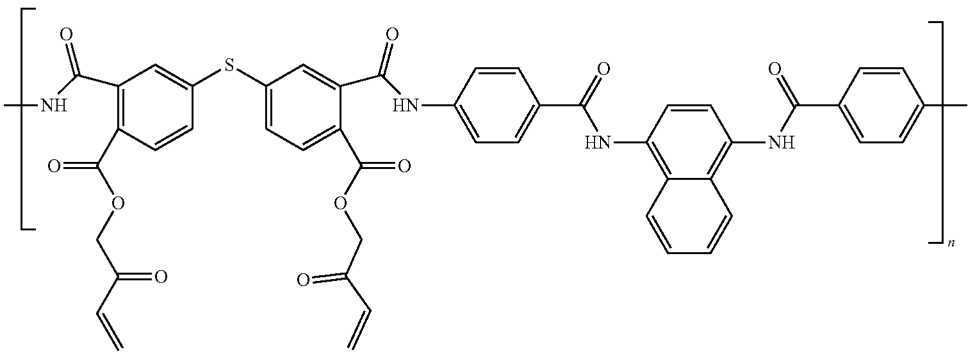
P1-172
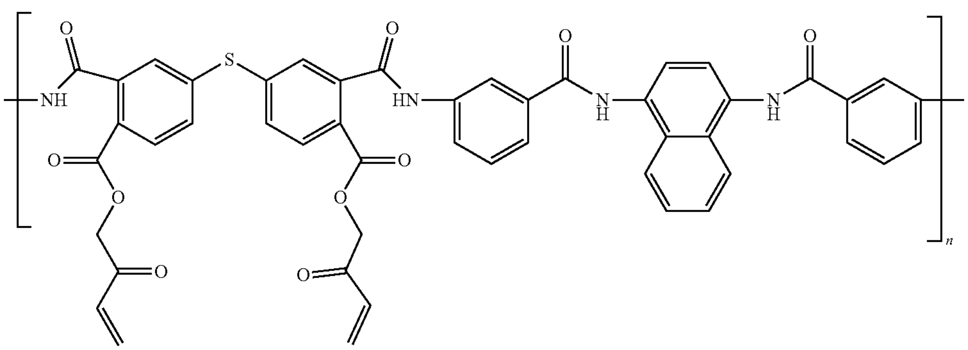
P1-173
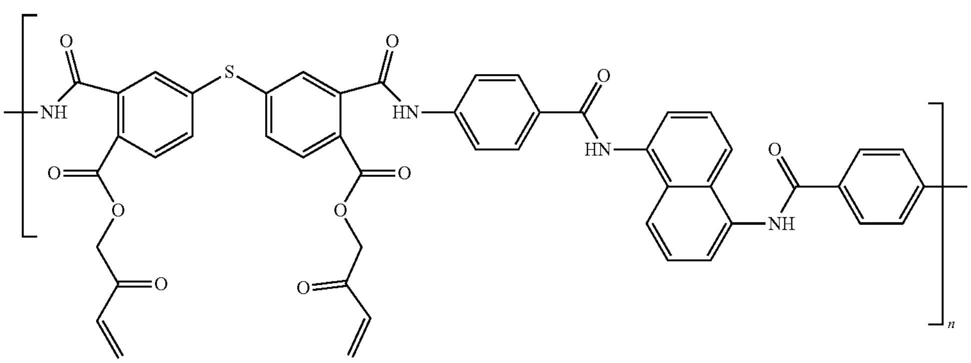

-continued
P1-174
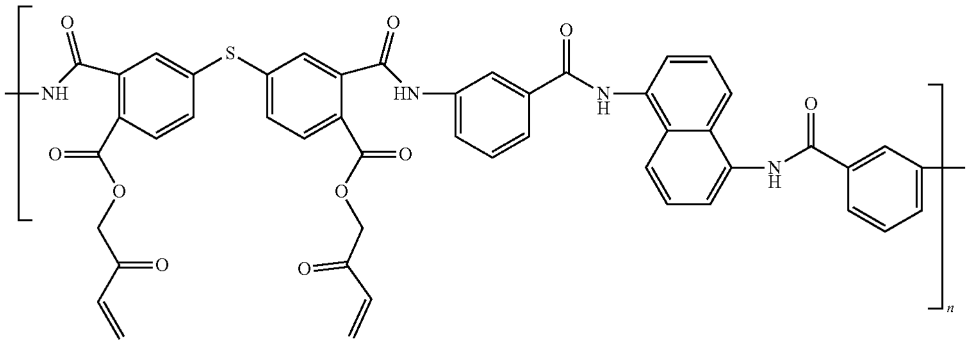
P1-175
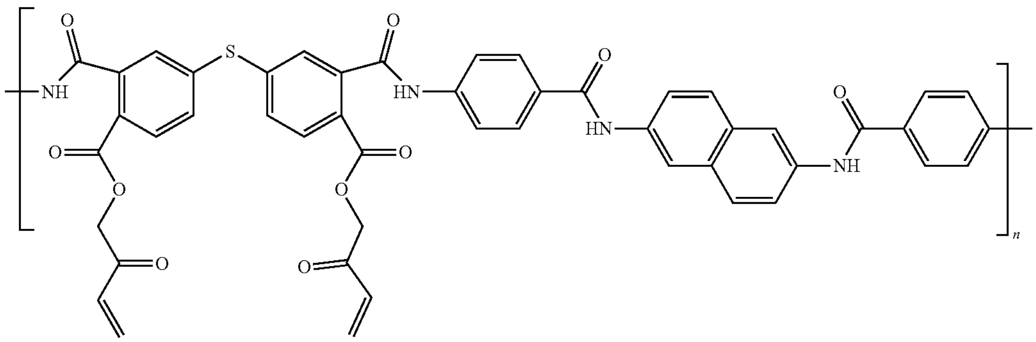
P1-176
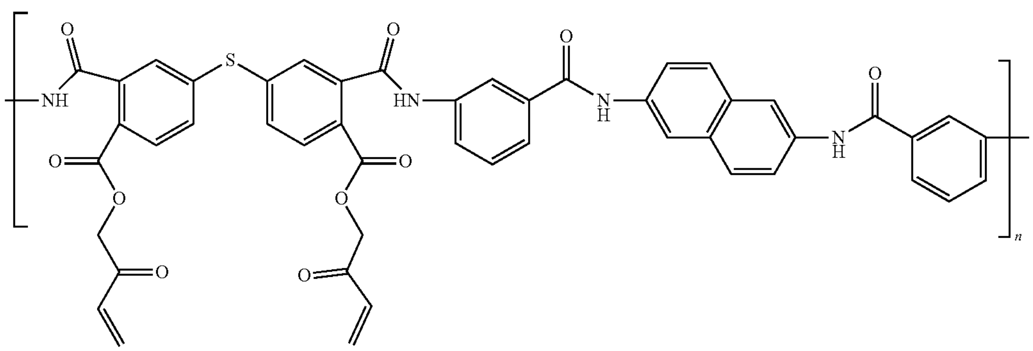
P1-177
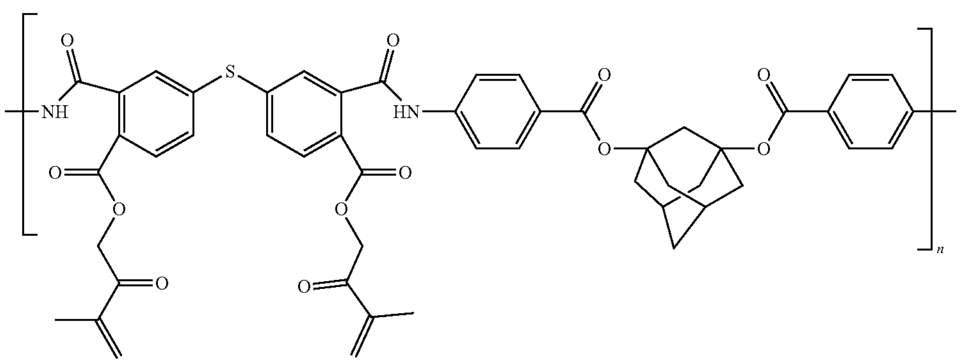

-continued
P1-178
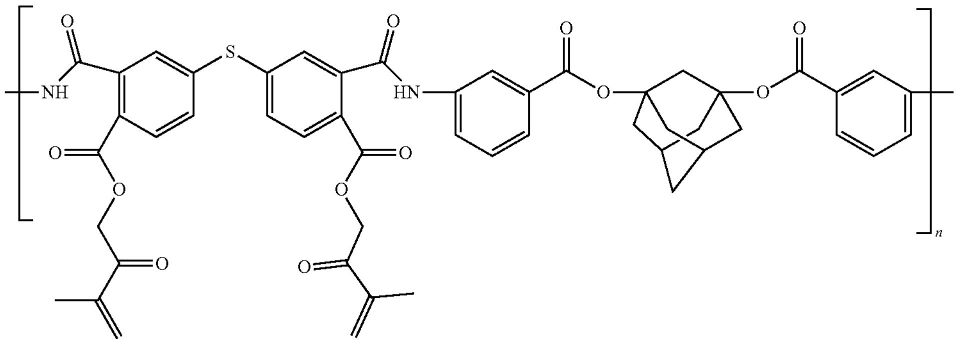
P1-179
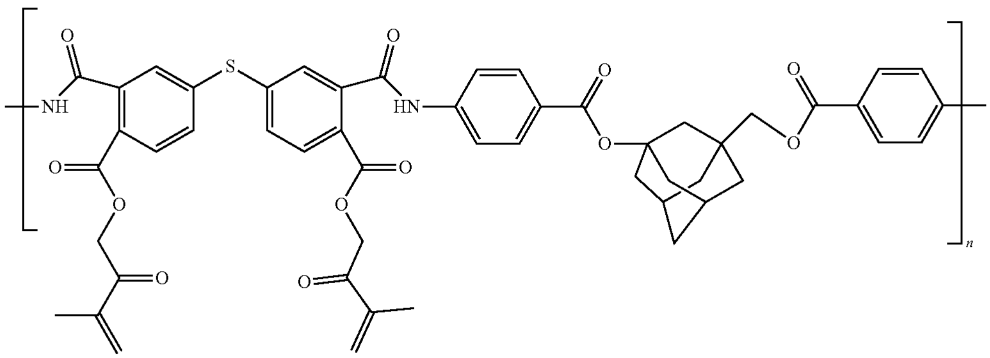
P1-180
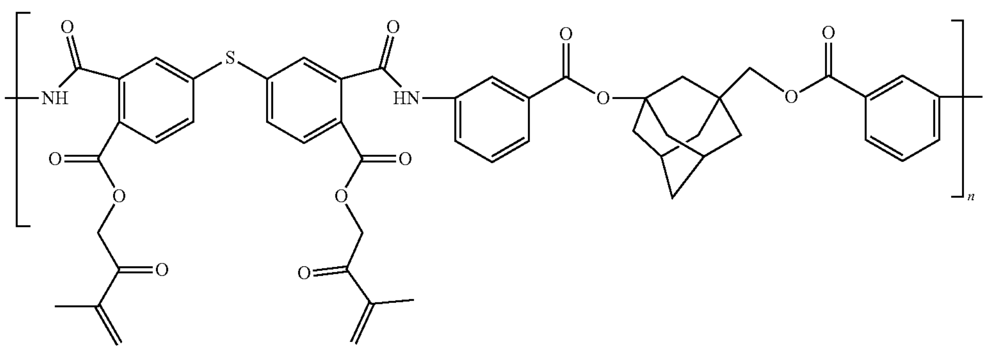
P1-181
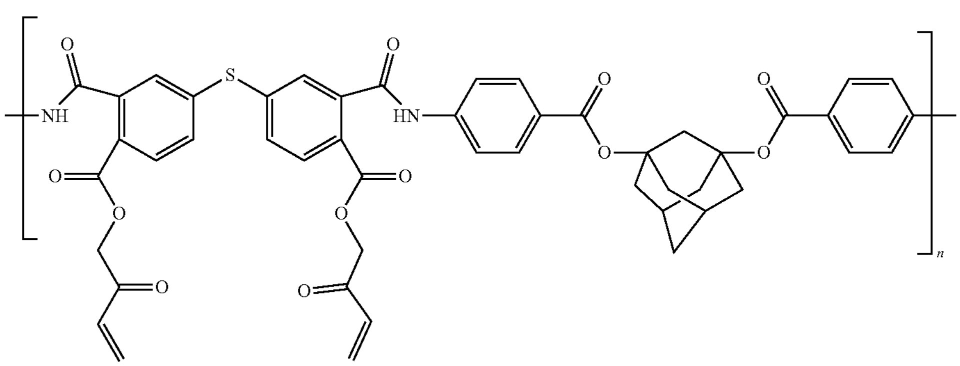

-continued
P1-182
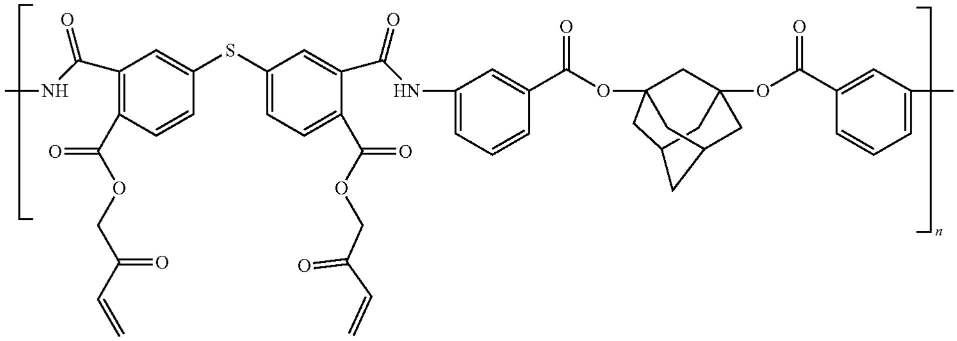
P1-183
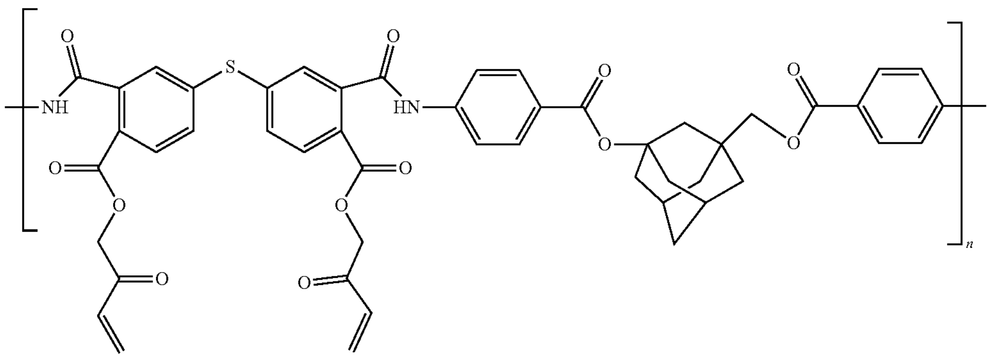
P1-184
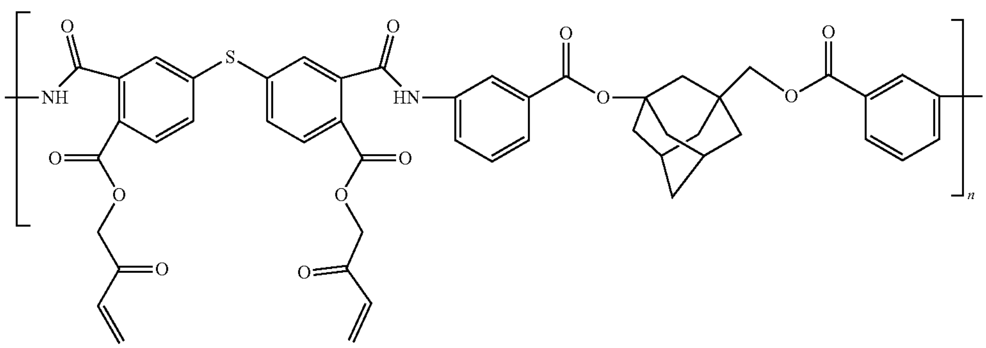
P1-185
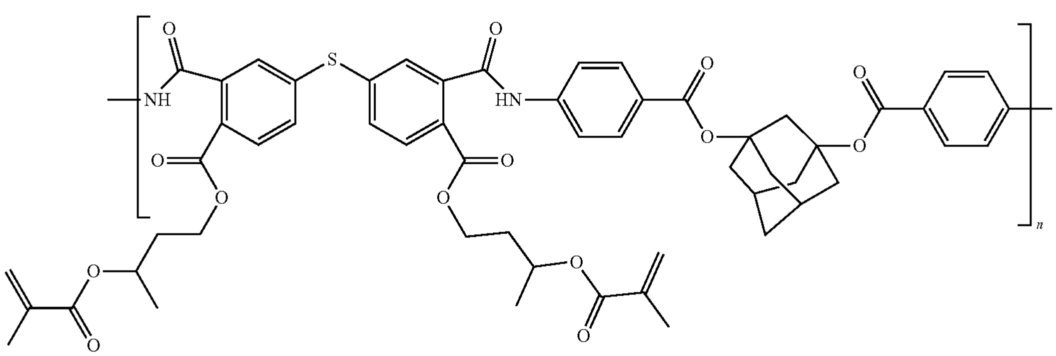

-continued
P1-186
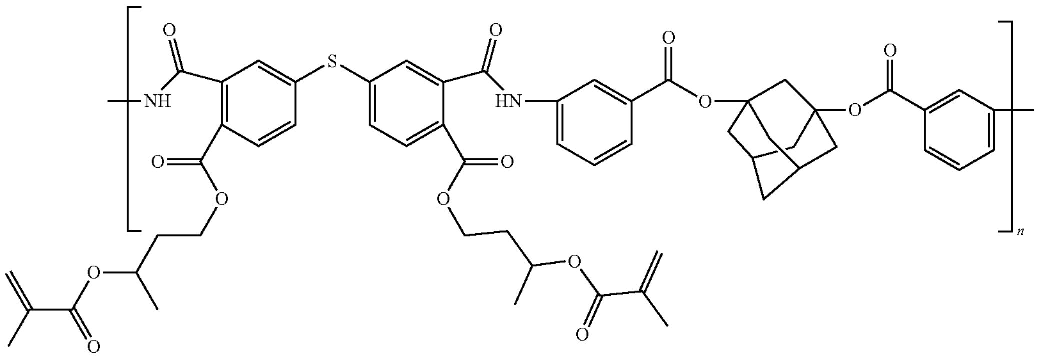
P1-187
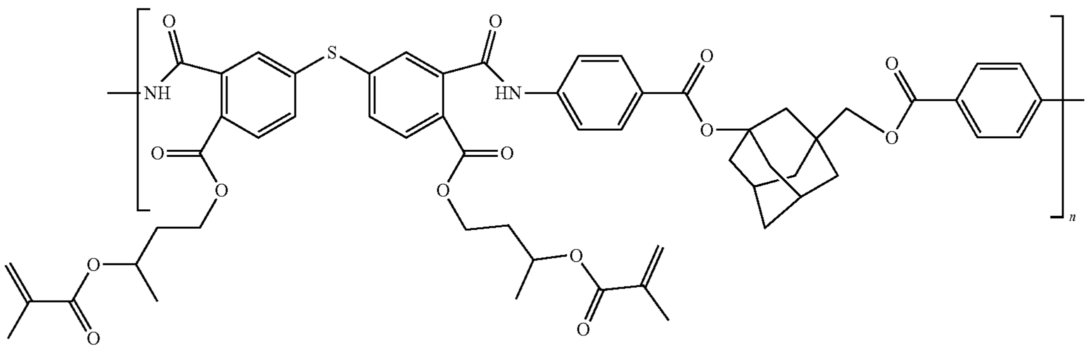
P1-188
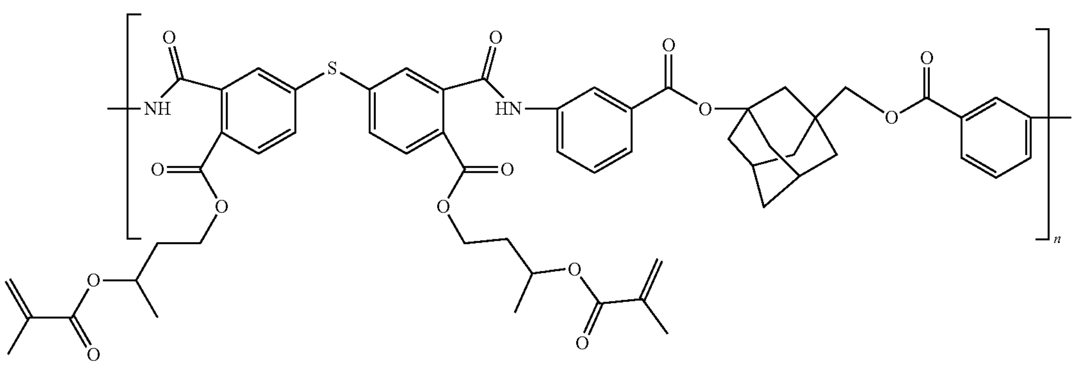
P1-189
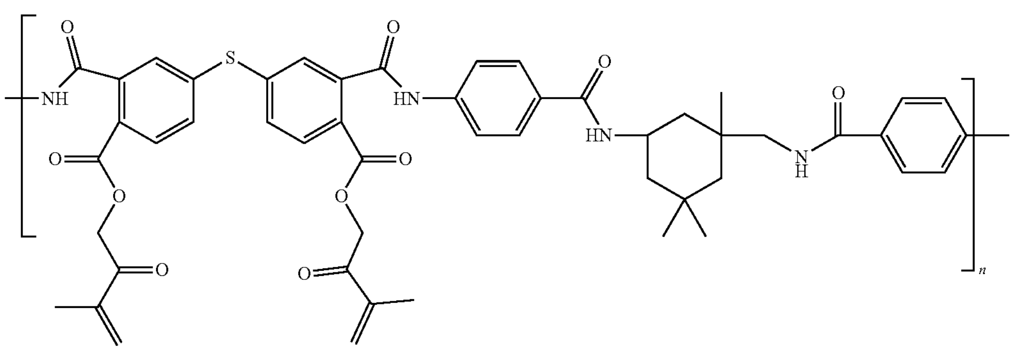

-continued
P1-190
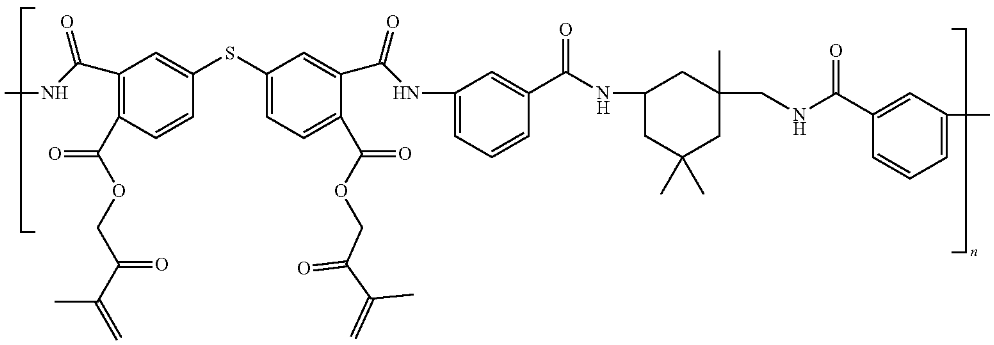
P1-191
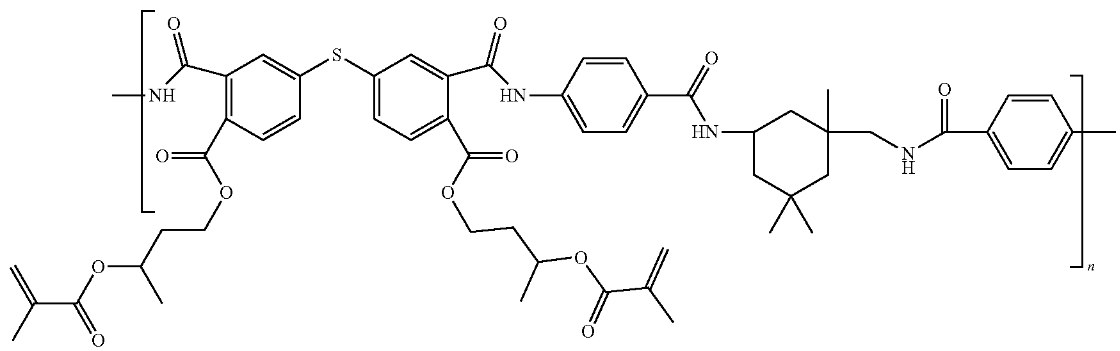
P1-192
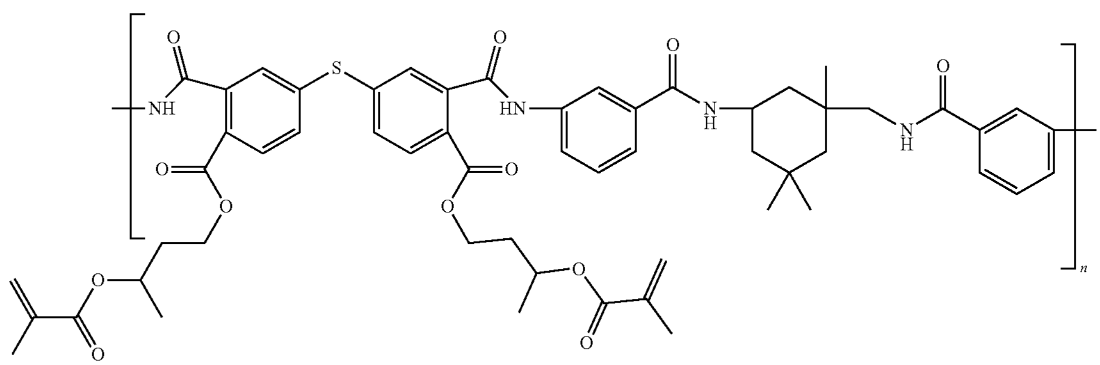
P1-193
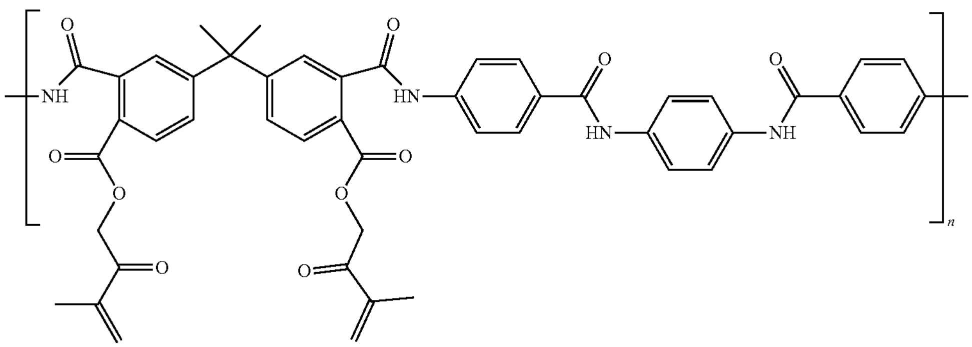

-continued
P1-194
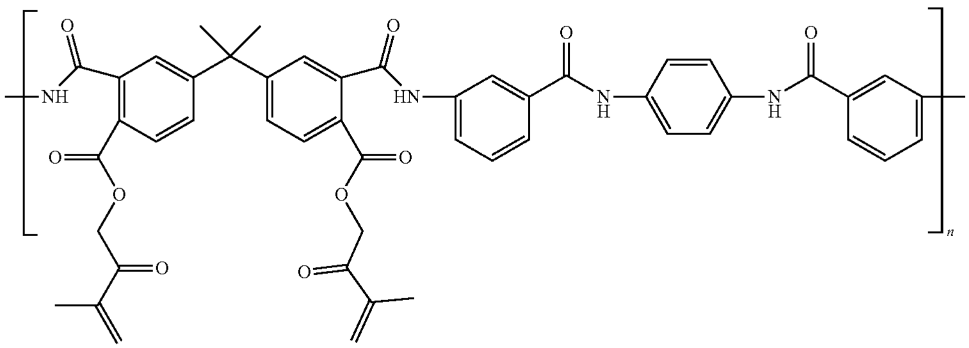
P1-195
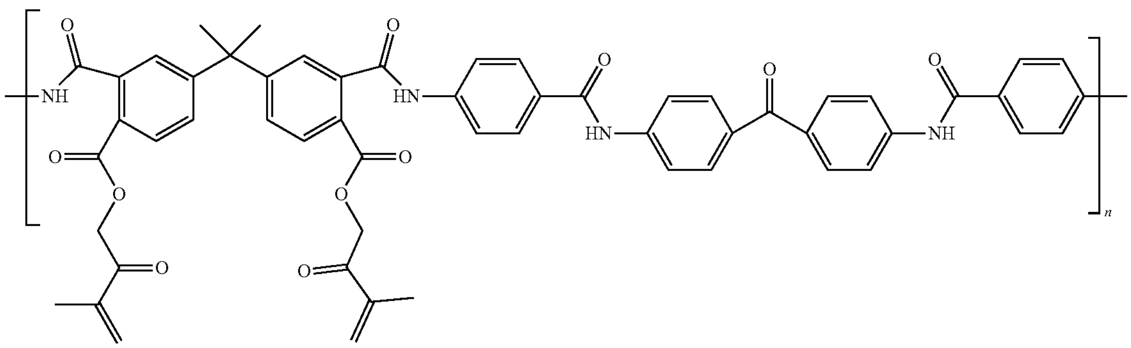
P1-196
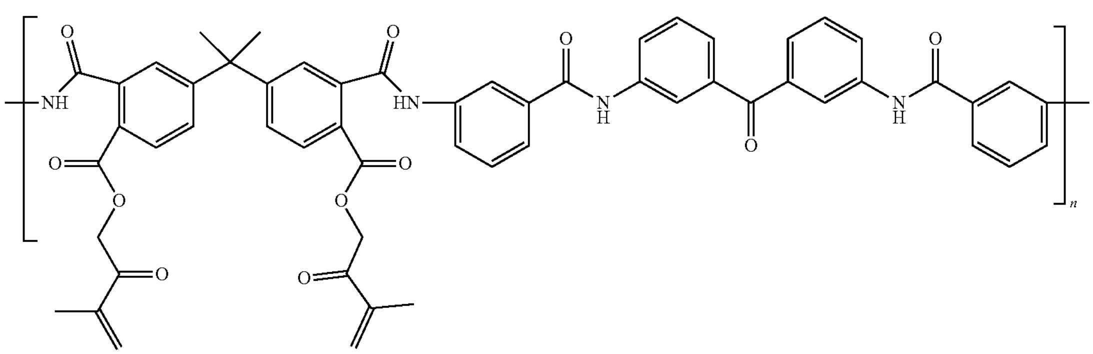
P1-197
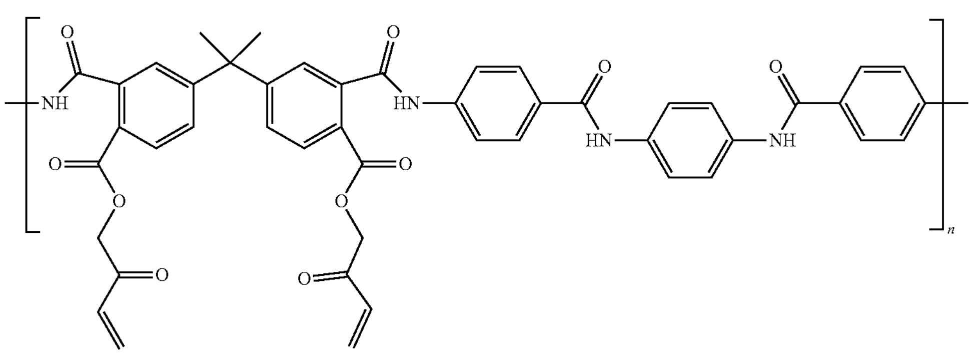

-continued
P1-198
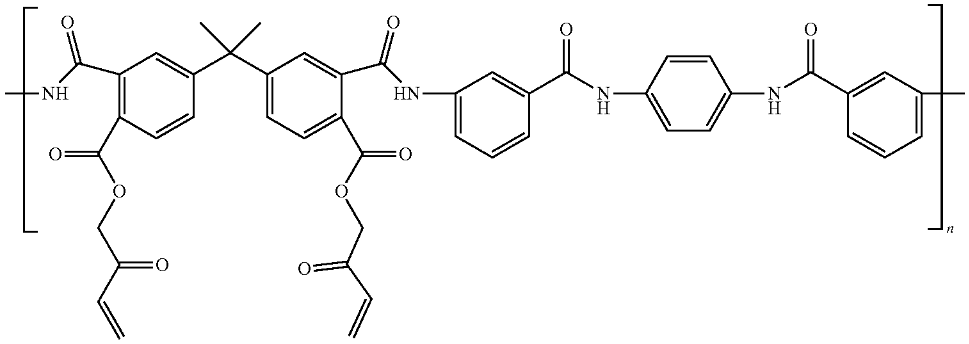
P1-199
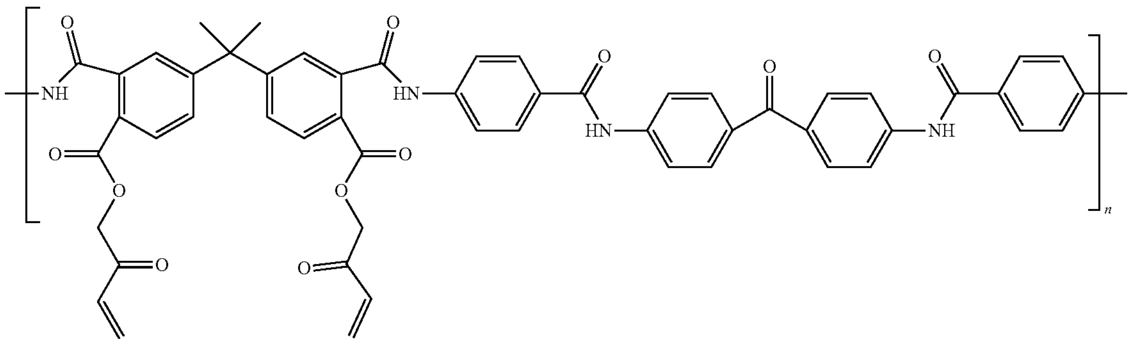
P1-200
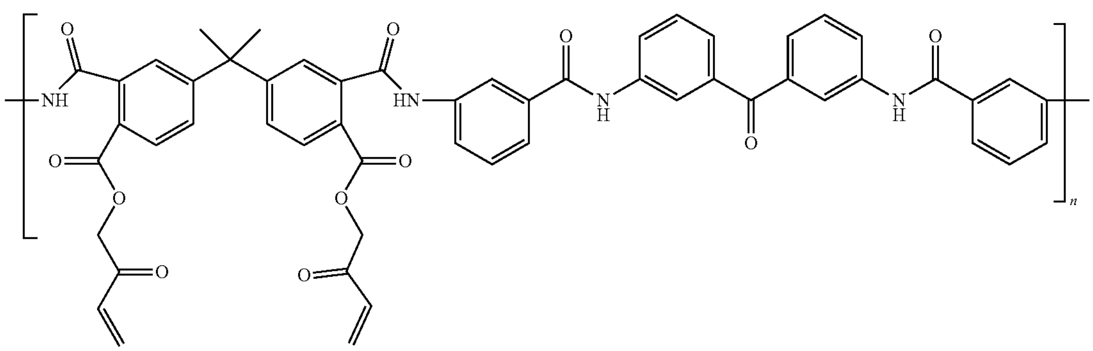
P1-201
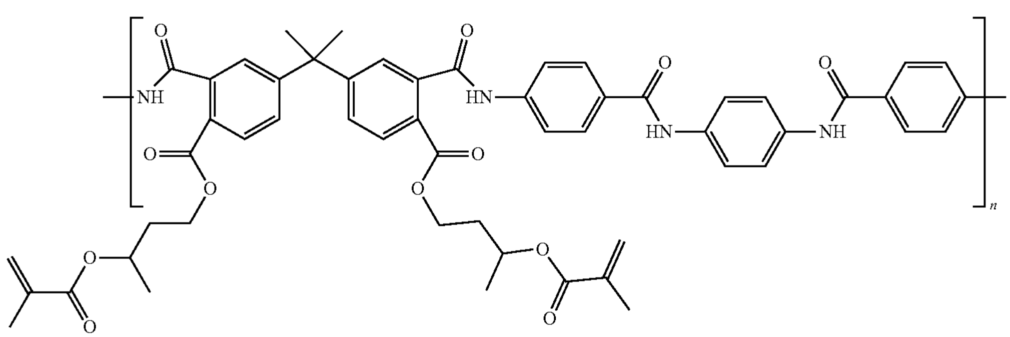

-continued
P1-202
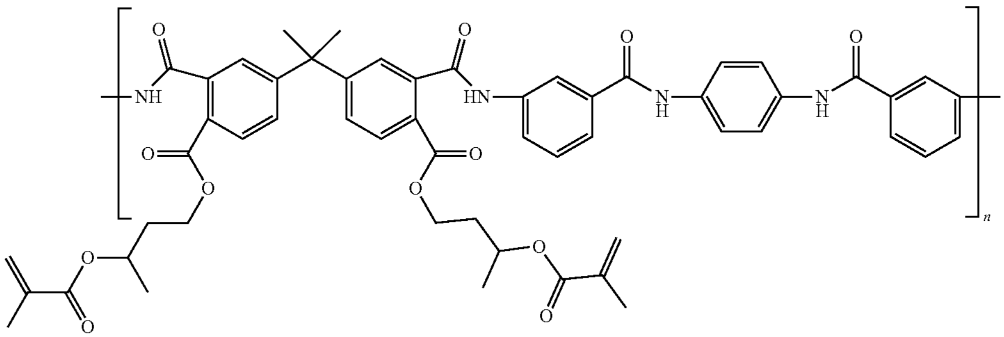
P1-203
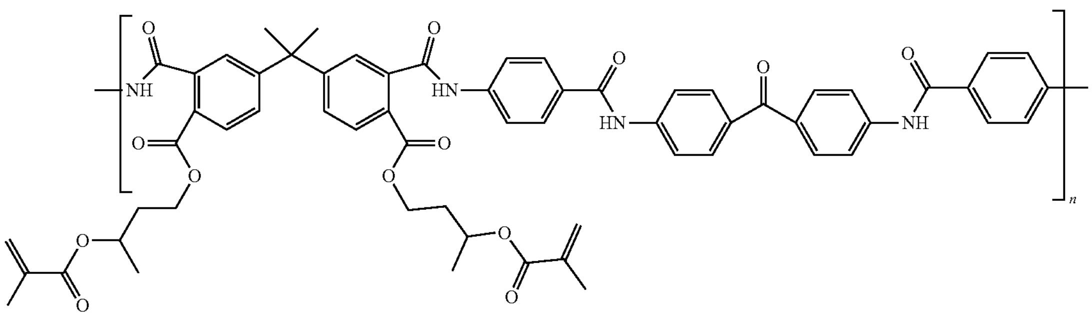
P1-204
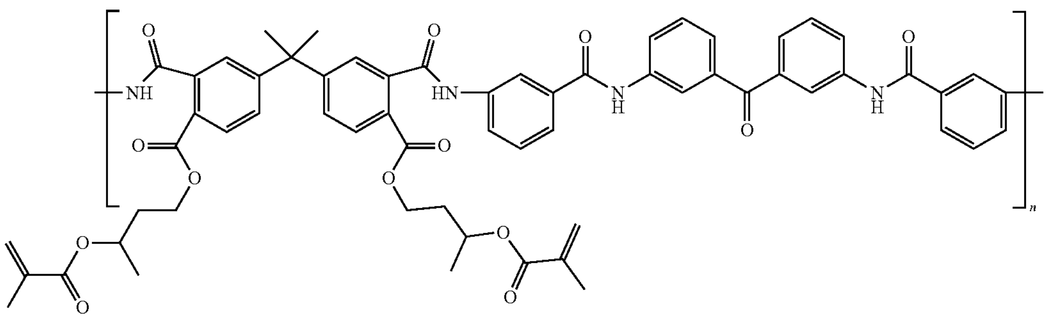
P1-205
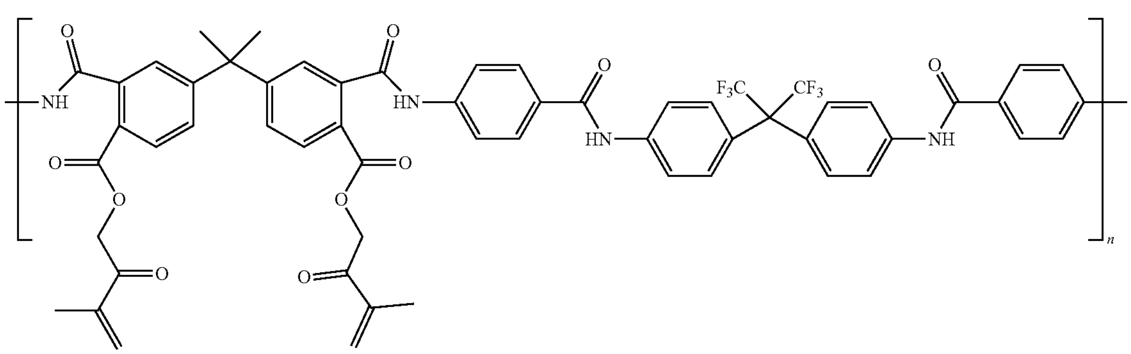

-continued
P1-206
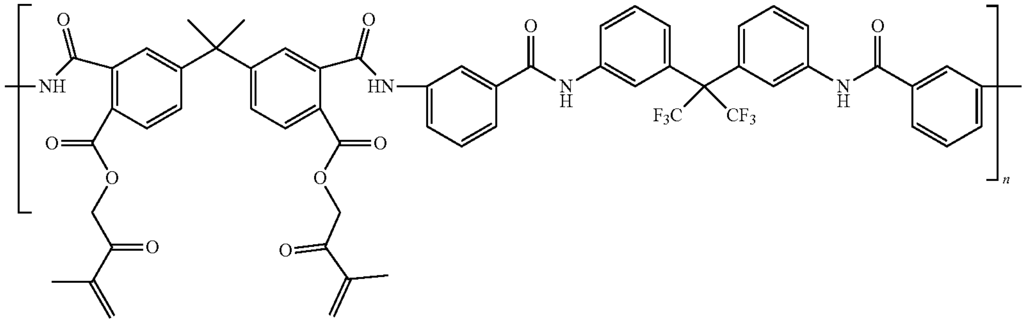
P1-207
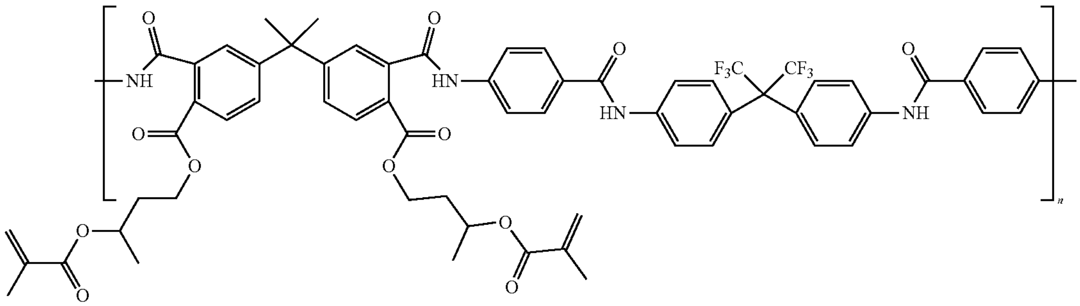
P1-208
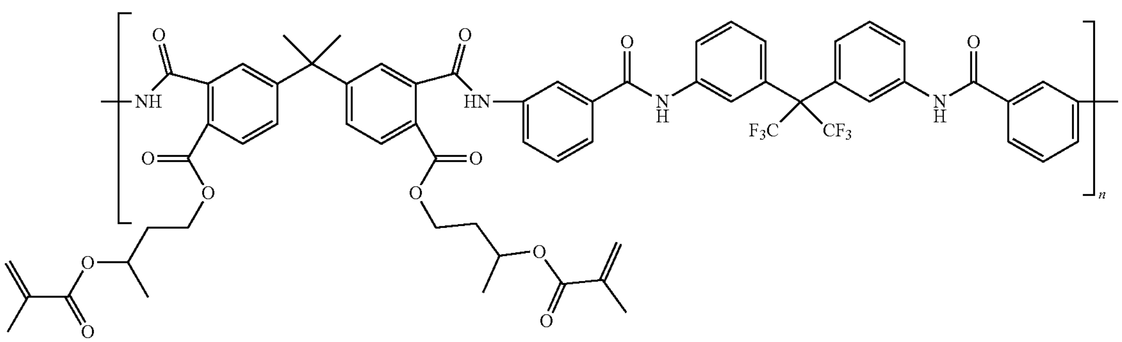
P1-209
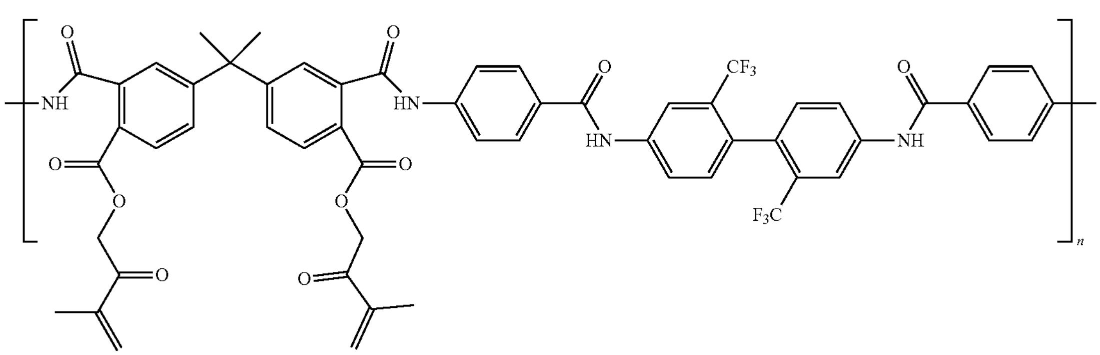

-continued
P1-210
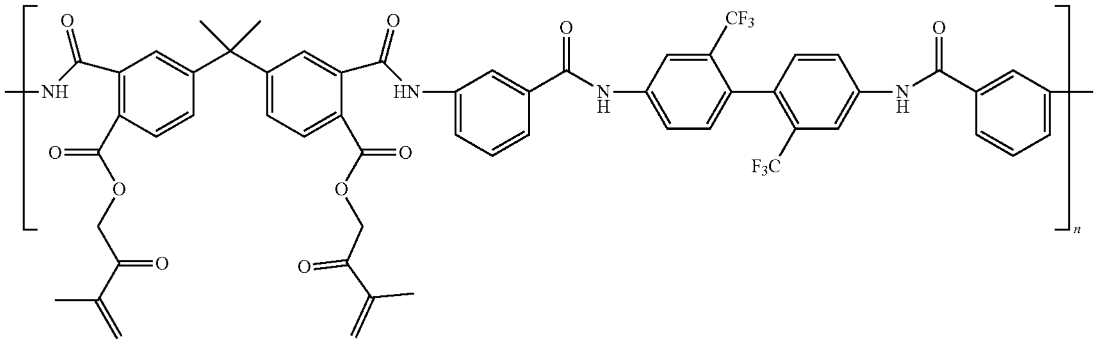
P1-211
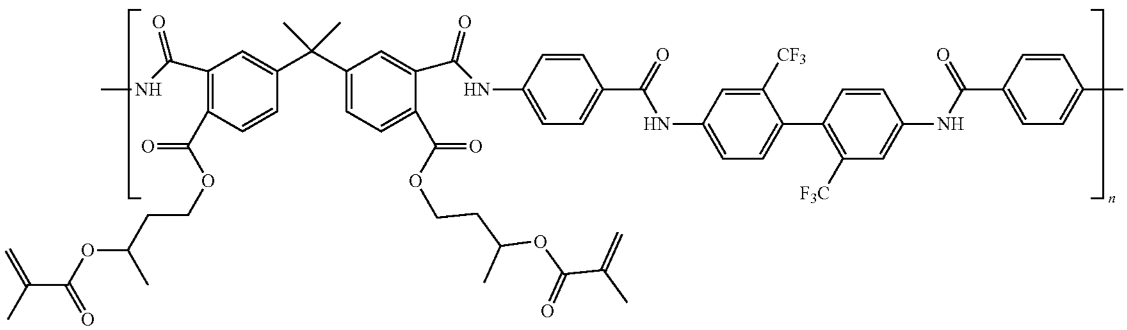
P1-212
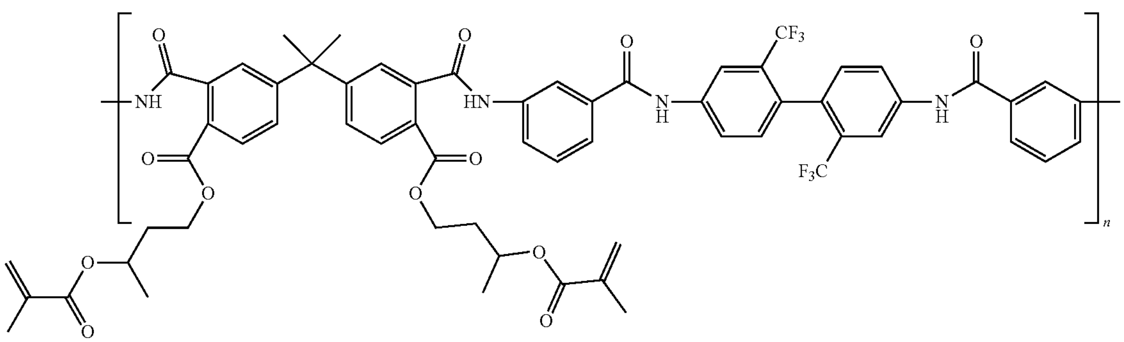
P1-213
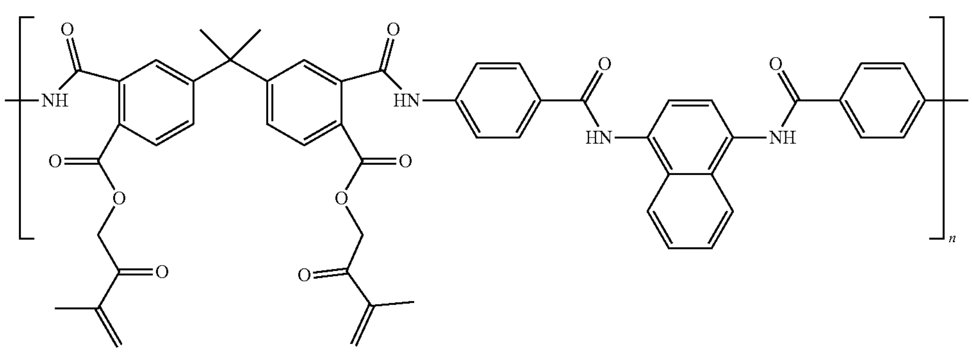

-continued
P1-214
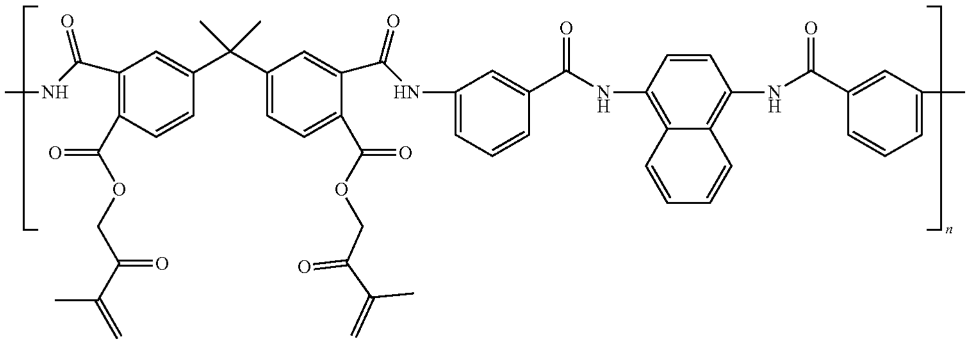
P1-215
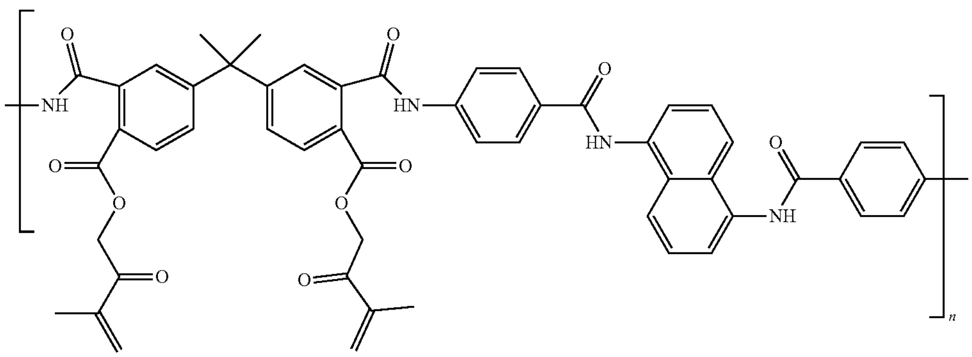
P1-216
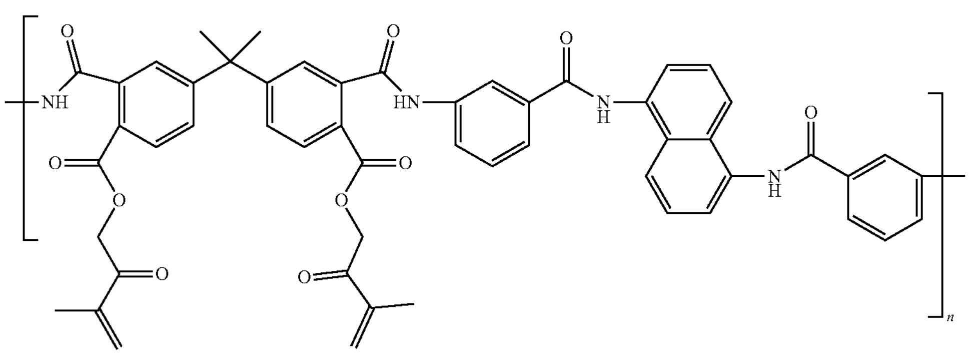
P1-217
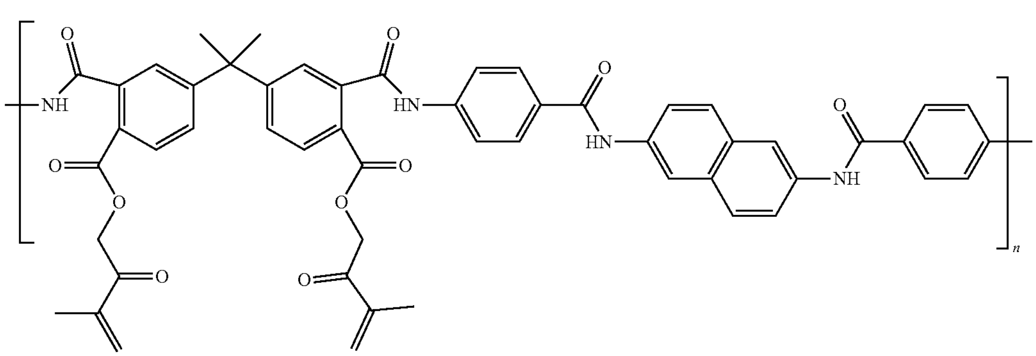

-continued
P1-218
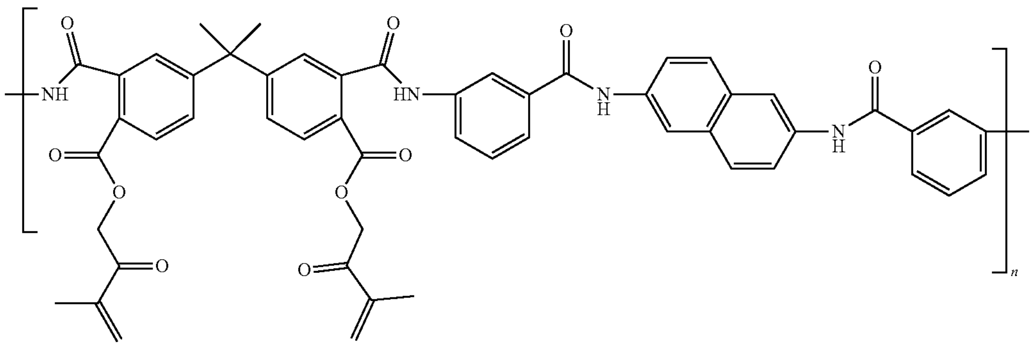
P1-219
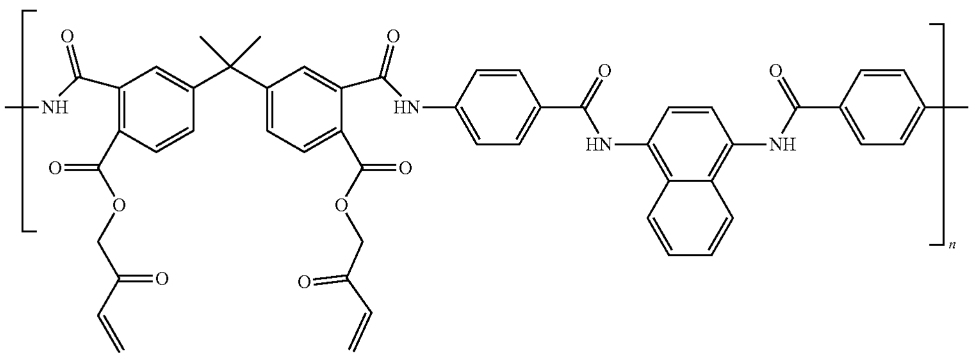
P1-220
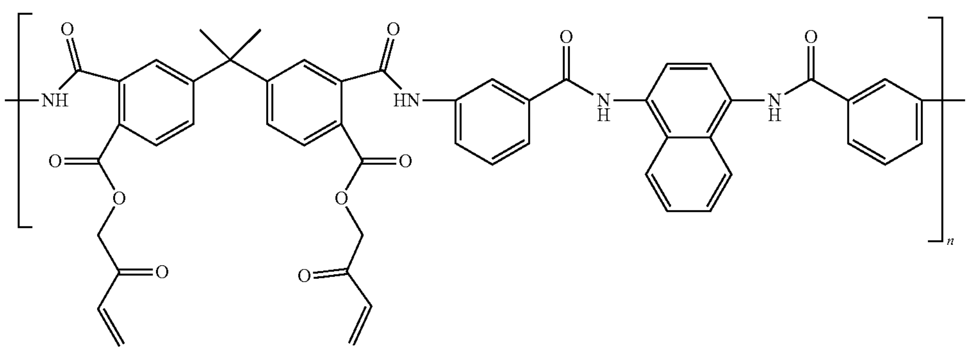
P1-221
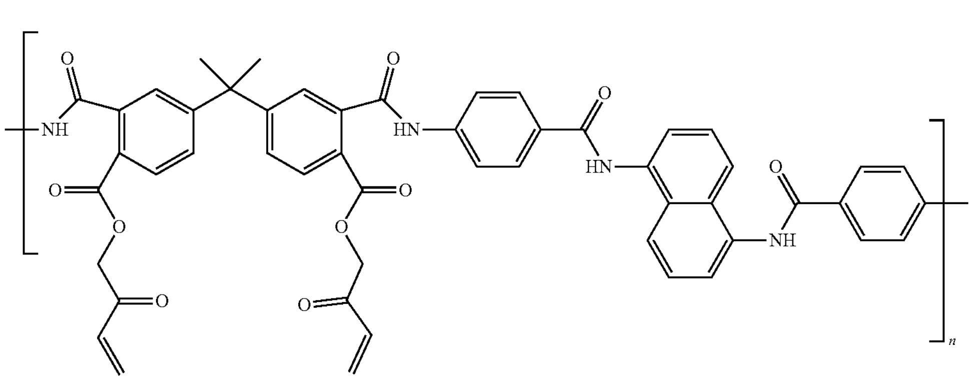

-continued
P1-222
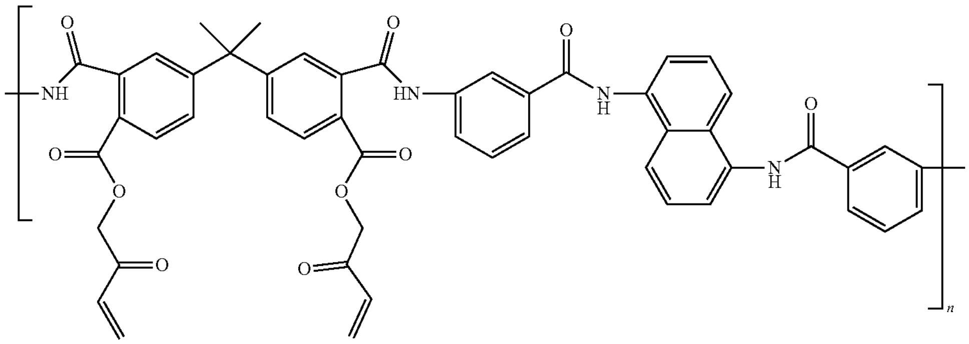
P1-223
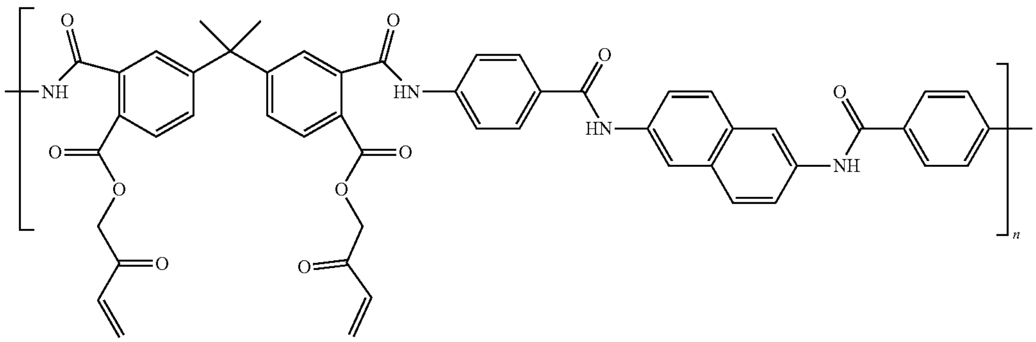
P1-224
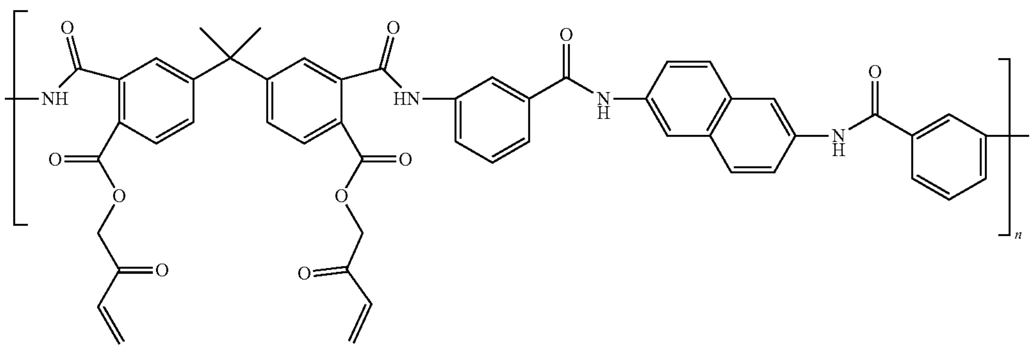
P1-225
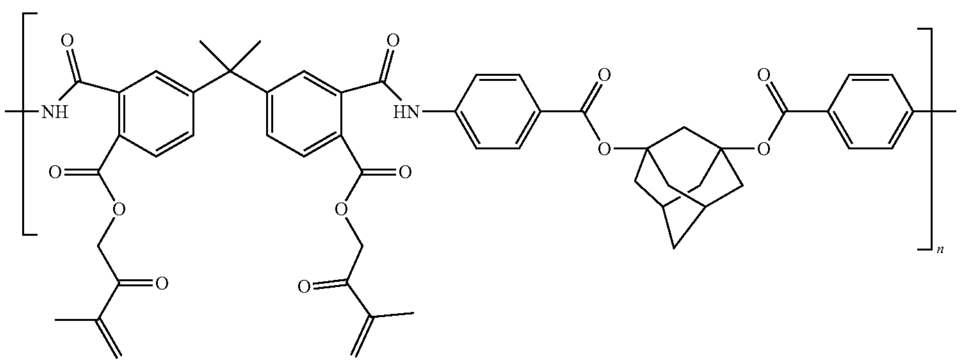

-continued
P1-226
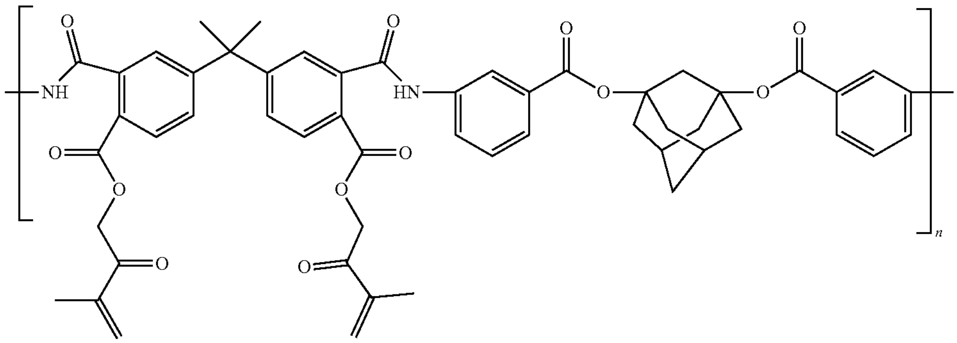
P1-227
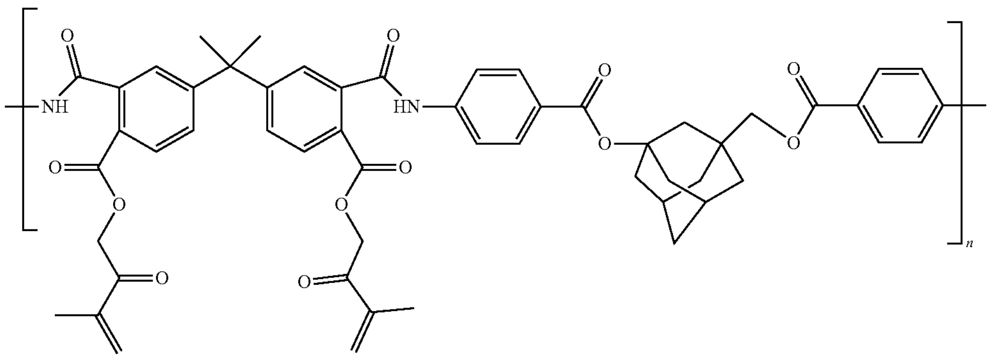
P1-228
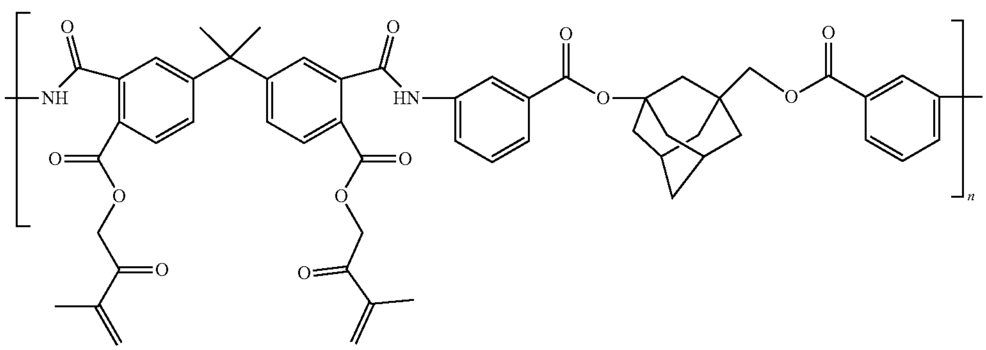
P1-229
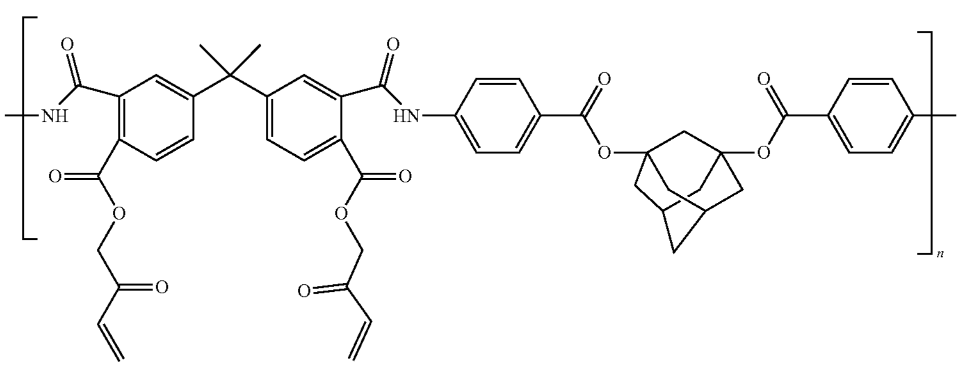

-continued
P1-230
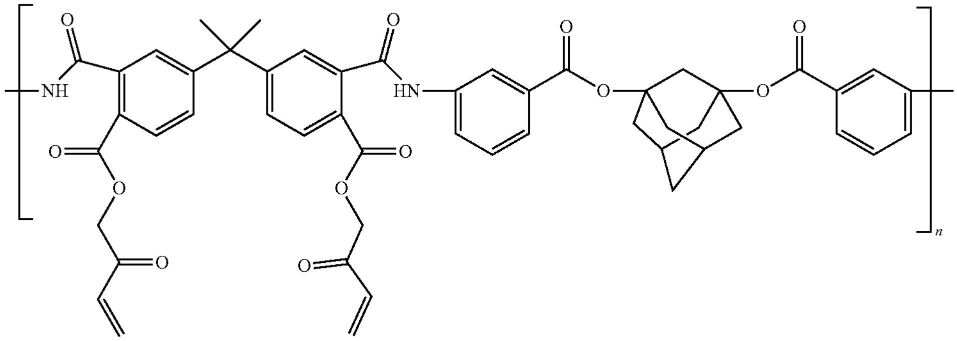
P1-231
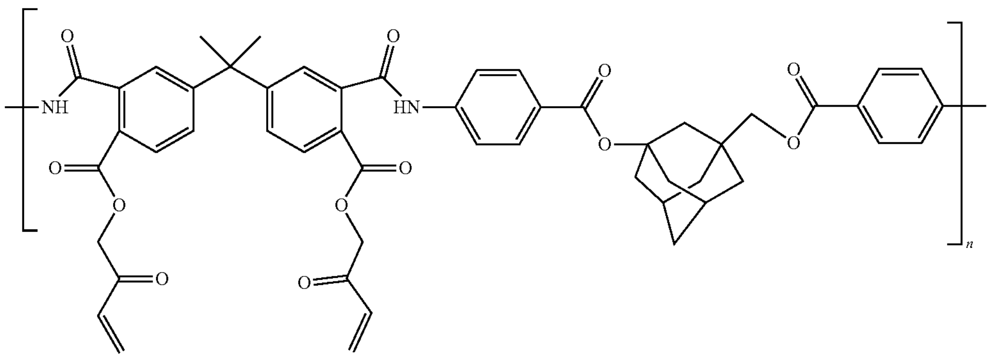
P1-232
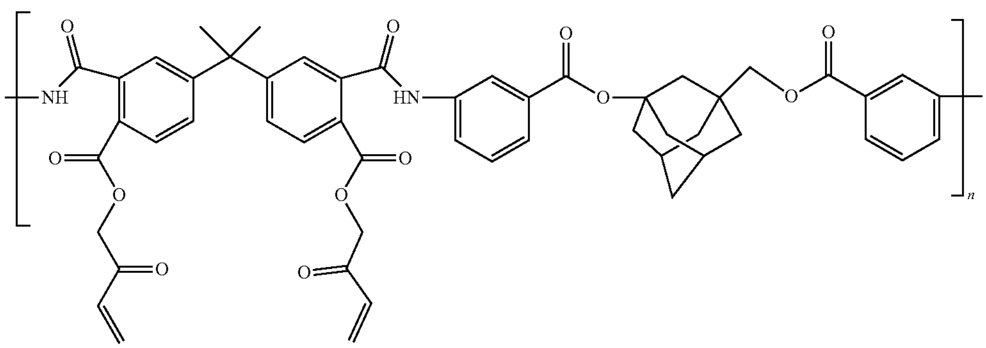
P1-233
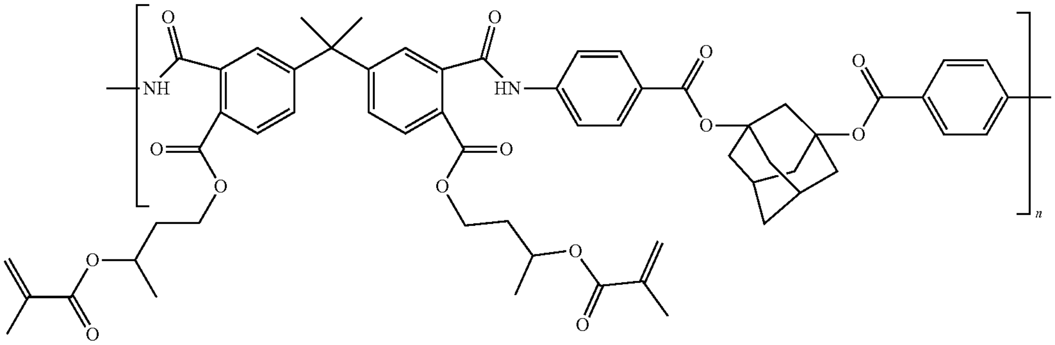

-continued
P1-234
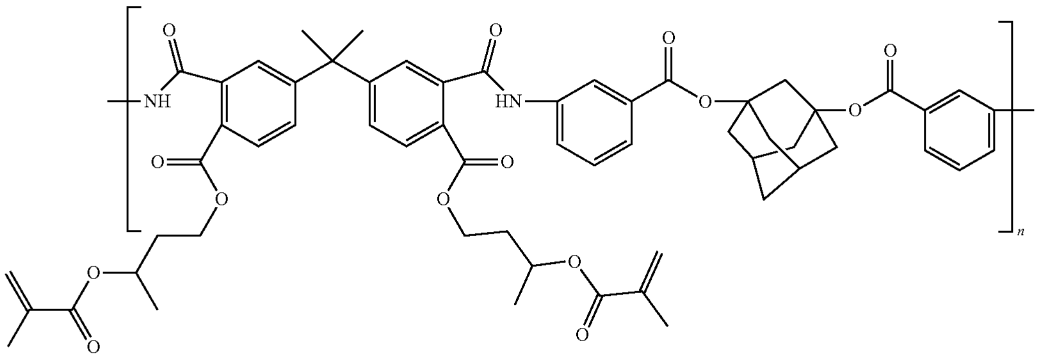
P1-235
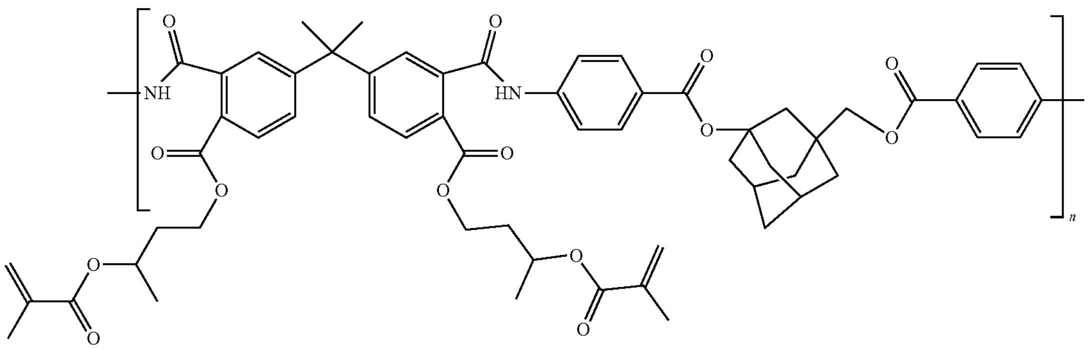
P1-236
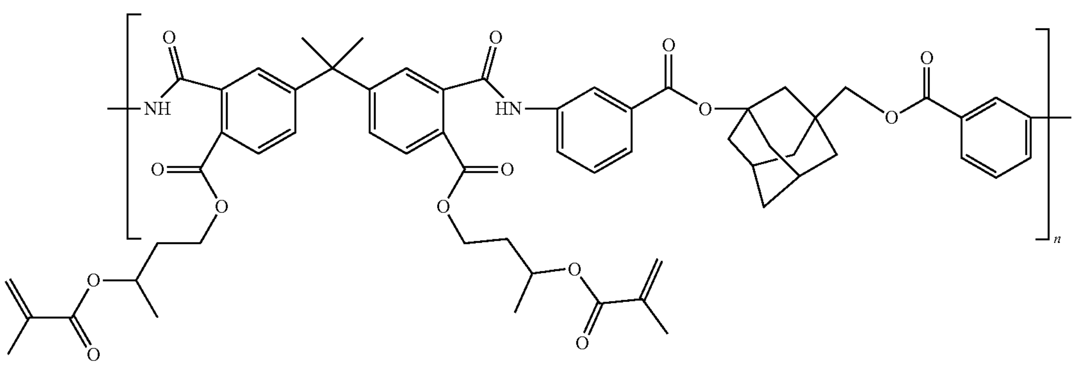
P1-237
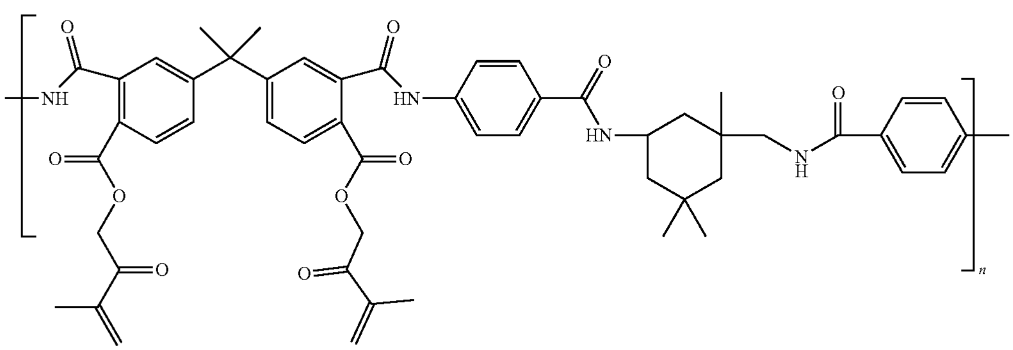

-continued
P1-238
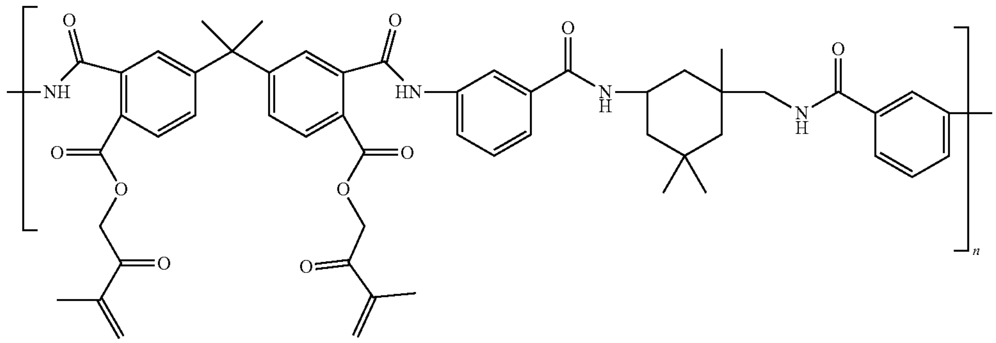
P1-239
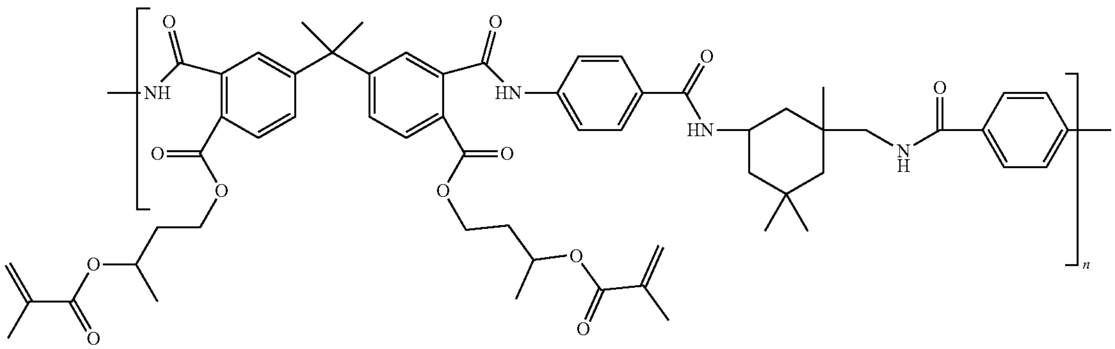
P1-240
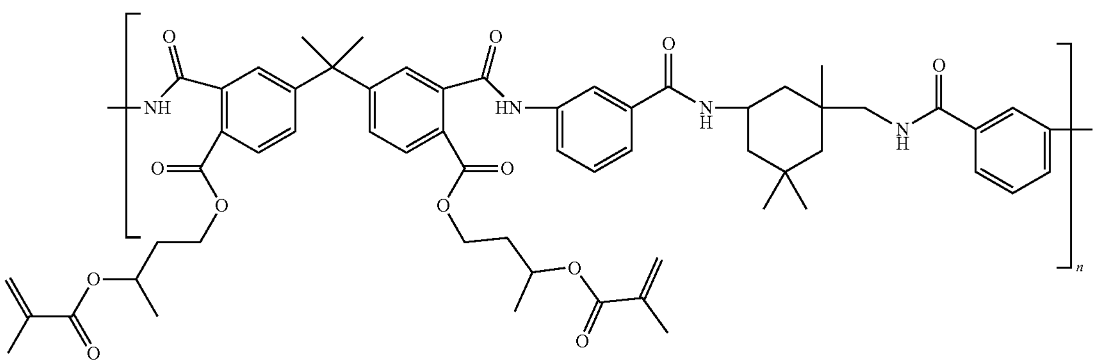
P1-241
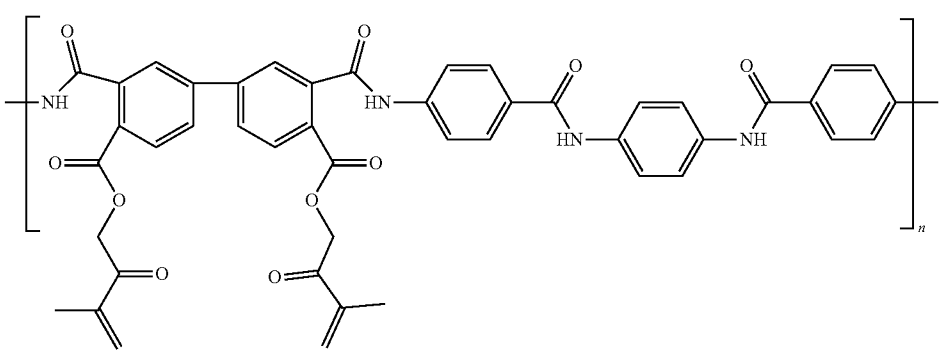

-continued
P1-242
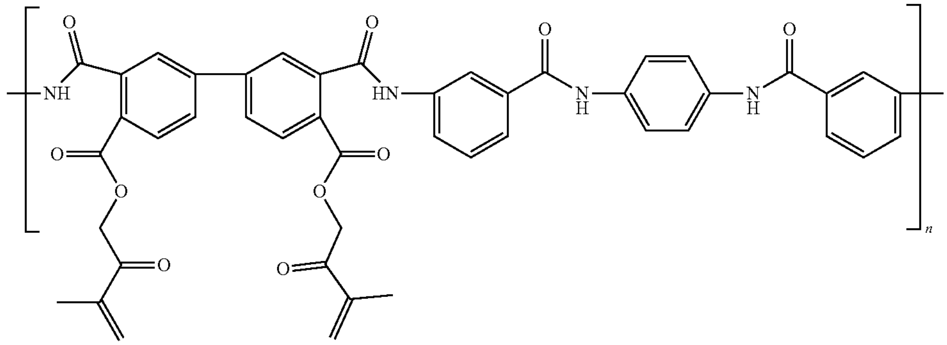
P1-243
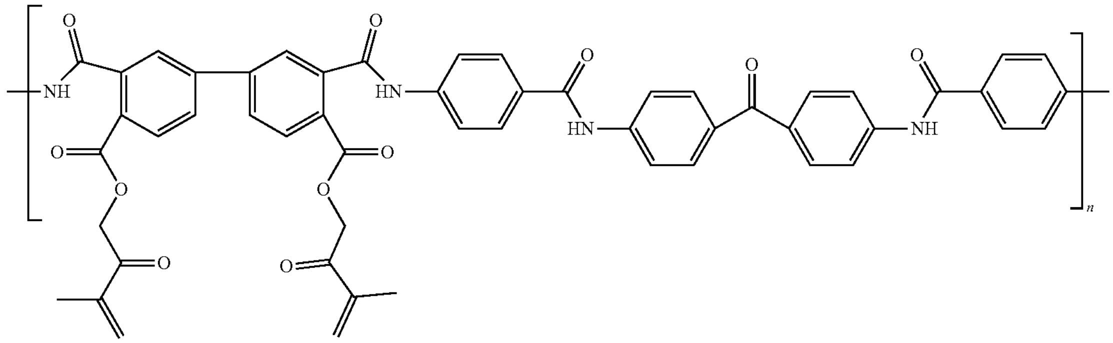
P1-244
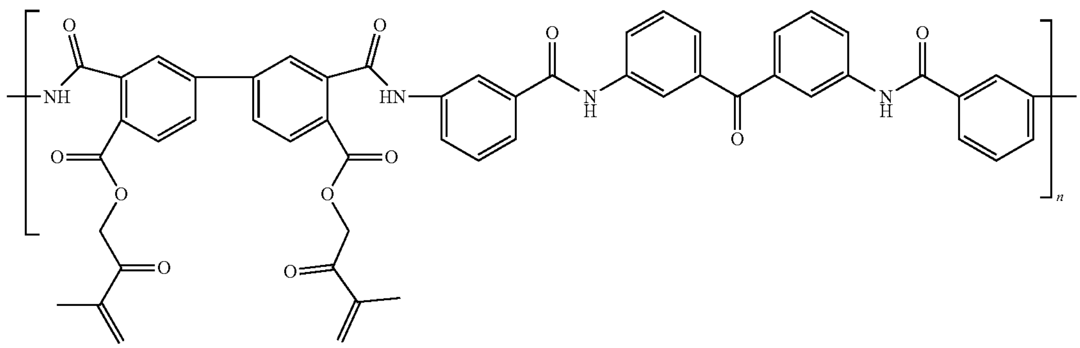
P1-245
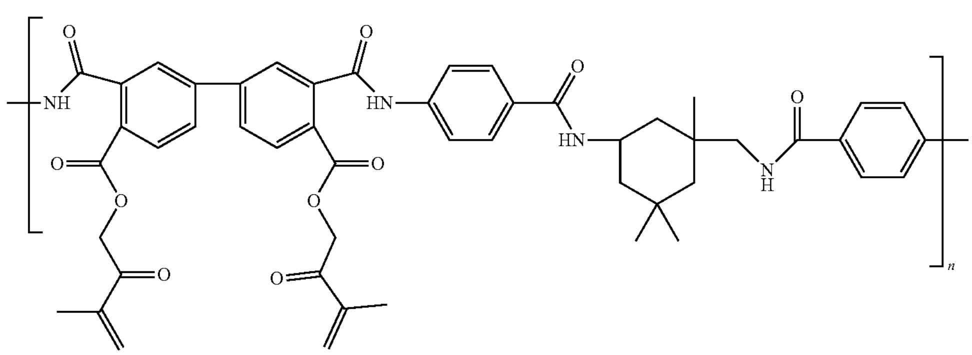

-continued
P1-246
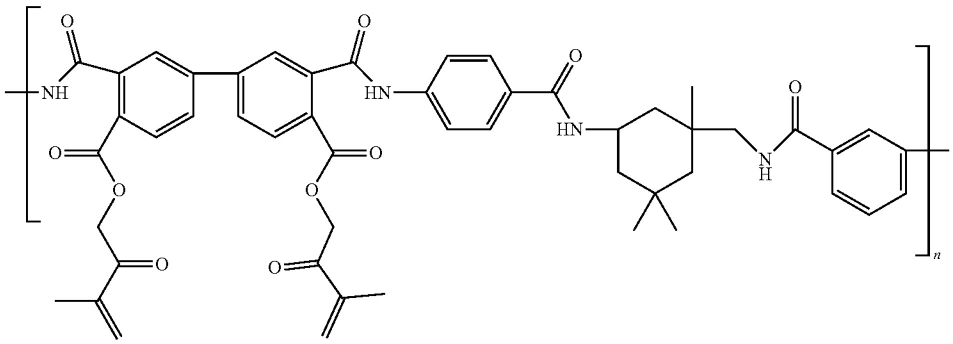
P1-247
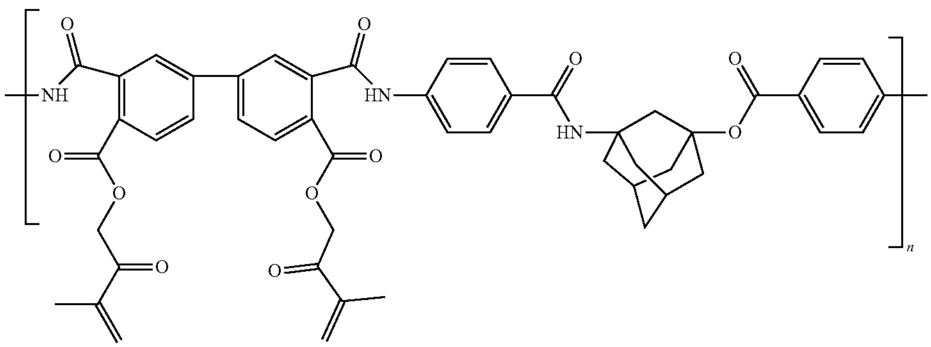
P1-248
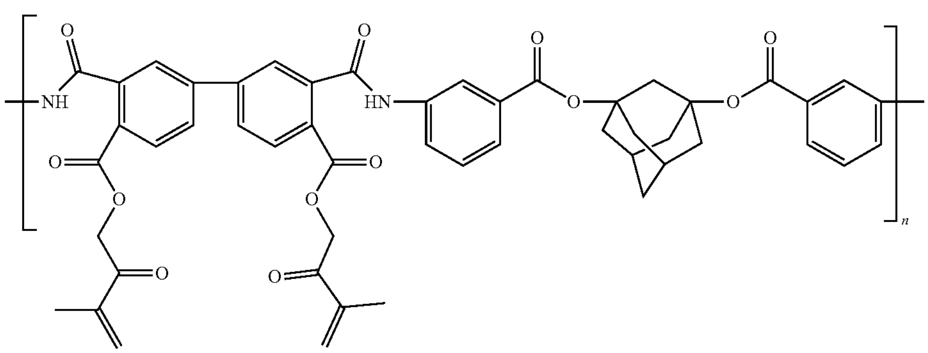
P1-249
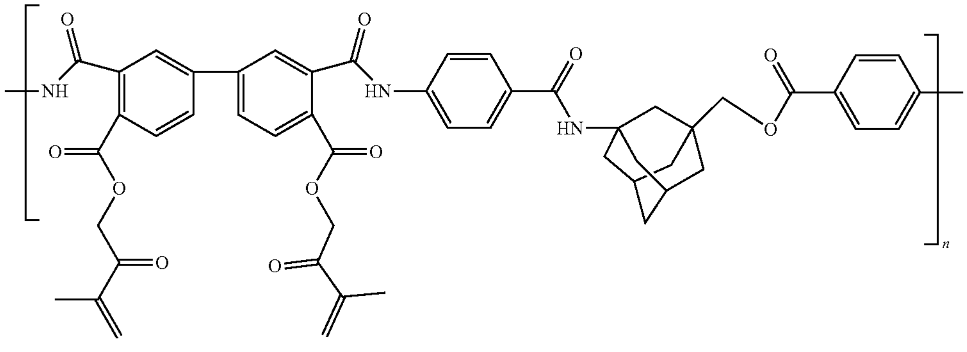

-continued
P1-250
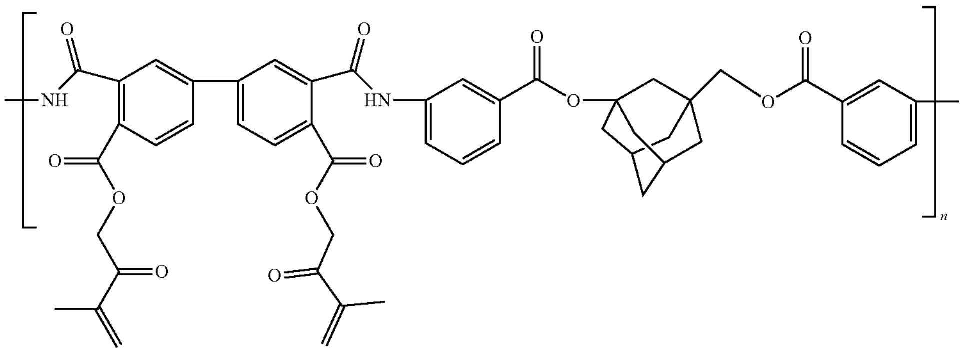
P1-251
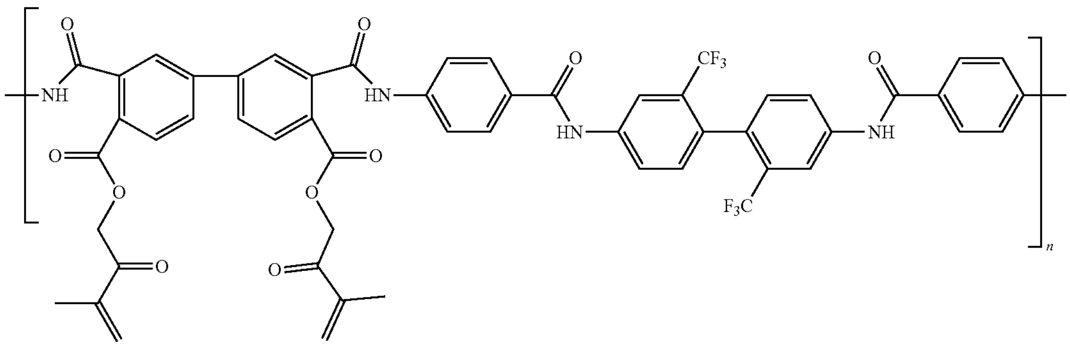
P1-252
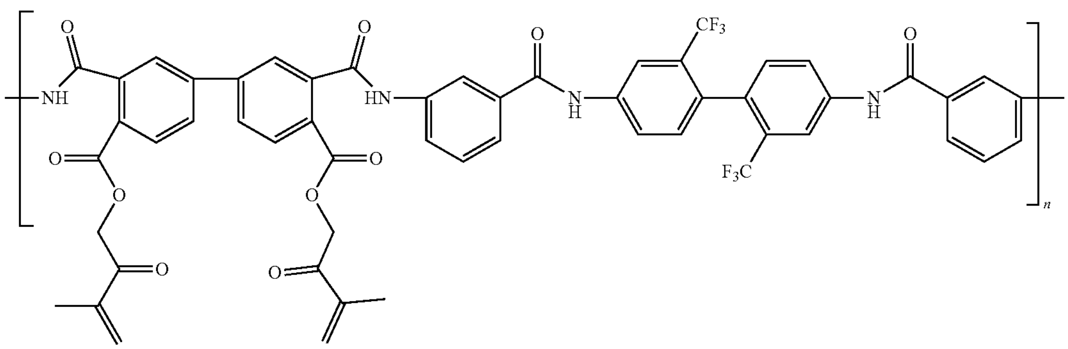
P1-253
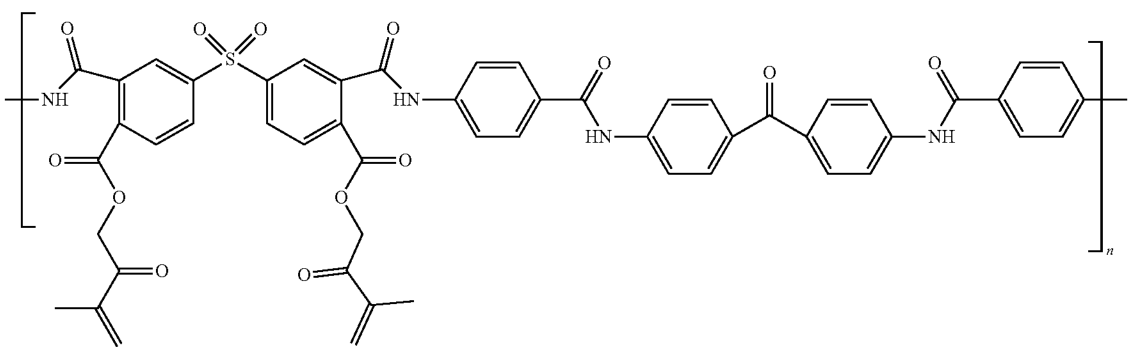

-continued
P1-254
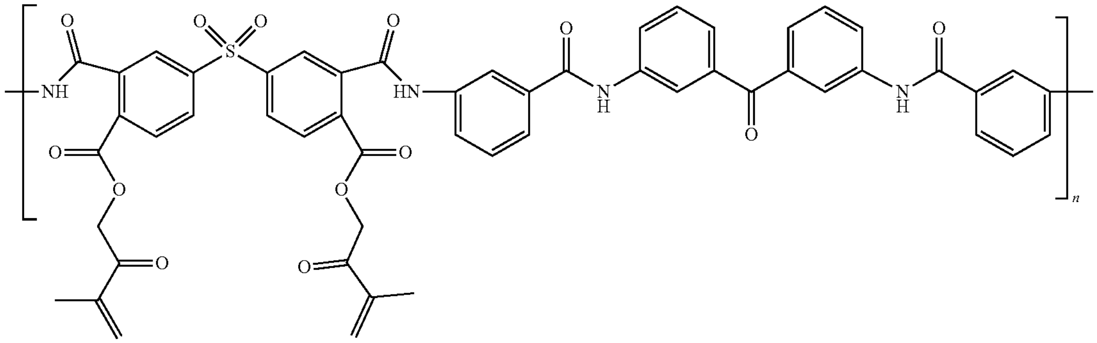
P1-255
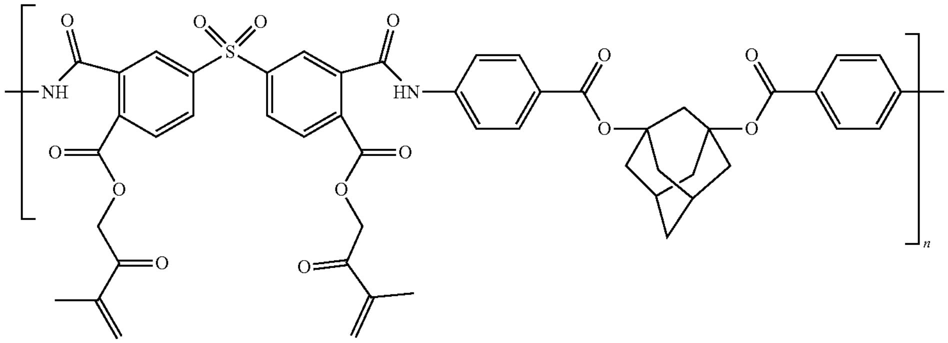
P1-256
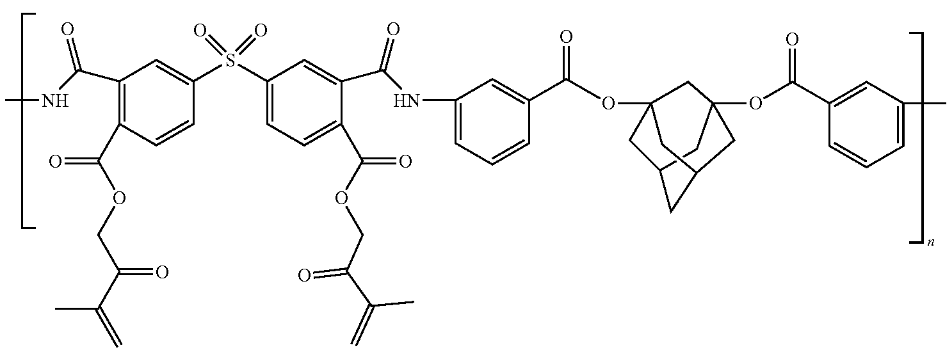
P1-257
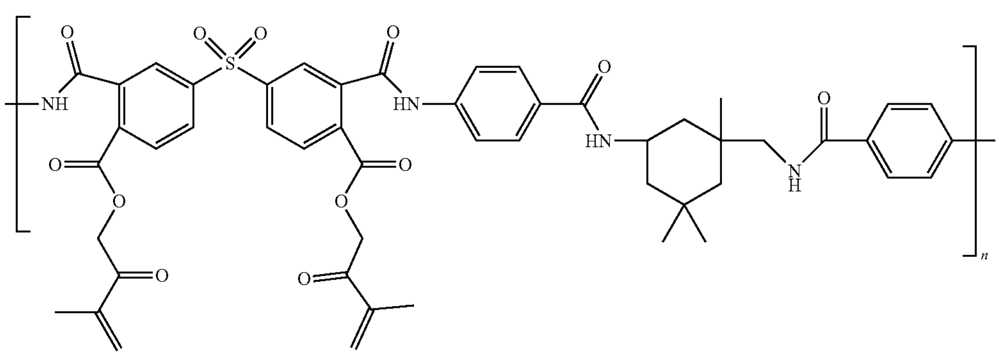

-continued

P1-258

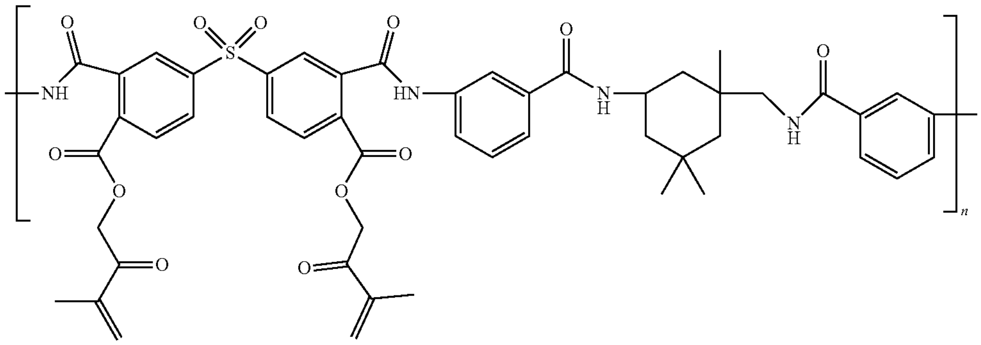

P1-259

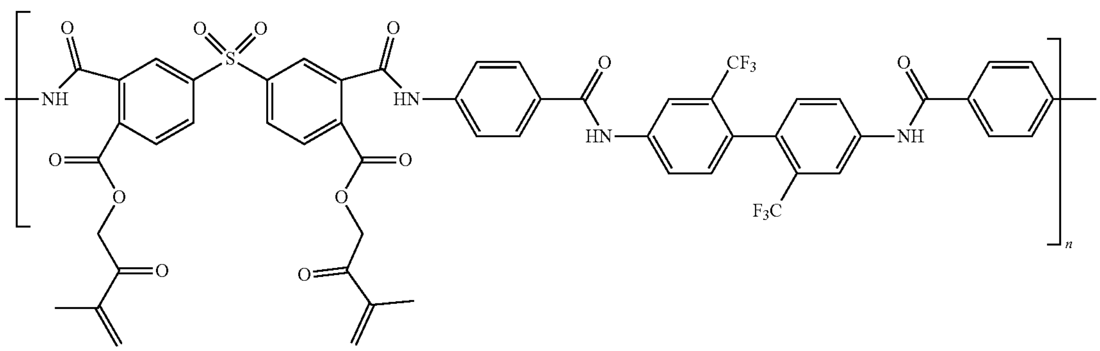

P1-260

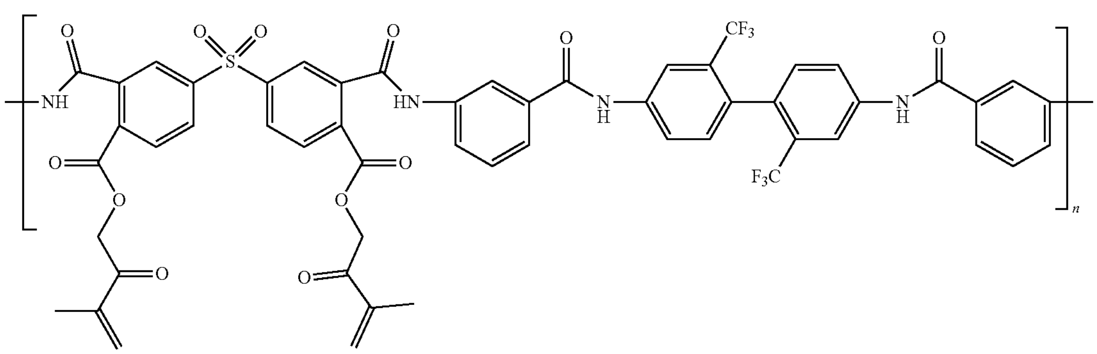

The photosensitive resin composition according to the present disclosure may include one or more compounds represented by Formula 1 above.

The compound of Formula 1 may have a weight average molecular weight (Mw), for example, 5,000 to 200,000, or 8,000 to 50,000. When the molecular weight of the compound is too small, it is difficult to properly implement the role as a base resin of the photosensitive resin composition, and when the molecular weight is too large, compatibility with other materials included in the photosensitive resin composition may be lowered.

The photosensitive resin composition according to the present disclosure may further include a polymeric binder including a carboxyl group, a photocrosslinking agent, an organic solvent, and a photoinitiator, in addition to the compound represented by Formula 1 above.

The photosensitive resin composition of the present disclosure may comprise a compound represented by Formula 1 in an amount of 10% to 70% by weight, or 10% to 60% or 20% to 30% by weight based on solid content. When the content of the compound represented by Formula 1 included in the photosensitive resin composition satisfies the above range, the photosensitive resin composition may have high-resolution patterning at low light intensity and excellent cured film properties.

When the photosensitive resin composition is used for alkali development, the polymeric binder containing a carboxyl group can improve pattern processing performance in an alkali developer and compensate for insufficient developability.

One or more polymers containing a carboxyl group may be mixed and used as the polymeric binder. For example, an acrylate resin may be used as a polymer binder containing a carboxyl group, but is not limited thereto.

The concentration of the carboxyl group contained in the polymeric binder may be 30 to 130 mol % based on the repeating unit of the polymer. When it is smaller than this, there is little solubility as an alkali developer, and when it is larger than this, the film thickness may increase during development.

The photocrosslinking agent may be, for example, a polyfunctional (meth)acrylate compound, an epoxy compound, a hydroxymethyl group substituted phenol compound, or a compound having an alkoxy alkylated amino group. In particular, among the above compounds, (meth) acrylate compounds are preferred. The photosensitive resin composition of this invention may comprise one or more types of photocrosslinking agents. The content ratio of the crosslinking agent can be determined by appropriately selecting an amount by which the film formed by the photosensitive resin composition can be sufficiently cured.

An organic solvent may be included in order to adjust the viscosity, storage stability and coating properties of the photosensitive resin composition. For example, at least one of aprotic solvents such as N,N-dimethylformamide, N,N-dimethylacetamide, N-methyl-2-pyrrolidone, γ-butyrolactone, and dimethyl sulfoxide; and organic solvents such as propylene glycol monomethyl ether acetate, propylene glycol monoethyl ether acetate, propylene glycol monopropyl ether acetate, and propylene glycol monobutyl ether acetate may be used.

The type of the photoinitiator is not particularly limited as long as it can initiate polymerization and/or crosslinking reaction of the photosensitive resin composition by irradiation of light.

The photosensitive resin composition according to the present disclosure may further include additives such as photosensitizers, adhesion aids, and surfactants.

A photosensitizer may be added to obtain high sensitivity and resolution after development.

Adhesion aid is for improving the adhesion of the film formed of the photosensitive resin composition, for example, one or more of organosilicon compounds such as aminopropylethoxysilane, glycidoxy propyltrimethoxysilane, oxypropyltrimethoxysilane; aluminum chelate compounds; and a titanium chelate compound may be used.

The surfactant is for improving properties such as coating properties, defoaming properties, and leveling properties of the composition, and for example, at least one of a fluorine-based and a silicone-based surfactant may be used.

Film and Electronic Devices

According to another embodiment of the present disclosure, it provides a film including a cured product of the photosensitive resin composition described above. Specifically, the film means a film form obtained by drying the above-described photosensitive resin composition or a film form in which the photosensitive resin composition is photocured or thermoset.

The above-described film can be prepared by applying and drying a photosensitive resin composition on a support by a known method. It is preferable that the said support can peel the photosensitive resin composition layer, and the light transmittance is good. In addition, it is preferable that the support has good surface smoothness.

A specific example of the support may be plastic film such as polyethylene terephthalate, polyethylene naphthalate, polypropylene, polyethylene, cellulose triacetic acid, cellulose diacetic acid, poly(meth)acrylic acid alkyl ester, poly (meth)acrylic acid ester copolymer, polychlorinated vinyl, polyvinyl alcohol, polycarbonate, polystyrene, cellophane, polyvinylidene chloride copolymer, polyamide, polyimide, vinyl chloride-vinyl acetate copolymer, polytetrafluoroethylene, and polytrifluoroethylene. In addition, a composite material composed of two or more of these can also be used, and a polyethylene terephthalate film excellent in light transmittance is particularly preferred. The thickness of the support may be 5 to 150 μm or 10 to 50 μm.

The method of applying the photosensitive resin composition is not particularly limited, and for example, it may be a spray method, a roll coating method, a rotation coating method, a slit coating method, an extrusion coating method, a curtain coating method, a die coating method, a wire bar coating method, a knife coating method or the like. Drying of the photosensitive resin composition varies depending on the type and content ratio of each component or organic solvent, but may be performed at 60° C. to 100° C. for 30 seconds to 15 minutes.

The film thickness of the dry film after drying and curing is 5 to 95 μm, and more specifically 10 to 50 μm.

The film may be used as one of a base film of a substrate for a display device, an insulating layer of a substrate for a display device, an interlayer insulating film for a display panel, a pixel defining film or a bank layer for a display panel, a solder resistor for a display panel, a black matrix for a display panel, a color filter substrate for a display panel, a protective film for a circuit board, a base film for a circuit board, an insulating layer for a circuit board, an interlayer insulating film for a semiconductor, or a solder resist.

Meanwhile, according to another embodiment of the present disclosure, a panel including an organic electric element including the above-described film and an electronic device including a driving circuit driving the panel are provided. Hereinafter, it is exemplarily described that the above-described film is used as a pixel defining layer or bank for a display panel that defines each pixel of an organic electronic element, but the present disclosure is not limited thereto.

A film used as a pixel defining layer for a display panel is meant to include a film or a processed product of the film, for example, a processed product or a photoreactive material laminated on a certain substrate.

After pre-lamination of the film at a temperature of 20° C. to 50° C. by a method such as flat pressing or roll pressing on the formation surface of the panel, a photosensitive film can be formed by vacuum lamination at 60° C. to 90° C.

In addition, the film may form a pattern by exposing the film to light using a photomask to form a fine configuration or fine width line. The exposure amount may be appropriately adjusted according to the type of light source used for UV exposure and the thickness of the film film, and may be, for example, 100 to 1200 $m/cm^2$, and more specifically, 100 to 500 $m/cm^2$, but is not limited thereto.

Usable active rays include electron beams, ultraviolet rays, X-rays, and the like, preferably ultraviolet rays may be used. In addition, the light source that can be used is a high-pressure mercury lamp, a low-pressure mercury lamp, or a halogen lamp.

When developing after exposure, a spray method is generally used. The photosensitive resin composition is developed using an aqueous alkali solution such as an aqueous sodium carbonate solution, and washed with water. Thereafter, the polyamic acid is changed to polyimide according to the pattern obtained by development through a heat treatment process. The heat treatment temperature may be 100° C. to 250° C. required for imidization. At this time, it is effective to continuously increase the heating temperature over 2 to 4 steps with an appropriate temperature profile. However, in some cases, it may be cured at a constant temperature. Through the above-described steps, a pixel defining layer or the like for a display panel may be obtained.

Further, the organic electronic element according to the present disclosure may be one of an organic light emitting diode (OLED), an organic solar cell, an organic photoconductor (OPC), an organic transistor (organic TFT), a single color or white lighting device.

The organic electronic element according to the present disclosure may be a top emission type, a bottom emission type, or a double-sided emission type depending on the material used.

A WOLED (White Organic Light Emitting Device) readily allows for the formation of ultra-high definition images, and is of excellent processability as well as enjoying the advantage of being produced using conventional color filter technologies for LCDs. In this regard, various structures for WOLEDs, used as back light units, have been, in the most part, suggested and patented. Representative among the structures are a parallel side-by-side arrangement of R (Red), G (Green), B (Blue) light-emitting units, a vertical stack arrangement of RGB light-emitting units, and a color conversion material (CCM) structure in which electroluminescence from a blue (B) organic light emitting layer, and photoluminescence from an inorganic luminescent using the electroluminescence are combined. The present disclosure is applicable to these WOLEDs.

Another embodiment of the present disclosure provides an electronic device including a display device, which includes the above described organic electronic element, and a control unit for controlling the display device. Here, the electronic device may be a wired/wireless communication terminal which is currently used or will be used in the future, and covers all kinds of electronic devices including a mobile communication terminal such as a cellular phone, a personal digital assistant (PDA), an electronic dictionary, a point-to-multipoint (PMP), a remote controller, a navigation unit, a game player, various kinds of TVs, and various kinds of computers.

Hereinafter, the synthesis example of the compound represented by Formula 1 and the preparation example of the photosensitive resin composition included in the photosensitive resin composition according to the present disclosure will be described in detail with reference to examples, but the preparation method of the compound of Formula 1 and the method of preparing photosensitive resin composition is not limited to the following examples.

The abbreviations used in the Synthesis Examples and Examples are as follows.

BPDA: 3,3',4,4'-Biphenyltetracarboxylic dianhydride
6FDA: 4,4'-(hexafluoroisopropylidene)diphthalic anhydride
BTDA: 3,3',4,4'-Benzophenone tetracarboxylic dianhydride
ODPA: 4,4'-Oxydiphthalic anhydride
DSDA: 3,3',4,4'-Diphenylsulfone tetracarboxylic dianhydride
NDA: naphthalene-1,4-diamine
TFDB: 2,2'-bis(trifluoromethyl)-[1,1'-biphenyl]-4,4'-diamine
ODA: 4,4'-oxydianiline
TDA: 4,4'-thiodianiline
MDA: 4,4'-methylenedianiline
HEA: 2-hydroxyethyl acrylate
HEMA: 2-hydoxyethyl methacrylate
GLM: Glycidyl methacrylate
NMP: N-methyl-2-pyrrolidone
GBL: γ-butyloractone
DCC: N,N'-Dicyclohexylcarbodiimide
PGMEA: Propylene glycol monomethyl ether acetate

SYNTHESIS EXAMPLE

The compound (final products) represented by Formula 1 according to the present disclosure is synthesized by the following reaction scheme, but the synthesis method of the compound is not limited thereto.

<Reaction Scheme 1>

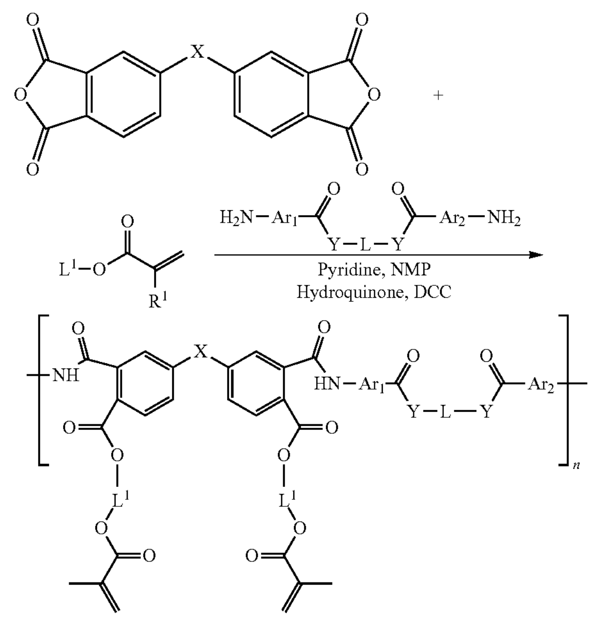

In Reaction Scheme 1, X, $L^1$, $R^1$, $Ar_1$, $Ar_2$, Y, L and n are the same as those defined in Formula 1 above.

Synthesis examples corresponding to Scheme 1 are as follows.

1. Synthesis Example of P1-3

<Reaction Scheme 2> Synthesis of Sub-1-1

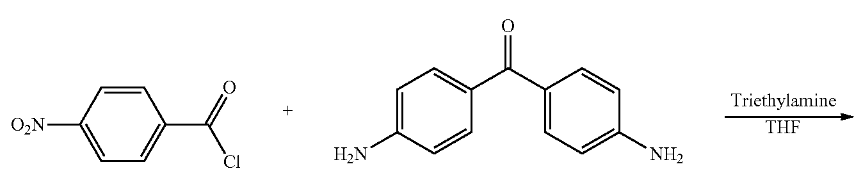

-continued

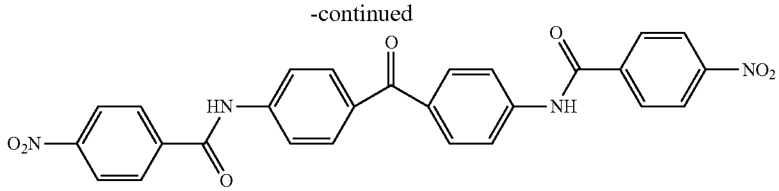

Add 50 g (0.24 mol) of 4-4'-diaminobenzophenone and 1500 mL of THF to a 5000 ml 5-neck round flask under a nitrogen atmosphere, and then mix until completely dissolved. In a 3000 mL beaker, add 87.43 g (0.47 mol) of 4-nitrobenzoyl chloride and 1500 mL of THF, mix vigorously, and slowly drop in a bis(4-aminophenyl)methanone solution. 149 mL of pyridine was added as a catalyst and mixed at room temperature for 6 hours in a nitrogen atmosphere. The precipitate was filtered out of the synthesized solution to obtain a powder, and washed with 2 L of distilled water. After repeating this process twice, it is washed in a mixed solvent of distilled water and ethanol (v/v=8/2) to obtain a filtered powder. The obtained product was vacuum-dried in a vacuum oven at 100° C. for 12 hours to obtain 99 g of Sub-1-1.

<Reaction Scheme 3> Synthesis of Sub-1

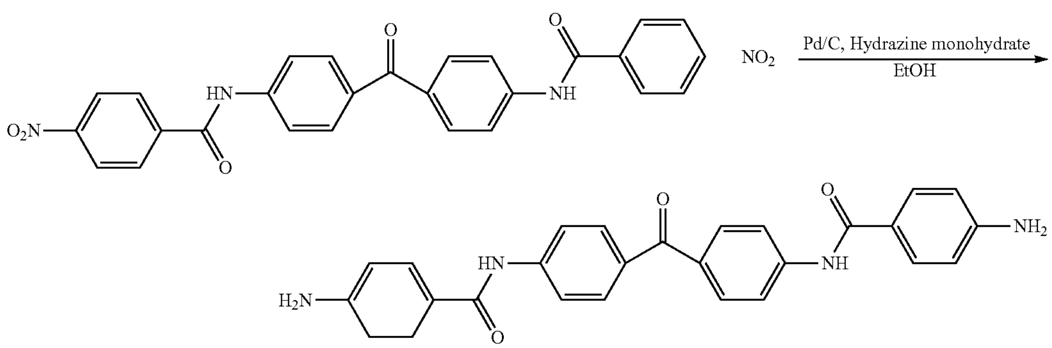

Sub-1-1 99.0 g (0.19 mol) was put into a 5000 mL 5-neck round flask and 2200 mL ethanol was added to completely dissolve at 60° C. Pd/C 2.11 g (0.02 mol) and hydrazine monohydrate 90.28 g (1.78 mol) were added and mixed for 12 hours in a nitrogen atmosphere to proceed with hydrogenation. After completion of the hydrogenation reaction, the solution obtained by filtering out the Pd/C catalyst was precipitated in 2 L of distilled water to obtain a product again, and dried in a vacuum oven at 100° C. for 12 hours to obtain 73 g of Sub-1.

<Reaction Scheme 4> Synthesis of P1-3

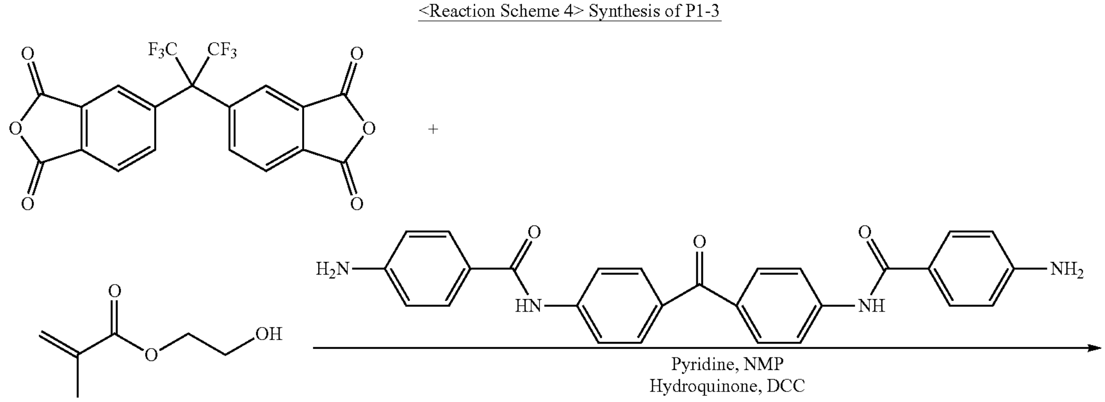

-continued

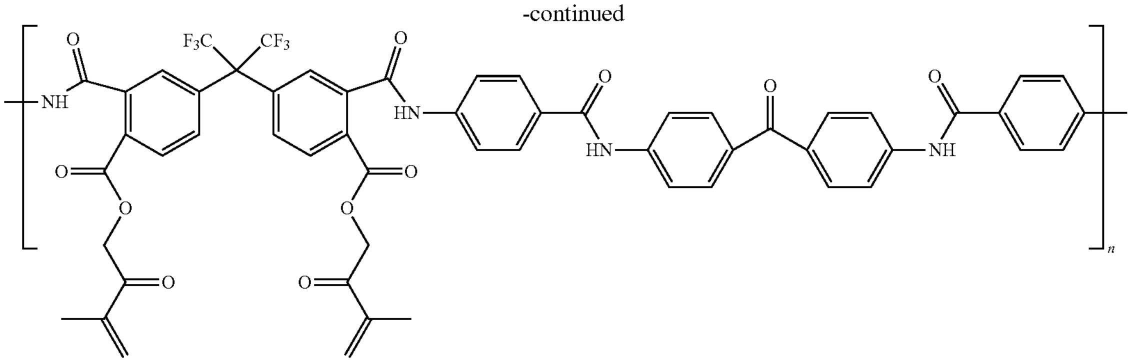

P1-3

6FDA 17.20 g (0.04 mol), HEMA 11.09 g (0.09 mol), pyridine 13.48 g (0.17 mol), hydroquinone 0.16 g (0.0014 mol), and NMP 35 g were added in a 250 ml three-necked flask under nitrogen atmosphere, the temperature was raised to 70° C. and the mixture was stirred for 10 hours. The completely dissolved solution was cooled at room temperature, NMP 29 g was added, DCC 15.98 g (0.077 mol) was added under ice-base and stirred for 2 hours, and then Sub-1 17.44 (0.038 mmol) dissolved in NMP 29 g added dropwise slowly, the mixture was stirred for 1 hour under ice-base, and stirred at room temperature for 8 hours. The reaction-completed compound was slowly added dropwise to a mixture of ethanol:water=1:1 to solidify, and then dried in a vacuum drying oven at 50° C. for one day to obtain 42.7 g of a polyamic ester resin.

2. Synthesis Example of P1-51

<Reaction Scheme 5> Synthesis of P1-51

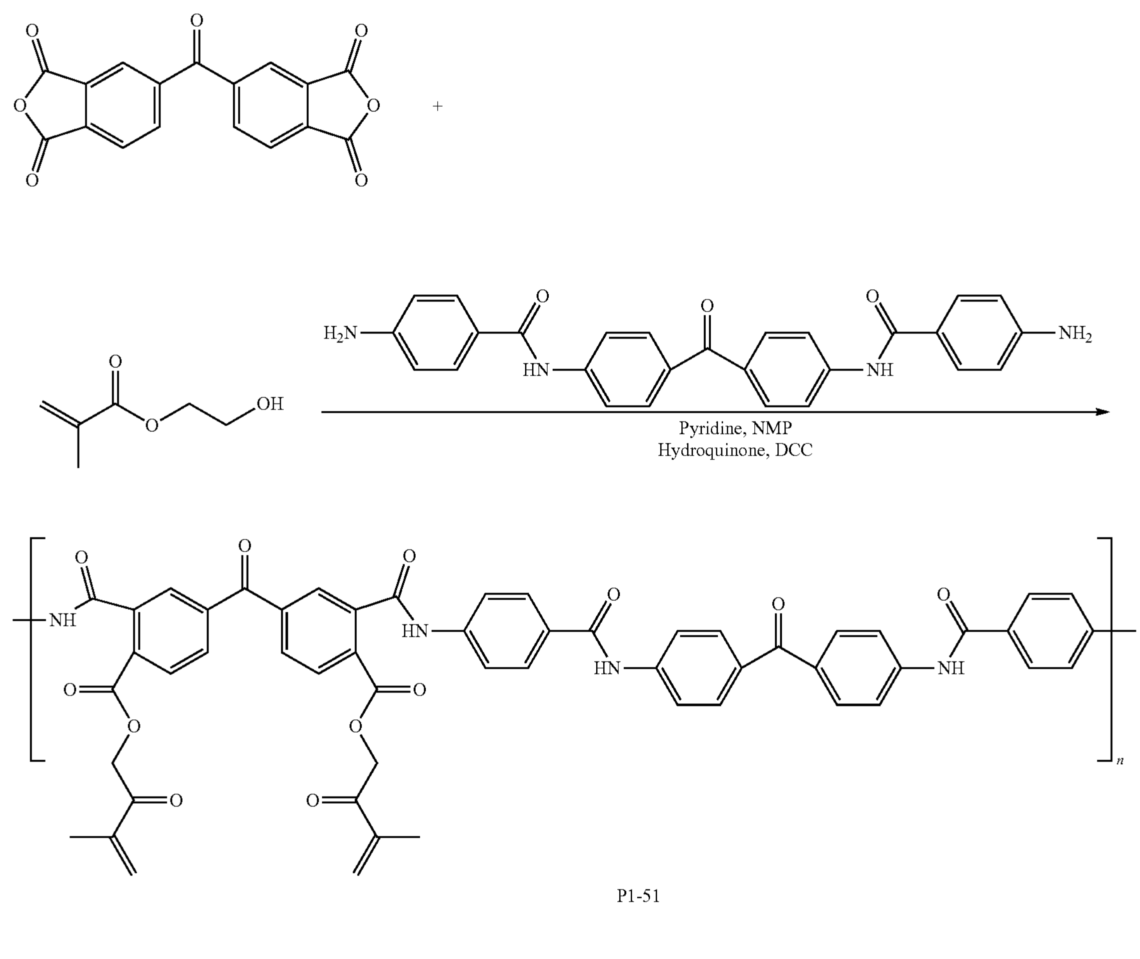

P1-51

BTDA 23.0 g (0.07 mol), HEMA 20.44 g (0.15 mol), pyridine 24.84 g (0.31 mol), hydroquinone 0.29 g (0.0026 mol), and NMP 55 g were added in a 500 ml three-necked flask under a nitrogen atmosphere, the temperature was raised to 70° C. and the mixture was stirred for 10 hours. The completely dissolved solution was cooled at room temperature, NMP 45 g was added, DCC 29.45 g (0.14 mol) was added under ice-base, stirred for 2 hours, and then Sub-1 32.16 (0.07 mmol) dissolved in NMP 46 g and added dropwise slowly. The mixture was stirred for 1 hour under ice-base and 8 hours at room temperature. The reaction-completed compound was slowly added dropwise to a mixture of ethanol:water=1:1 to solidify, and then dried in a vacuum drying oven at 50° C. for one day to obtain 70.3 g of a polyamic ester resin.

3. Synthesis Example of P1-81

<Reaction Scheme 6> Synthesis of Sub-2-1

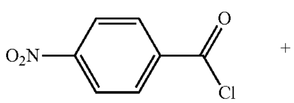

-continued

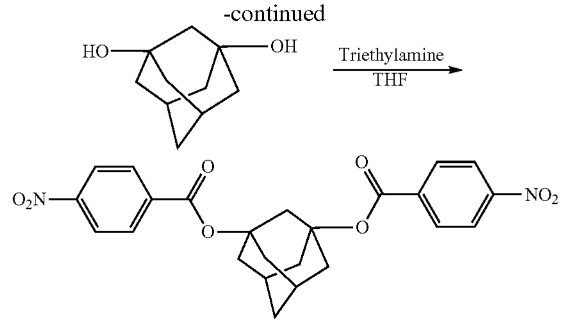

After cooling a 5000 ml 5-neck round flask in a nitrogen atmosphere to 0° C. using an ice bath, THF 2300 ml, Triethylamine 33.08 g (0.33 mol), Hydroquinone 25.0 g (0.15 mol) and 4-nitrobenzyl chloride 57.9 g (0.31 mol) were added and the mixture was stirred for 4 hours to raise the temperature to room temperature. The precipitate was filtered out of the synthesized solution to obtain a powder, and washed with 2 L of distilled water. After repeating this process twice, it is washed in a mixed solvent of distilled water and ethanol (v/v=8/2) to obtain a filtered powder. The obtained product was vacuum-dried in a vacuum oven at 100° C. for 12 hours to obtain 57 g of Sub-2-1.

<Reaction Scheme 7> Synthesis of Sub-2

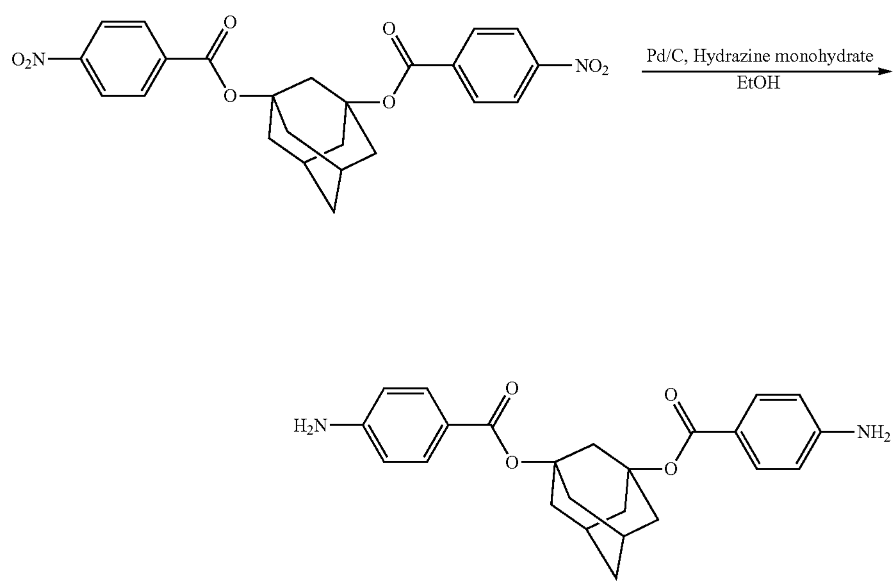

Sub-2-1 36.6 g was put into a 5000 mL 5-neck round flask, and 3500 mL ethanol was added to completely dissolve at 60° C., and then Pd/C 1.33 g (0.01 mol) and hydrazine monohydrate 56.2 g (1.12 mol) were added, and mixed in a nitrogen atmosphere for 12 hours to proceed with hydrogenation. After completion of the hydrogenation reaction, the solution obtained by filtering the Pd/C catalyst was precipitated in 2 L of distilled water to obtain a product again, and dried in a vacuum oven at 100° C. for 12 hours to obtain 43 g of Sub-2.

<Reaction Scheme 8> Synthesis of P1-81

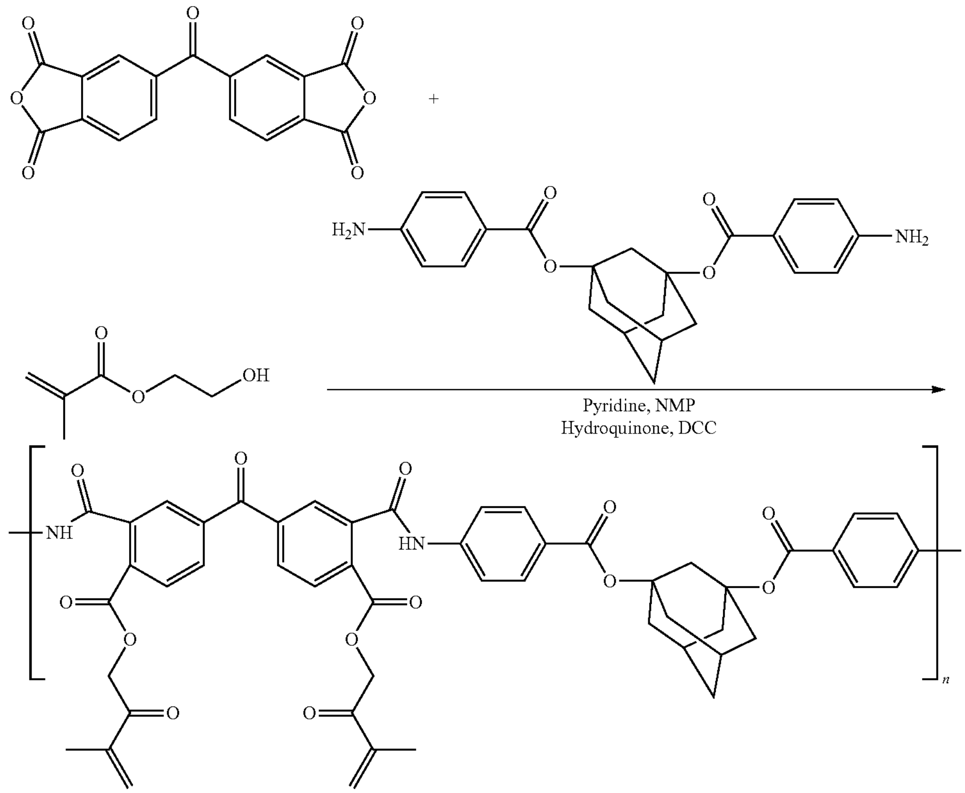

P1-81

BTDA 19.3 g (0.06 mol), HEMA 17.15 g (0.13 mol), pyridine 20.85 g (0.26 mol), hydroquinone 0.24 g (0.0022 mol), and NMP 43 g were added in a 500 ml three-necked flask under a nitrogen atmosphere, the temperature was raised to 70° C. and the mixture was stirred for 10 hours. The completely dissolved solution was cooled at room temperature, NMP 36 g was added, DCC 29.45 g (0.14 mol) was added under ice-base, stirred for 2 hours, and then Sub-2 24.35 (0.06 mmol) dissolved in NMP 36 g added dropwise slowly, and the mixture was stirred for 1 hour under ice-base, and was stirred at room temperature for 8 hours. The reaction-completed compound was slowly added dropwise to a mixture of ethanol:water=1:1 to solidify, and then dried in a vacuum drying oven at 50° C. for one day to obtain 56.54 g of a polyamic ester resin.

4. Synthesis Example of P1-93

<Reaction Scheme 9> Synthesis of Sub-3-1

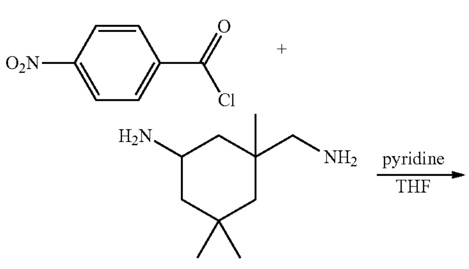

-continued

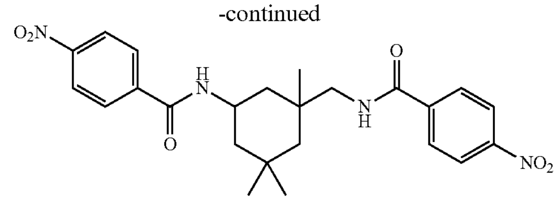

In a 5000 ml 5-neck round flask under a nitrogen atmosphere, 30 g (0.18 mol) of 3-(aminomethyl)-3,5,5-trimethylcyclohexan-1-amine and 1500 mL of THF were added and then mixed until completely dissolved. In a 3000 mL beaker, 65.38 g (0.35 mol) of 4-nitrobenzoyl chloride and 1500 mL of THF were added, mixed vigorously, and slowly dropped into 3-(aminomethyl)-3,5,5-trimethylcyclohexan-1-amine solution. 200 mL of pyridine was added as a catalyst and mixed at room temperature for 6 hours in a nitrogen atmosphere. The precipitate was filtered out of the synthesized solution to obtain a powder, and washed with 2 L of distilled water. After repeating this process twice, it is washed in a mixed solvent of distilled water and ethanol (v/v=8/2) to obtain a filtered powder. The obtained product was vacuum-dried in a vacuum oven at 100° C. for 12 hours to obtain 48 g of Sub-3-1.

<Reaction Scheme 10> Synthesis of Sub-3

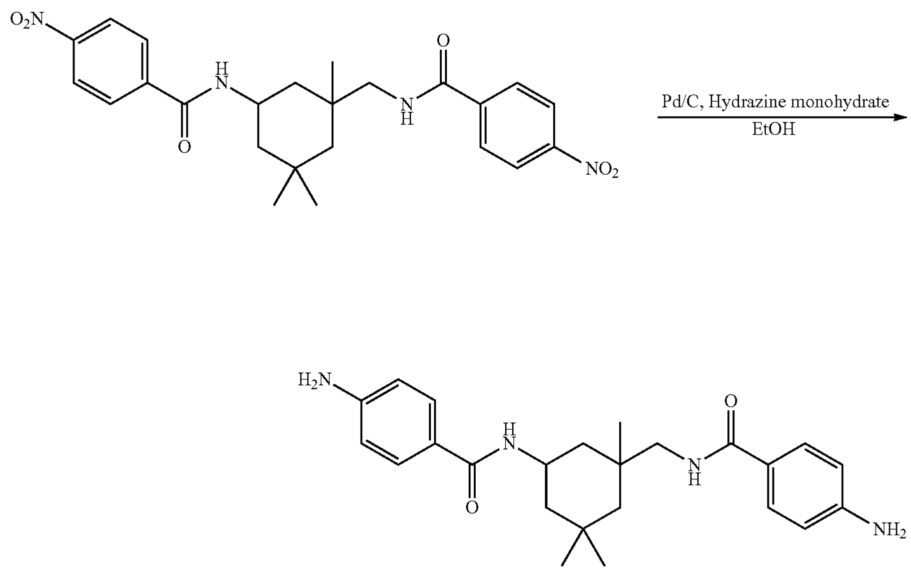

Sub-3-1 36.6 g (0.08 mol) was put into a 5000 mL 5-neck round flask and 2500 mL ethanol was added to completely dissolve at 60° C., and then Pd/C 0.85 g (0.01 mol) and hydrazine monohydrate 35.98 g (0.72 mol) were added and mixed for 12 hours in a nitrogen atmosphere to proceed with hydrogenation. After completion of the hydrogenation reaction, the solution obtained by filtering out the Pd/C catalyst was precipitated in 2 L of distilled water to obtain a product again, and dried in a vacuum oven at 100° C. for 12 hours to obtain 25 g of Sub-3.

<Reaction Scheme 11> Synthesis of P1-93

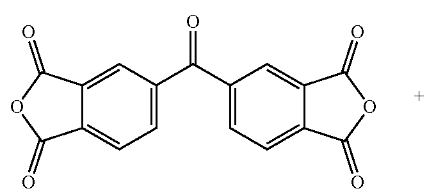

-continued

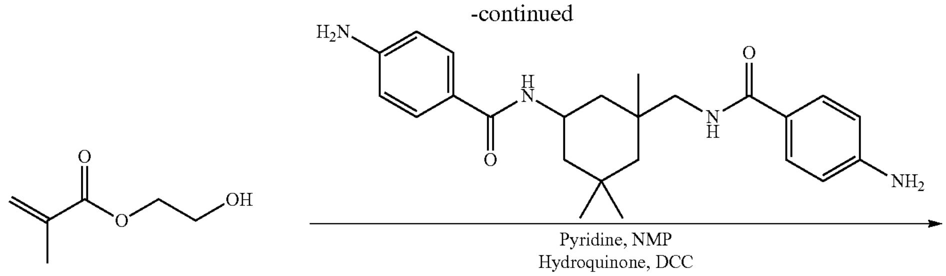

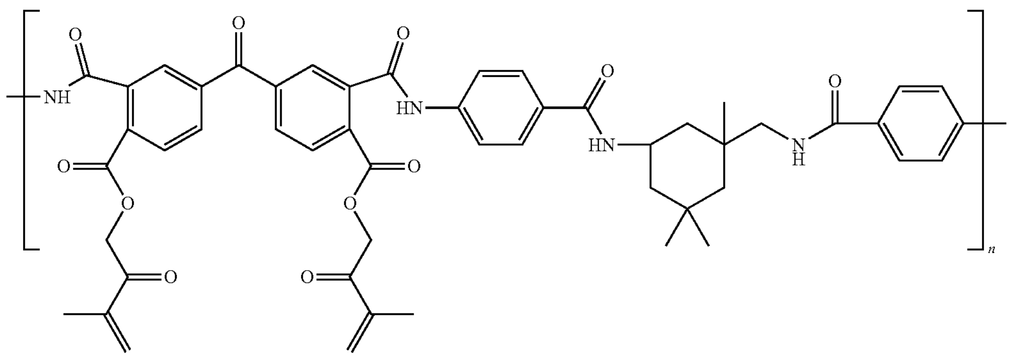

P1-93

BTDA 16.5 g (0.05 mol), HEMA 14.66 g (0.11 mol), pyridine 17.82 g (0.22 mol), hydroquinone 0.21 g (0.0019 mol) and NMP 37 g were added in a 500 ml three-necked flask under a nitrogen atmosphere, the temperature was raised to 70° C. and the mixture was stirred for 10 hours. The completely dissolved solution was cooled at room temperature, 31 g of NMP was added, DCC 21.13 g (0.10 mol) was added under ice-base, and stirred for 2 hours, and then 20.92 g (0.05 mmol) of Sub-3 dissolved in 31 g of NMP added drowise slowly, the mixture was stirred for 1 hour under ice-base and stirred at room temperature for 8 hours. The reaction-completed compound was slowly added dropwise to a mixture of ethanol:water=1:1 to solidify, and then dried in a vacuum drying oven at 50° C. for one day to obtain 48.9 g of a polyamic ester resin.

5. Synthesis Example of P1-253

<Reaction Scheme 12> Synthesis of P1-253

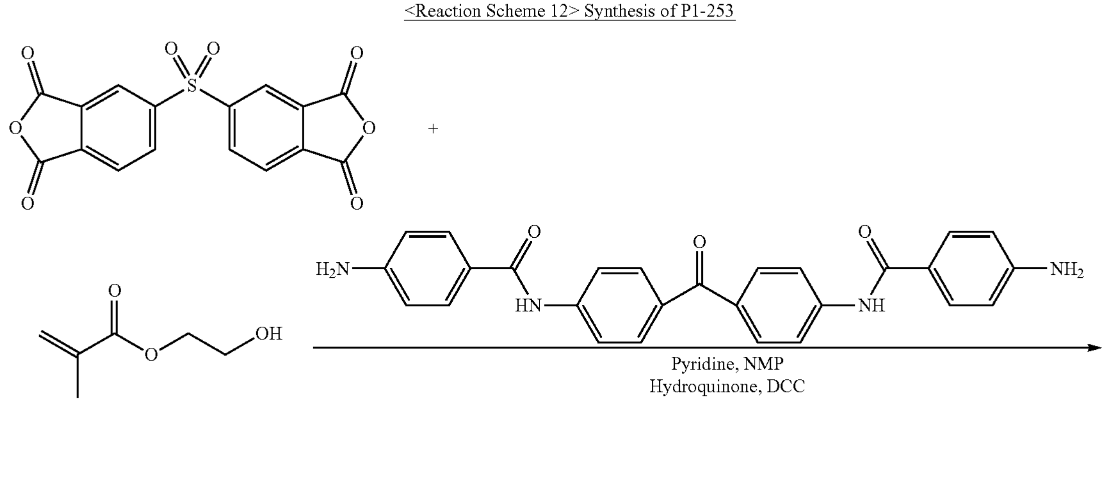

-continued

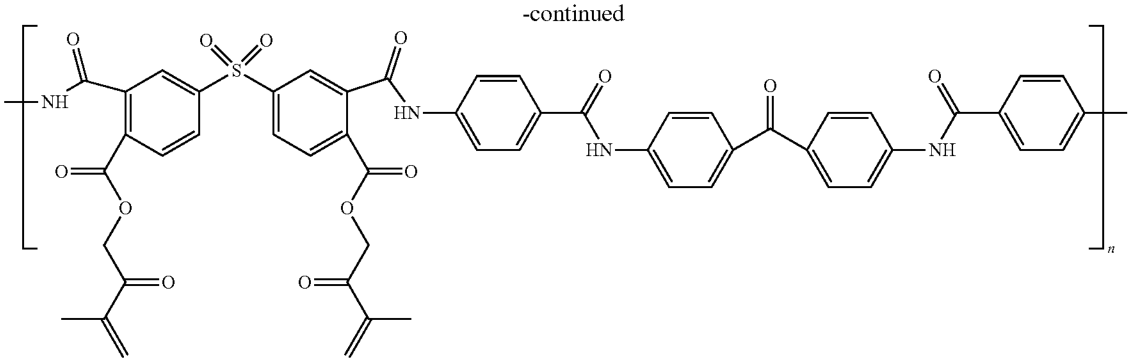

P1-253

DSDA 17.91 g (0.05 mol), HEMA 14.31 g (0.11 mol), pyridine 17.40 g (0.22 mol), hydroquinone 0.2 g (0.0018 mol), and NMP 40 g were added in a 500 ml three-necked flask under a nitrogen atmosphere, the temperature was raised to 70° C. and the mixture was stirred for 10 hours. The completely dissolved solution was cooled at room temperature, NMP 34 g was added, DCC 20.63 g (0.10 mol) was added under ice-base, stirred for 2 hours, and then Sub-1 22.52 (0.05 mmol) dissolved in NMP 34 g added dropwise slowly. The mixture was stirred for 1 hour under ice-base and 8 hours at room temperature. The reaction-completed compound was slowly added dropwise to a mixture of ethanol:water=1:1 to solidify, and then dried in a vacuum drying oven at 50° C. for one day to obtain 50.36 g of a polyamic ester resin.

COMPARATIVE EXAMPLE

The compound of Comparative Example is synthesized by the following reaction scheme.

Comparative Example 1

<Reaction Scheme 13>

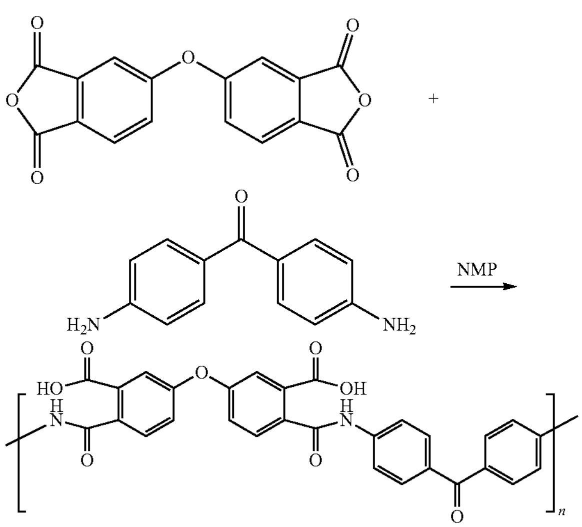

비교예 1

ODA 10 g (0.05 mol) and NMP 20 g were put in a 250 ml 3-neck flask in a nitrogen atmosphere and dissolved at room temperature. After cooling the dissolved solution to 0° C., 10.61 g (0.05 mol) of bis(4-aminophenyl)methanone was slowly added, and 28 g of NMP was added, followed by stirring for 3 hours. 34.4 g of NMP was added to the mixed solution, and after stirring at room temperature for 10 hours, 103 g of varnish having a final viscosity of 100 to 5000 cps (measured at 25° C.) was obtained.

Comparative Example 2

<Reaction Scheme 14>

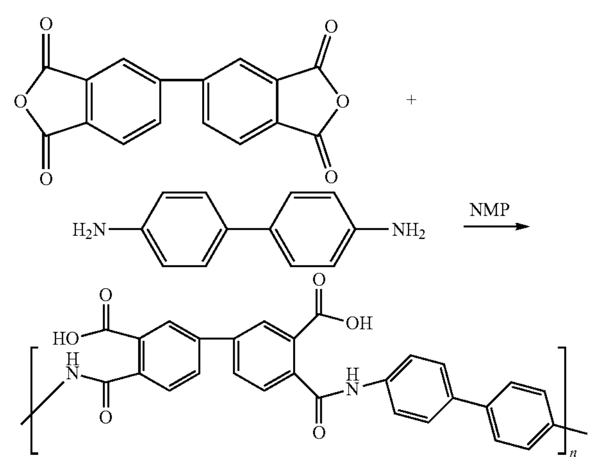

비교예 2

In a 250 ml 3-neck flask in a nitrogen atmosphere, 9.21 g (0.05 mol) of benzidine and 25 g of NMP were added and dissolved at room temperature. After cooling the dissolved solution to 0° C., 14.7 g (0.05 mol) of BPDA was slowly added thereto, and 30.79 g of NMP was added, followed by stirring for 3 hours. NMP 39 g was added to the mixed solution, and after stirring at room temperature for 10 hours, 119.5 g of varnish having a final viscosity of 100 to 5000 cps (measured at 25° C.) was obtained.

Preparation of Photosensitive Resin Composition

The photosensitive resin composition of Examples and Comparative Examples, in addition to the polyamic ester compound of Formula 1 and the compound of Comparative Example, includes the following components.

(A) A Polymeric Binder Containing a Carboxyl Group

Cardo binder resin (A-1, acid value: 110, Mw: 9800) as follows was used.

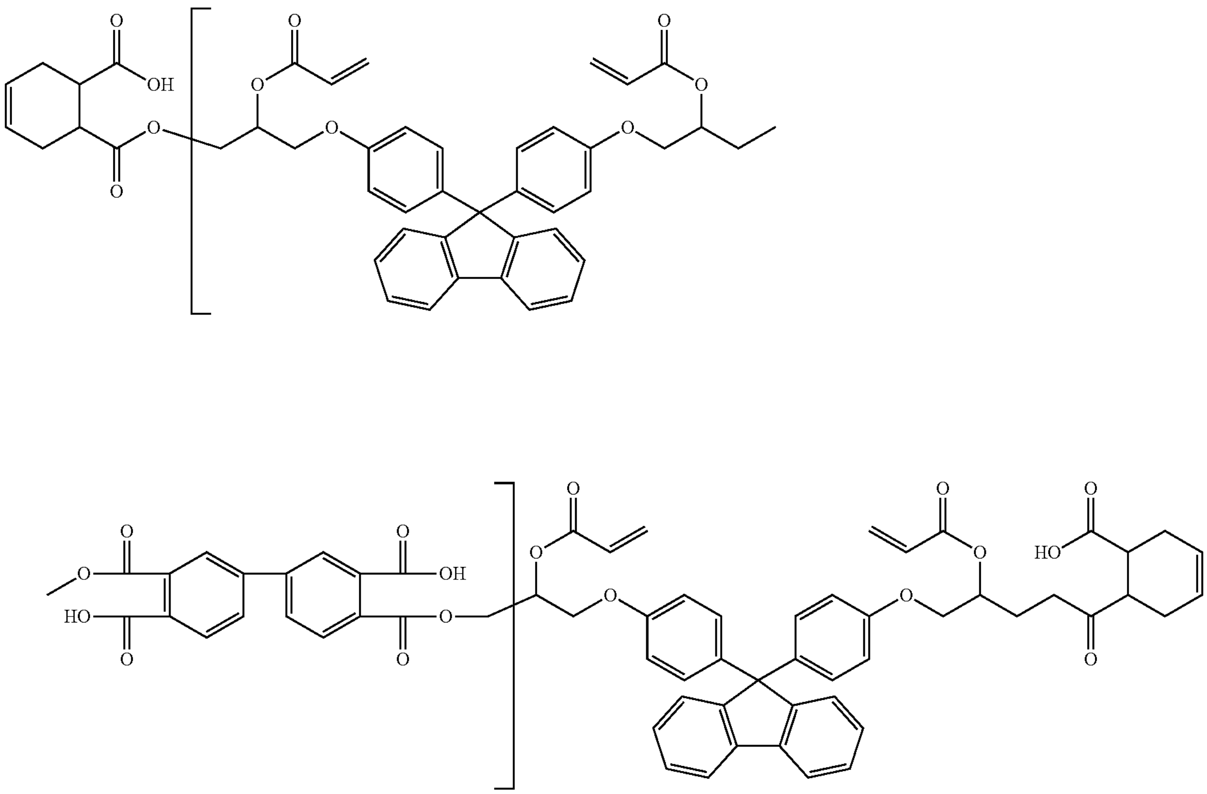

(B) Photocrosslinking Agent

As a photocrosslinking agent, the following dipentaerythritol hexaacrylate (M-1, Dipentaerythritol Hexaacrylate) was used.

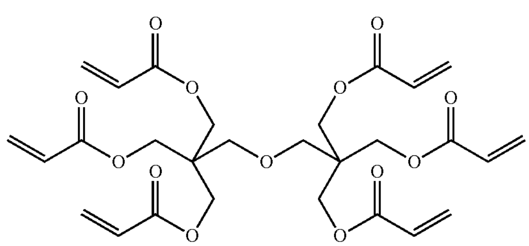 [SMILES: C=CC(=O)OCC(COCC(COC(=O)C=C)(COC(=O)C=C)COC(=O)C=C)(COC(=O)C=C)COC(=O)C=C]

(C) Photoinitiator

As a photoinitiator, the following compounds (I-1, 1-[4-(phenylthio)phenyl]-2-(O-benzoyloxime)-1,2-octanedione) was used.

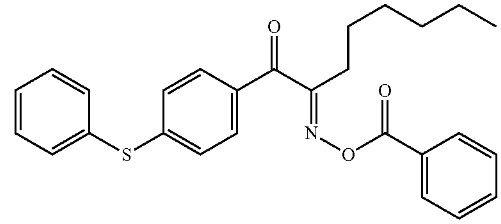 [SMILES: CCCCCC/C(=N\OC(=O)c1ccccc1)C(=O)c1ccc(Sc2ccccc2)cc1]

(D) Organic Solvent

PGMEA (S-1) and NMP (S-2) were used as solvents.

(E) Photosensitizer

As a photosensitizer, the following benzantrone (E-1, benzanthrone) was used.

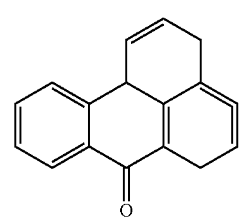 [SMILES: O=C1C2=C3C(=C=CC2)CC=CC3c2ccccc21]

The photosensitive resin compositions of Examples and Comparative Examples include the above components as described in Table 1 below.

TABLE 1

| | Resin | | Binder | | Organic Solvent | | Crosslinking agent | | Photoinitiator | | Adhesion aid | |
|---|---|---|---|---|---|---|---|---|---|---|---|---|
| | Compound | amount | Compound | amount | Compound | amount | Compound | amount | Compound | amount | Compound | amount |
| Example 1 | P1-3 | 6.15 | A-1 | 6.15 | S-1<br>S-2 | 64<br>16 | M-1 | 7 | I-1 | 0.4 | E-1 | 0.3 |
| Example 2 | P1-51 | 6.15 | A-1 | 6.15 | S-1<br>S-2 | 64<br>16 | M-1 | 7 | I-1 | 0.4 | E-1 | 0.3 |
| Example 3 | P1-81 | 6.15 | A-1 | 6.15 | S-1<br>S-2 | 64<br>16 | M-1 | 7 | I-1 | 0.4 | E-1 | 0.3 |
| Example 4 | P1-113 | 6.15 | A-1 | 6.15 | S-1<br>S-2 | 64<br>16 | M-1 | 7 | I-1 | 0.4 | E-1 | 0.3 |
| Example 5 | P1-253 | 6.15 | A-1 | 6.15 | S-1<br>S-2 | 64<br>16 | M-1 | 7 | I-1 | 0.4 | E-1 | 0.3 |
| Comparative Example 1 | Comparative Example 1 | 6.15 | A-1 | 6.15 | S-1<br>S-2 | 64<br>16 | M-1 | 7 | I-1 | 0.4 | E-1 | 0.3 |
| Comparative Example 2 | Comparative Example 2 | 6.15 | A-1 | 6.15 | S-1<br>S-2 | 64<br>16 | M-1 | 7 | I-1 | 0.4 | E-1 | 0.3 |

The amount of Table 1 is based on mass %, and the physical properties of the photosensitive resin composition were evaluated in the following manner, and the results are shown in Table 2 below.

Resolution Evaluation

A photosensitive resin layer having a thickness of 10 μm was formed by spin coating the photosensitive resin composition prepared in Examples and Comparative Examples on a 100*100 mm glass plate, and heating at 100° C. for 60 seconds on a hot plate. The glass substrate coated with the photosensitive resin layer was vacuum-bonded to the photomask, and then exposed from 30 mJ/cm$^2$ to 150 mJ/cm$^2$ using an i-line exposure machine. After completion of the exposure, it was developed in a 2.38 wt % tetramethylammonium hydroxide aqueous solution at 23° C. for 60 seconds, and washed with DI-water for 30 seconds to obtain a pattern in which the exposed portion remained clear. Thereafter, a final heat treatment was performed at 230° C. for 60 minutes using a baking oven to complete the patterning process. The heat treatment-completed pattern was measured for the resolution of each Example and Comparative Example through SEM analysis.

2. Evaluation of Residual Film Rate

The method of coating a photosensitive resin composition on a glass substrate, exposure, and heat treatment is the same as the resolution evaluation, and the thickness of the pattern that has not undergone the final heat treatment process and the pattern that has undergone the final heat treatment process is analyzed and compared by SEM, to evaluate the residual film rate.

Residual film rate=thickness of pattern before final heat treatment/thickness of pattern after final heat treatment×100

The evaluation results of each are shown in Table 2 below.

TABLE 2

| | Resolution by amount of light (μm) | | | | | | Residual film rate |
|---|---|---|---|---|---|---|---|
| | 30 mJ/cm$^2$ | 50 mJ/cm$^2$ | 80 mJ/cm$^2$ | 100 mJ/cm$^2$ | 120 mJ/cm$^2$ | 150 mJ/cm$^2$ | (%) |
| Example 1 | — | ≥10 | ≥10 | ≥5 | ≥5 | ≤5 | 89% |
| Example 2 | ≥10 | ≥5 | ≥5 | ≥5 | ≤10 | ≤10 | 83% |
| Example 3 | — | ≥10 | ≥5 | ≥5 | ≥5 | ≤5 | 88% |
| Example 4 | — | ≥5 | ≥5 | ≥5 | ≤10 | ≤10 | 87% |
| Example 5 | ≥10 | ≥5 | ≥5 | ≥5 | ≤10 | ≤10 | 82% |
| Comparative Example 1 | — | — | — | — | ≥20 | ≥20 | 71% |
| Comparative Example 2 | — | — | — | — | — | ≥20 | 73% |

In the evaluation of the resolution, in Example 1, the pattern was all dropped at 30 mJ/cm$^2$, and a pattern of a larger size including a 10 μm pattern was formed at 50 mJ/cm$^2$ and 80 mJ/cm$^2$. Patterns with a size larger than that including 5 μm at 100 mJ/cm$^2$ and 120 mJ/cm$^2$ were formed, and at 150 mJ/cm$^2$, it was confirmed that the patterns of smaller size including 5 μm were connected to tangle together, and the patterns lager than 5 μm were formed.

In Example 2, a pattern having a size larger than that including a 10 μm pattern was formed at 30 mJ/cm$^2$. A pattern with a size larger than that including a 5 μm pattern was formed at 50 mJ/cm$^2$~100 mJ/cm$^2$. At 120 mJ/cm$^2$ and 150 mJ/cm2, it was confirmed that patterns of sizes smaller than that including 10 μm were connected to each other and entangled, and patterns of larger sizes were formed.

In Example 3, all of the patterns were peeled at 30 mJ/cm$^2$, and a pattern having a size larger than that including a 10 μm pattern was formed at 50 mJ/cm$^2$. Patterns with a size larger than that including 5 μm were formed at 80 mJ/cm$^2$~120 mJ/cm$^2$, and in the patterns of less than 5 μm at 150 mJ/cm$^2$, it was confirmed that the patterns were connected and entangled, and patterns of larger sizes were formed.

In Example 4, all of the patterns were peeled at 30 mJ/cm$^2$, and patterns of larger sizes, including a 5 μm pattern, were formed at 50 mJ/cm$^2$ to 100 mJ/cm$^2$. At 120 mJ/cm$^2$ and 150 mJ/cm$^2$, it was confirmed that the patterns of sizes of less than 10 μm, including 10 μm, were connected to each other and entangled, and a pattern of a larger size was formed.

In Example 5, a pattern having a size larger than that including a 10 μm pattern was formed at 30 mJ/cm$^2$. At 50 mJ/cm$^2$, 80 mJ/cm$^2$, and 100 mJ/cm$^2$, patterns of larger sizes including 5 μm patterns were formed. At 120 mJ/cm$^2$ and 150 mJ/cm$^2$, it was confirmed that patterns of sizes smaller than that including 10 μm were connected to each other and entangled, and patterns of larger sizes were formed.

In Comparative Example 1, a pattern having a size larger than that including a 20 μm pattern was formed at 120 mJ/cm$^2$ or more, and the pattern were peeled at an amount of light less than that.

In Comparative Example 2, a pattern having a size larger than that including a 20 μm pattern was formed at 150 mJ/cm$^2$ or more, and the pattern were peeled at an amount of light less than that.

In the evaluation of the residual film rate, Examples 2 and 5 confirmed the remaining film rate of 82% to 83%, and the remaining film rate of Examples 1, 3, and 4 was confirmed to be 87% to 89%. This is because in the case of Examples 1, 3, and 4, the distance between molecules became closer compared to Examples 2 and 5 due to the pi electron transition between molecules during the final heat treatment.

Comparative Examples 1 and 2 confirmed that the thickness of the film was reduced after the final heat treatment due to a low steric hindrance effect between molecules because the functional group was not included.

The present disclosure relates to a negative photosensitive resin composition capable of high-resolution patterning at low light intensity, has excellent pattern adhesion, fine patterning is possible, and it was confirmed that the cured film characteristics are excellent.

The above description is merely illustrative of the present disclosure, and those of ordinary skill in the art to which the present disclosure pertains will be able to make various modifications without departing from the essential characteristics of the present disclosure. Accordingly, the embodiments disclosed in the present disclosure are not intended to limit the present disclosure, but to explain the present disclosure, and the scope of the present disclosure are not limited by these embodiments.

The scope of protection of the present disclosure should be interpreted by the claims below, and all technologies within the scope equivalent thereto should be construed as being included in the scope of the present disclosure.

What is claimed is:

1. Photosensitive resin composition comprising a compound represented by the following Formula 1:

[Formula 1]

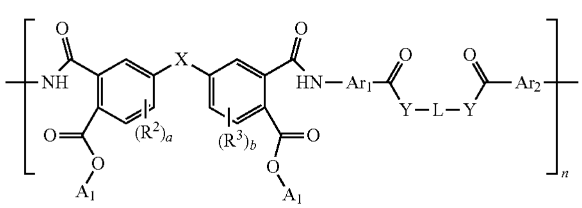

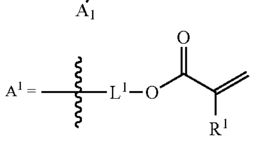

wherein in Formula 1,

X is selected from the group consisting of a single bond, O, S, $CR^aR^b$, NR, C═O, $SO_2$ and $C(CF_3)_2$, Y is selected from the group consisting of a single bond, O, S and NR, $R^a$ and $R^b$ are each independently selected from the group consisting of a hydrogen; a heavy hydrogen; a halogen; a $C_6$-$C_{60}$ aryl group; a $C_2$-$C_{60}$ heterocyclic group containing at least one heteroatom of O, N, S, Si, and P; a fused ring group of a $C_3$-$C_{60}$ aliphatic ring and a $C_6$-$C_{60}$ aromatic ring; a $C_1$-$C_{60}$ alkyl group; a $C_3$-$C_{60}$ cycloalkyl group; a $C_2$-$C_{60}$ alkenyl group; a $C_2$-$C_{60}$ alkynyl group; a $C_1$-$C_{60}$ alkoxy group; and a $C_6$-$C_{30}$ aryloxy group, $R^a$ and $R^b$ may be bonded to each other to form a spiro compound, R is selected from the group consisting of a hydrogen; a heavy hydrogen; a halogen; a $C_6$-$C_{60}$ aryl group; a $C_2$-$C_{60}$ heterocyclic group containing at least one heteroatom of O, N, S, Si, and P; a fused ring group of a $C_3$-$C_{60}$ aliphatic ring and a $C_6$-$C_{60}$ aromatic ring; a $C_1$-$C_{60}$ alkyl group; a $C_3$-$C_{60}$ cycloalkyl group; $C_2$-$C_{60}$ alkenyl group; a $C_2$-$C_{60}$ alkynyl group; a $C_1$-$C_{60}$ alkoxy group; and a $C_6$-$C_{30}$ aryloxy group, $R^1$ is selected from the group consisting of a hydrogen; a heavy hydrogen; a halogen; a $C_6$-$C_{60}$ aryl group; a $C_2$-$C_{60}$ heterocyclic group containing at least one heteroatom of O, N, S, Si, and P; a fused ring group of a $C_3$-$C_{60}$ aliphatic ring and a $C_6$-$C_{60}$ aromatic ring; a $C_1$-$C_{60}$ alkyl group; a $C_3$-$C_{60}$ cycloalkyl group; a $C_2$-$C_{60}$ alkenyl group; a $C_2$-$C_{60}$ alkynyl group; a $C_1$-$C_{60}$ alkoxy group; a $C_6$-$C_{30}$ aryloxy group; an ester group; and an ether group, $R^2$ and $R^3$ are each independently selected from the group consisting of a deuterium; a halogen; a $C_6$-$C_{60}$ aryl group; a $C_2$-$C_{60}$ heterocyclic group containing at least one heteroatom of O, N, S, Si, and P; a fused ring group of a $C_3$-$C_{60}$ aliphatic ring and a $C_6$-$C_{60}$ aromatic ring; a $C_1$-$C_{60}$ alkyl group; a $C_3$-$C_{60}$ cycloalkyl group; a $C_2$-$C_{60}$ alkenyl group; a $C_2$-$C_{60}$ alkynyl group; a $C_1$-$C_{60}$ alkoxy group; and a $C_6$-$C_{30}$ aryloxy group;

$L^1$ is selected from the group consisting of a single bond; a $C_6$-$C_{60}$ arylene group;

a fused ring group of a $C_3$-$C_{60}$ aliphatic ring and a $C_6$-$C_{60}$ aromatic ring; and a $C_2$-$C_{60}$ heterocyclic group containing at least one heteroatom of O, N, S, Si, and P; and a $C_1$-$C_{60}$ alkylene group, $Ar^1$ and $Ar^2$ are each independently selected from the group consisting of a $C_6$-$C_{60}$ arylene group; a fused ring group of a $C_3$-$C_{60}$ aliphatic ring and a $C_6$-$C_{60}$ aromatic ring; a $C_1$-$C_{60}$ alkylene group; $C_2$-$C_{60}$ alkenylene group; and a $C_2$-$C_{60}$ heterocyclic group containing at least one heteroatom of O, N, S, Si and P, n is an integer from 2 to 1000, a and b are each an integer of 1 to 3, and when a or b is 2 or more, a plurality of $R^2$s or a plurality of $R^{3s}$ may be bonded to each other to form a ring, L is selected from the group consisting of a single bond; a $C_6$-$C_{60}$ arylene group; a fused ring group of a $C_3$-$C_{60}$ aliphatic ring and a $C_6$-$C_{60}$ aromatic ring; and a $C_2$-$C_{60}$ heterocyclic group containing at least one heteroatom of O, N, S, Si, and P; a $C_1$-$C_{60}$ alkylene group; a $C_2$-$C_{60}$ alkenylene group; and the following Formulas 2-1 to 2-4,

[Formula 2-1]

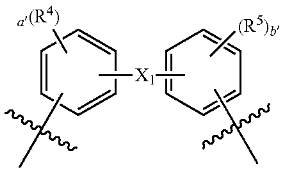

[Formula 2-2]

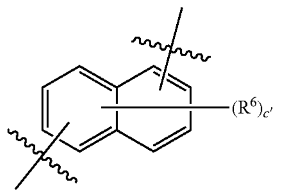

[Formula 2-3]

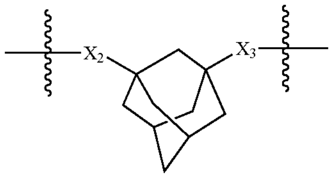

[Formula 2-4]

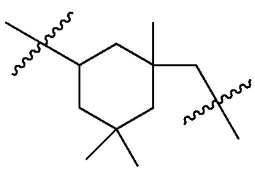

wherein in Formula 2-1 to Formula 2-4, $X_1$ to $X_3$ are each selected from the group consisting of a single bond, O, S, C═O, CR'R", and $SO_2$, R' and R" are each independently selected from the group consisting of a hydrogen; a deuterium; a halogen; a $C_6$-$C_{60}$ aryl group; a $C_2$-$C_{60}$ heterocyclic group containing at least one heteroatom of O, N, S, Si and P; a fused ring group of a $C_3$-$C_{60}$ aliphatic ring and a $C_6$-$C_{60}$ aromatic ring; a $C_1$-$C_{60}$ alkyl group; a $C_3$-$C_{60}$ cycloalkyl group; a $C_2$-$C_{60}$ alkenyl group; a $C_2$-$C_{60}$ alkynyl group; a $C_1$-$C_{60}$ alkoxy group; a $C_6$-$C_{60}$ aryloxy group; and $CF_3$, and R' and R" may be bonded to each other to form a spiro compound, $R^4$, $R^5$ and $R^6$ are each selected from the group consisting of a deuterium; a halogen; a $C_6$-$C_{60}$ aryl group; a $C_2$-$C_{60}$ heterocyclic group containing at least one heteroatom of O, N, S, Si, and P; a fused ring group of a $C_3$-$C_{60}$ aliphatic ring and a $C_6$-$C_{60}$ aromatic ring; a $C_1$-$C_{60}$ alkyl group; a $C_3$-$C_{60}$ cycloalkyl group; a $C_2$-$C_{60}$ alkenyl group; a $C_2$-$C_{60}$ alkynyl group; a $C_1$-$C_{60}$ alkoxy group; a $C_6$-$C_{60}$ aryloxy group; an ester group; an ether group; an amide group; an imide group; $CF_3$ and a cyano group, a' and b' are each an integer of 1 to 4, and when a' or b' is 2 or more, a plurality of $R^4$s or a plurality of $R^5$s may be bonded to each other to form a ring, c' is an integer of 1 to 6, and when c' is 2 or more, a plurality of $R^6$ may be bonded to each other to form a ring, the aryl group, the heterocyclic group, the fused ring group, the alkyl group, the cycloalkyl group, the alkenyl group, the alkynyl group, the alkoxy group, the aryloxy group, the alkylene group, the arylene group, the alkylene group, the alkenylene group, the ester group, the ether group, the amide group and the imide group respectively may be substituted with one or more substituents selected from the group consisting of a deuterium; a halogen; a silane group; a siloxane group; a boron group; a cyano group; a $C_1$-$C_{20}$ alkylthio group; a $C_1$-$C_{20}$ alkoxy group; a $C_1$-$C_{20}$ alkyl group; a $C_2$-$C_{20}$ alkenyl group; a $C_2$-$C_{20}$ alkynyl group; a $C_6$-$C_{20}$ aryl group; a $C_6$-$C_{20}$ aryl group substituted with deuterium; a $C_2$-$C_{20}$ heterocyclic group; a $C_3$-$C_{20}$ cycloalkyl group; a $C_7$-$C_{20}$ arylalkyl group; a $C_8$-$C_{20}$ arylalkenyl group; a carbonyl group; an ether group; a $C_2$-$C_{20}$ alkoxylcarbonyl group; and a $C_6$-$C_{30}$ aryloxy group.

2. The photosensitive resin composition of claim 1, wherein the compound represented by Formula 1 is represented by any one of the following Formulas 3 to 10:

[Formula 3]

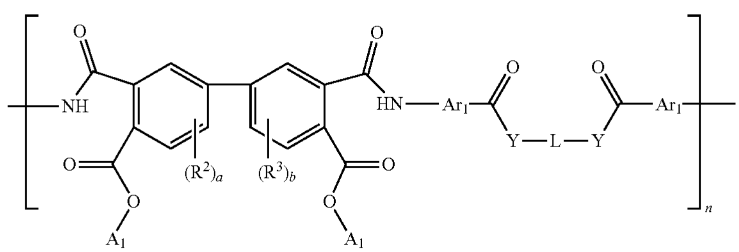

[Formula 4]

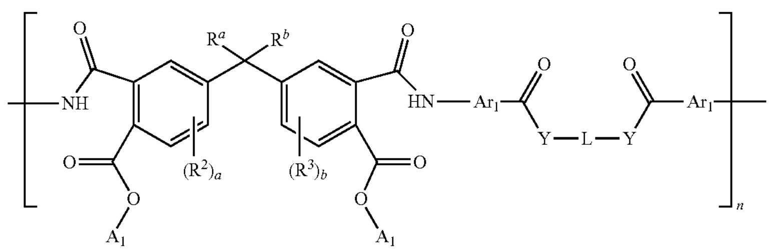

-continued
[Formula 5]
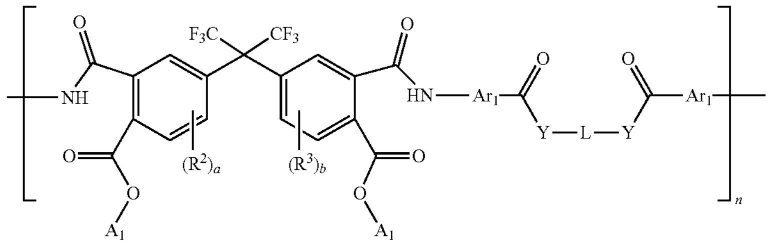
[Formula 6]
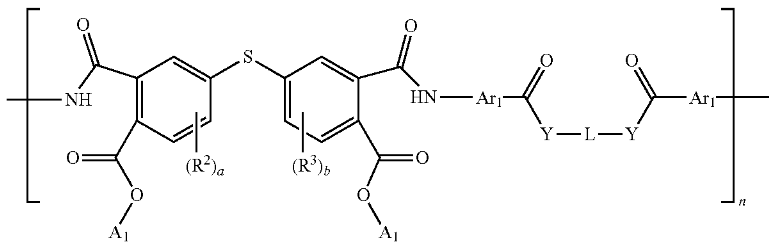
[Formula 7]
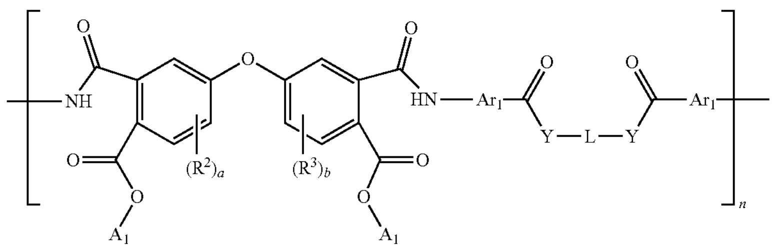
[Formula 8]
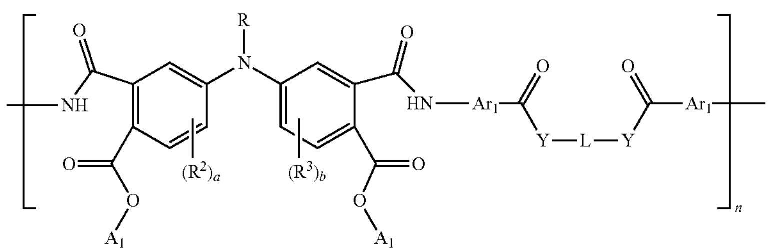
[Formula 9]
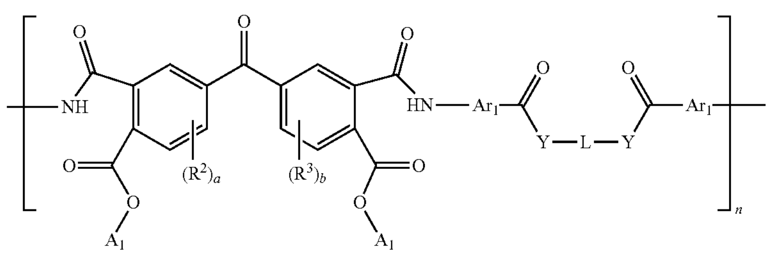
[Formula 10]
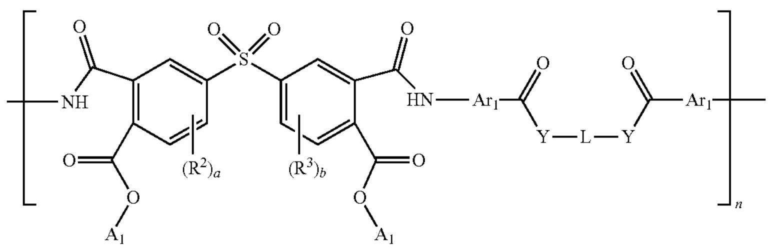

wherein in Formula 3 to 10, $R^2$, $R^3$, $R^a$, $R^b$, $A_1$, $Ar_1$, Y, L and n are the same as defined in Formula 1.
3. The photosensitive resin composition of claim 1, wherein the compound represented by Formula 1 is represented by any one of the following formulas:
P1-1
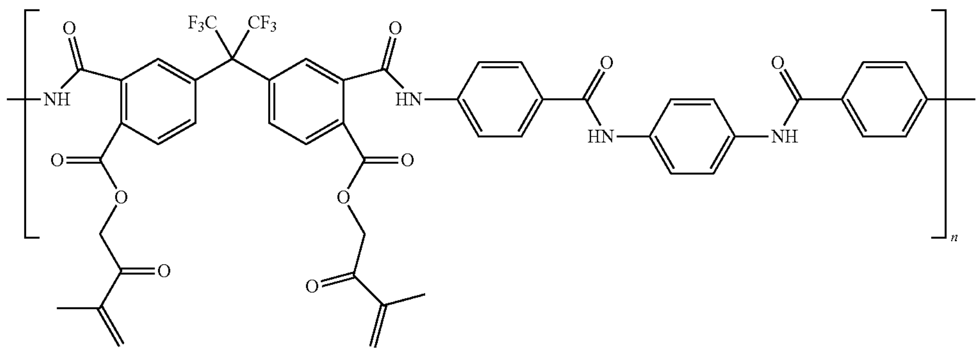
P1-2
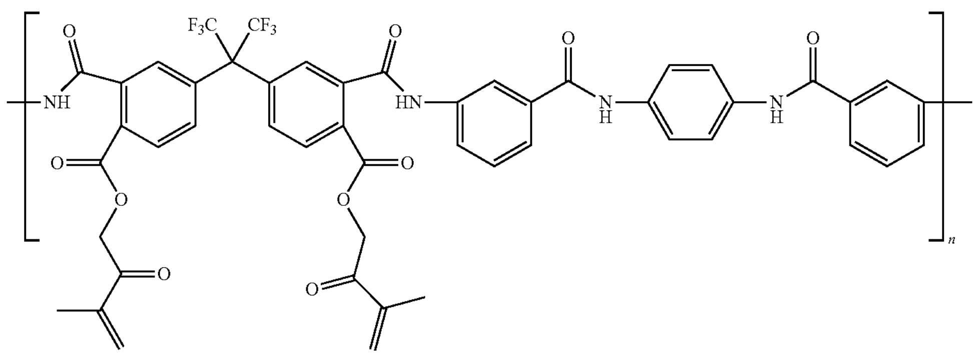
P1-3
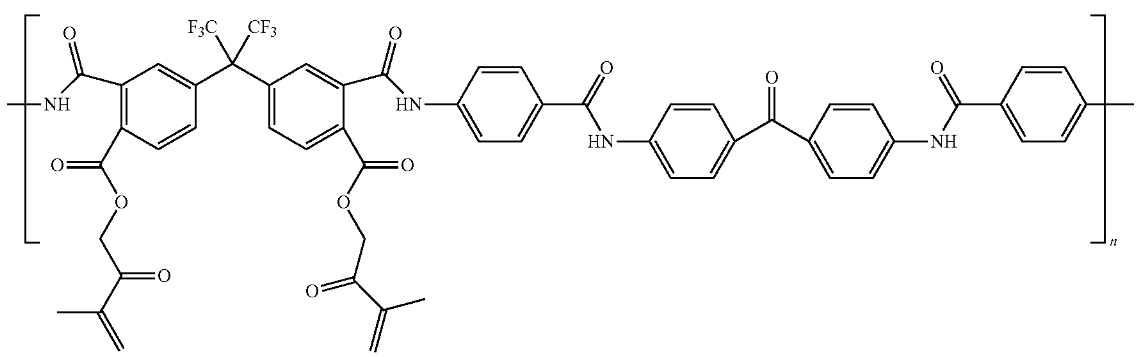
P1-4
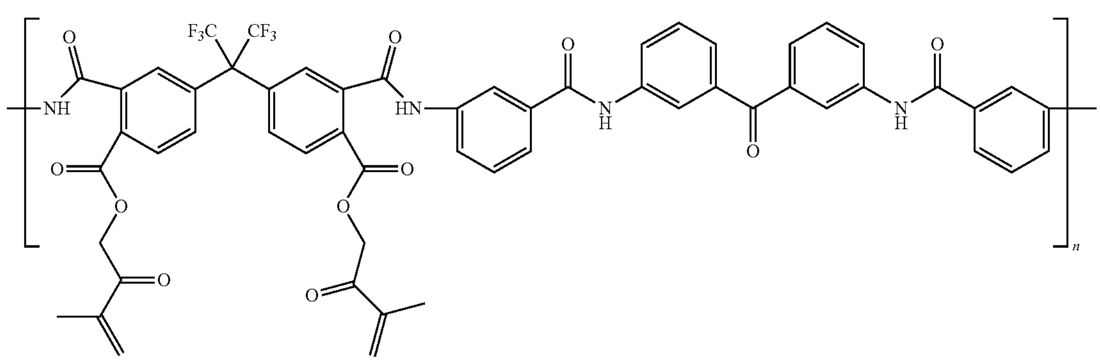

-continued
P1-5
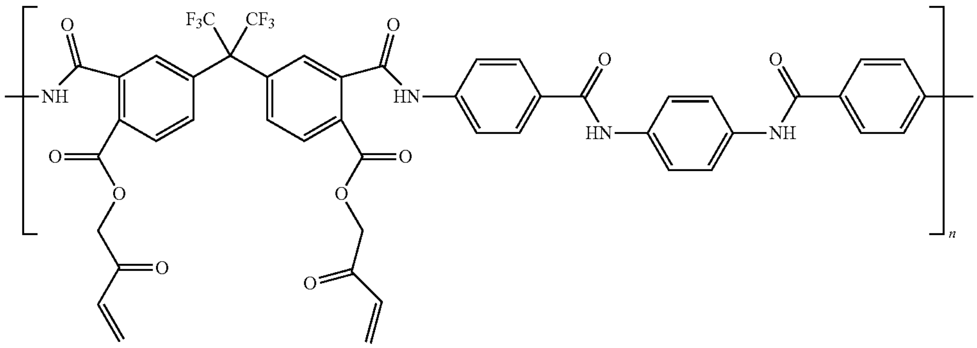
P1-6
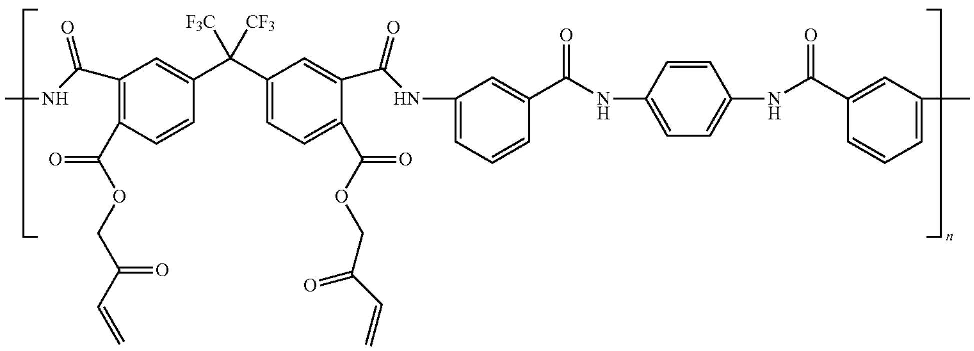
P1-7
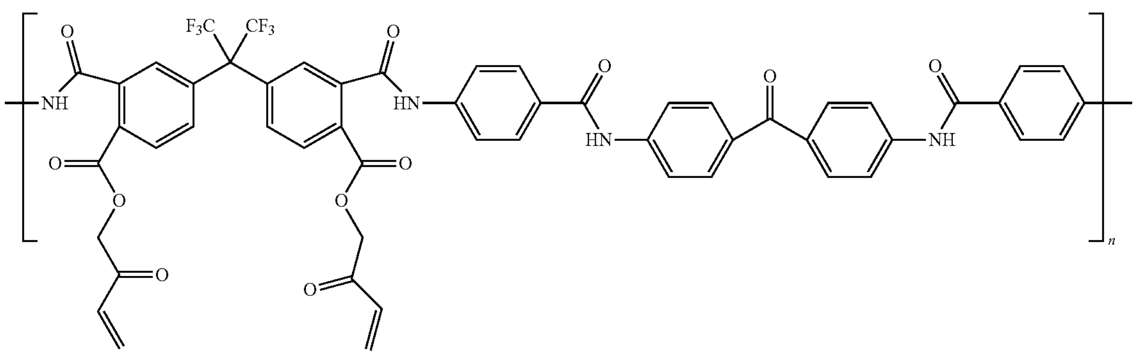
P1-8
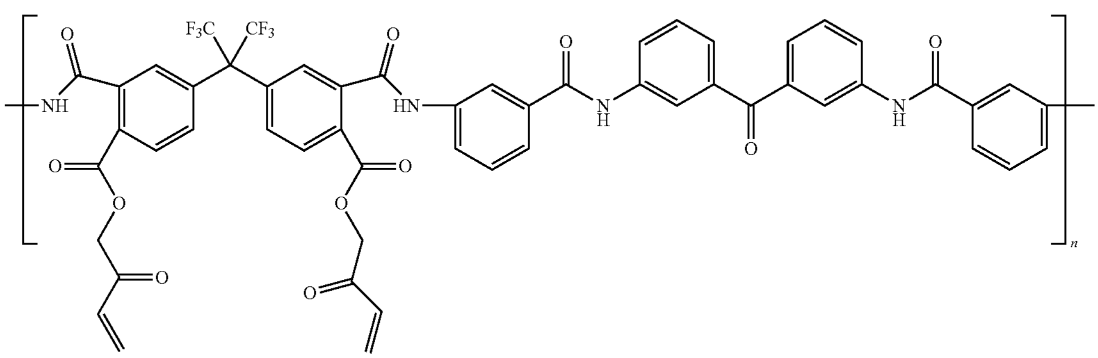

-continued
P1-9
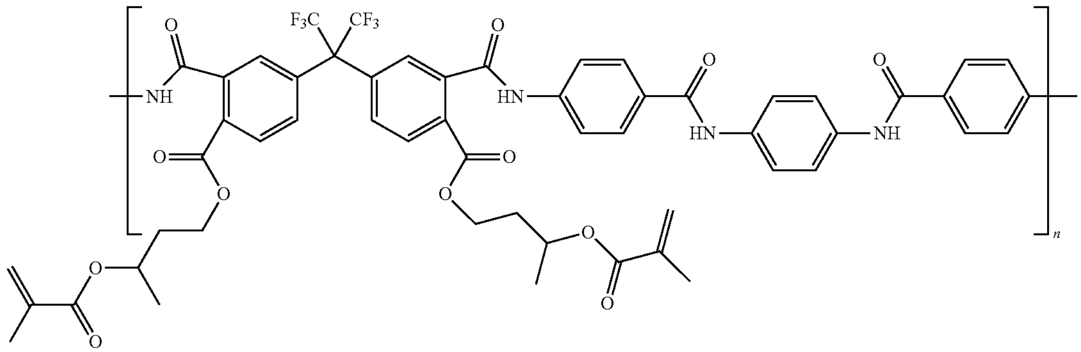
P1-10
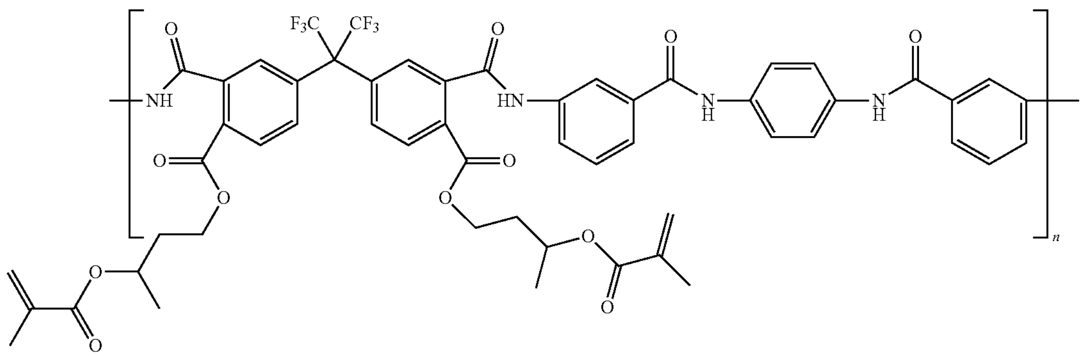
P1-11
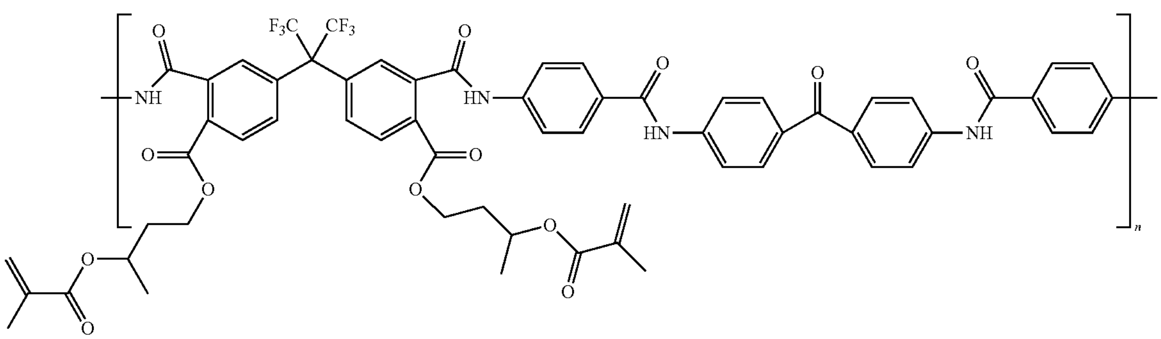
P1-12
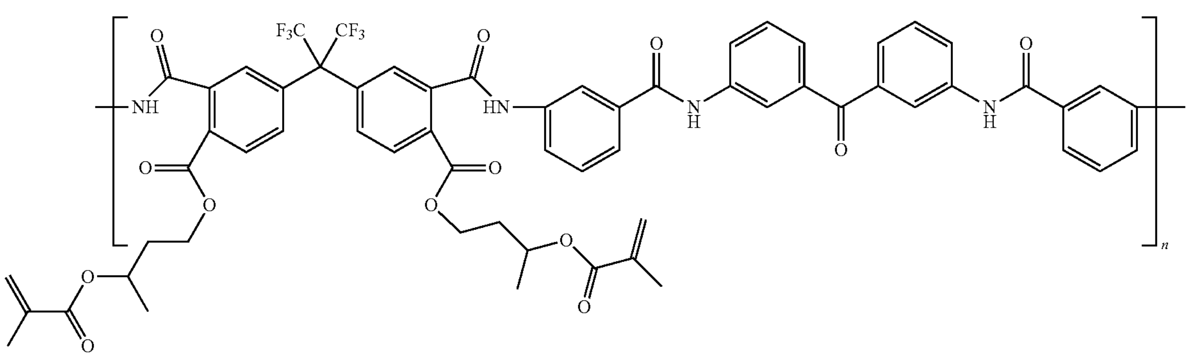

-continued
P1-13
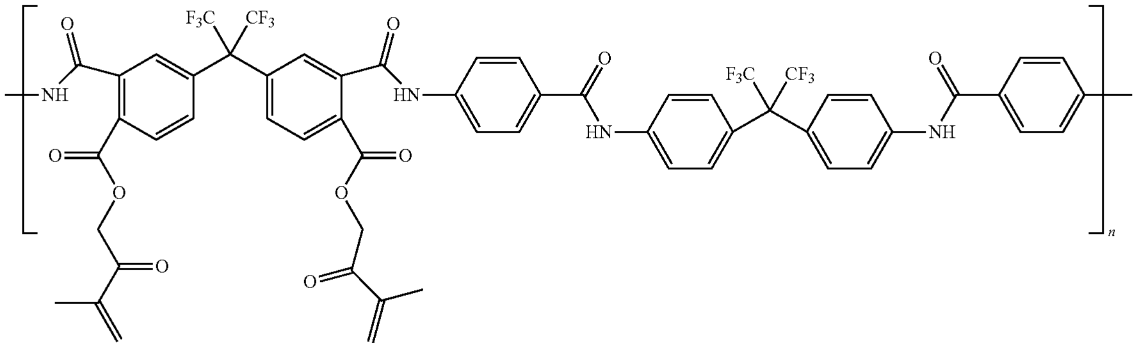
P1-14
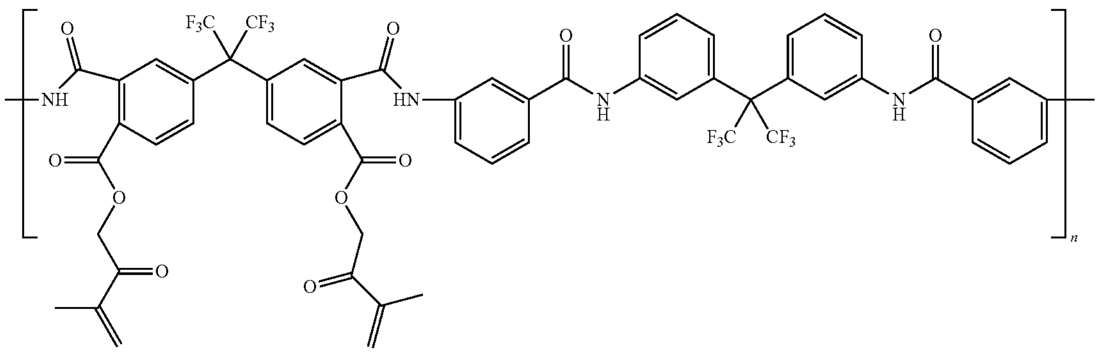
P1-15
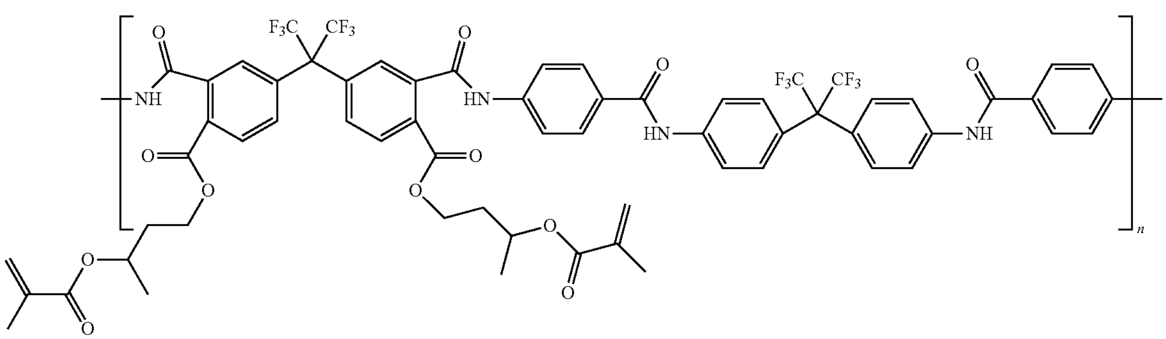
P1-16
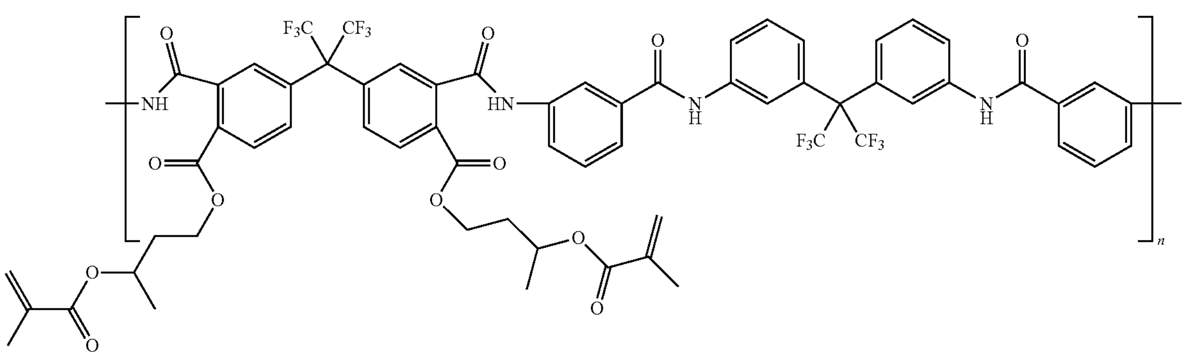

-continued
P1-17
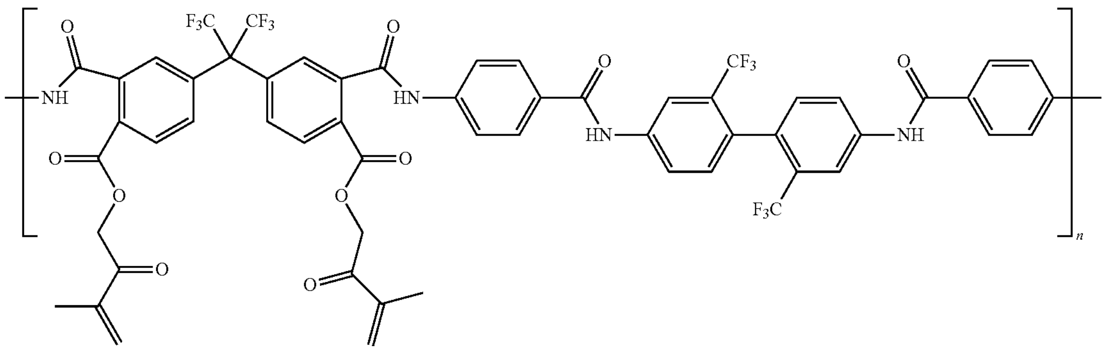
P1-18
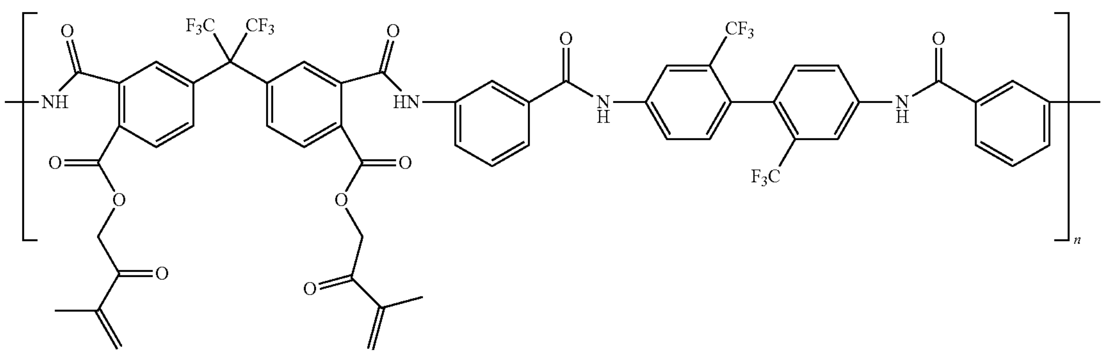
P1-19
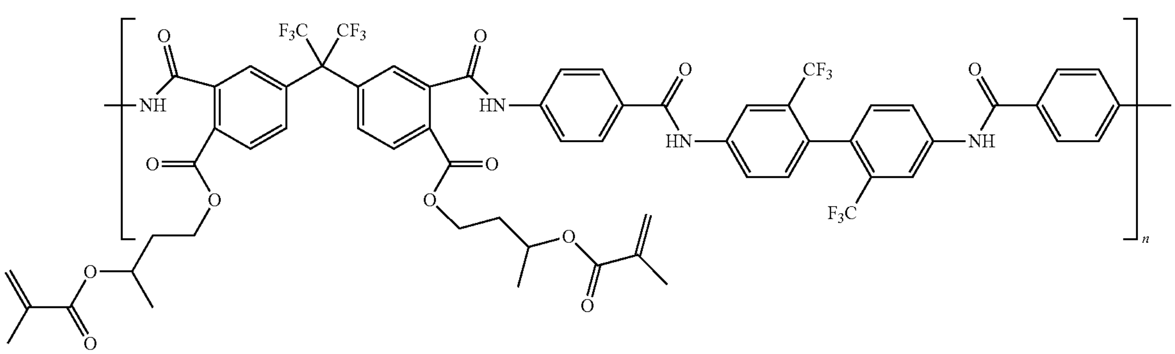
P1-20
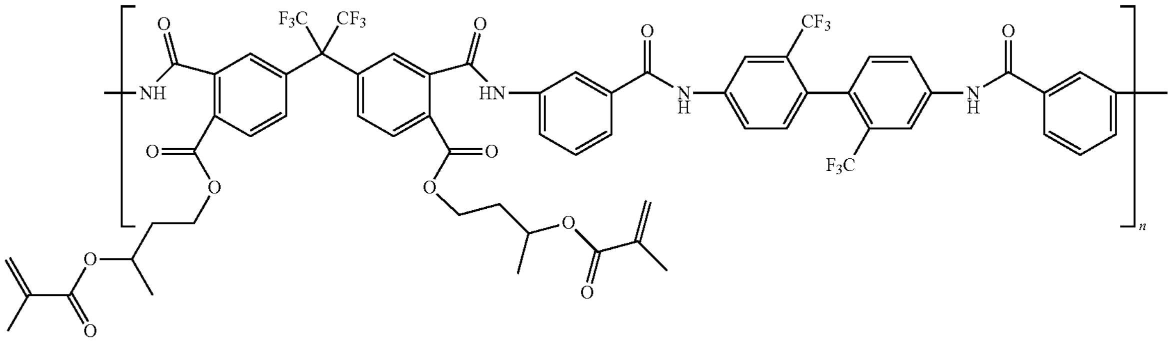

-continued
P1-21
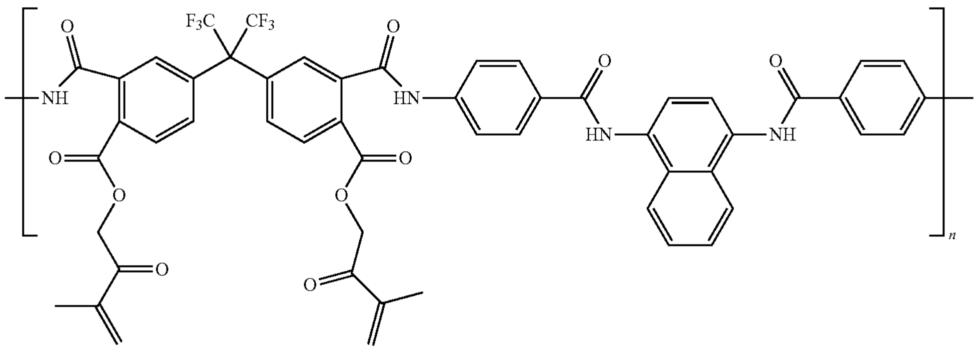
P1-22
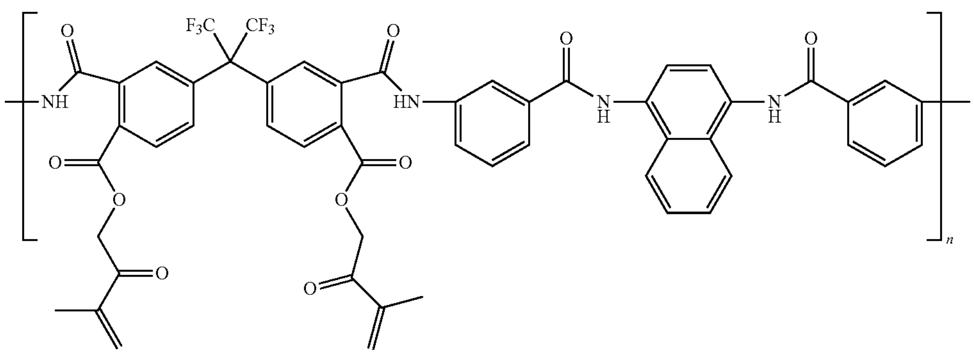
P1-23
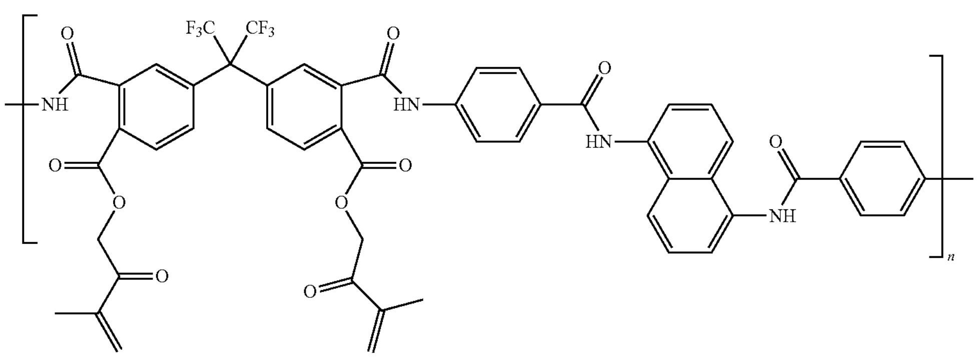
P1-24
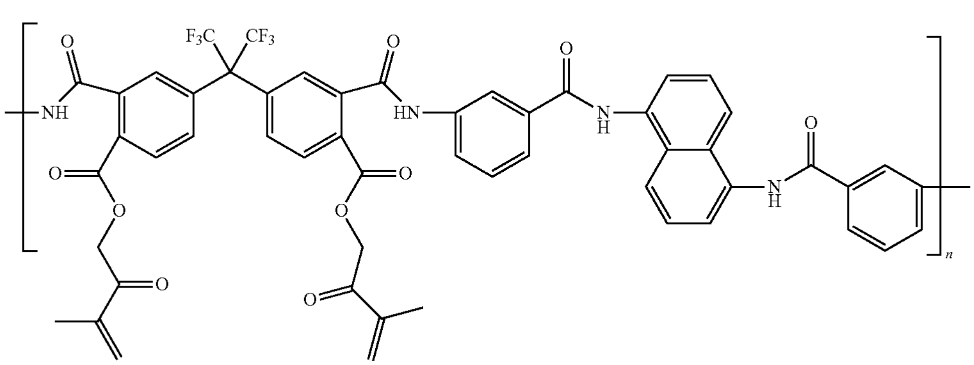

-continued
P1-25
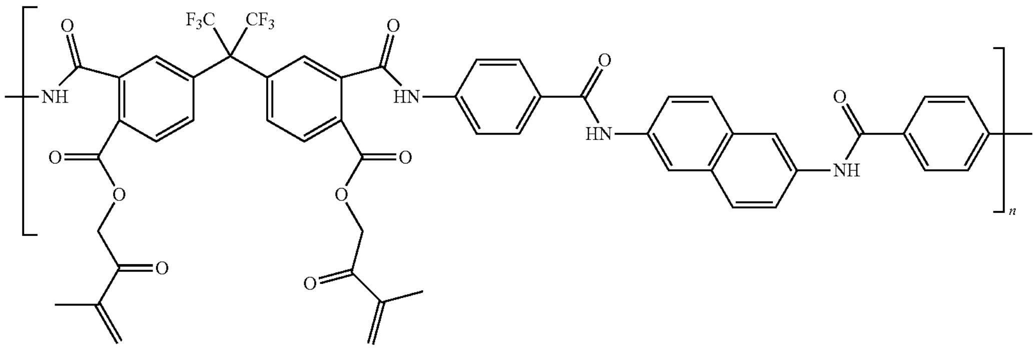
P1-26
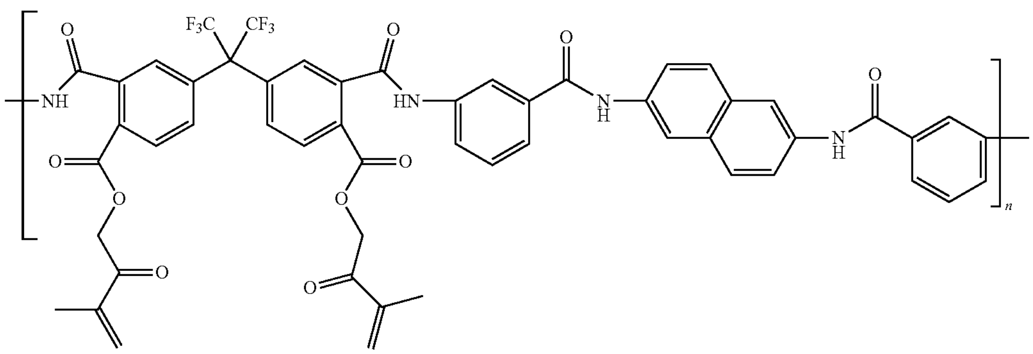
P1-27
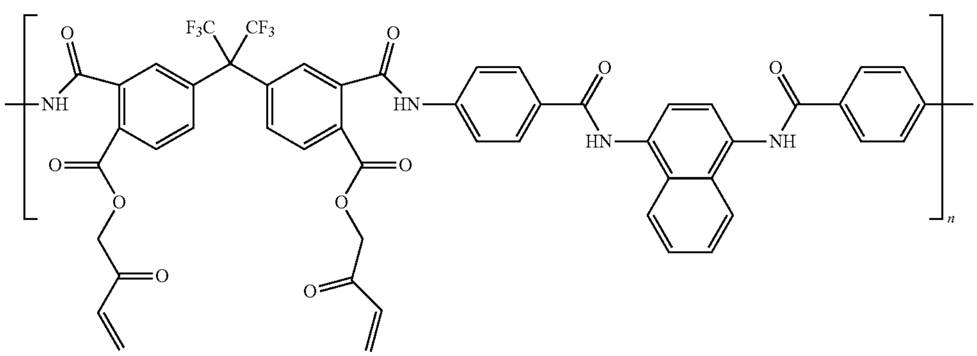
P1-28
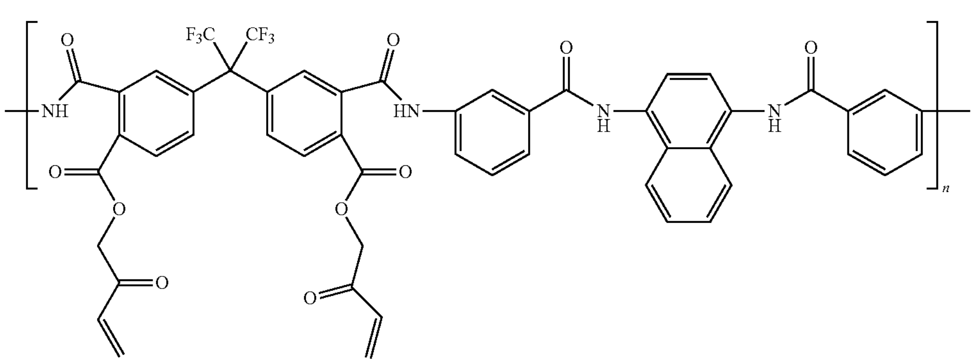

-continued
P1-29
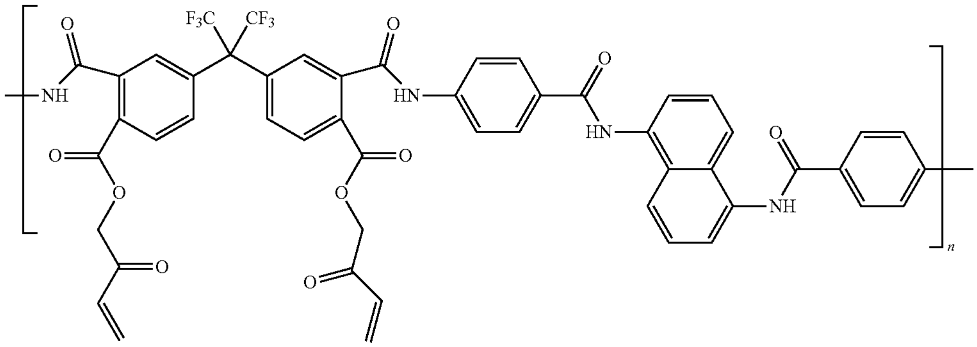
P1-30
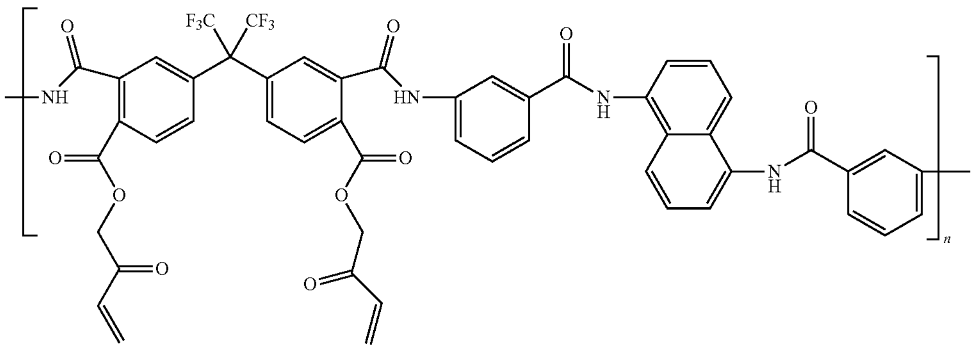
P1-31
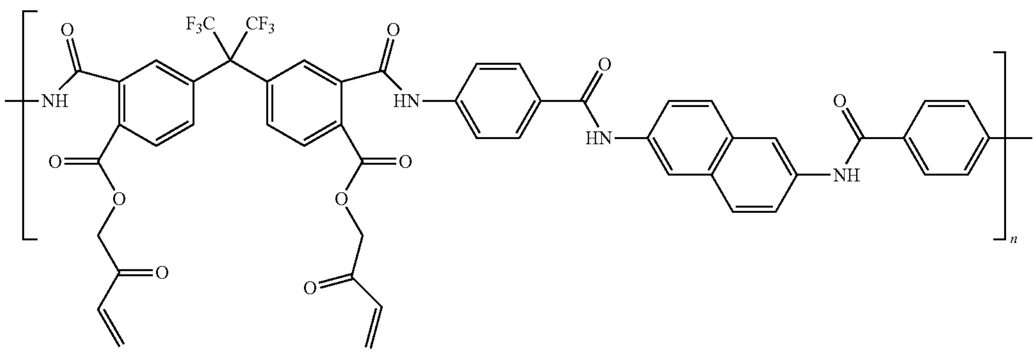
P1-32
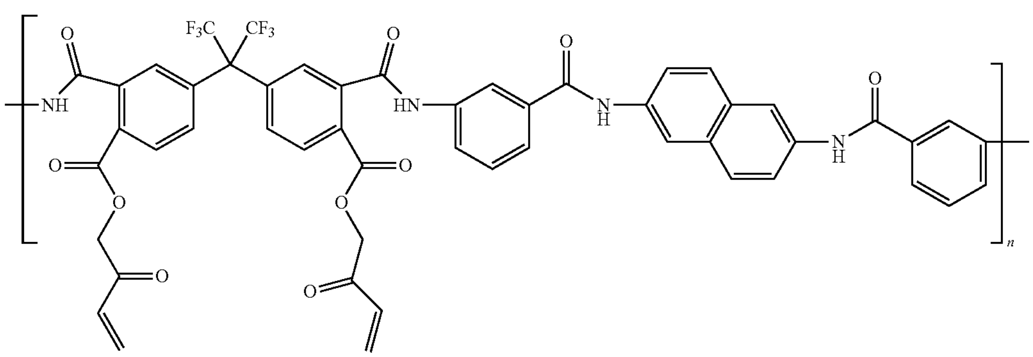

-continued
P1-33
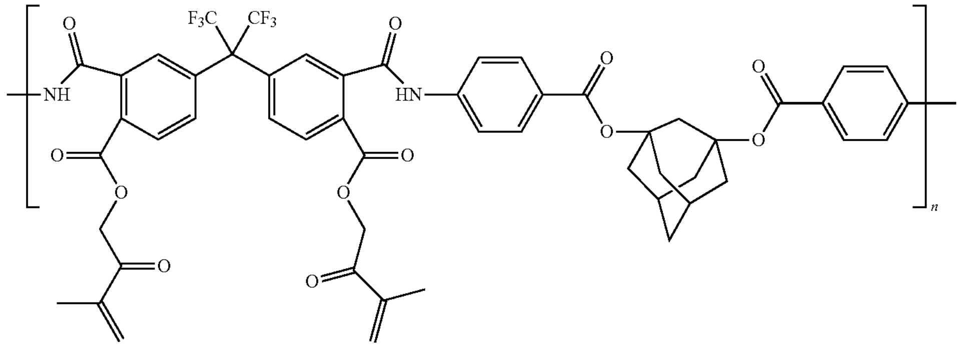
P1-34
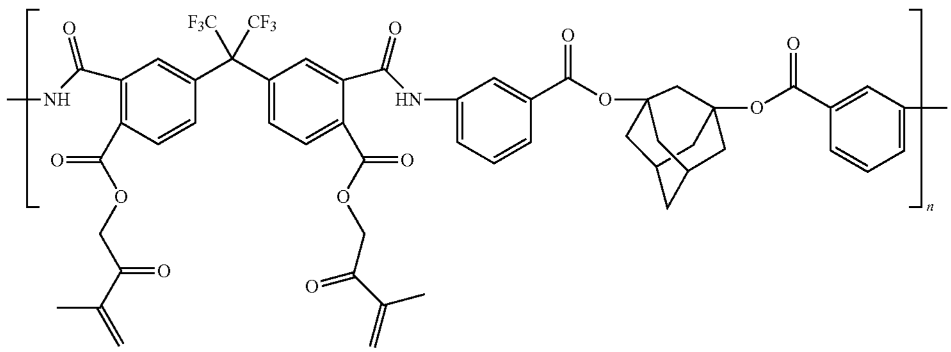
P1-35
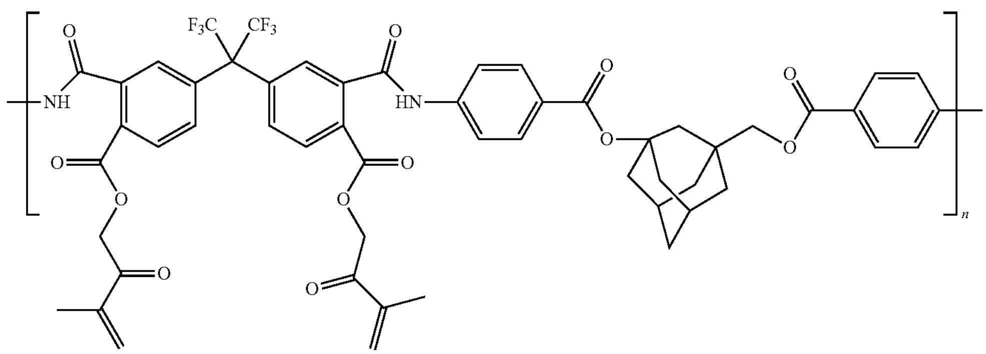
P1-36
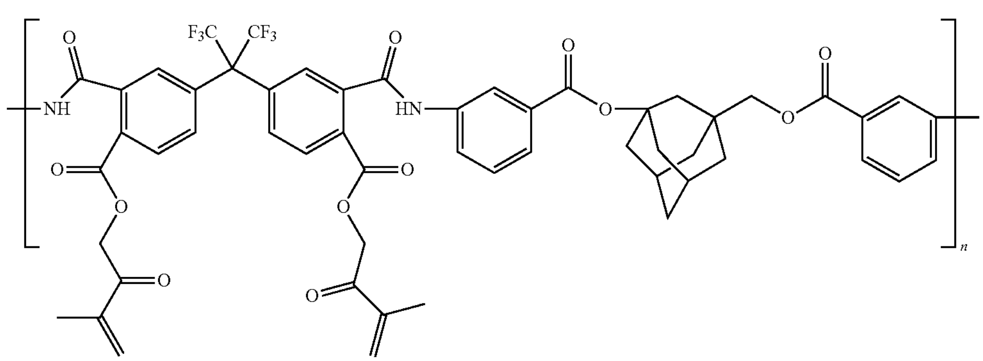

-continued
P1-37
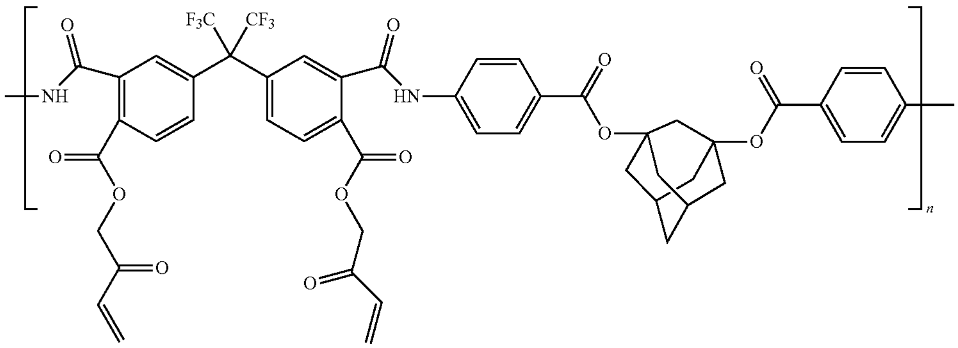
P1-38
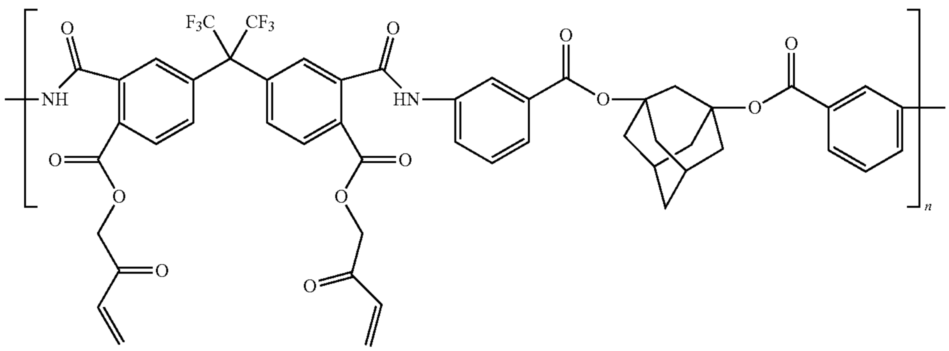
P1-39
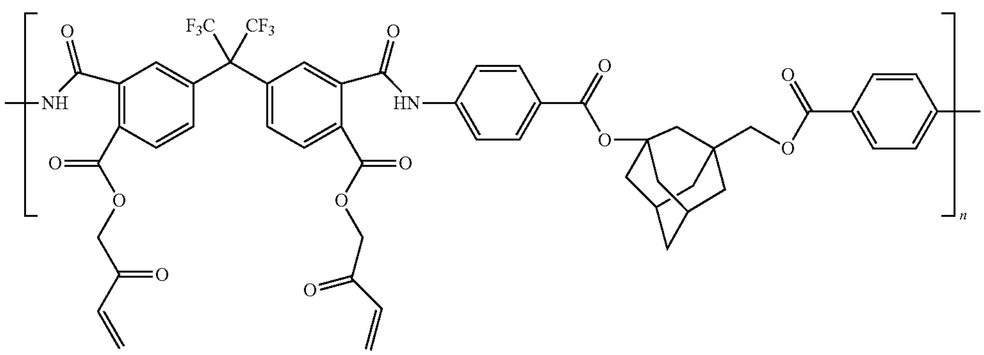
P1-40
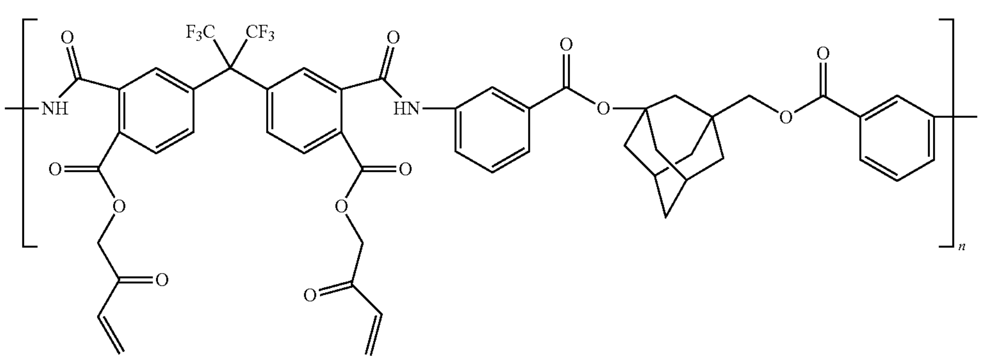

-continued
P1-41
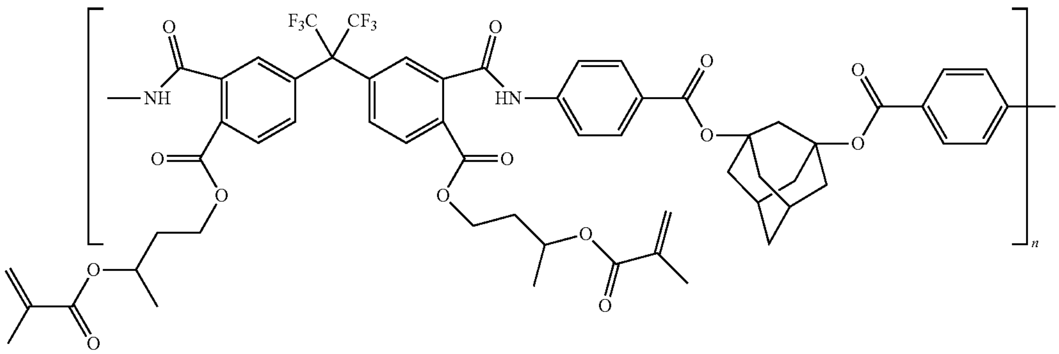
P1-42
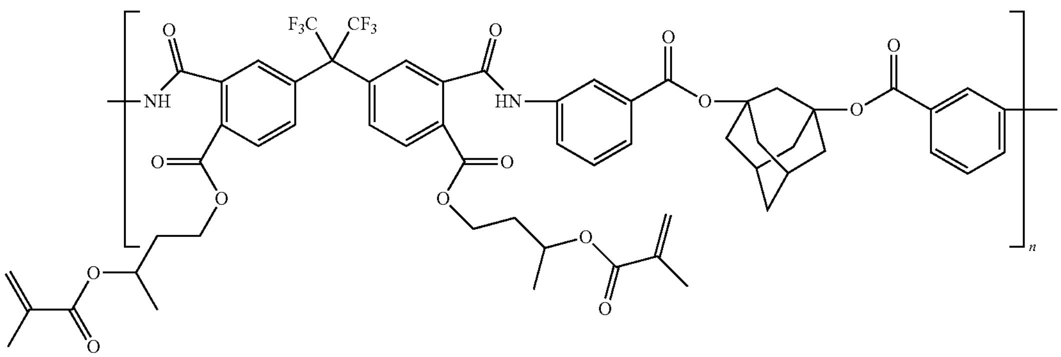
P1-43
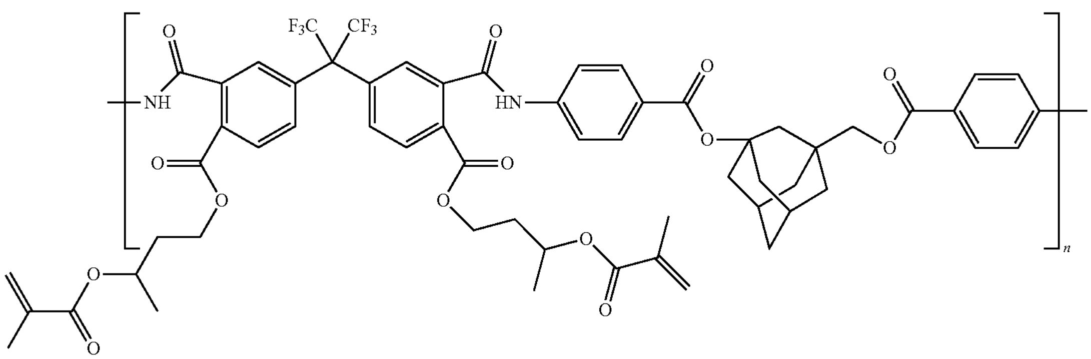
P1-44
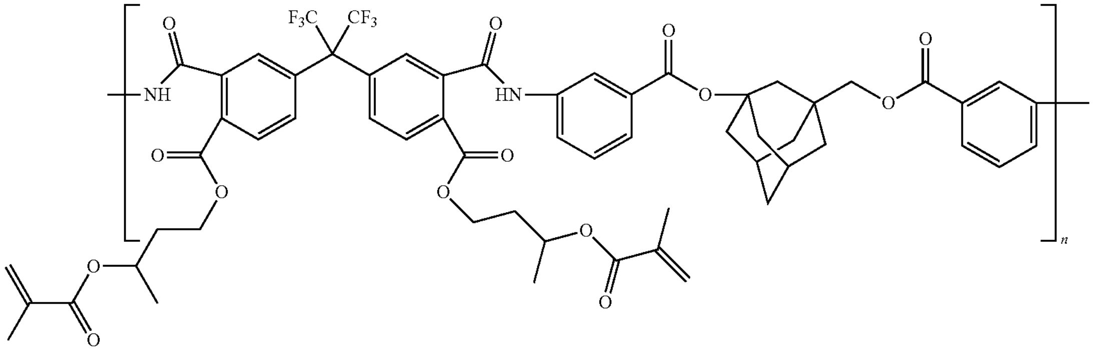

-continued
P1-45
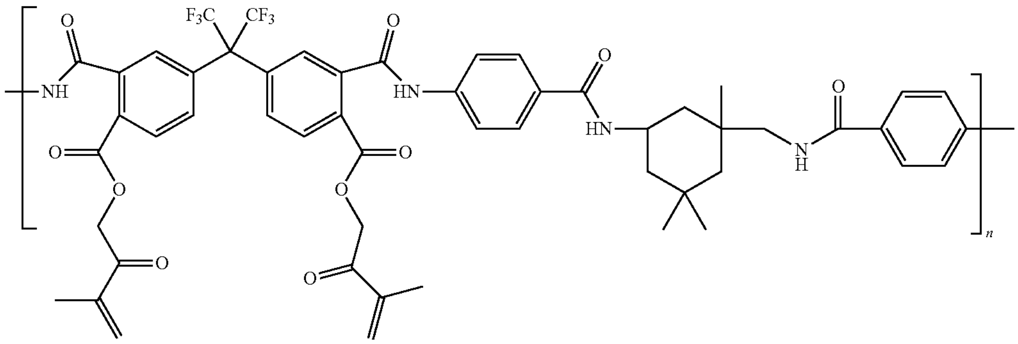
P1-46
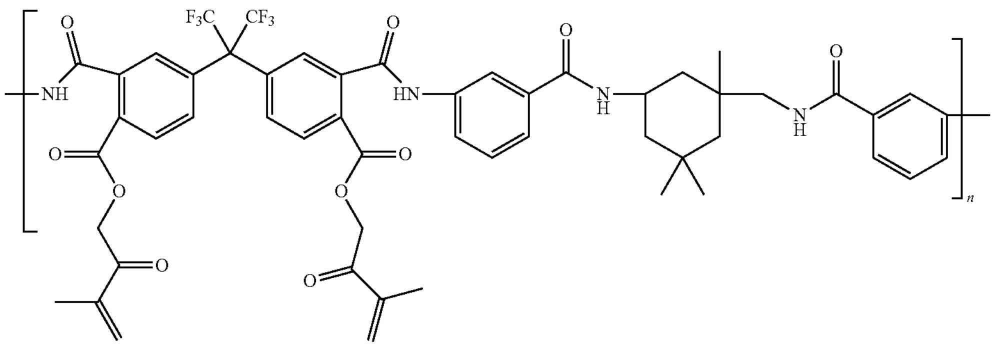
P1-47
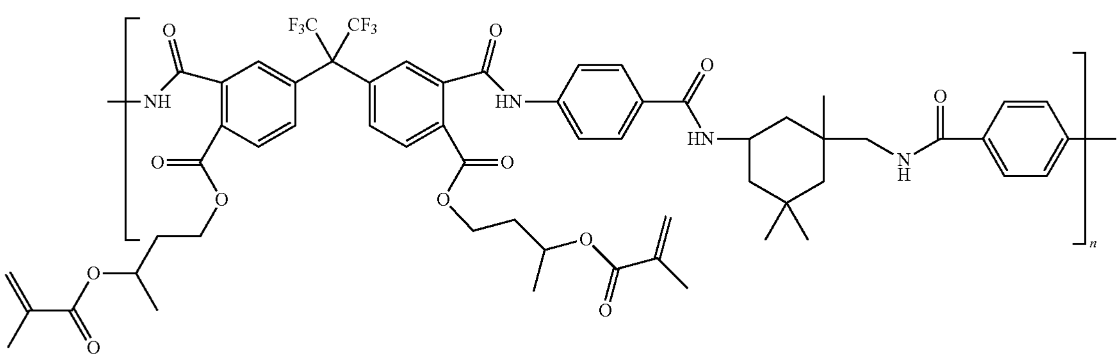
P1-48
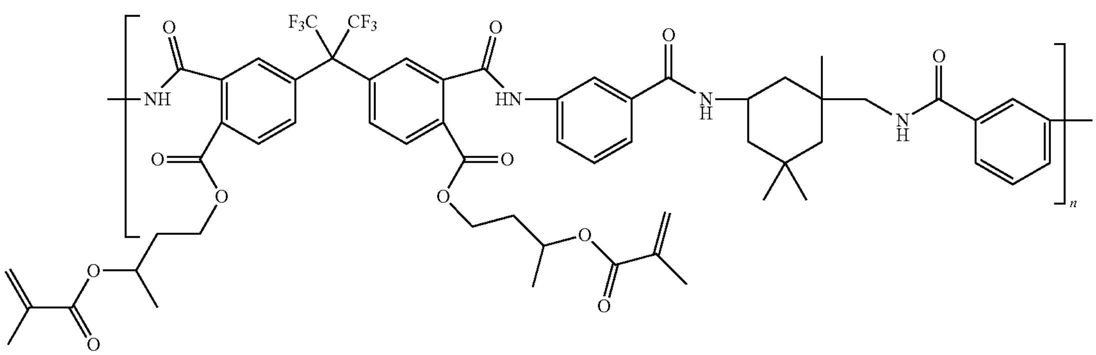

-continued
P1-49
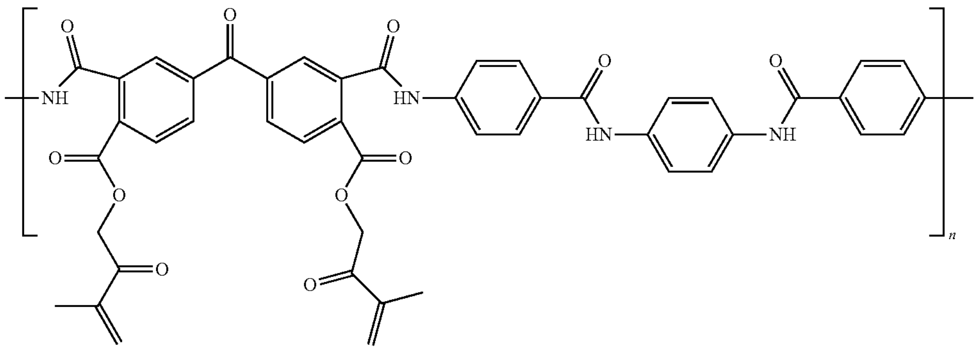
P1-50
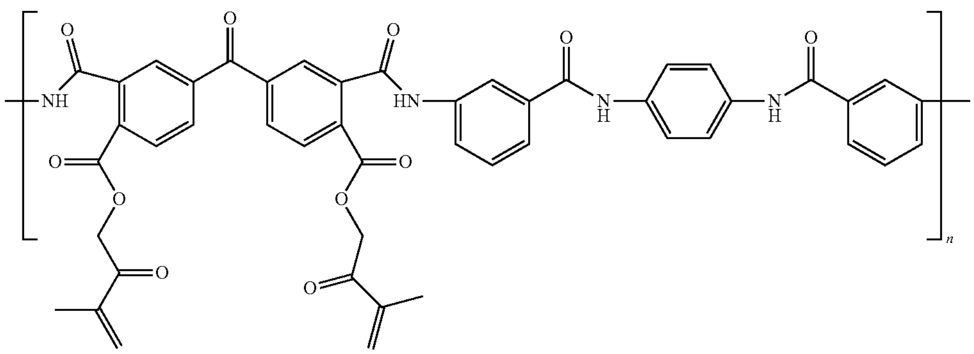
P1-51
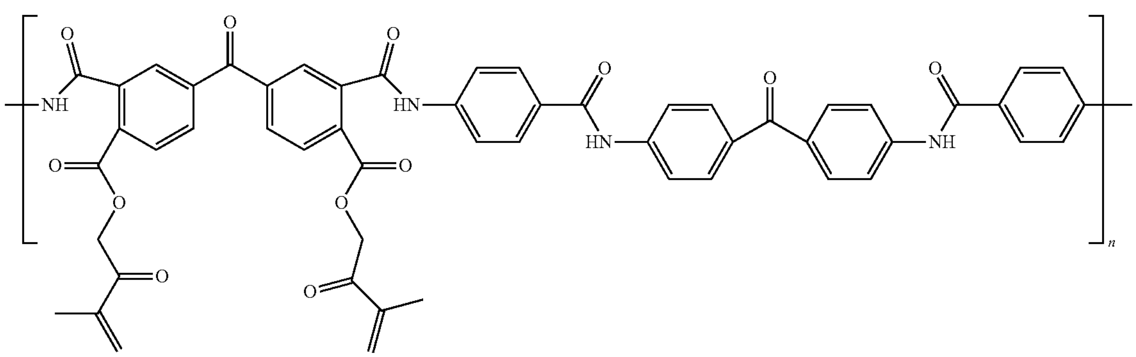
P1-52
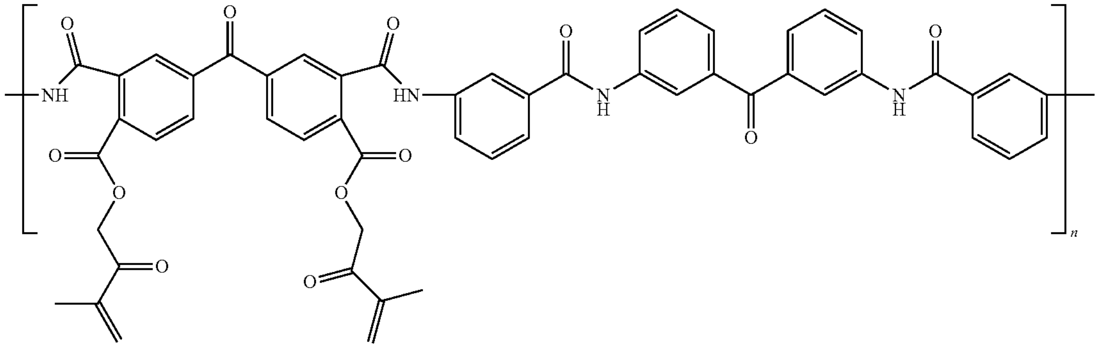

-continued
P1-53
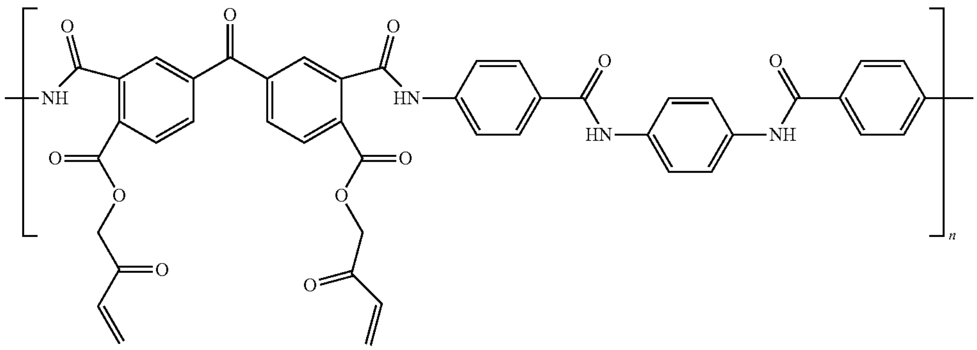
P1-54
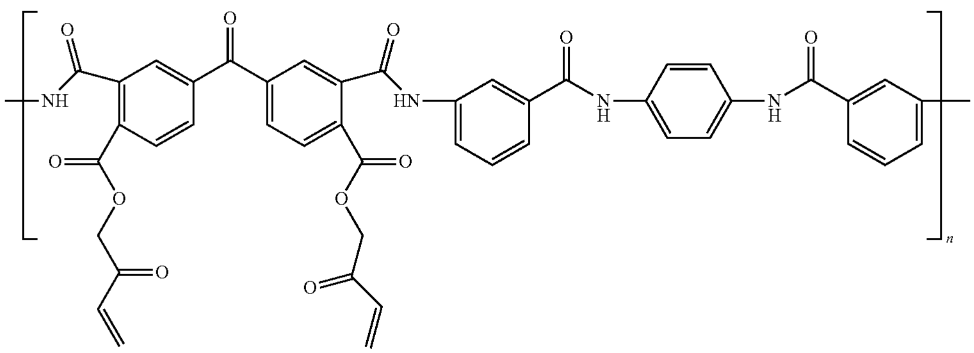
P1-55
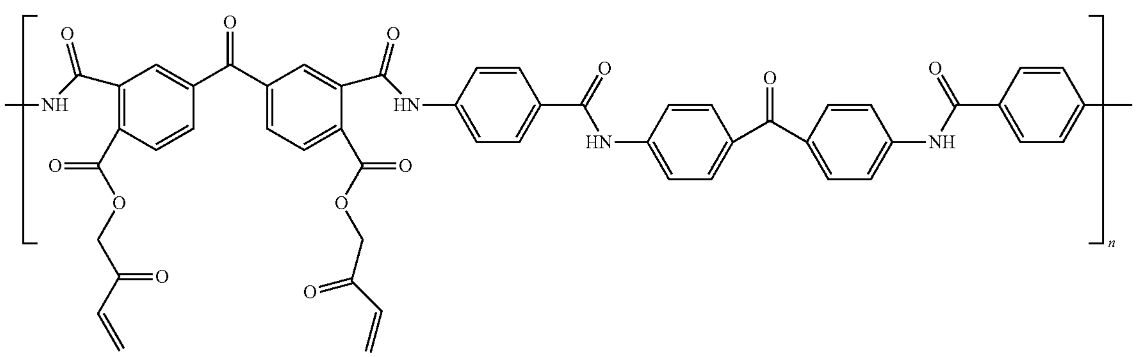
P1-56
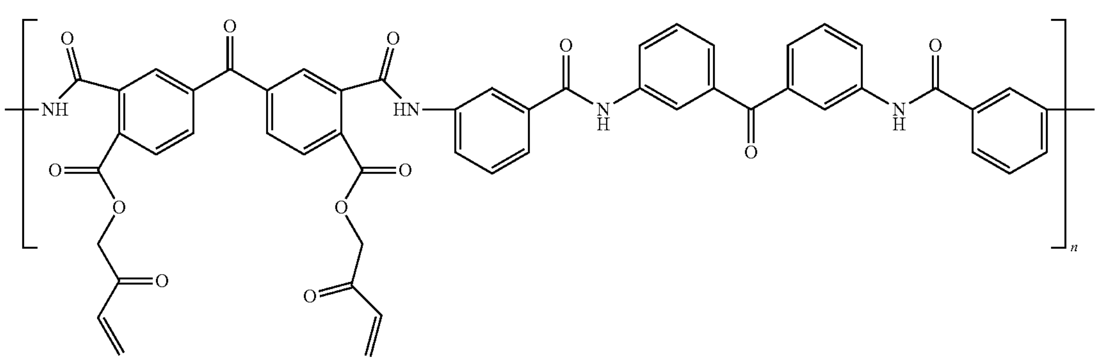

-continued
P1-57
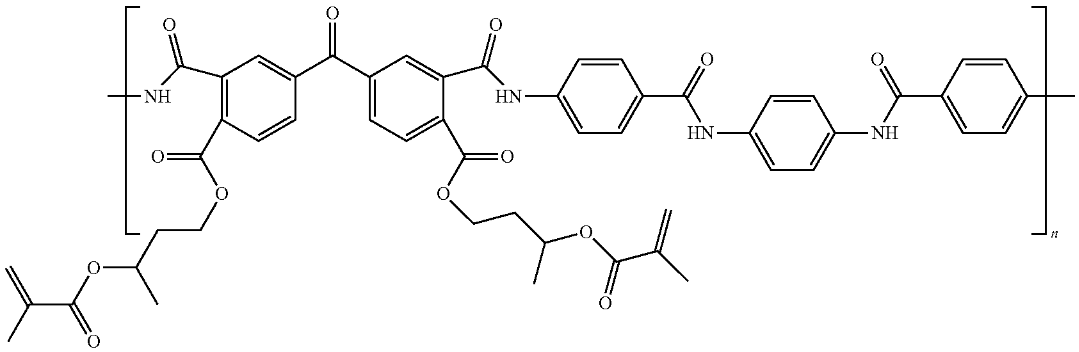
P1-58
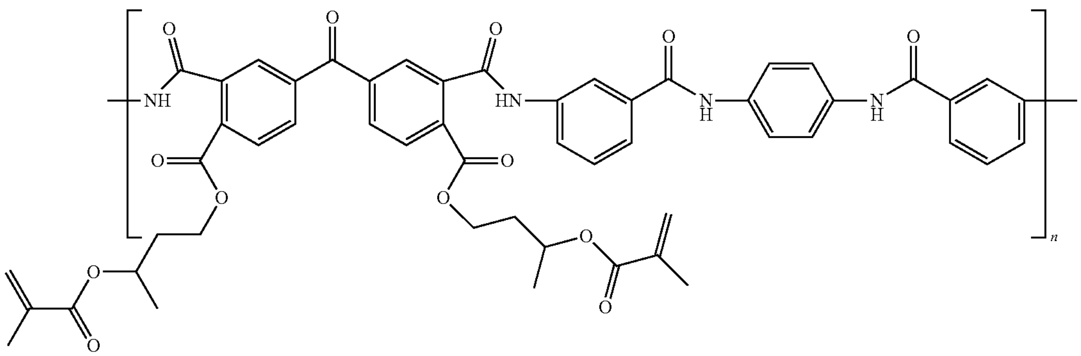
P1-59
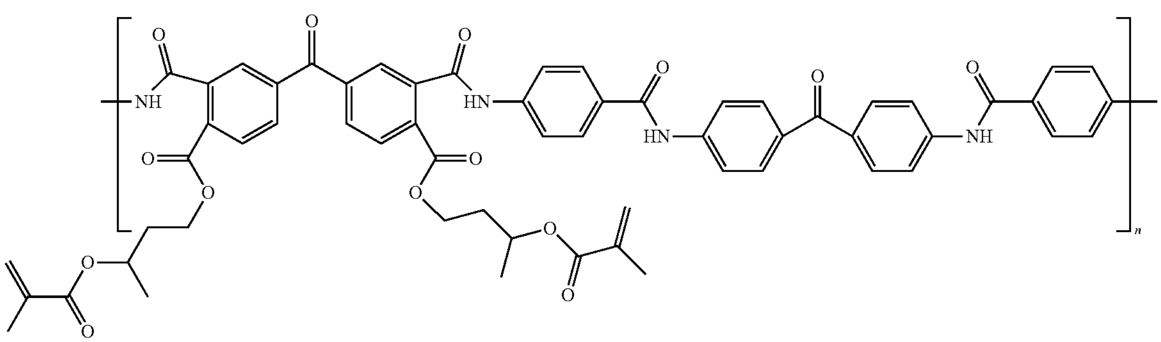
P1-60
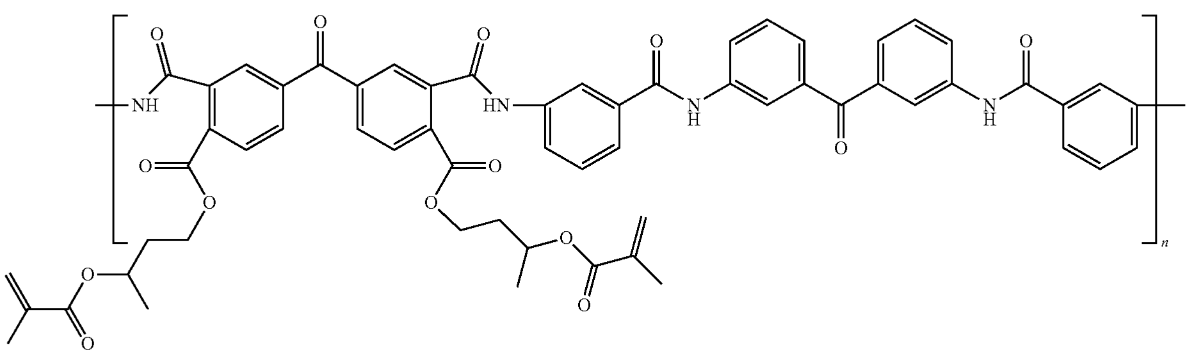

-continued
P1-61
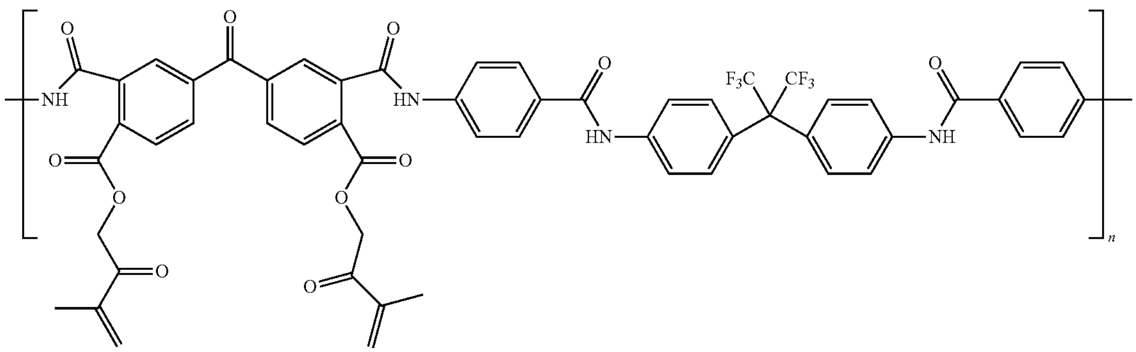
P1-62
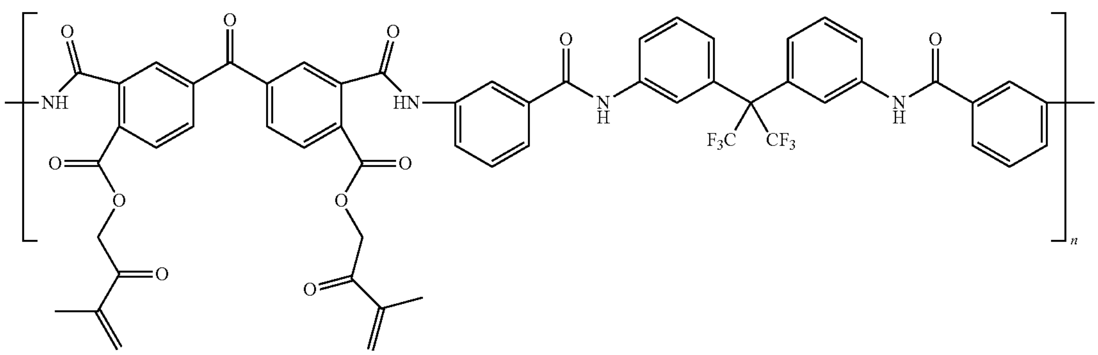
P1-63
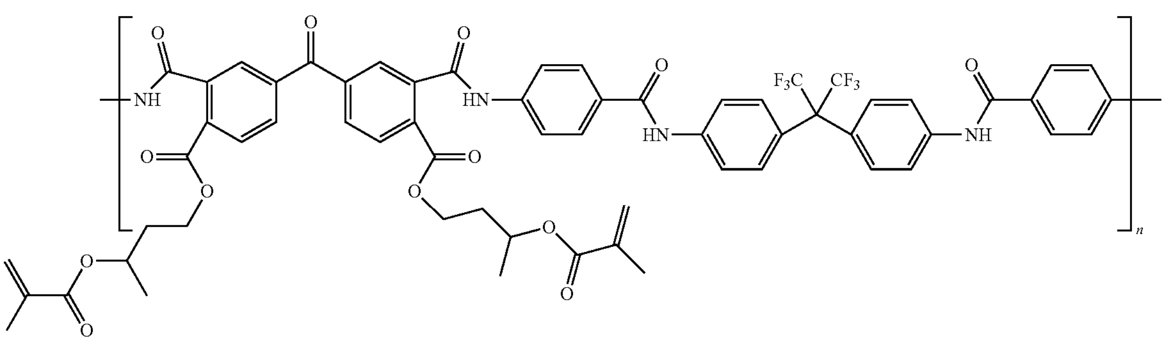
P1-64
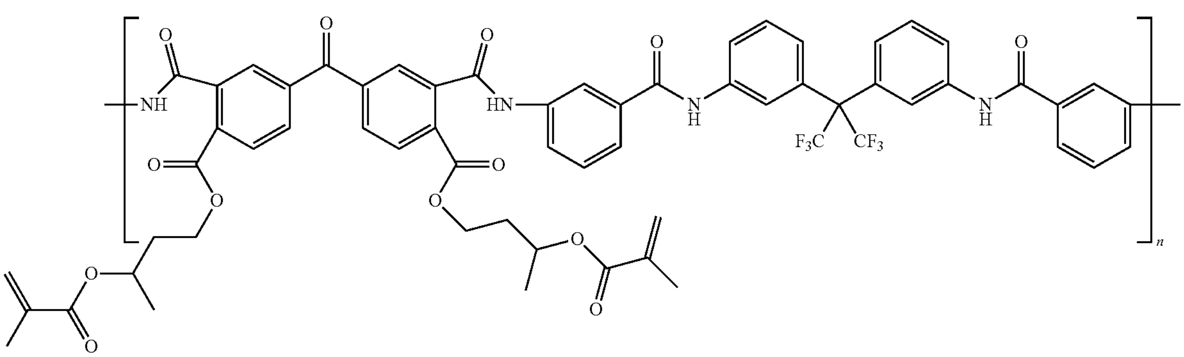

-continued
P1-65
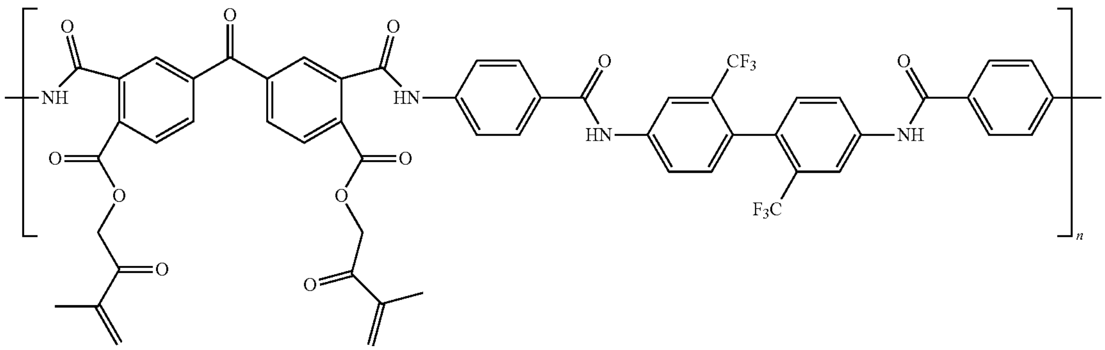
P1-66
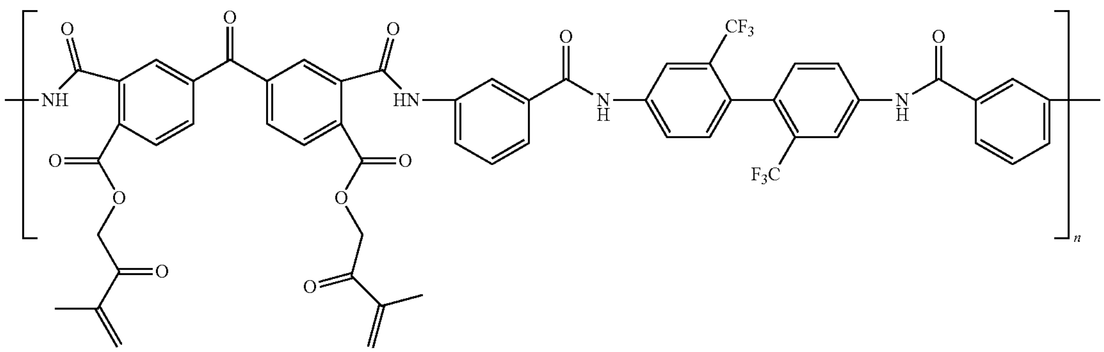
P1-67
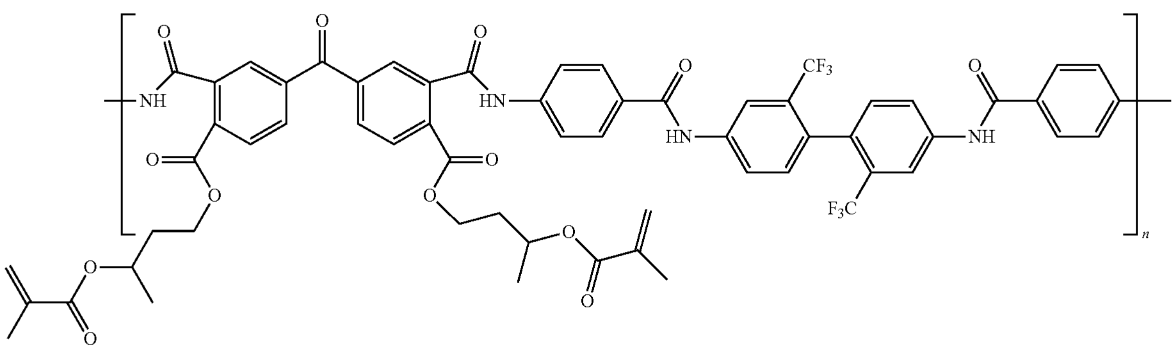
P1-68
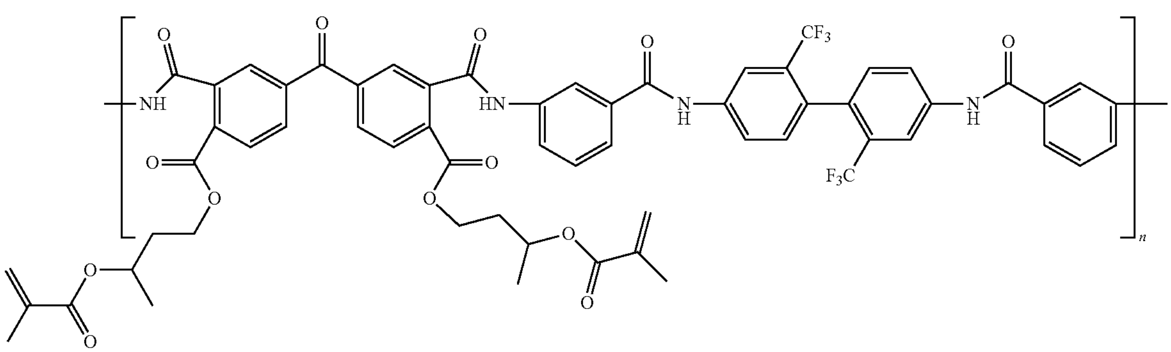

-continued
P1-69
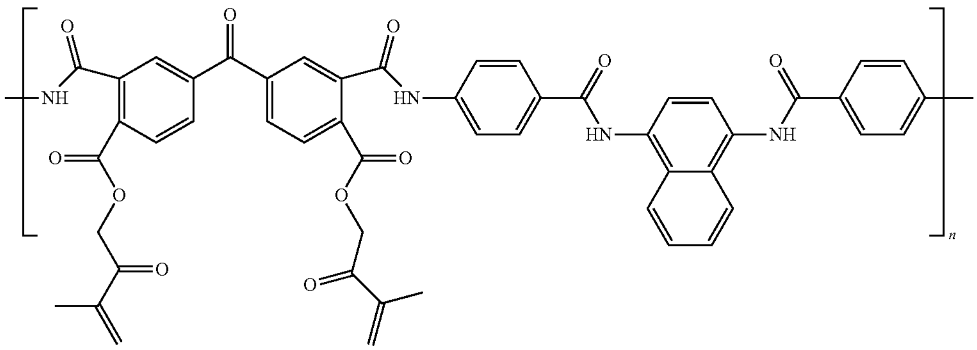
P1-70
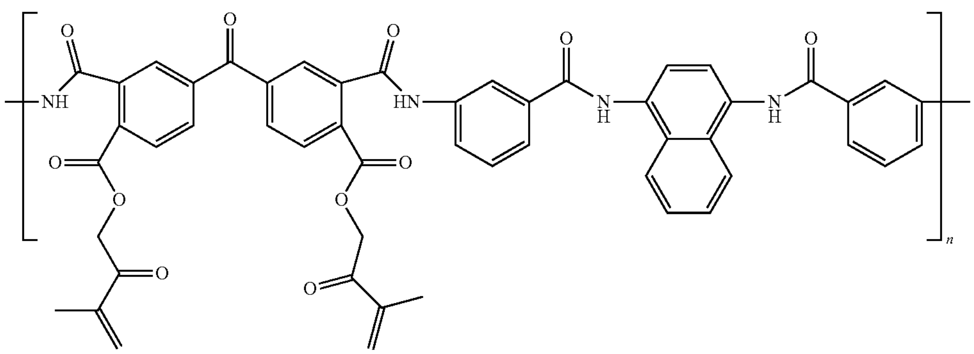
P1-71
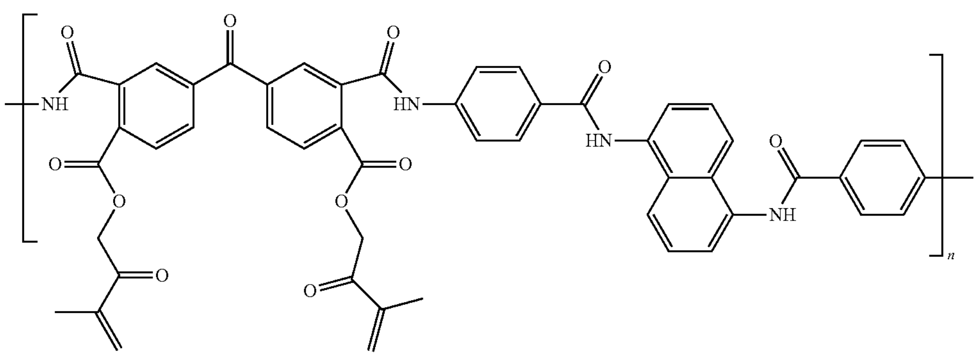
P1-72
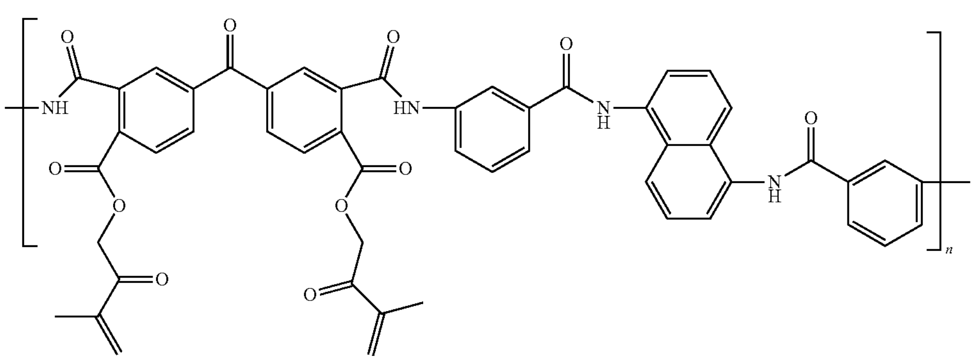

-continued
P1-73
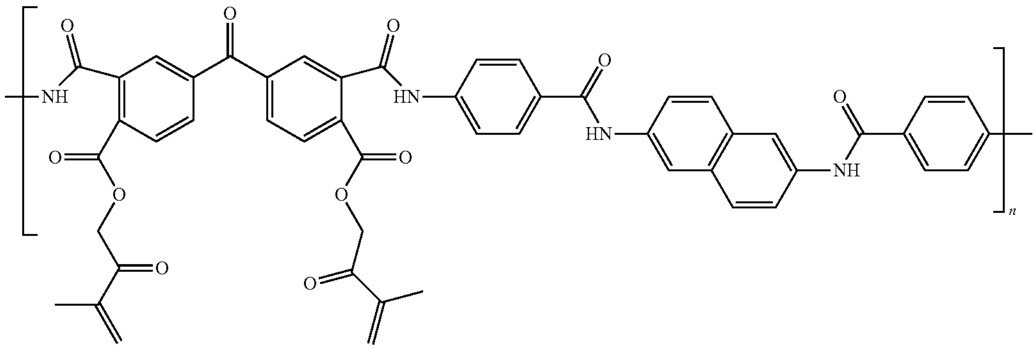
P1-74
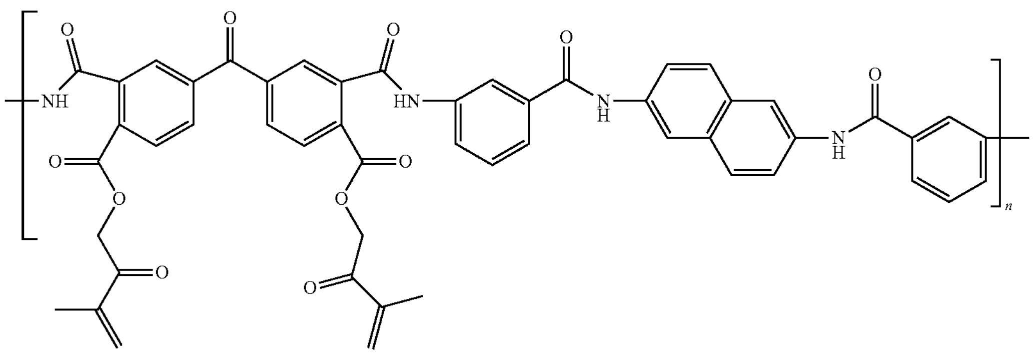
P1-75
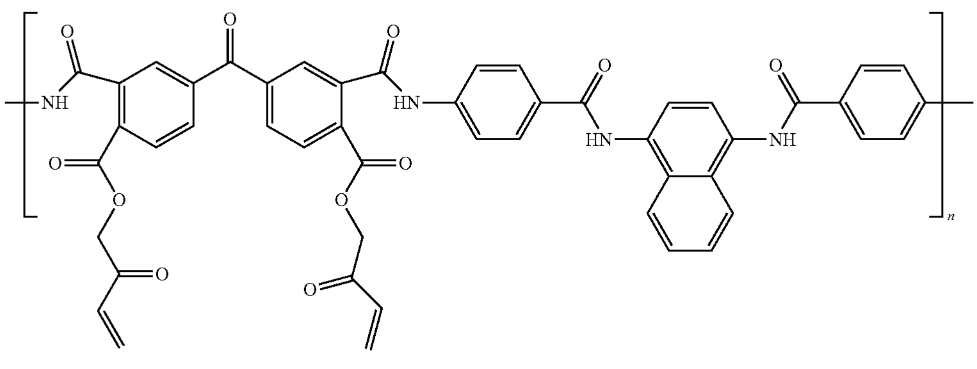
P1-76
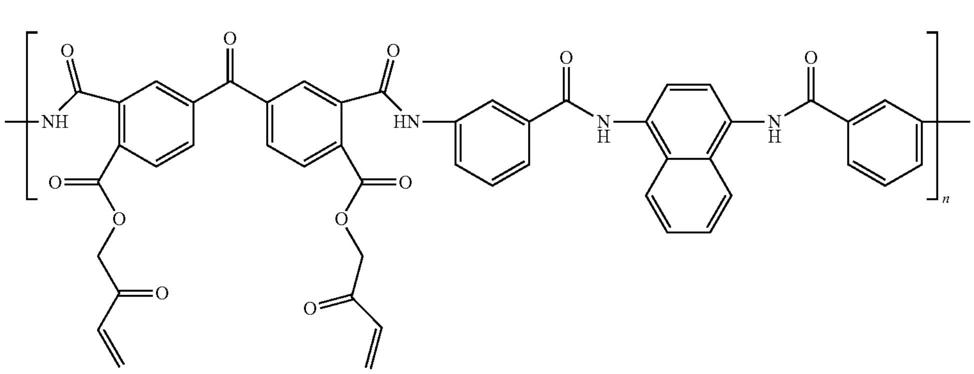

-continued
P1-77
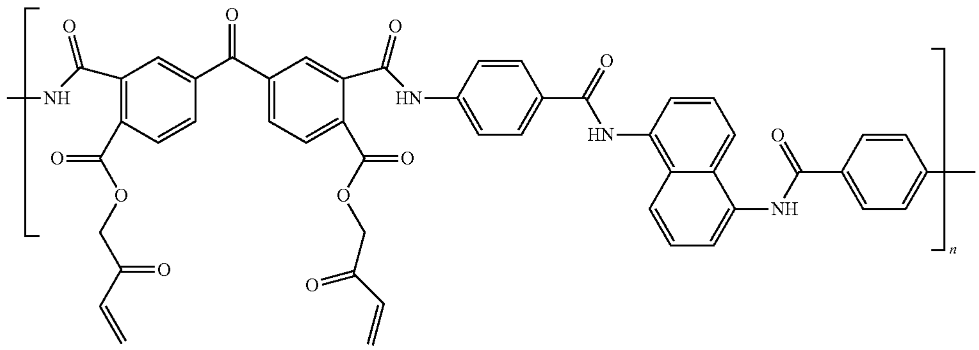
P1-78
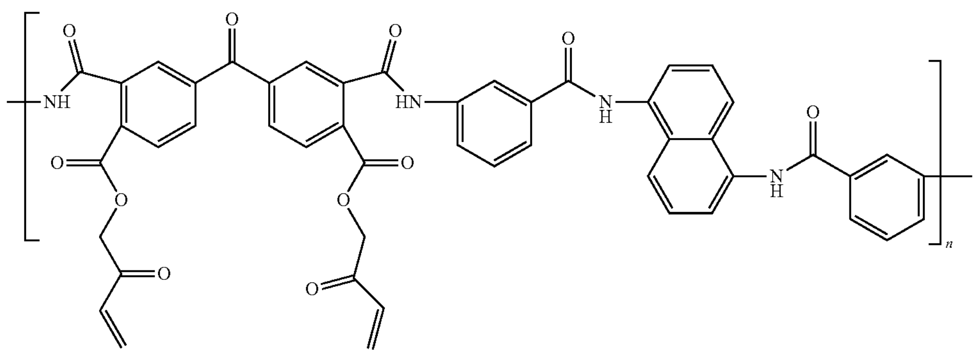
P1-79
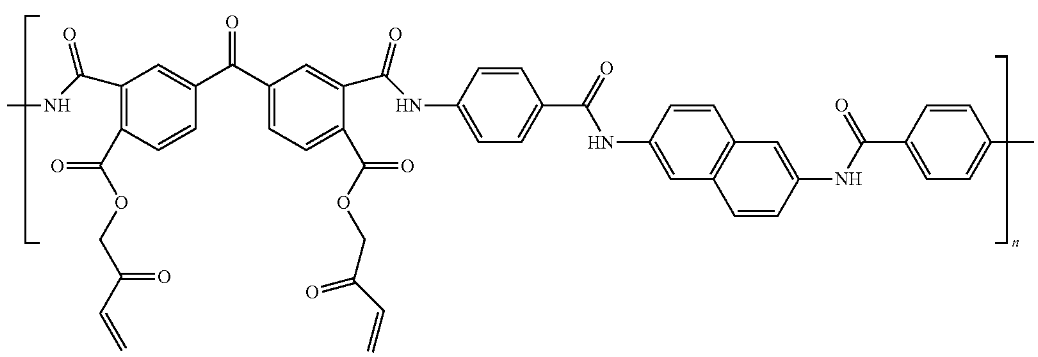
P1-80
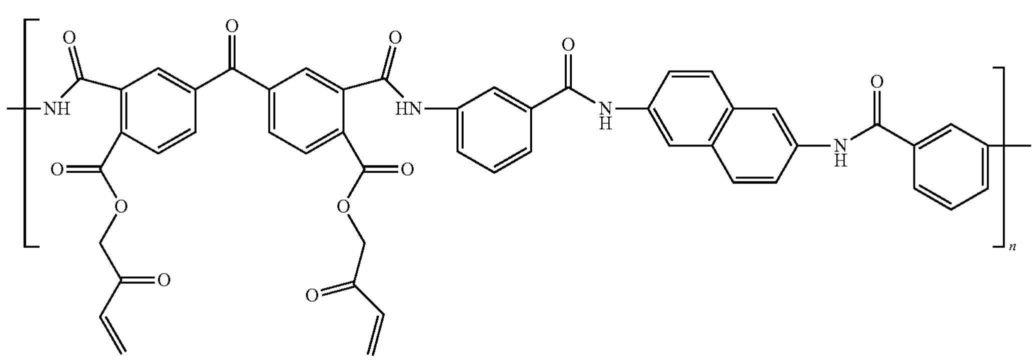

-continued
P1-81
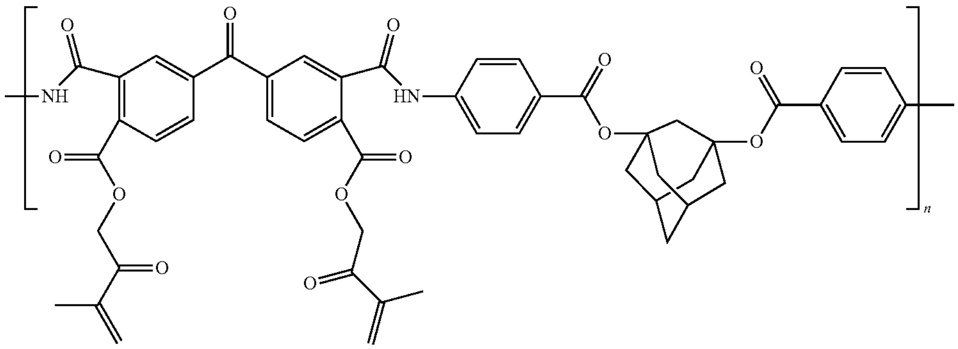
P1-82
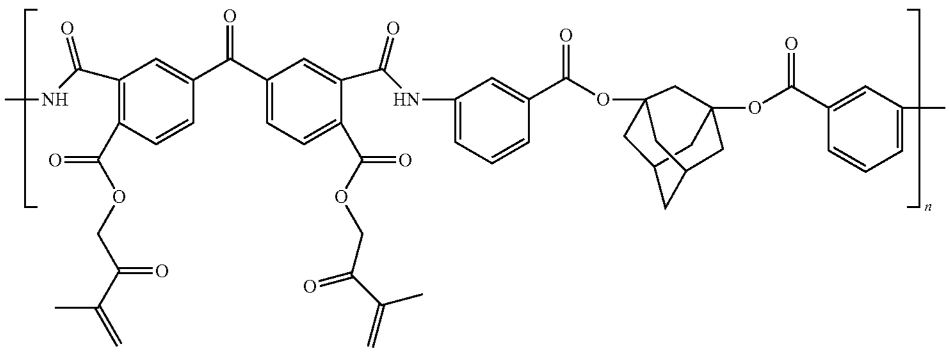
P1-83
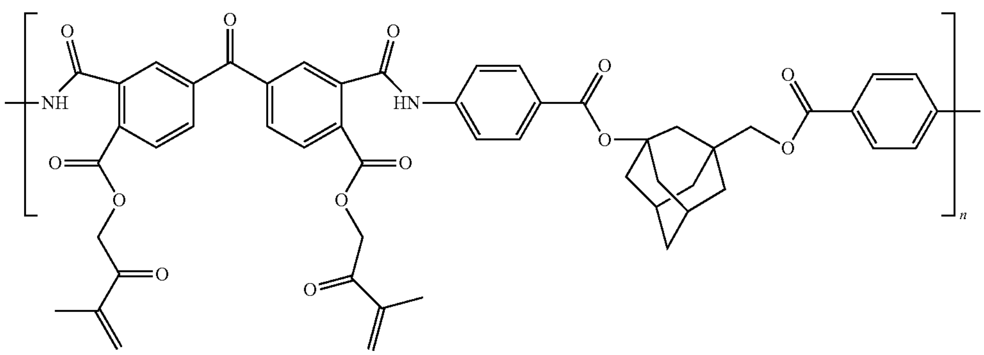
P1-84
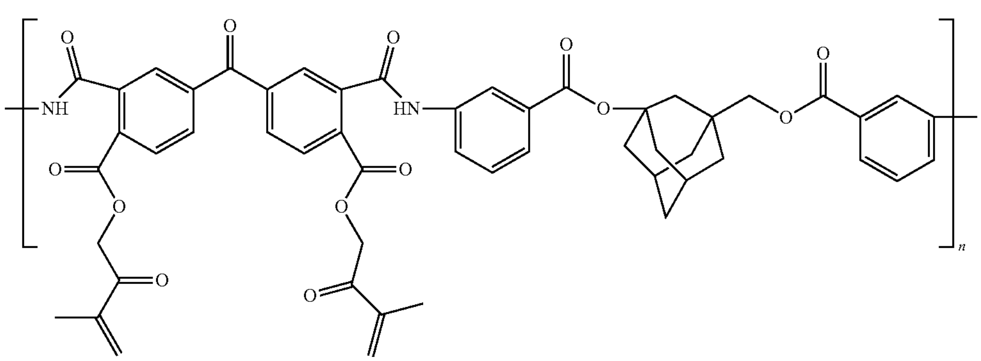

-continued
P1-85
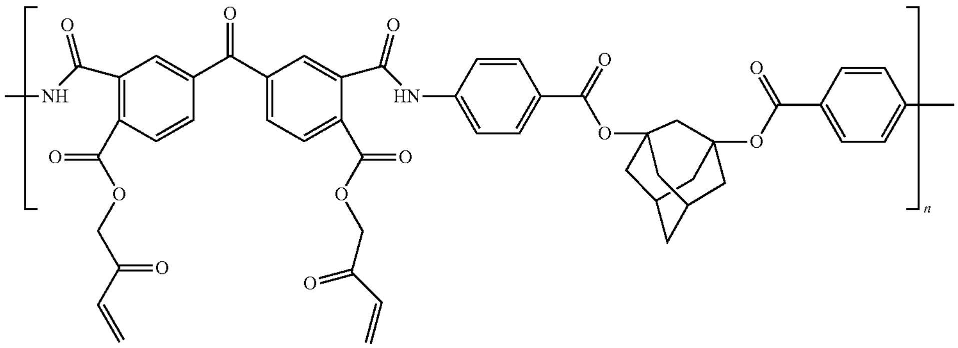
P1-86
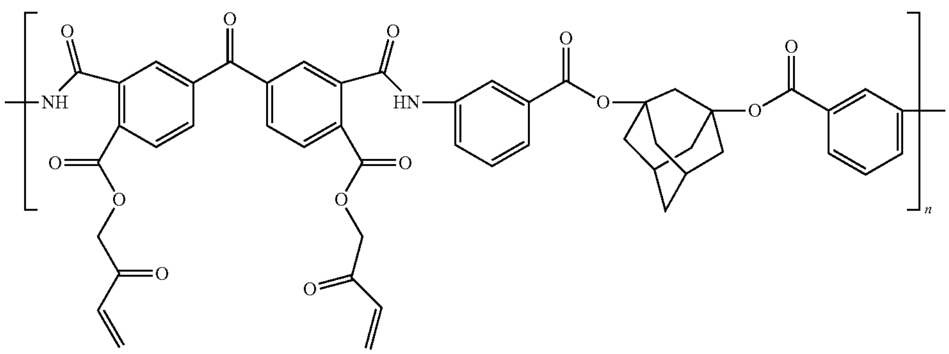
P1-87
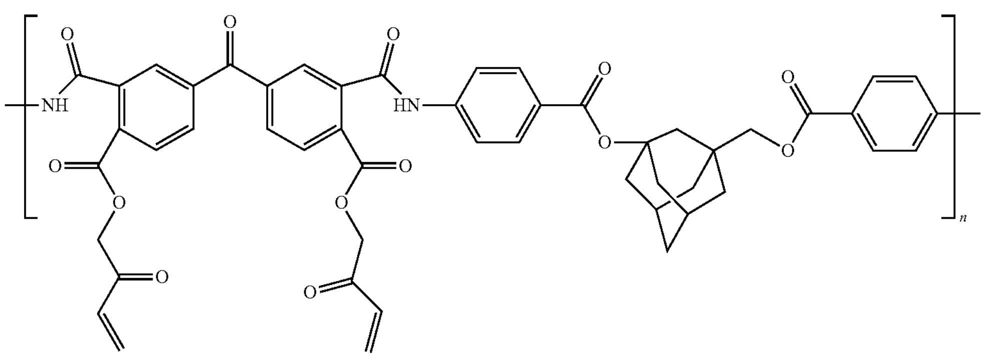
P1-88
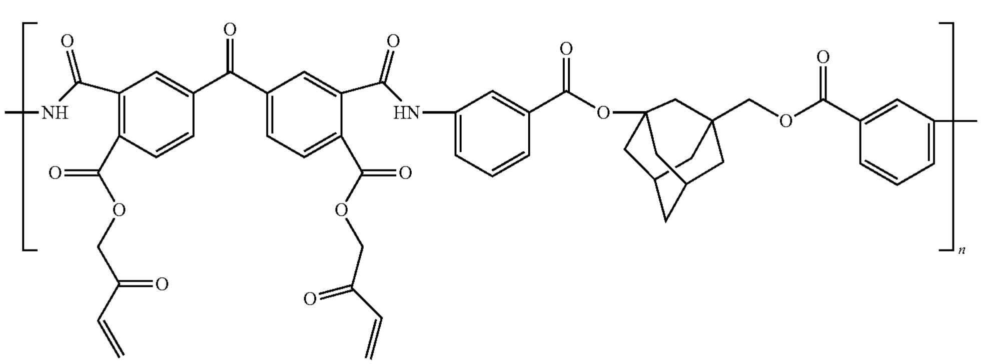

-continued
P1-89
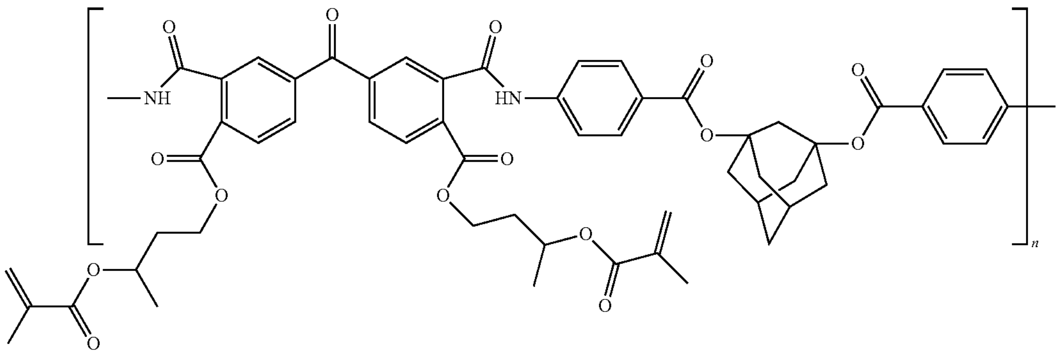
P1-90
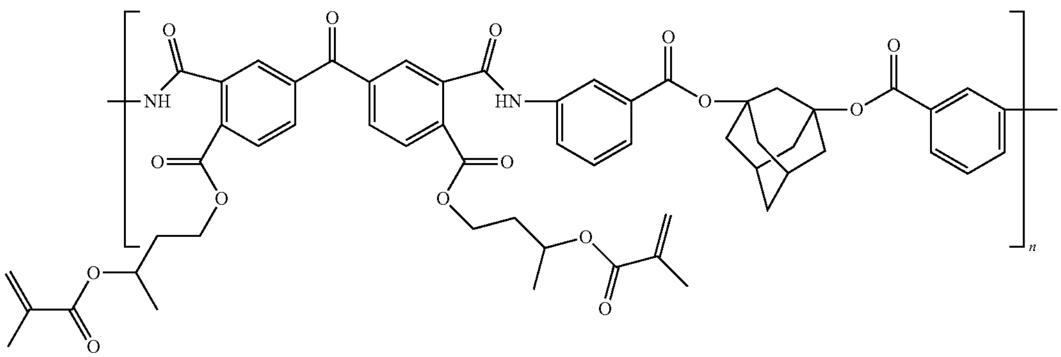
P1-91
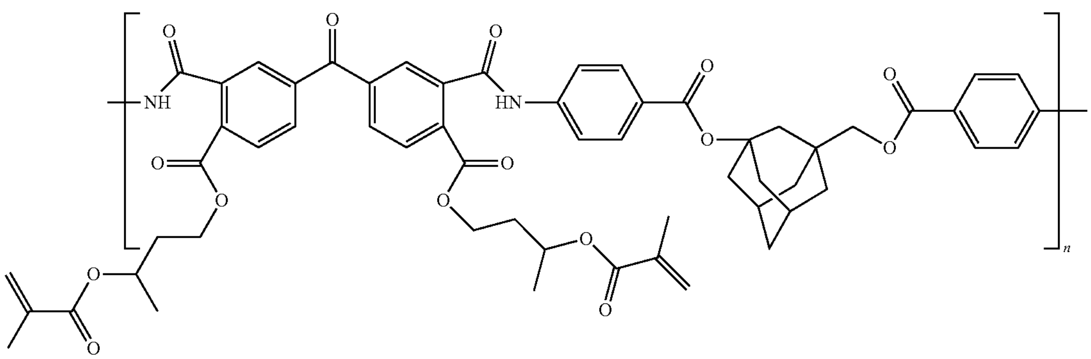
P1-92
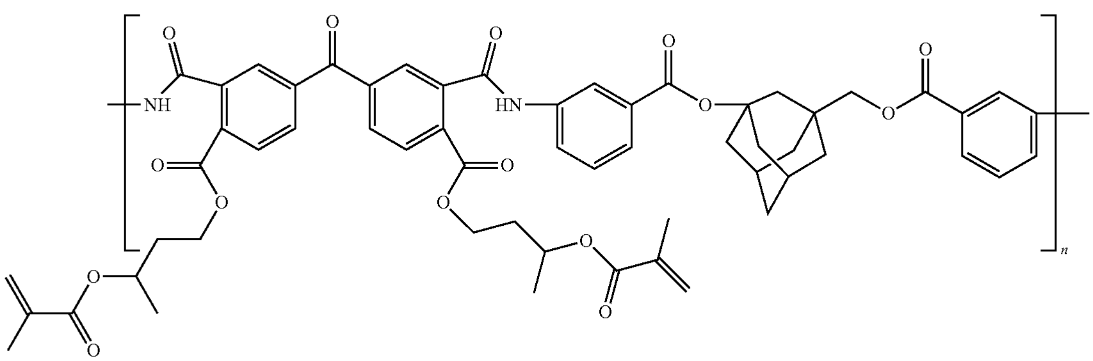

-continued
P1-93
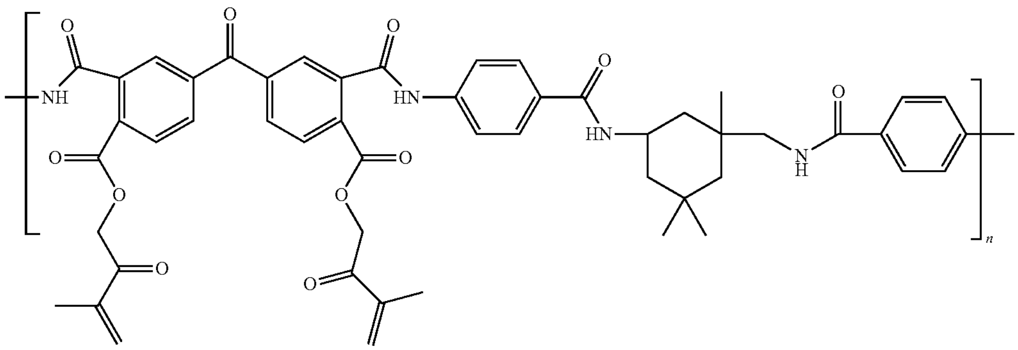
P1-94
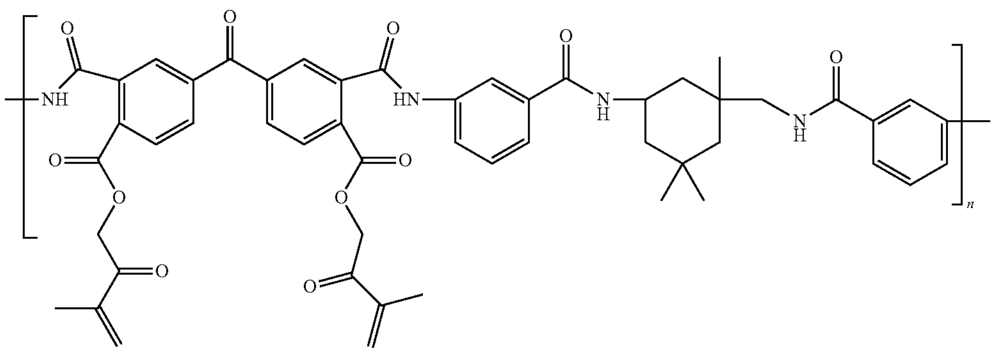
P1-95
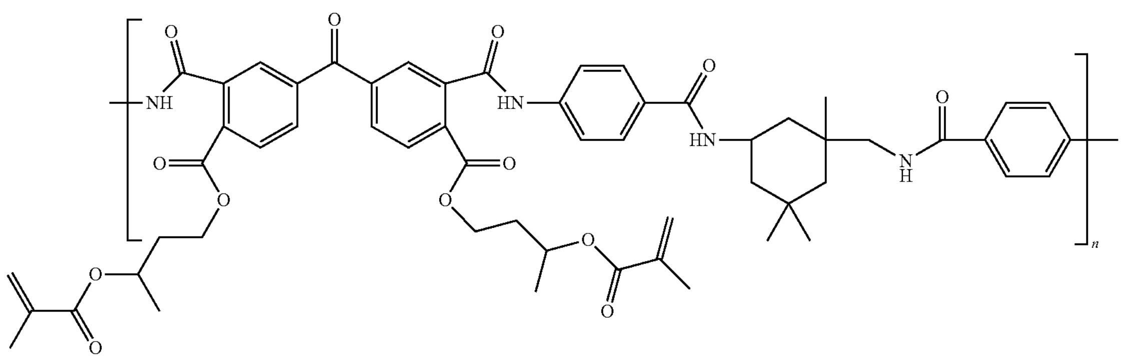
P1-96
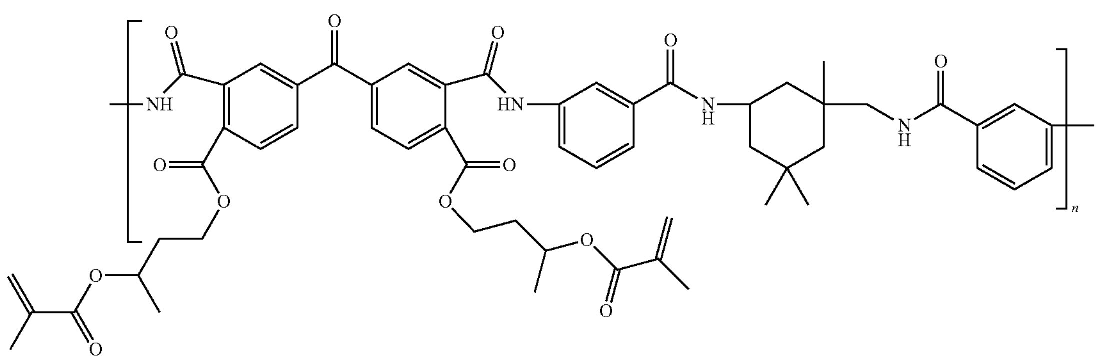

-continued
P1-97
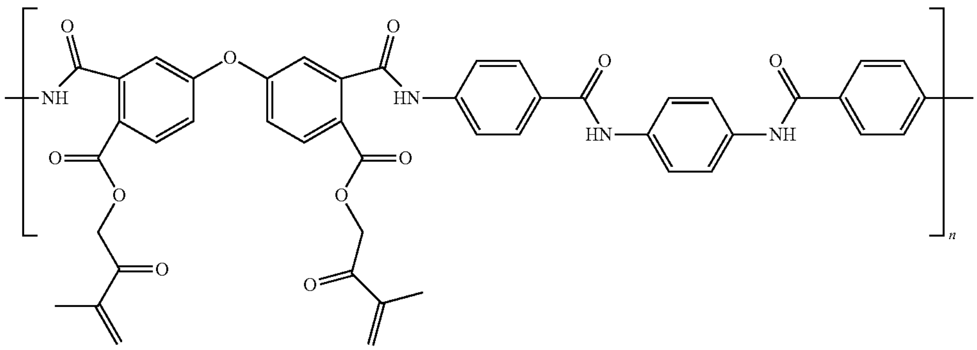
P1-98
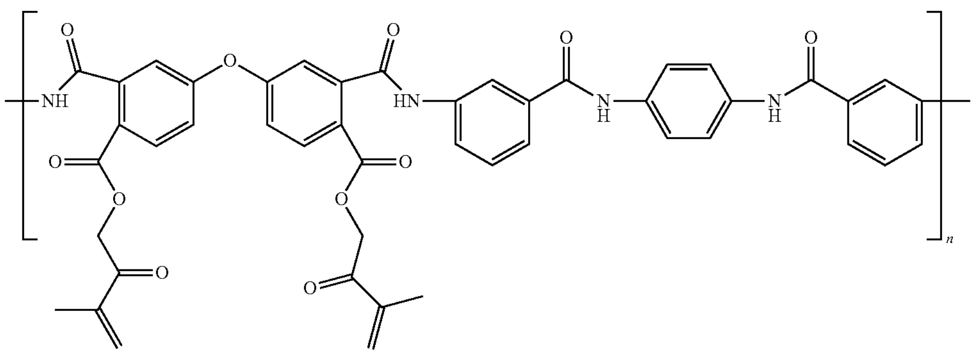
P1-99
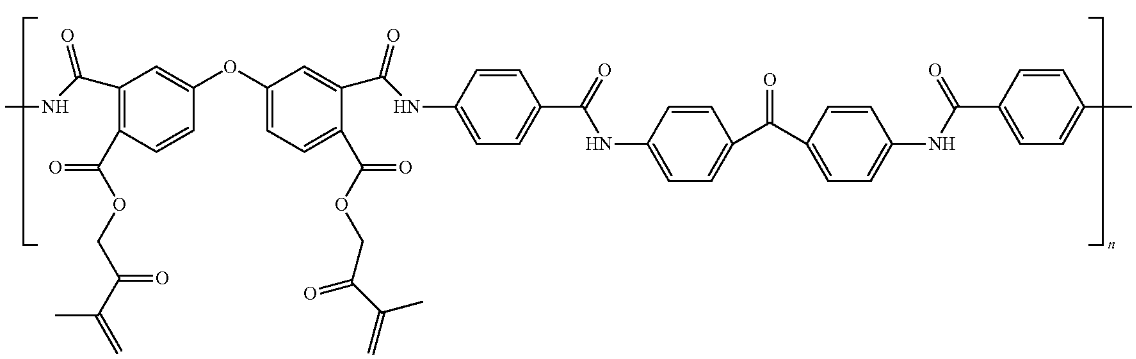
P1-100
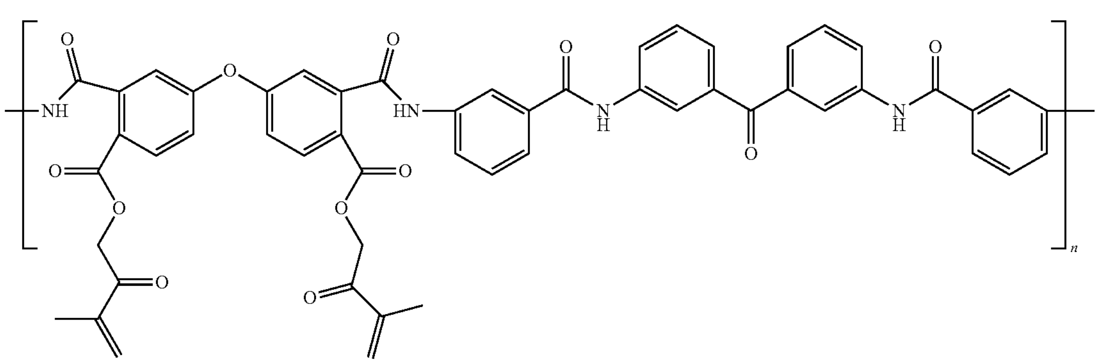

-continued
P1-101
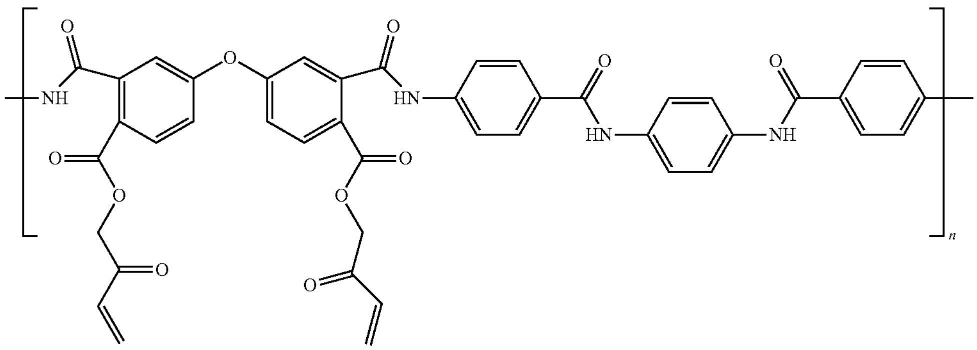
P1-102
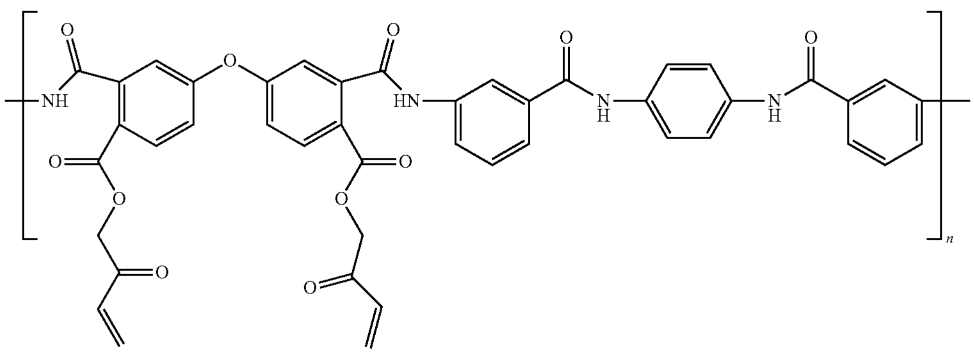
P1-103
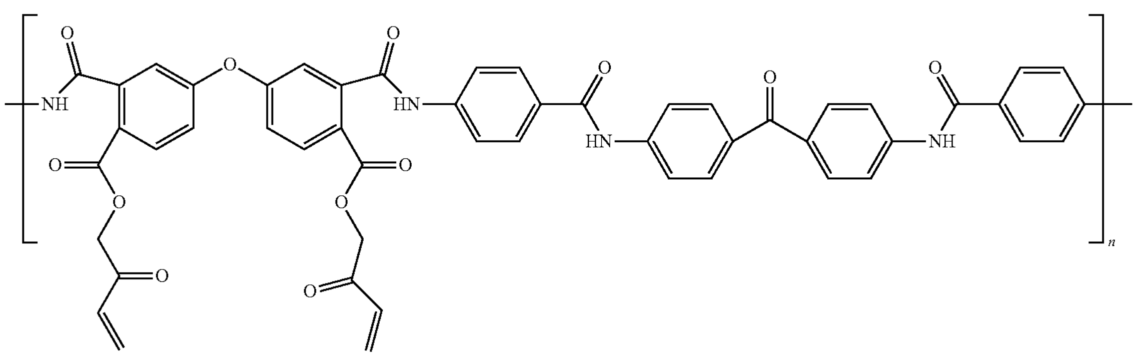
P1-104
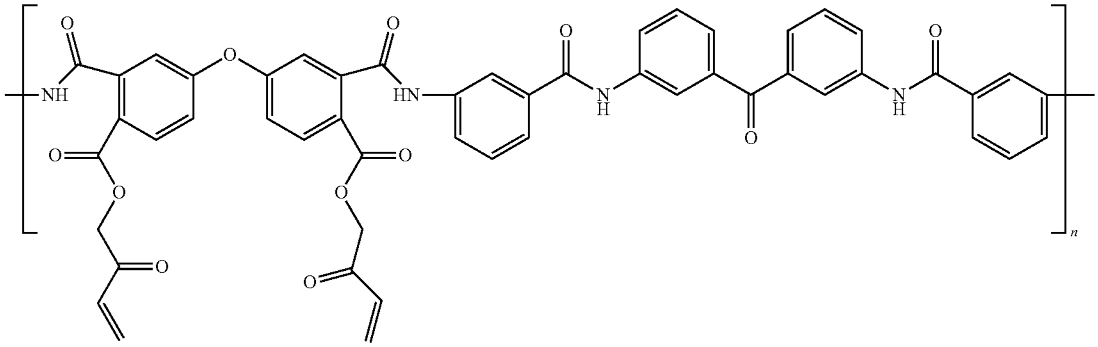

-continued
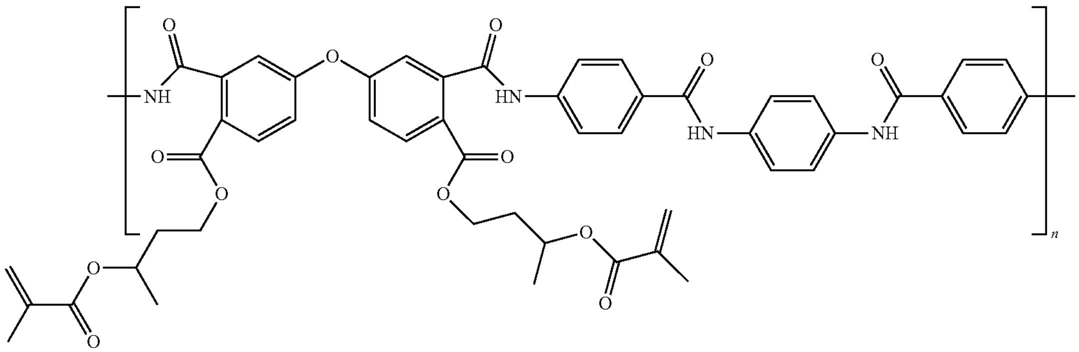
P1-105
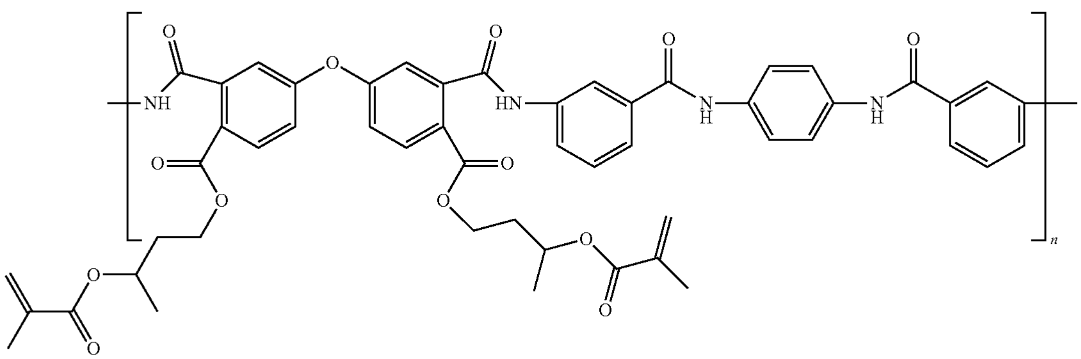
P1-106
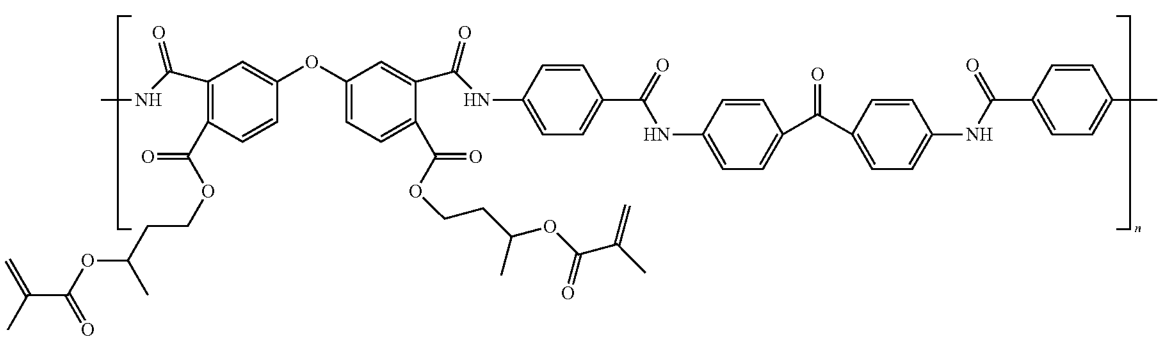
P1-107
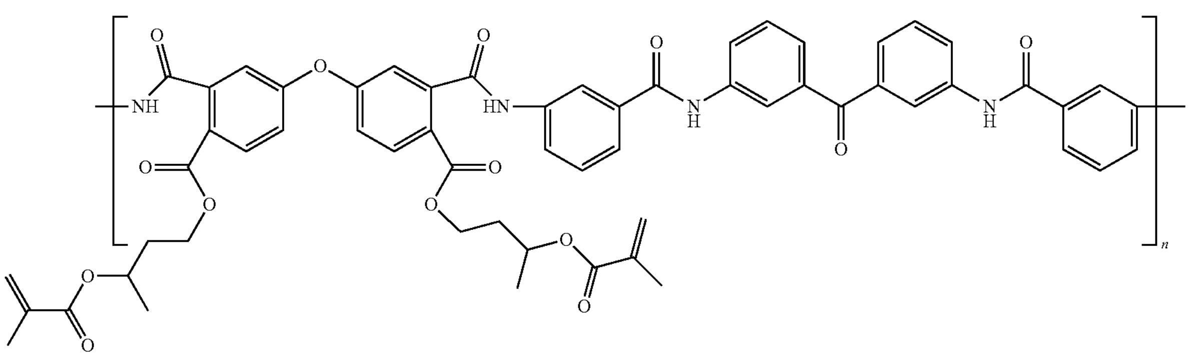
P1-108

-continued
P1-109
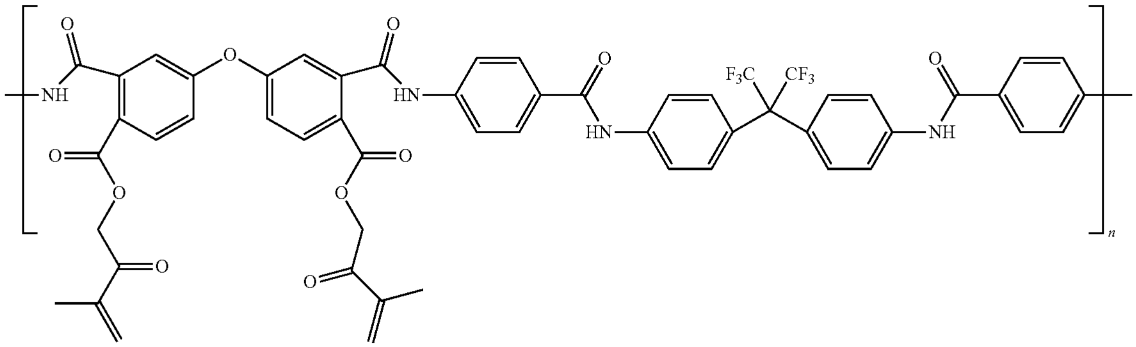
P1-110
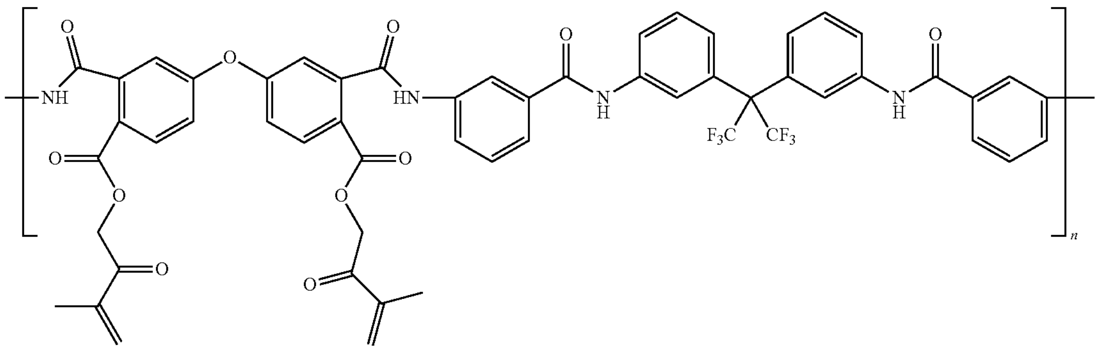
P1-111
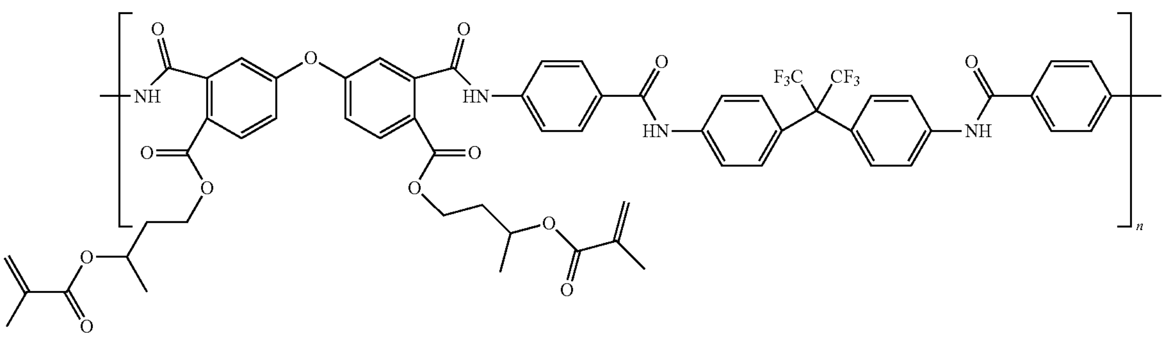
P1-112
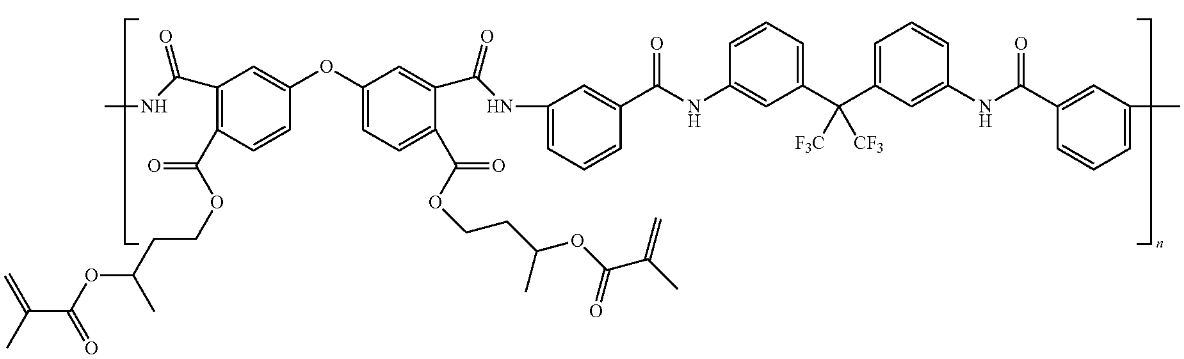

-continued
P1-113
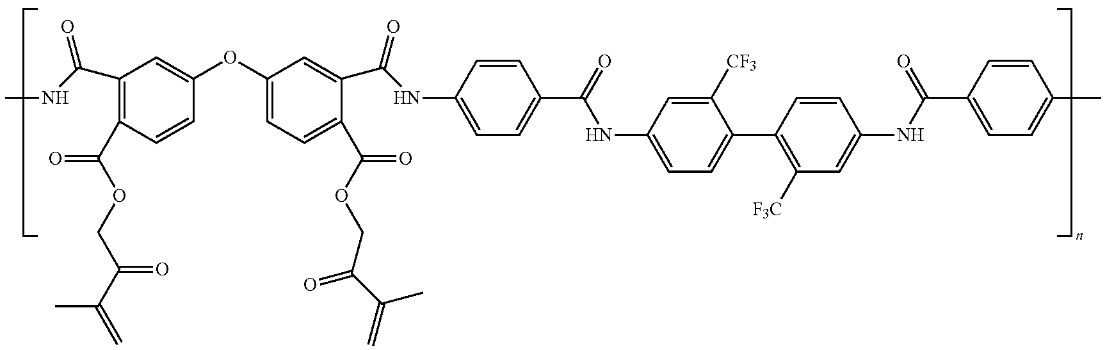
P1-114
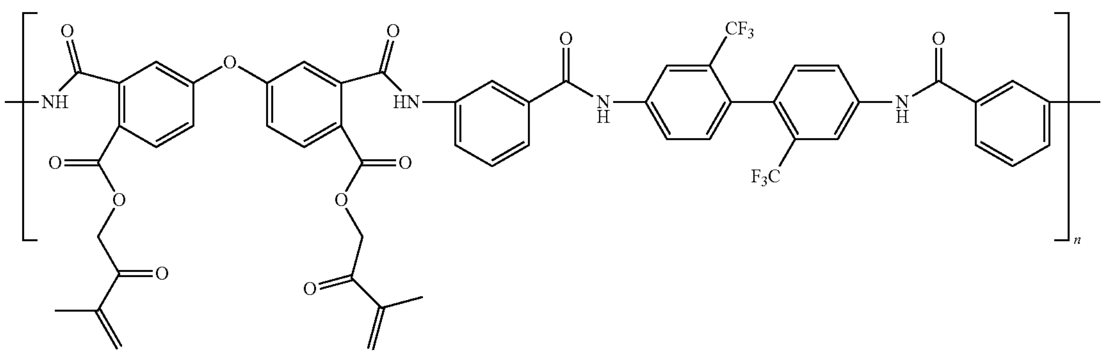
P1-115
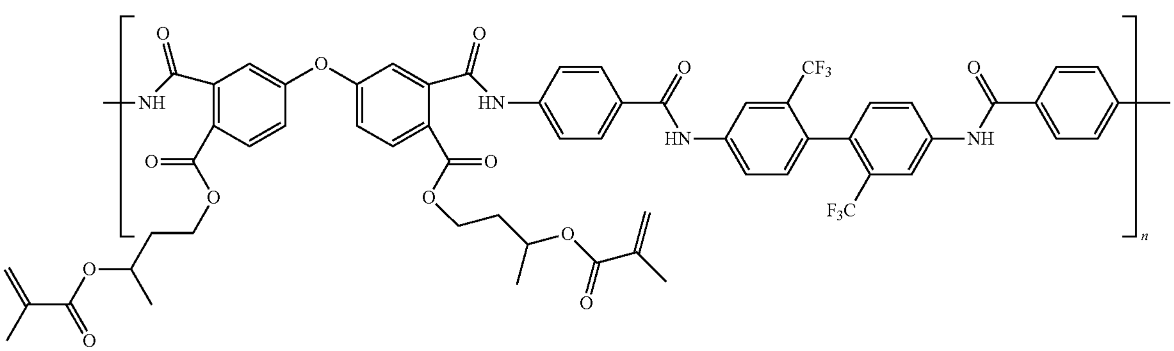
P1-116
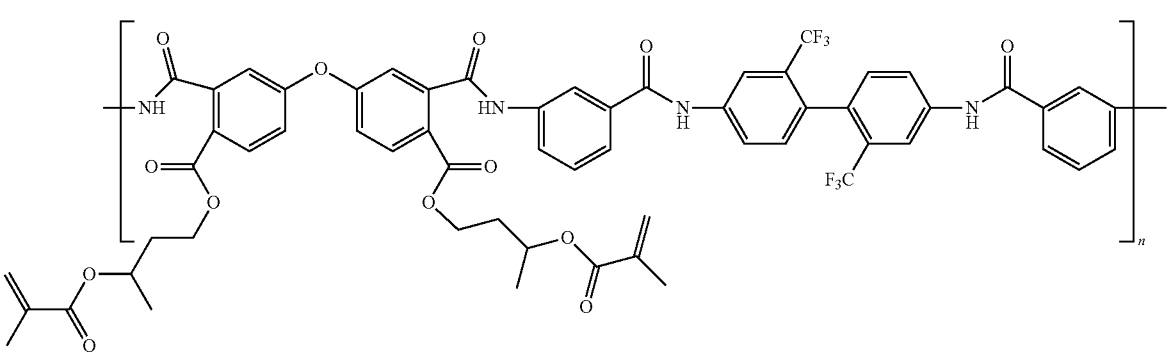

-continued
P1-117
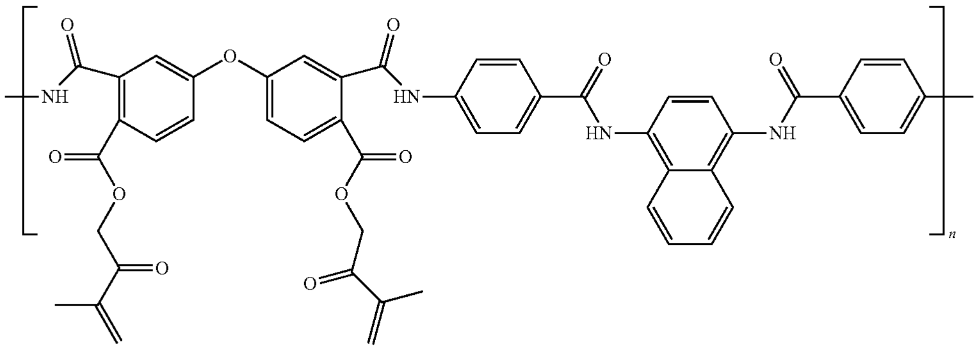
P1-118
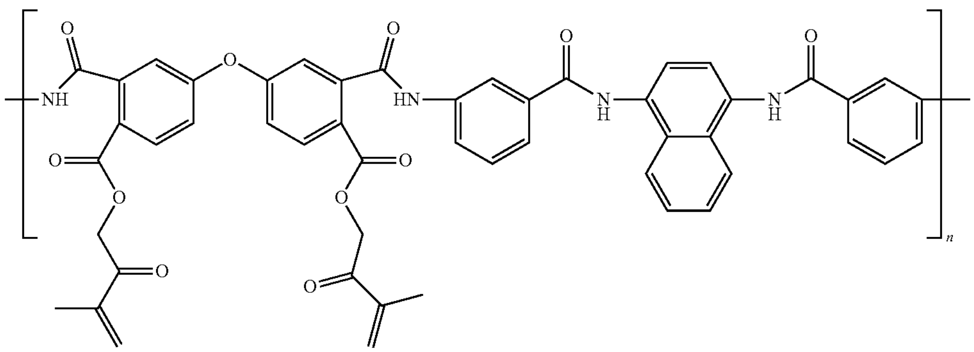
P1-119
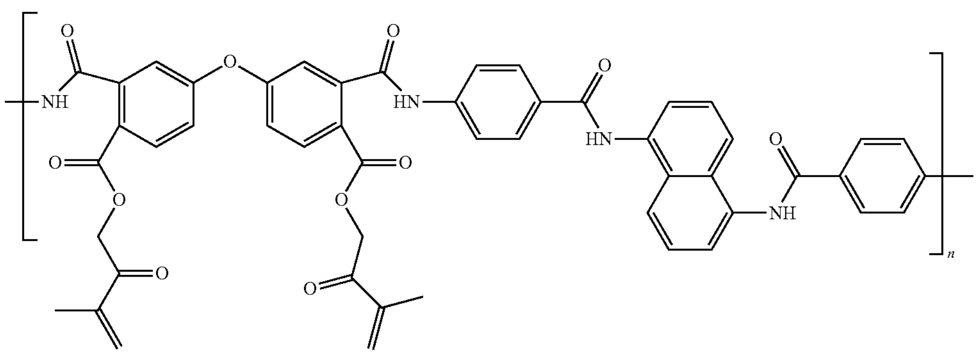
P1-120
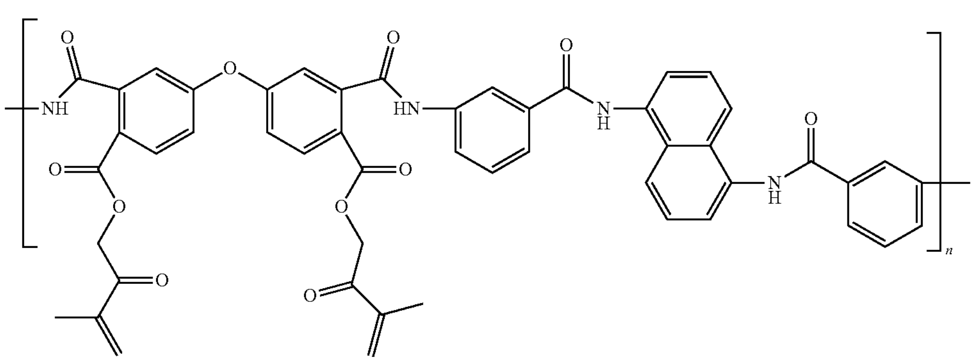

-continued
P1-121
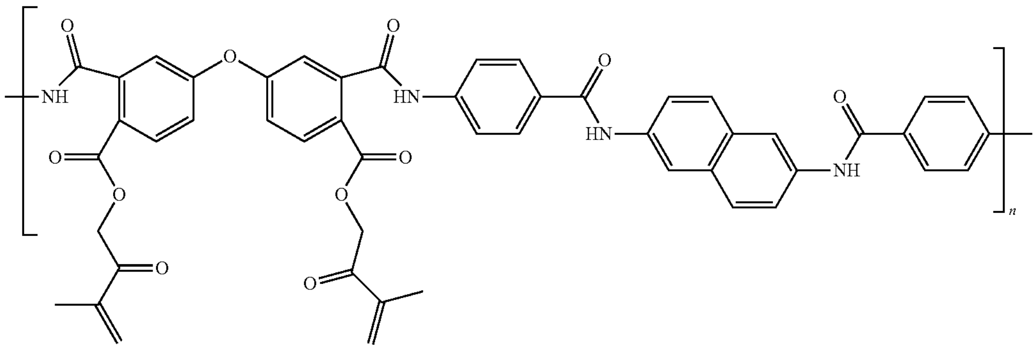
P1-122
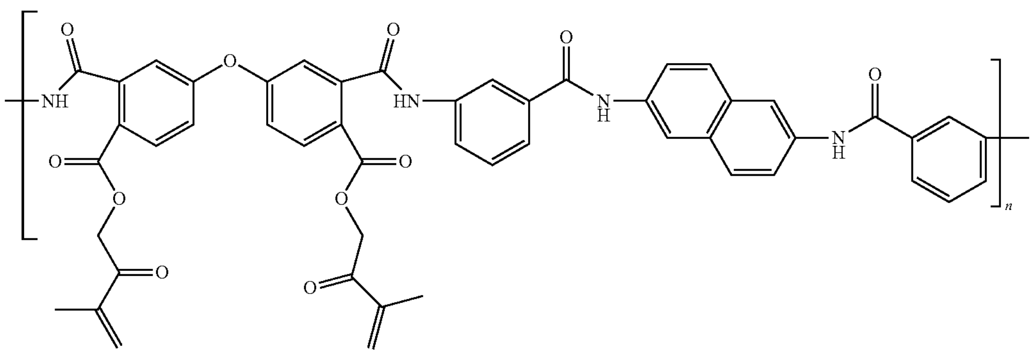
P1-123
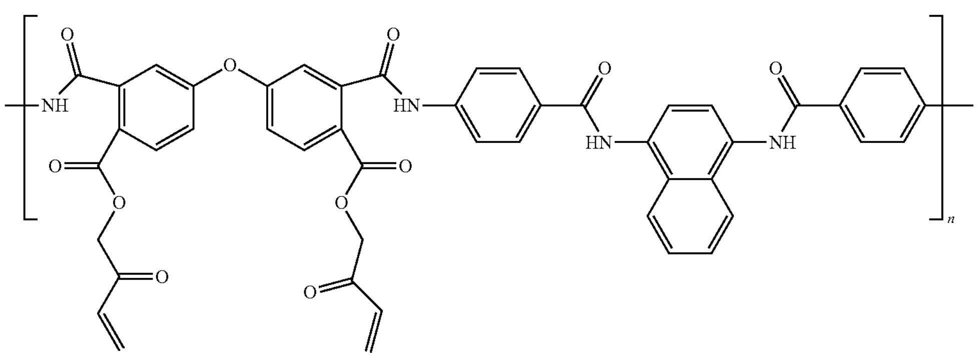
P1-124
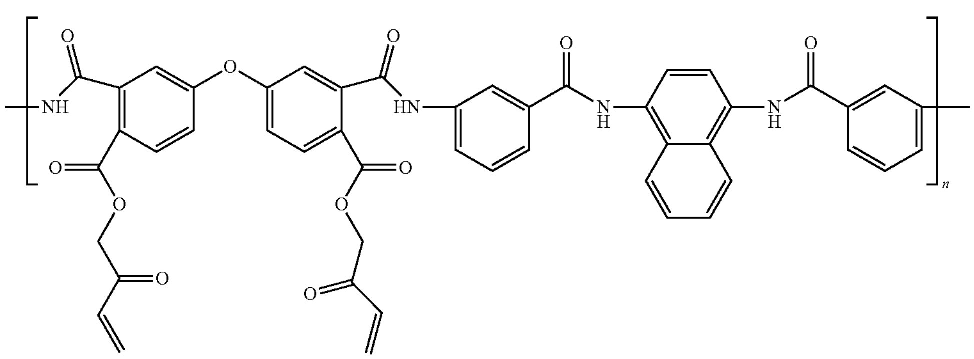

-continued
P1-125
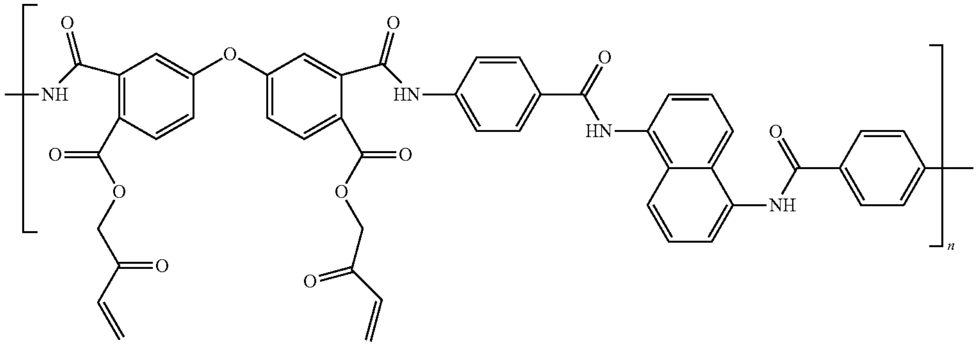
P1-126
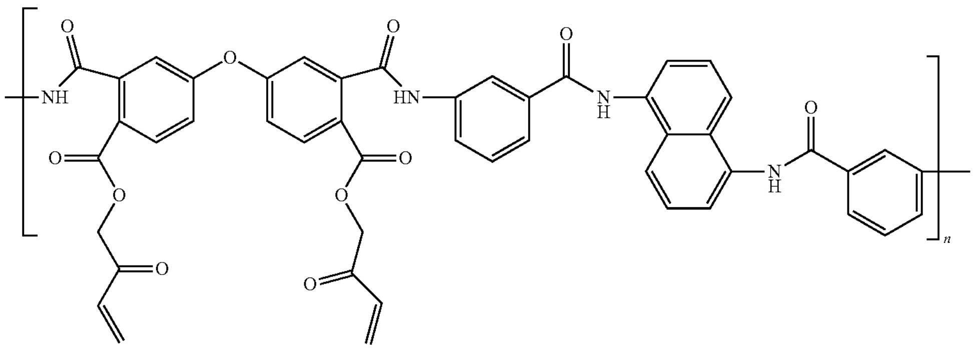
P1-127
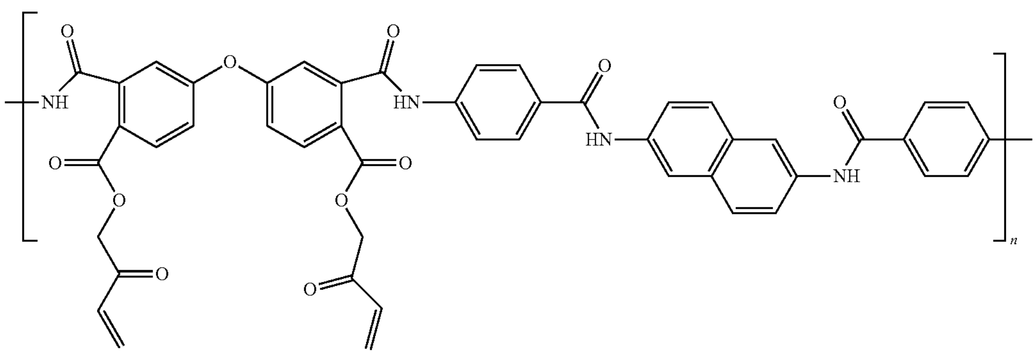
P1-128
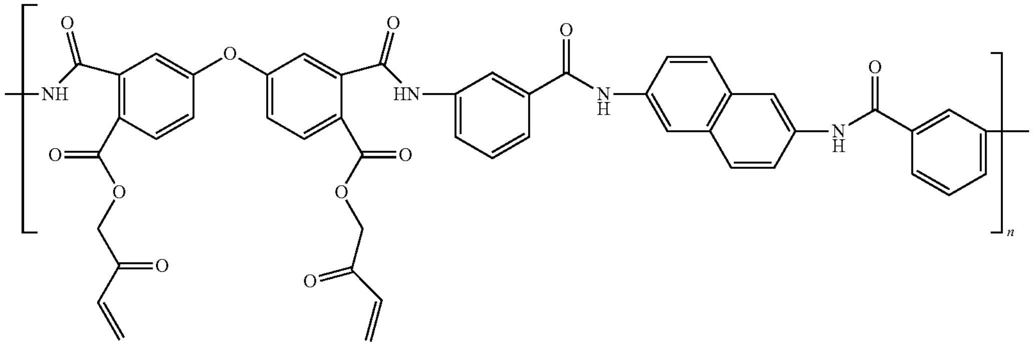

P1-129
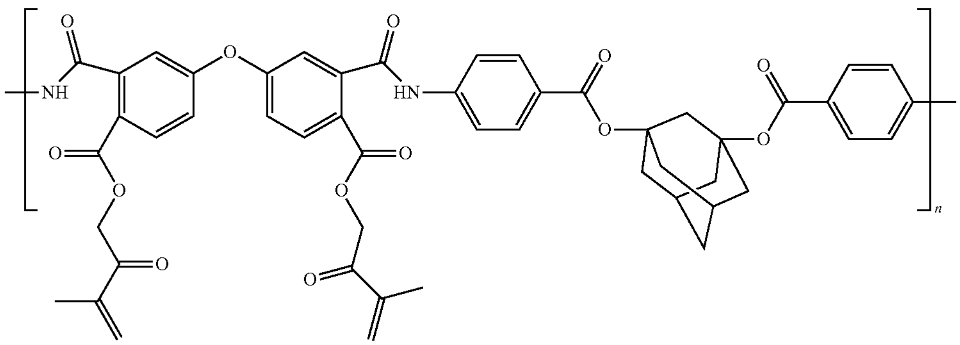
P1-130
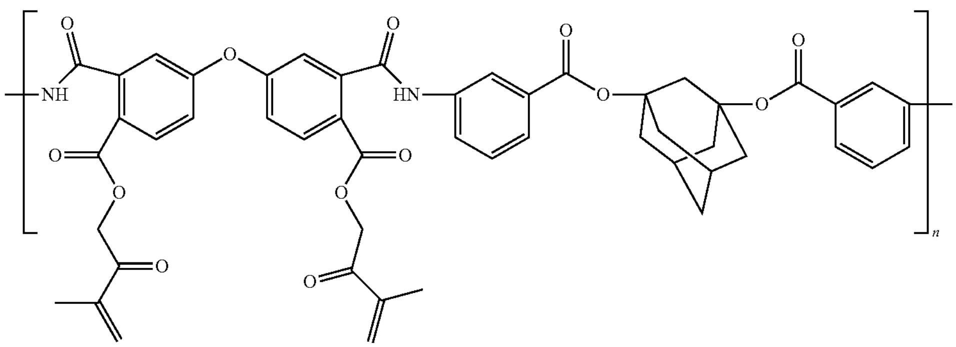
P1-131
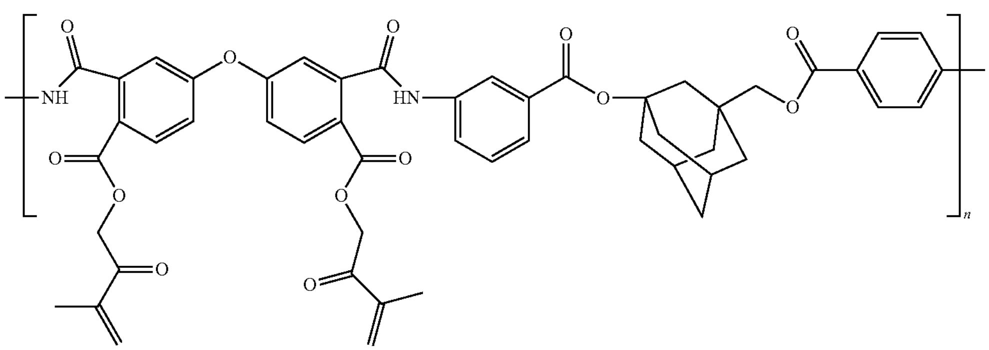
P1-132
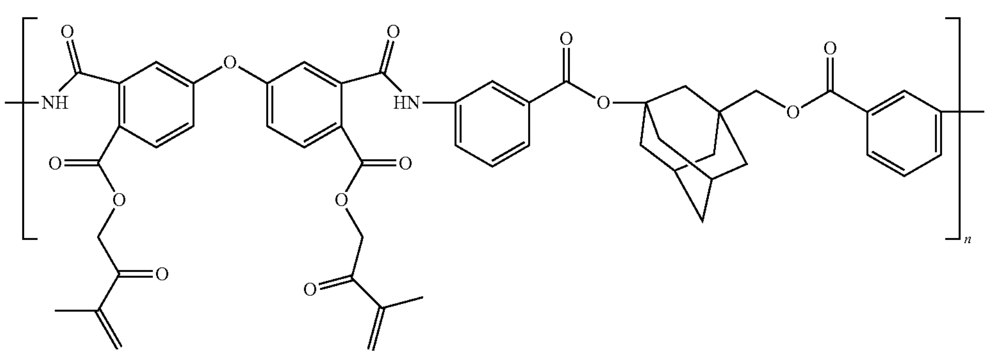

-continued
P1-133
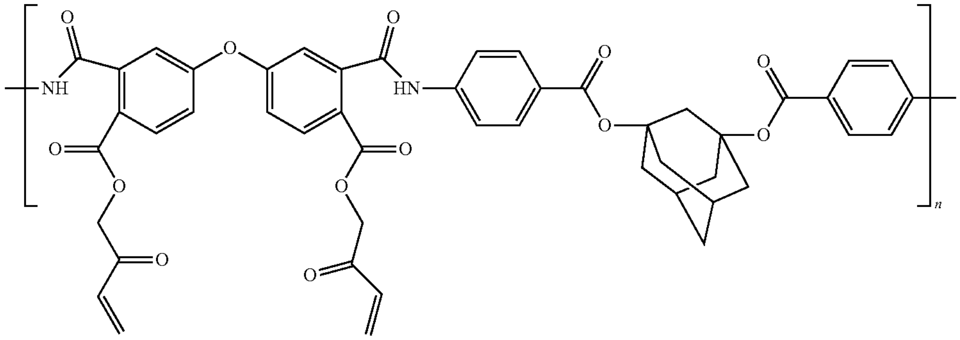
P1-134
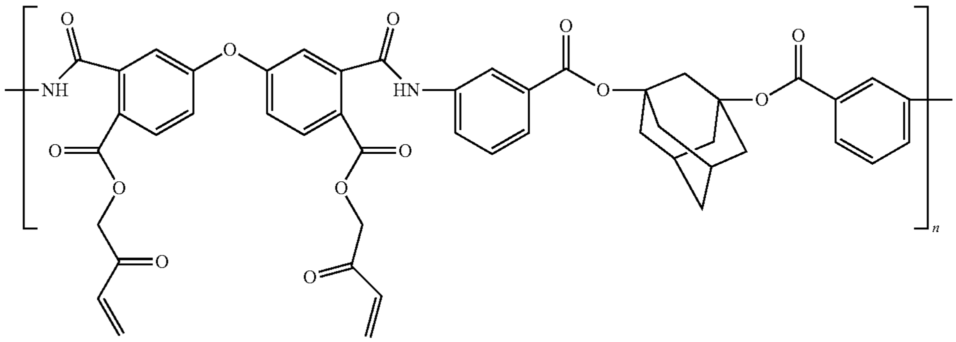
P1-135
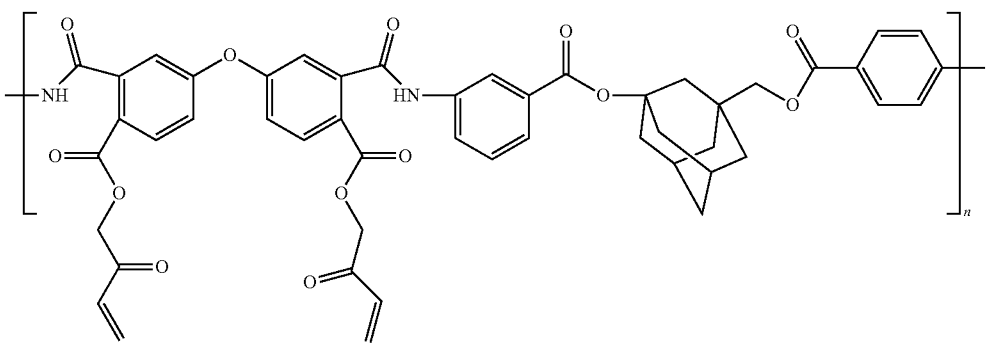
P1-136
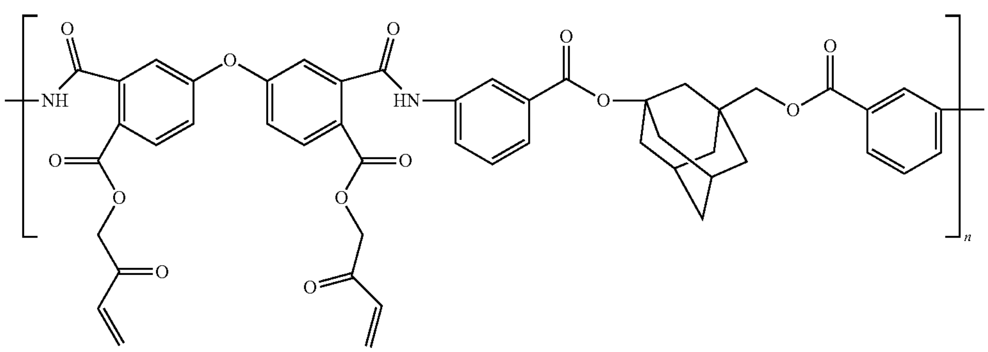

-continued
P1-137
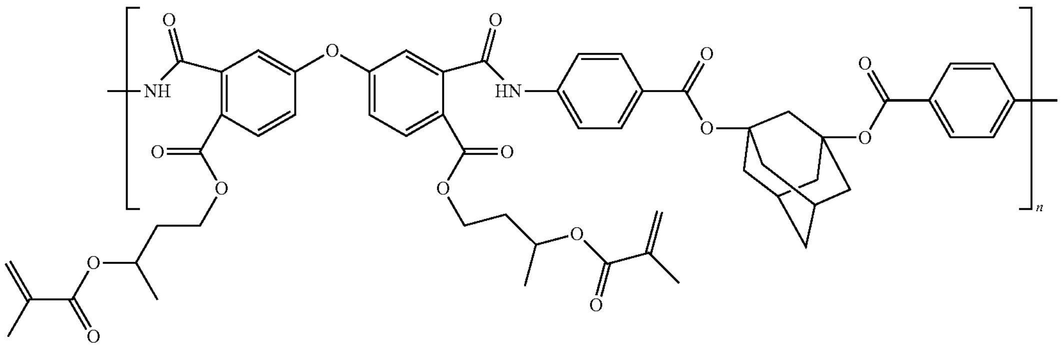
P1-138
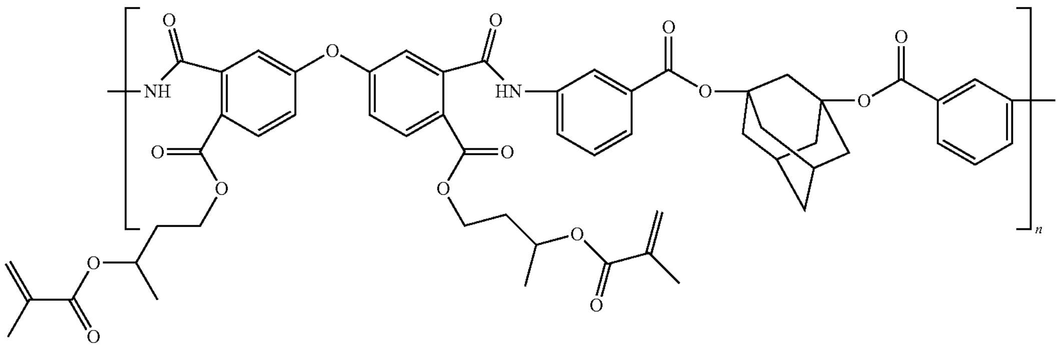
P1-139
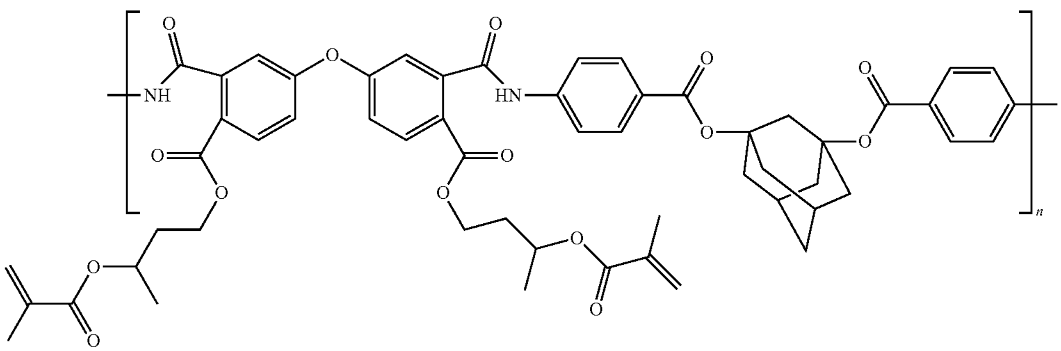
P1-140
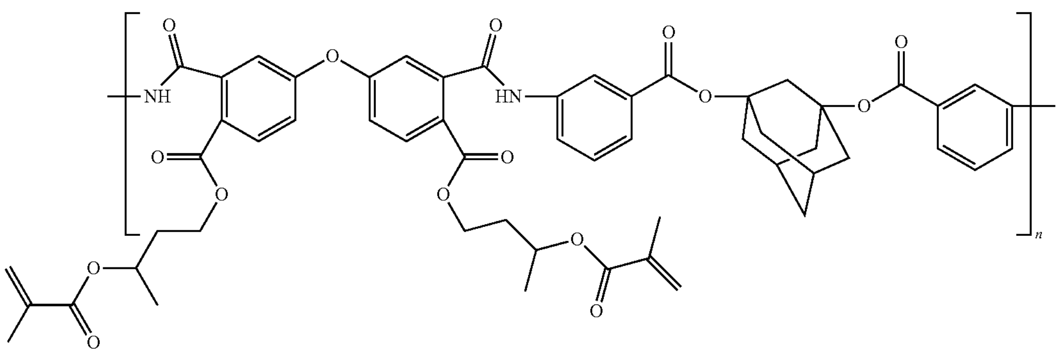

-continued
P1-141
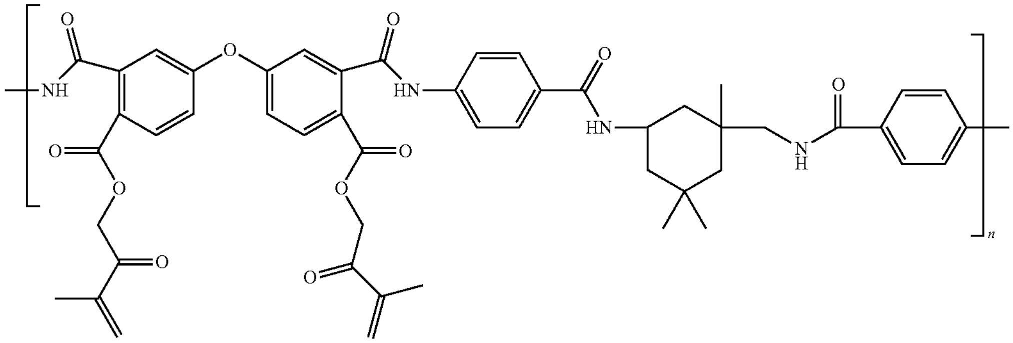
P1-142
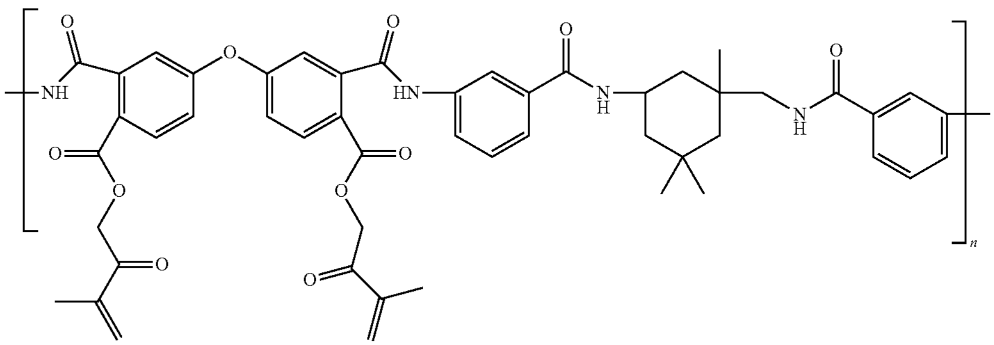
P1-143
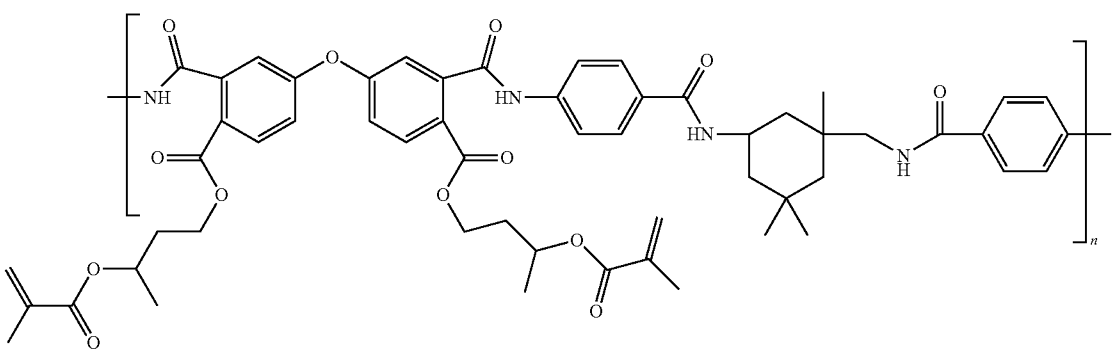
P1-144
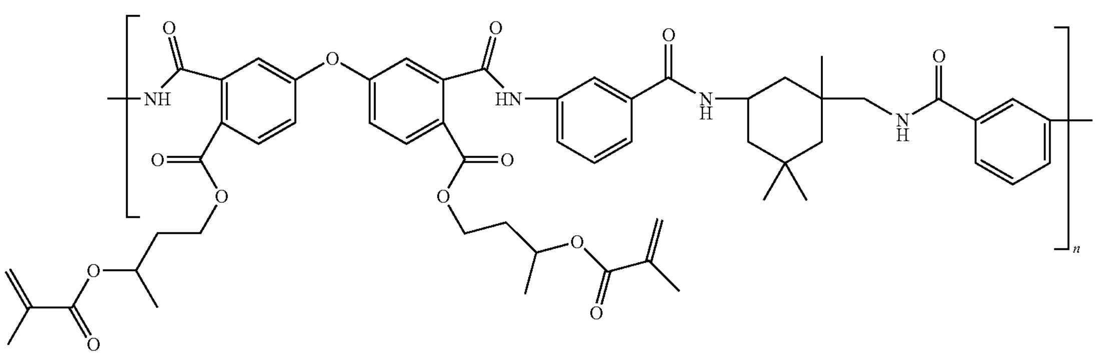

-continued
P1-145
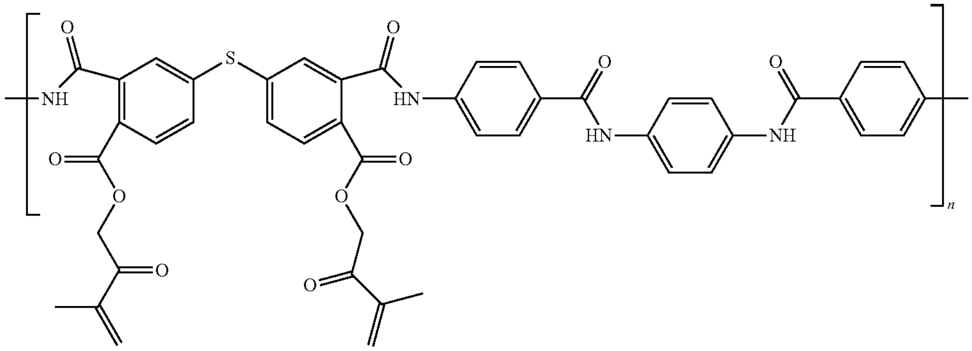
P1-146
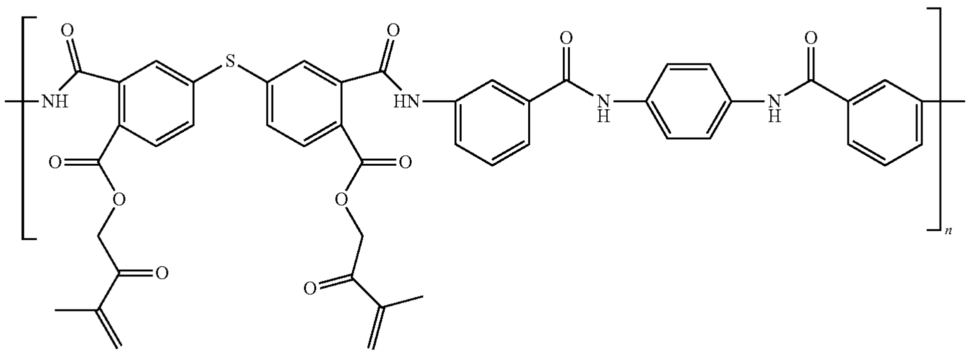
P1-147
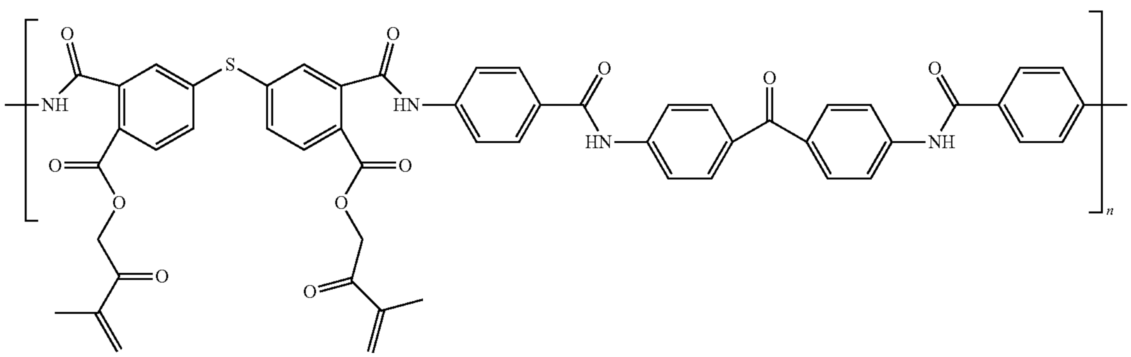
P1-148
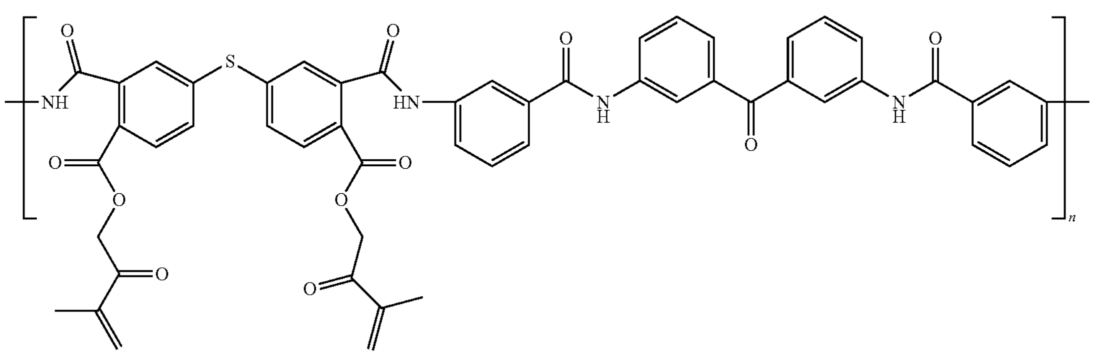

-continued
P1-149
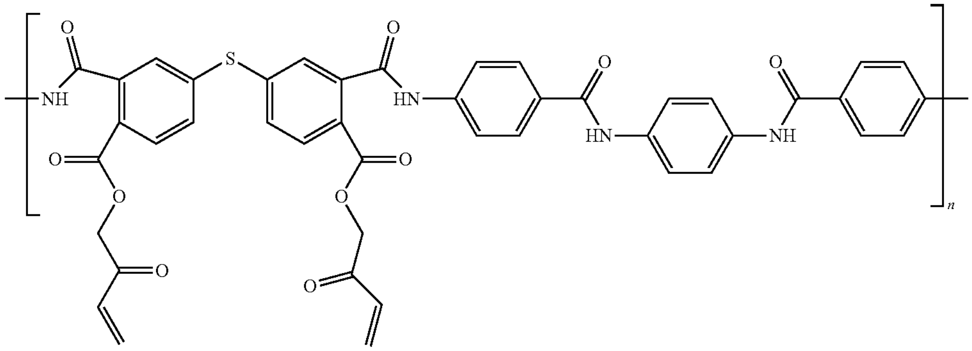
P1-150
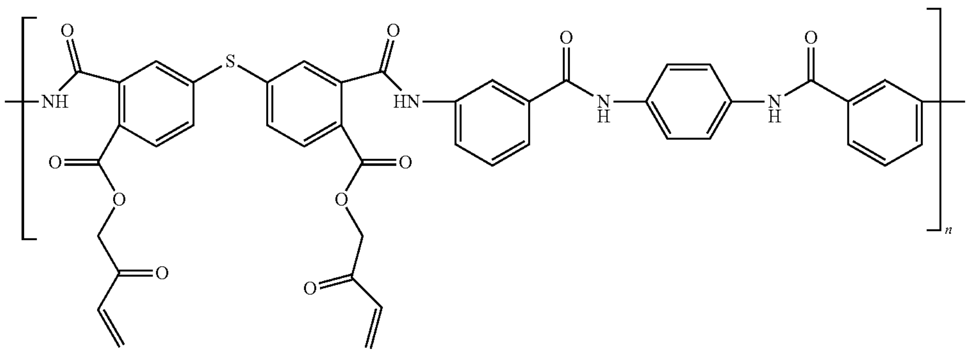
P1-151
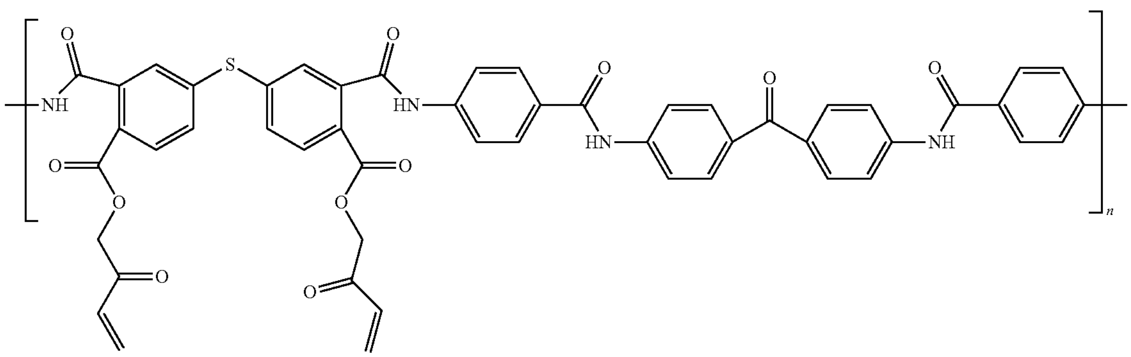
P1-152
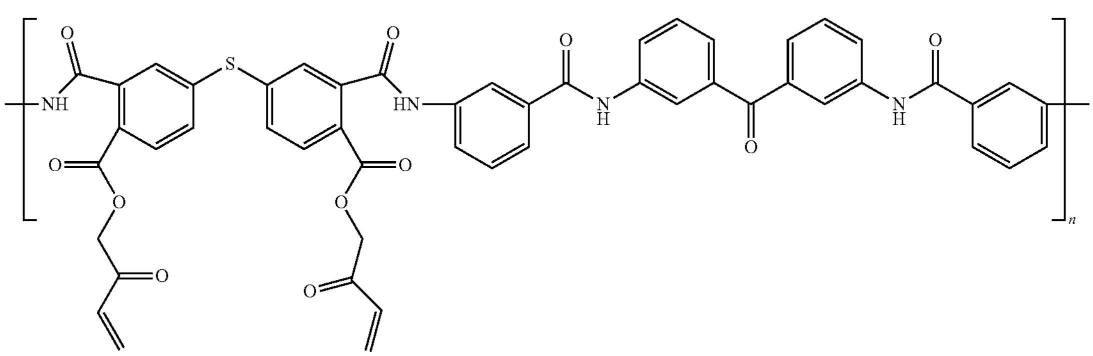

-continued
P1-153
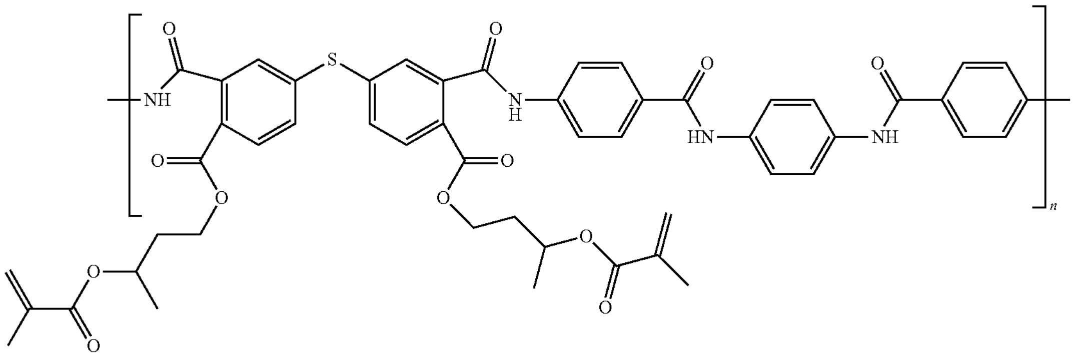
P1-154
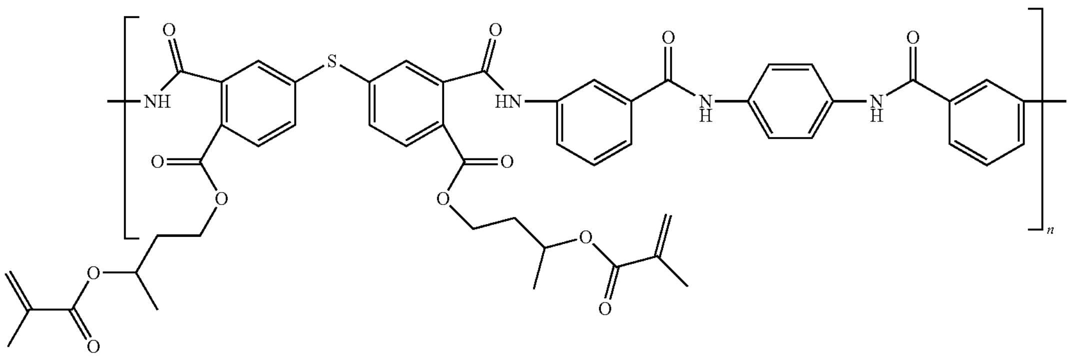
P1-155
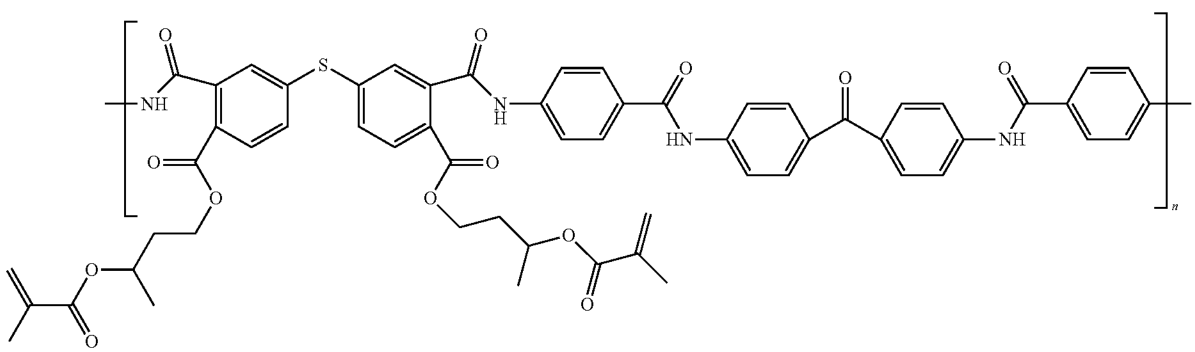
P1-156
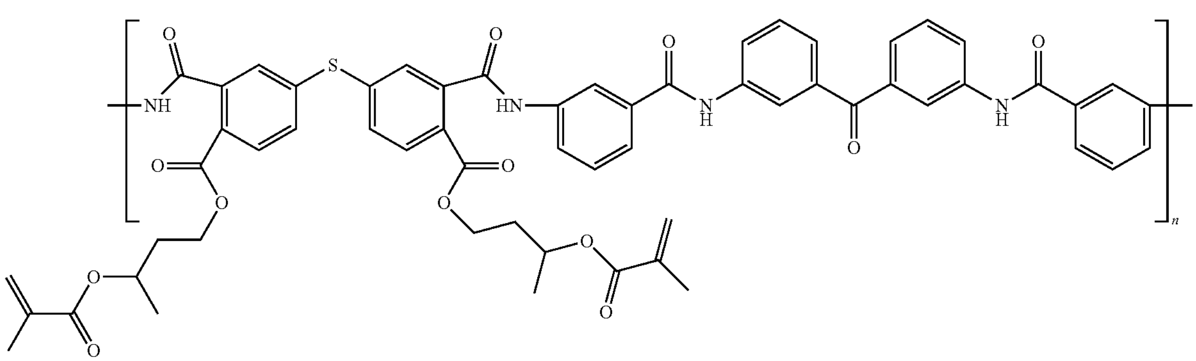

-continued
P1-157
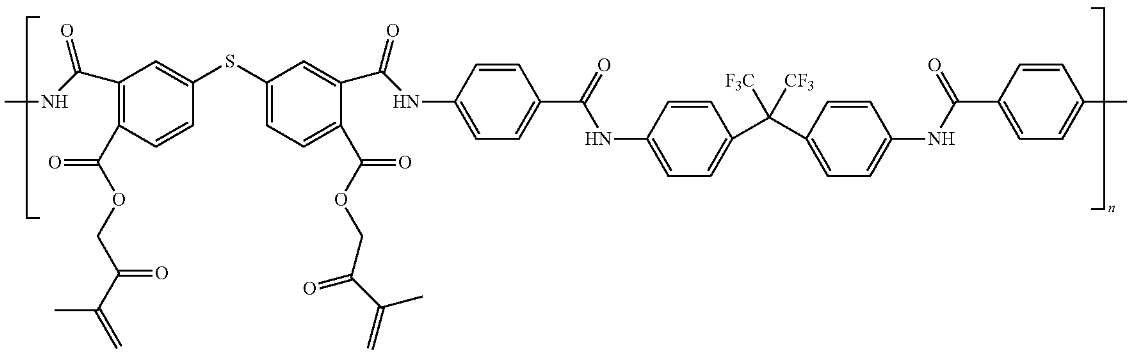
P1-158
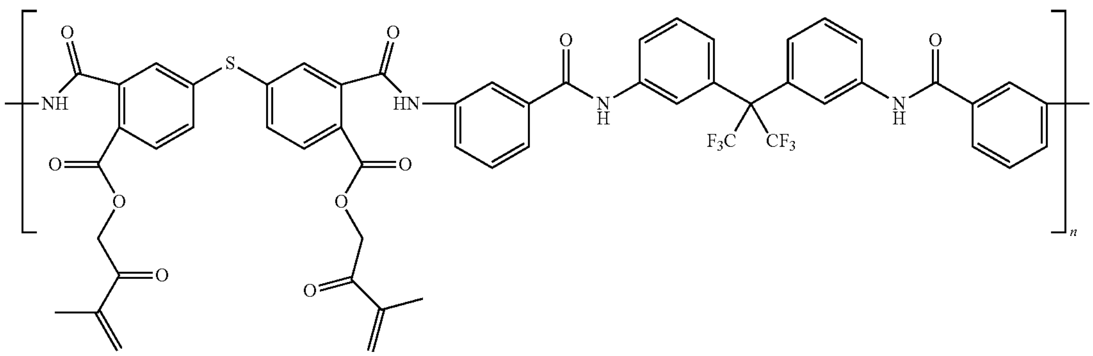
P1-159
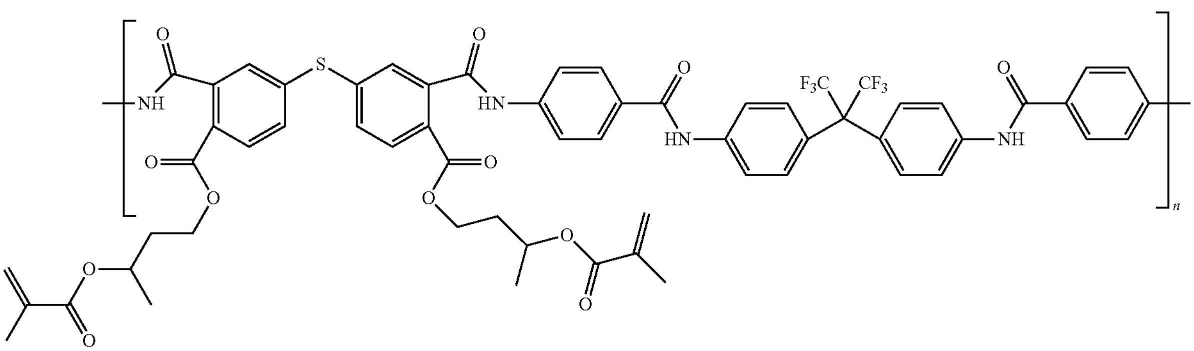
P1-160
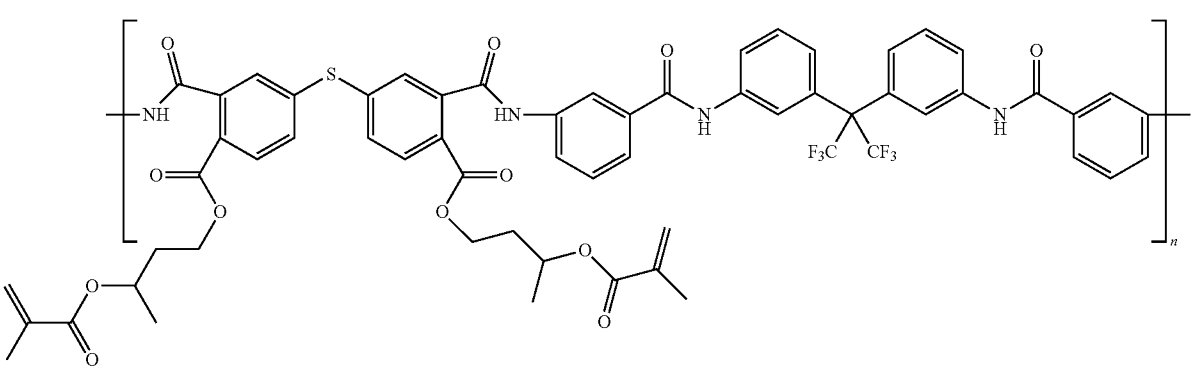

-continued
P1-161
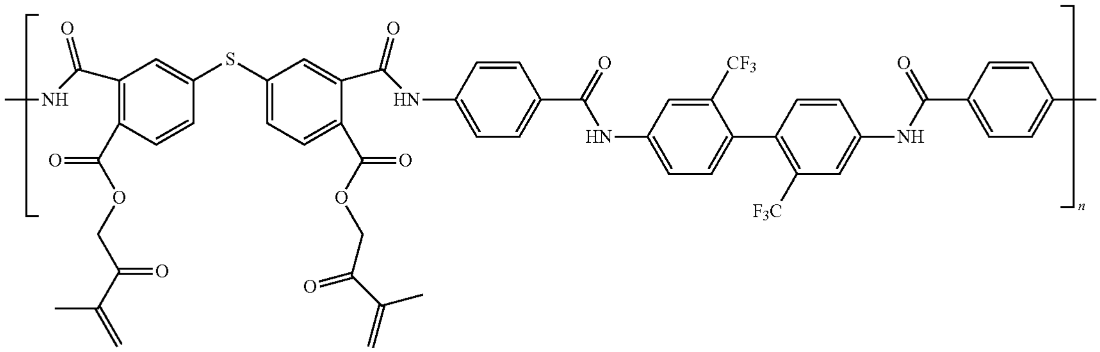
P1-162
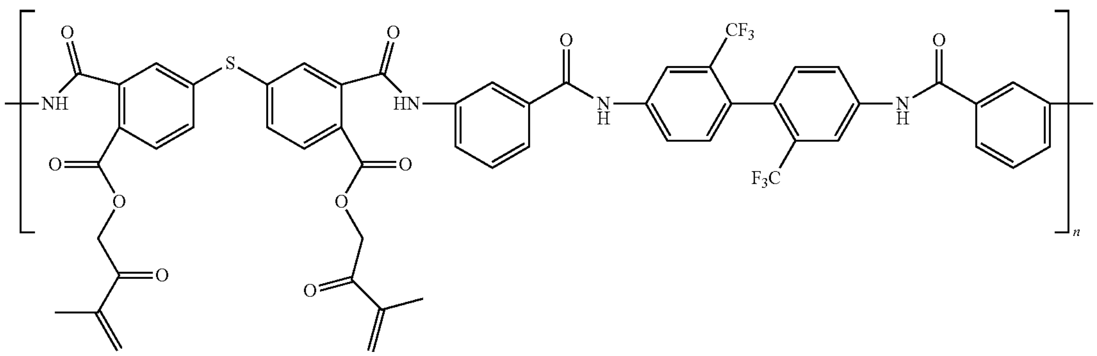
P1-163
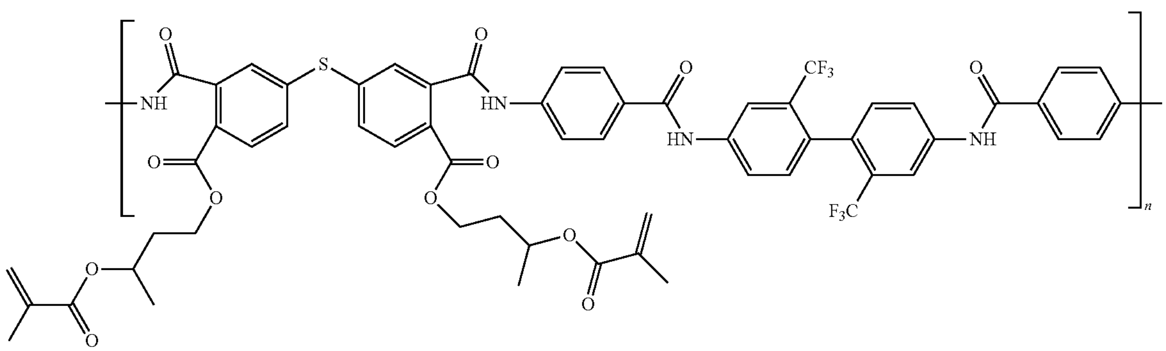
P1-164
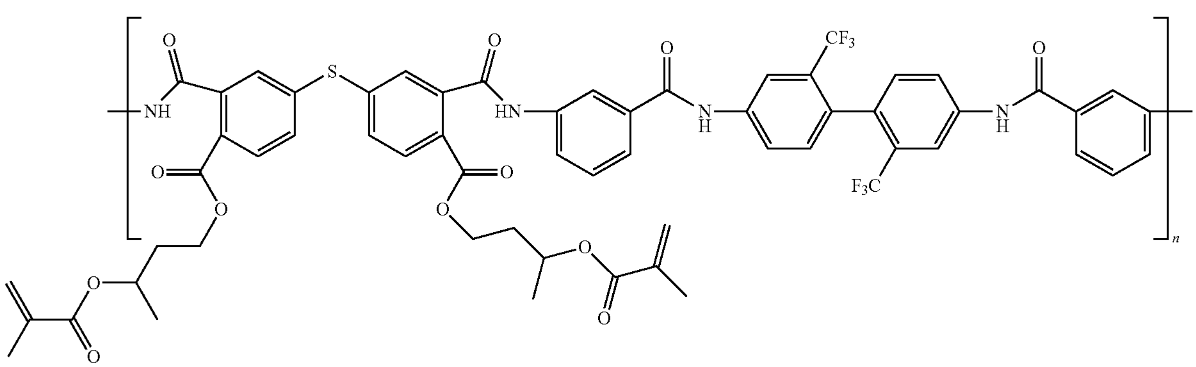

-continued
P1-165
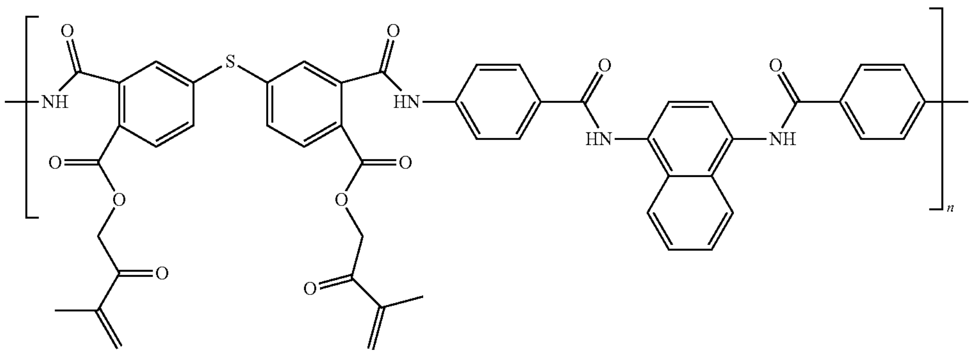
P1-166
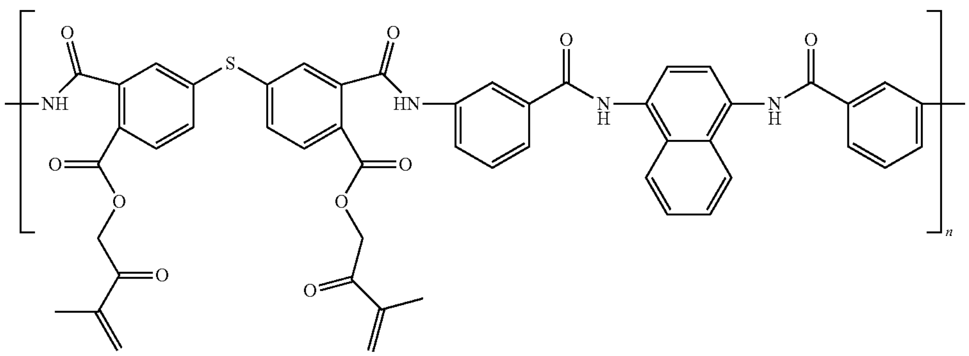
P1-167
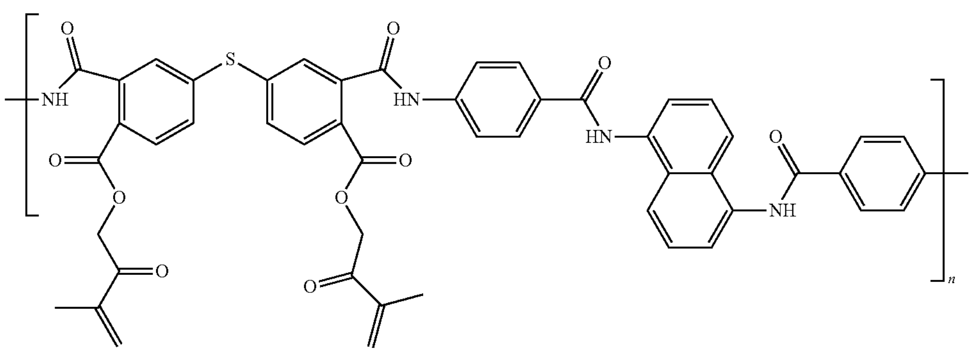
P1-168
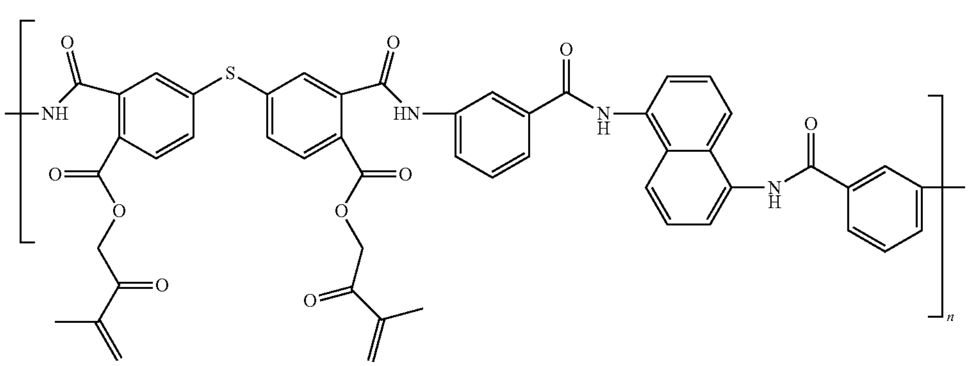

-continued
P1-169
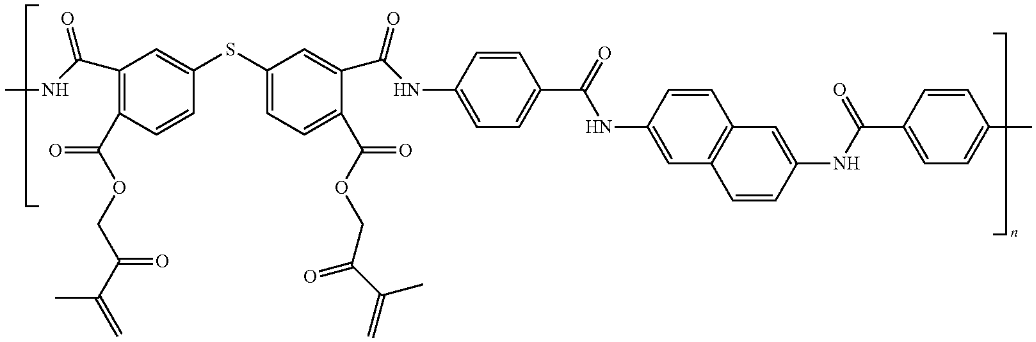
P1-170
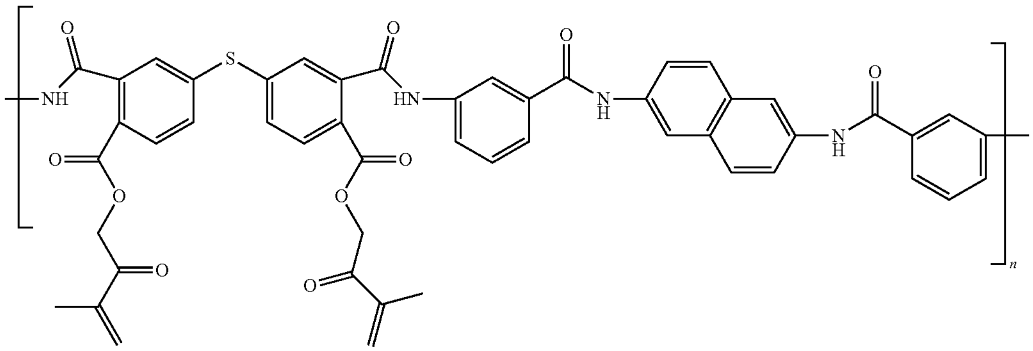
P1-171
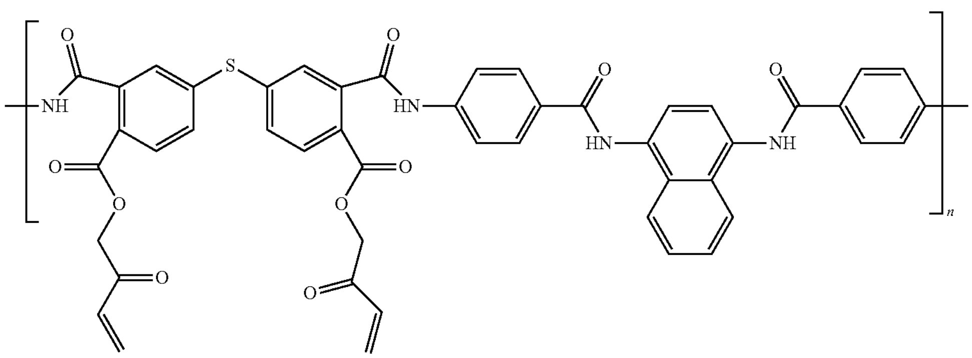
P1-172
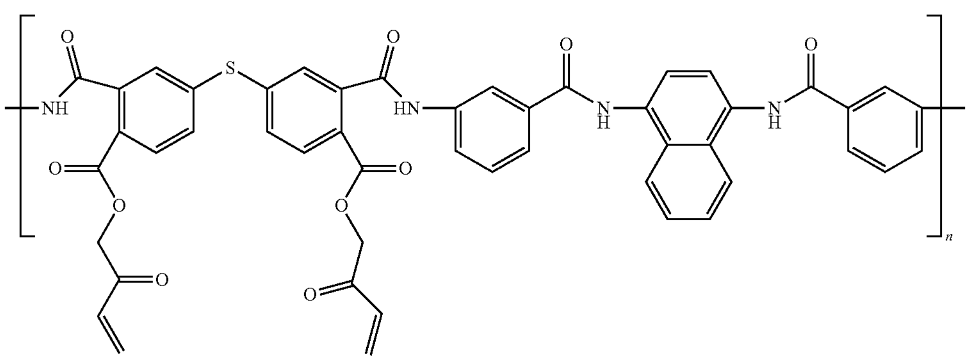

-continued
P1-173
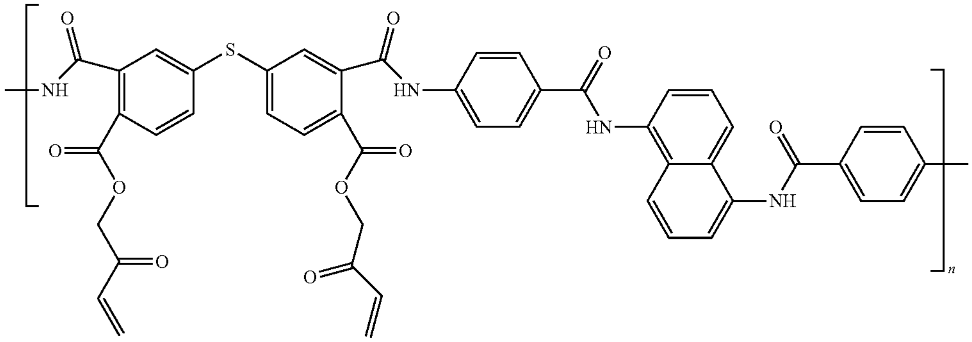
P1-174
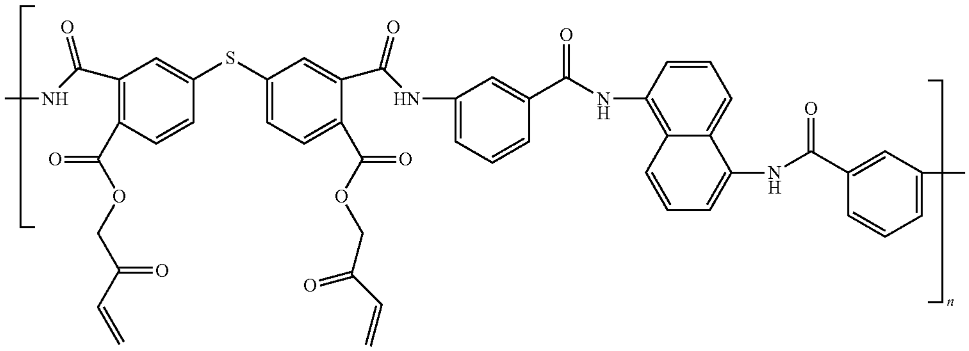
P1-175
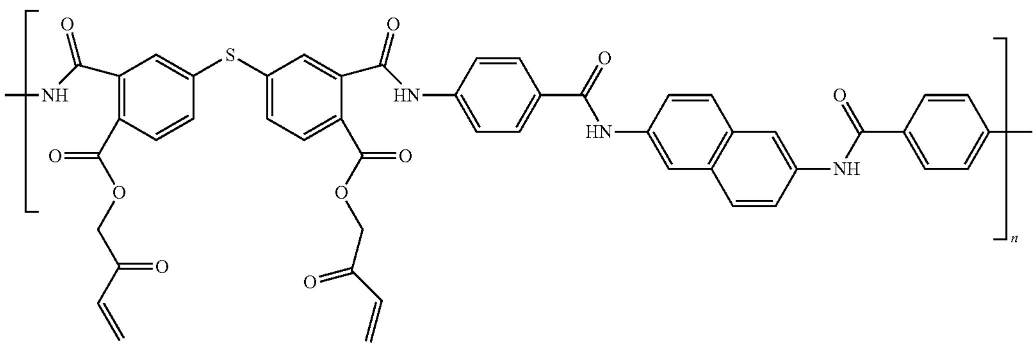
P1-176
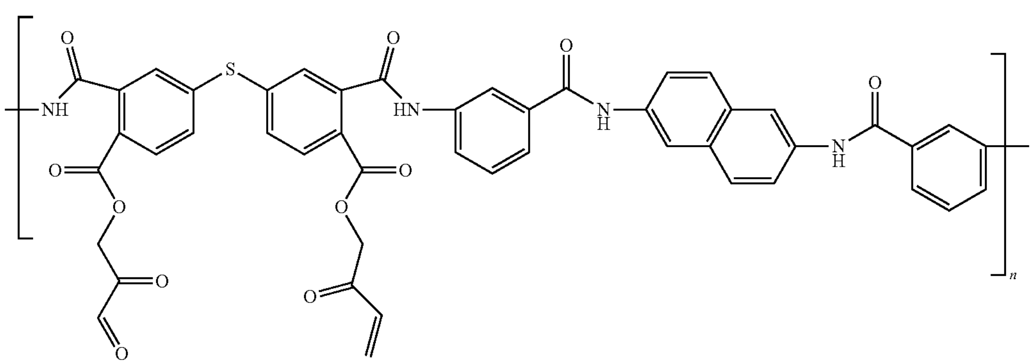

-continued
P1-177
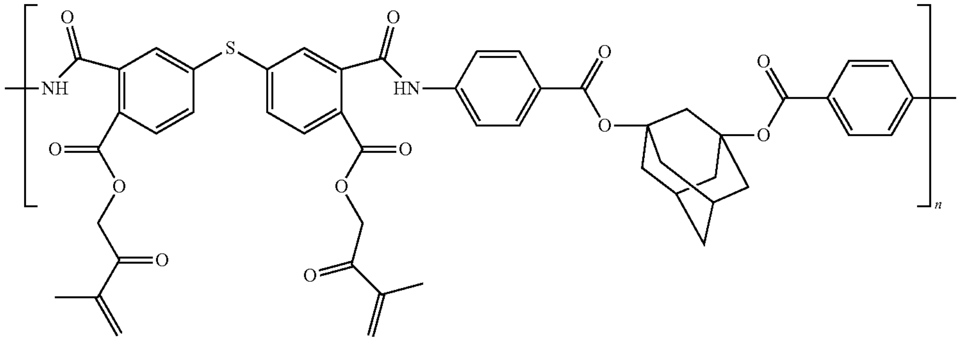
P1-178
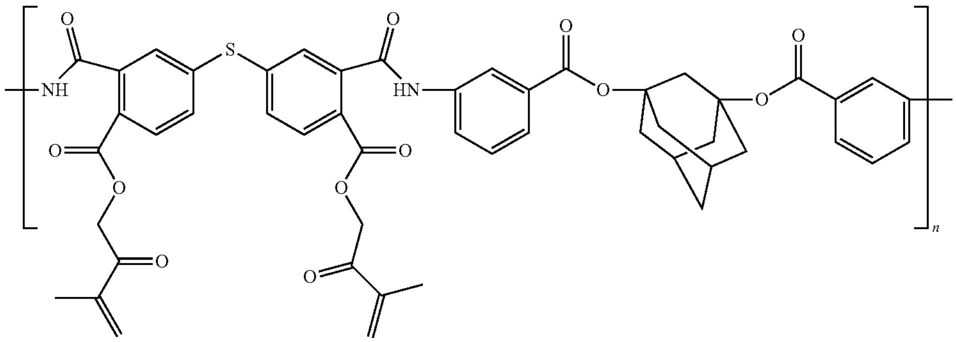
P1-179
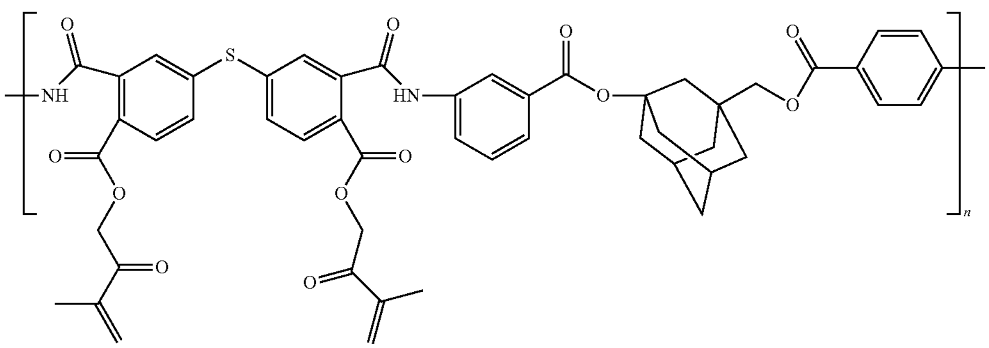
P1-180
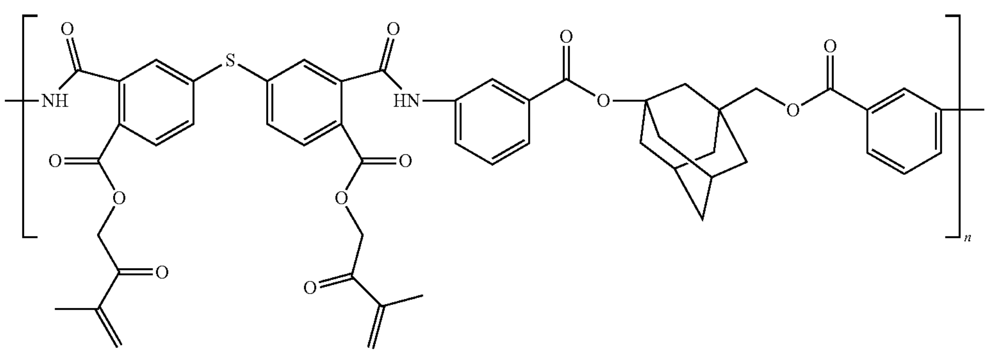

-continued
P1-181
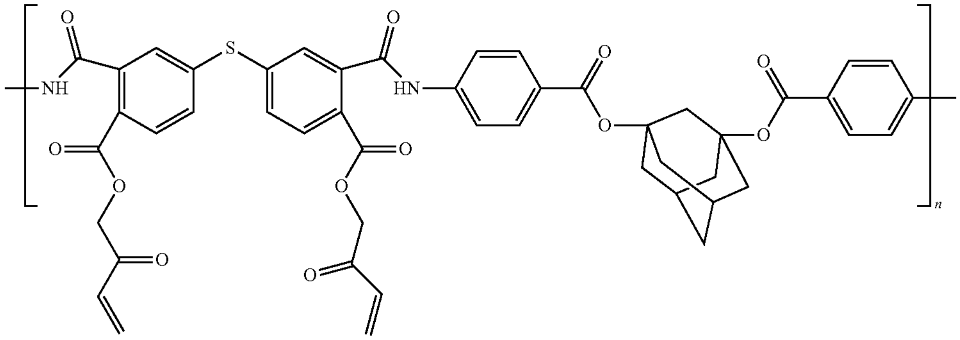
P1-182
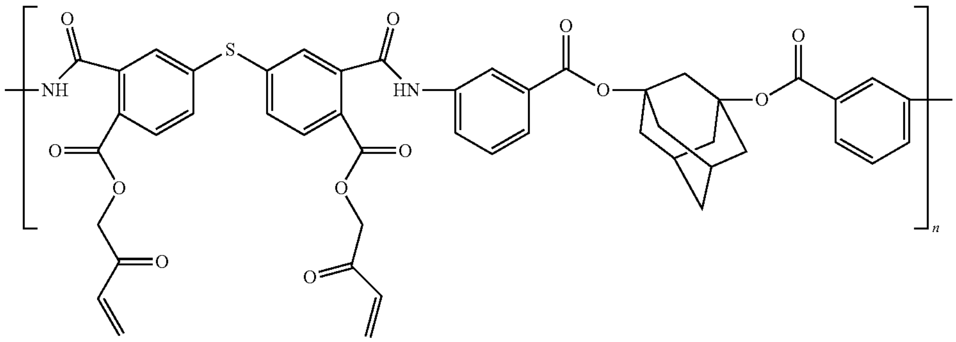
P1-183
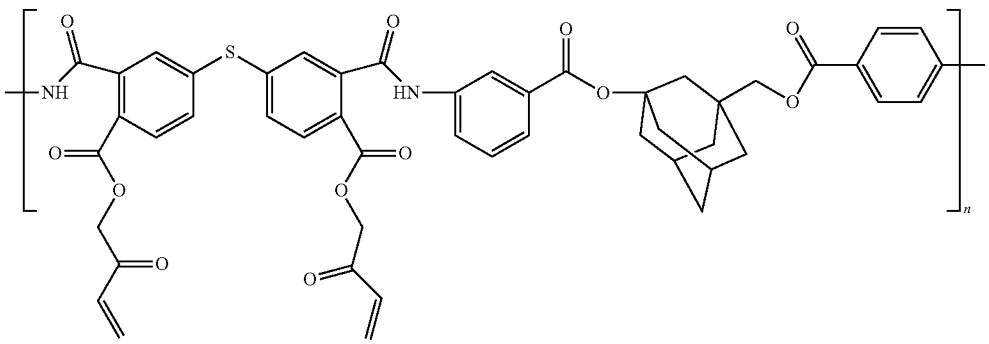
P1-184
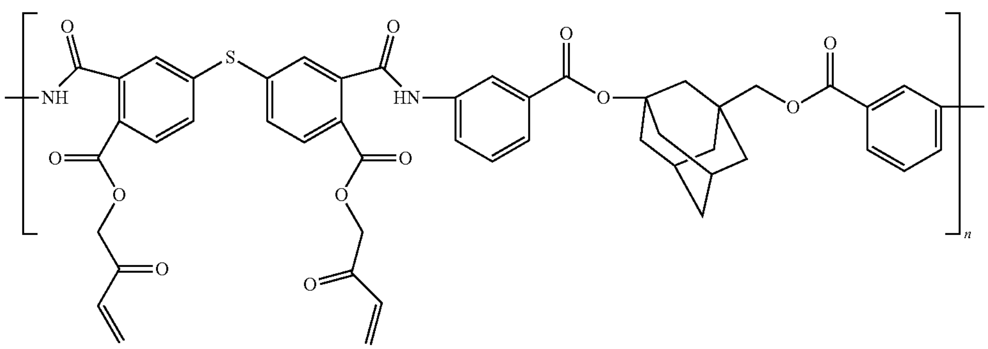

-continued
P1-185
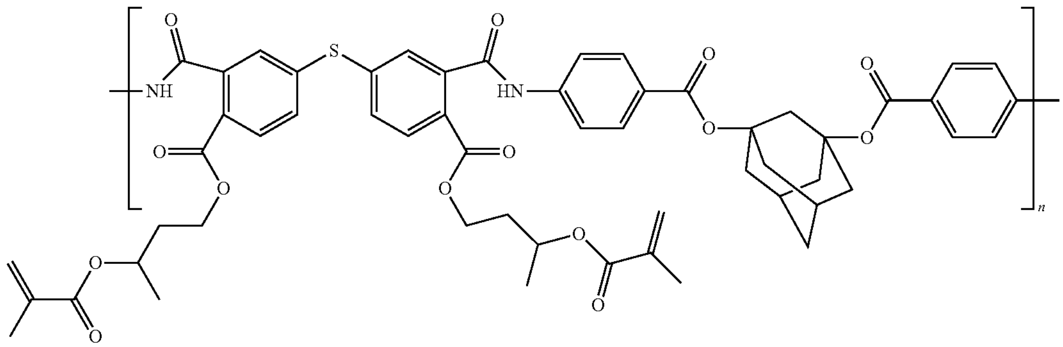
P1-186
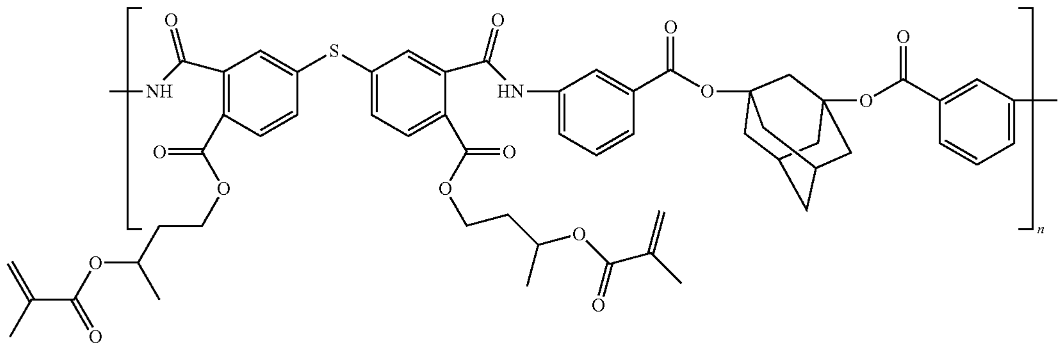
P1-187
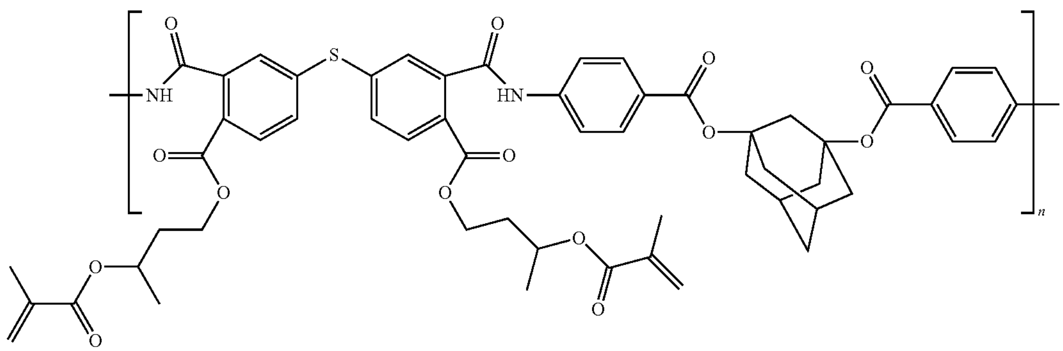
P1-188
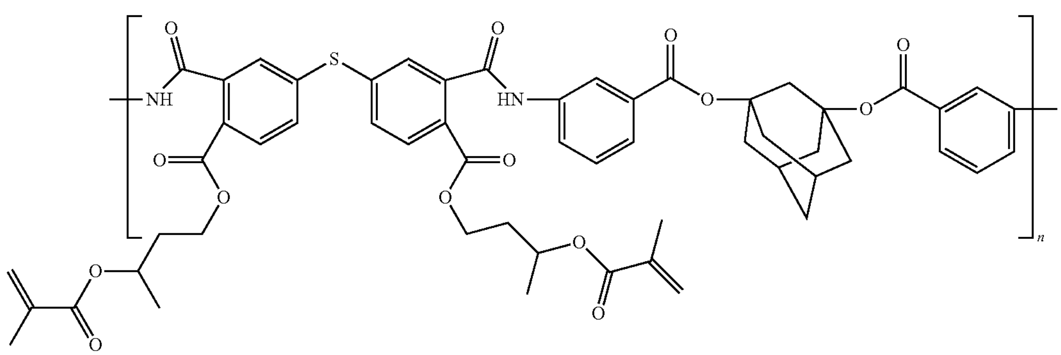

-continued
P1-189
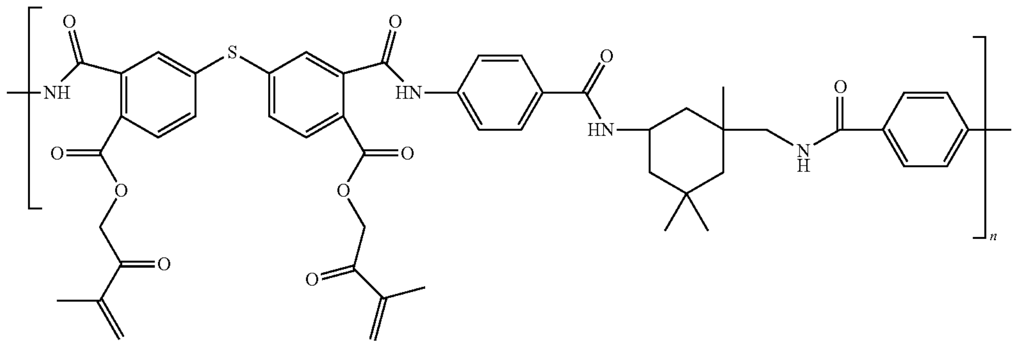
P1-190
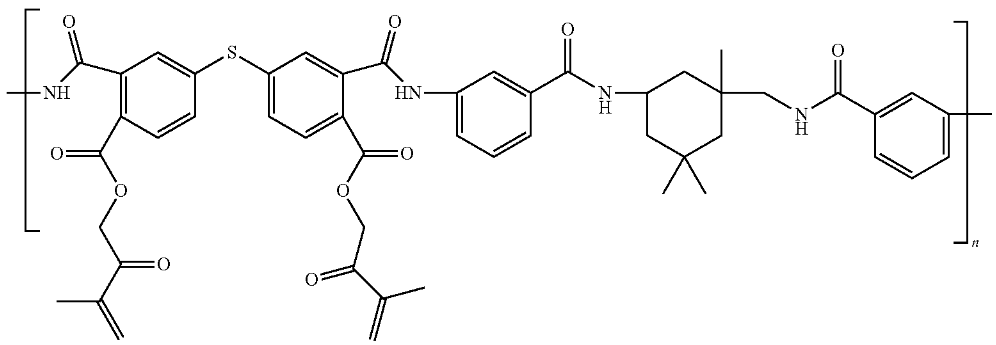
P1-191
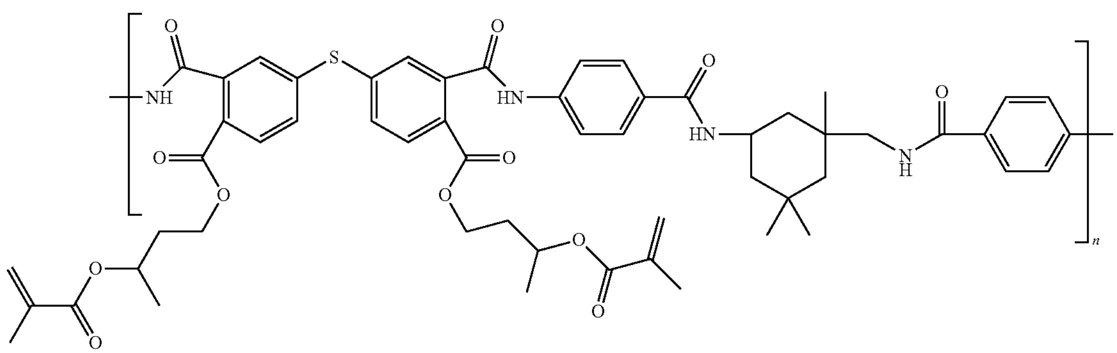
P1-192
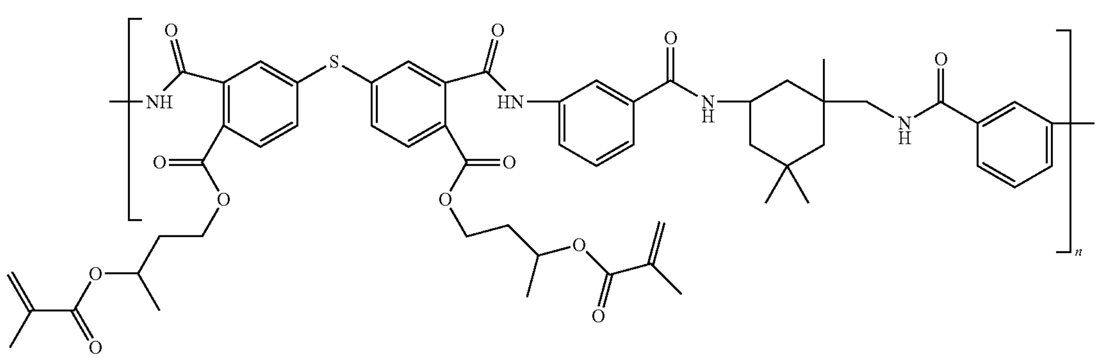

-continued
P1-193
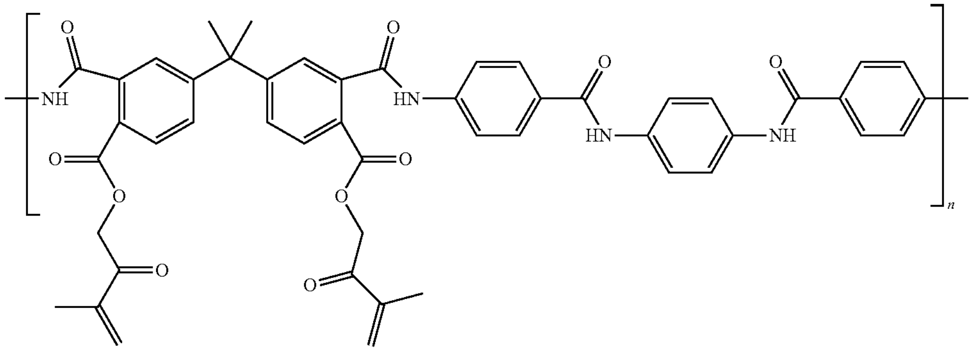
P1-194
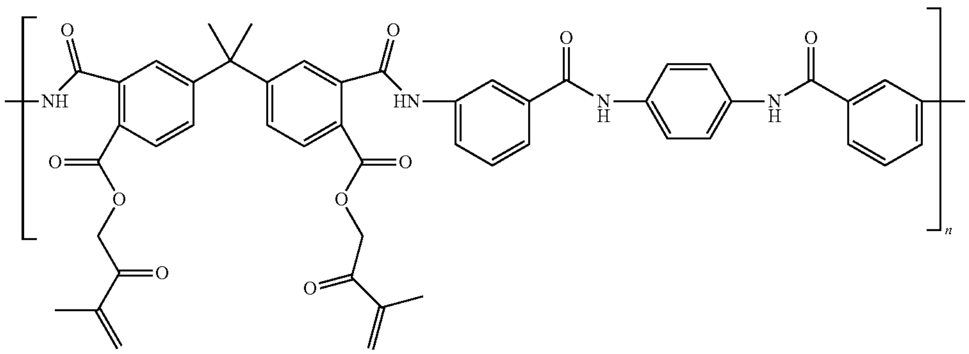
P1-195
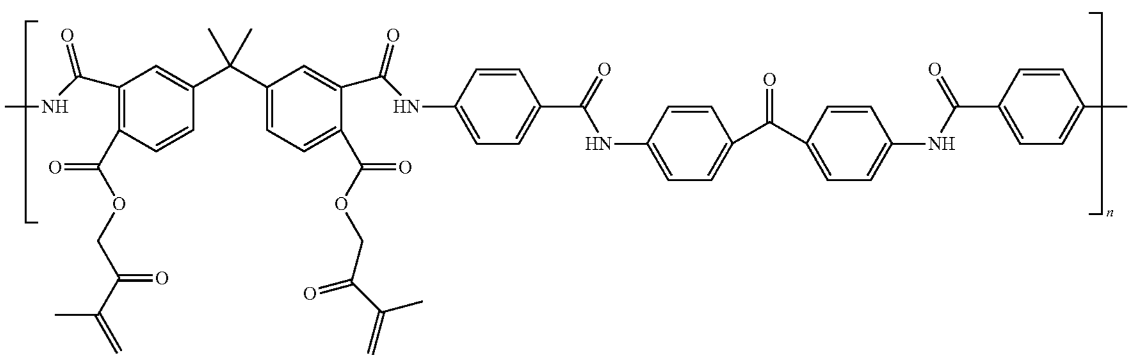
P1-196
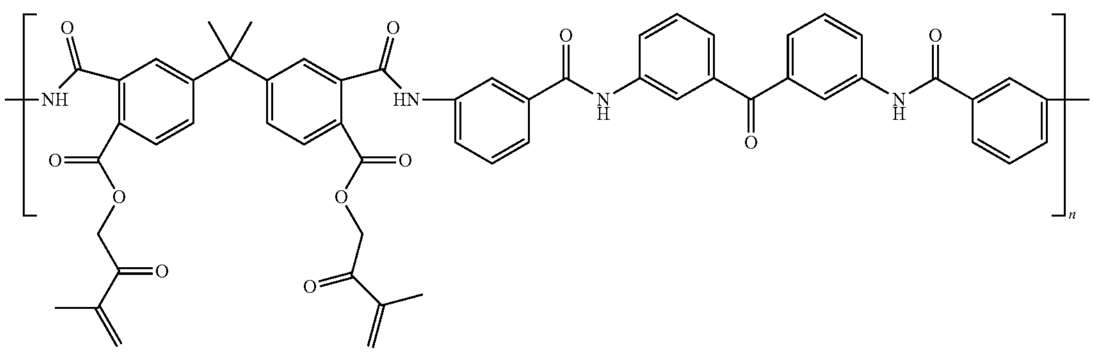

-continued
P1-197
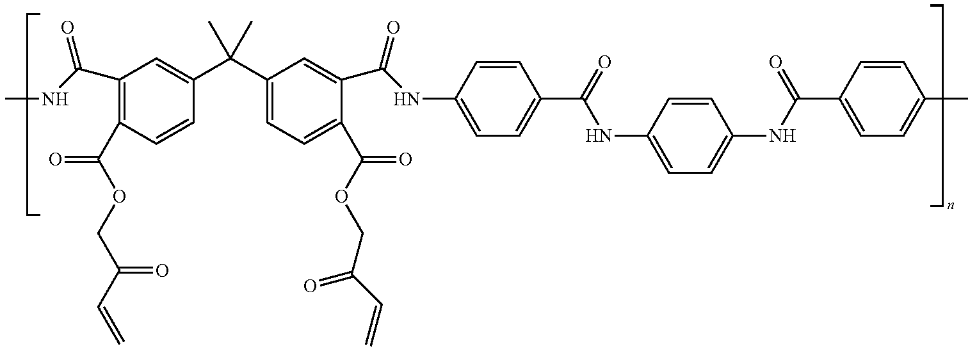
P1-198
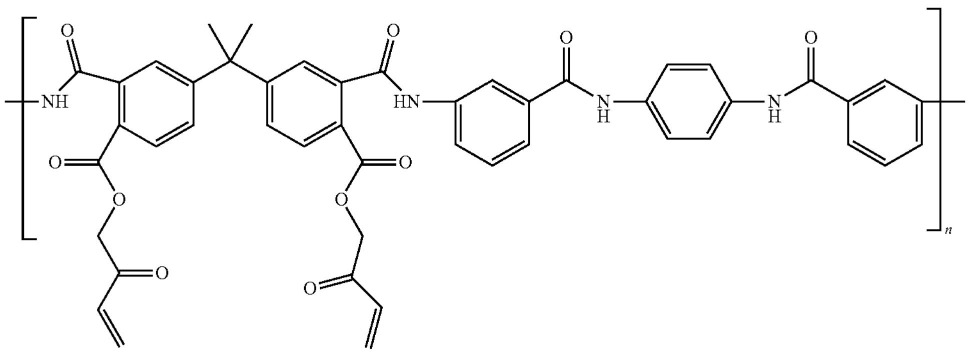
P1-199
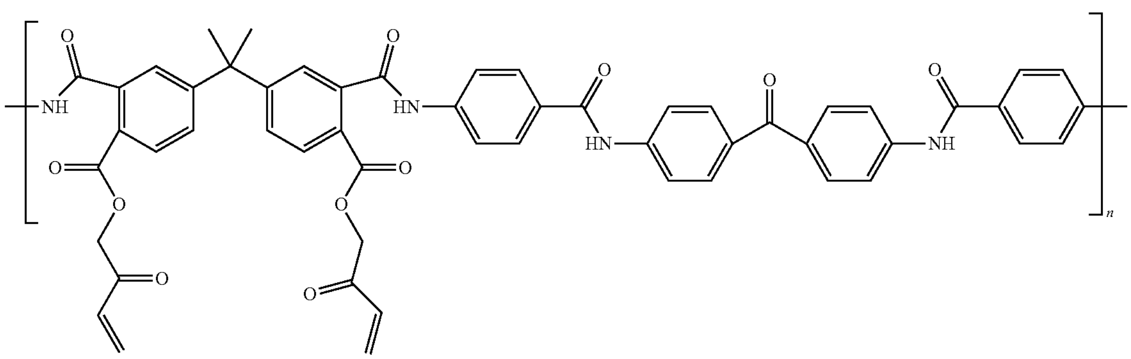
P1-200
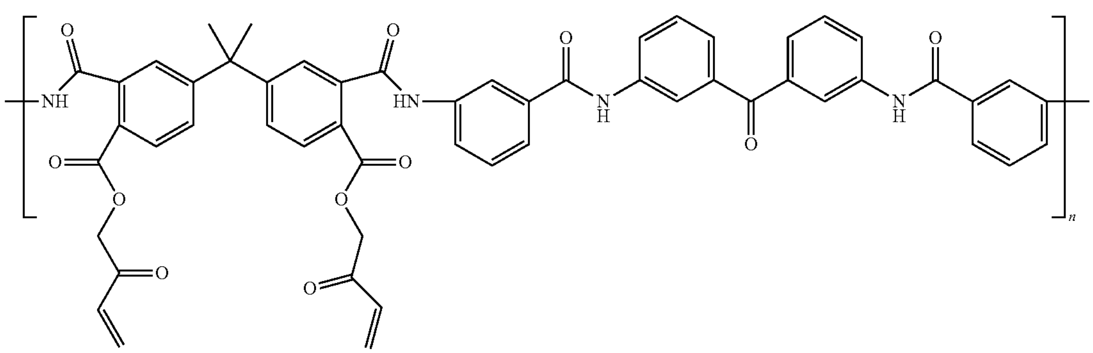

-continued
P1-201
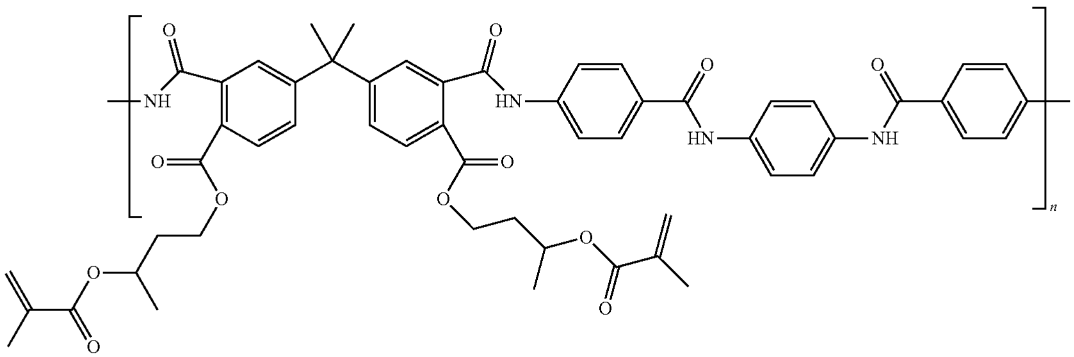
P1-202
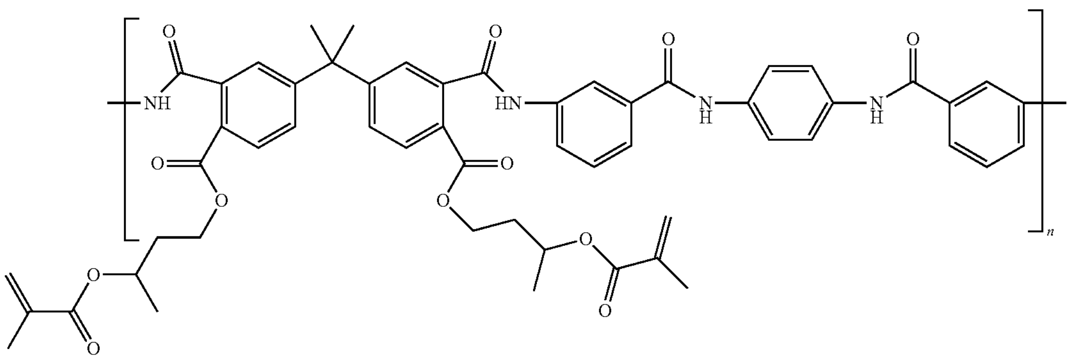
P1-203
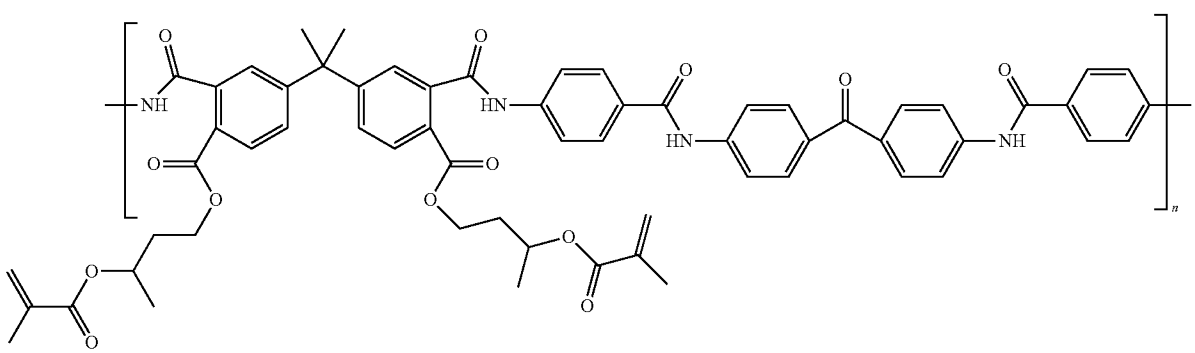
P1-204
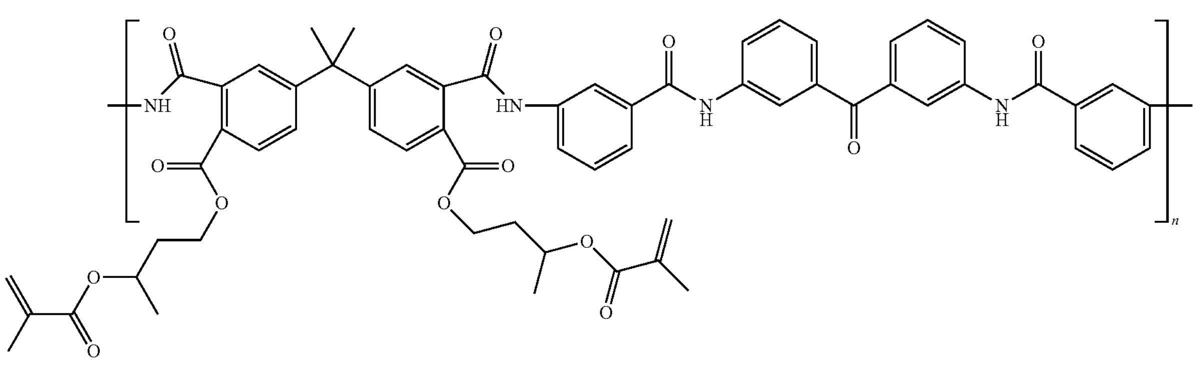

-continued
P1-205
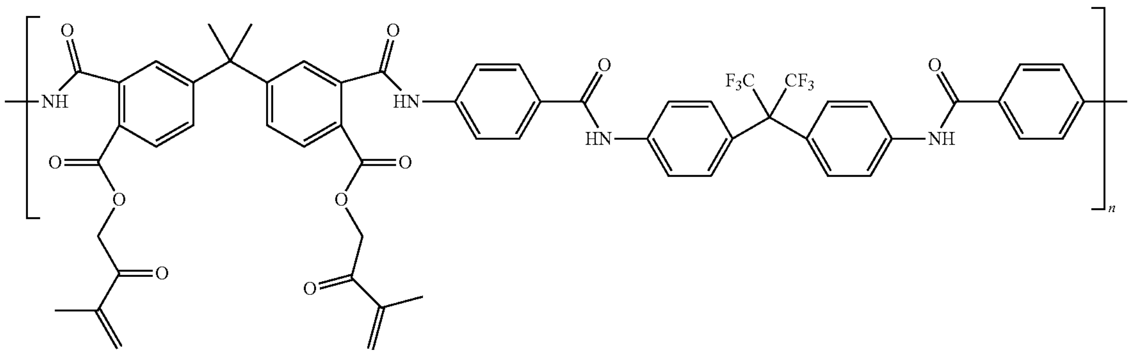
P1-206
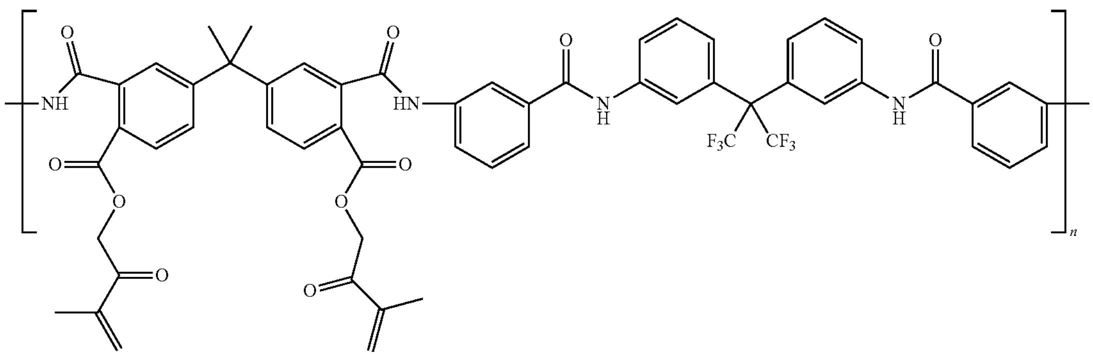
P1-207
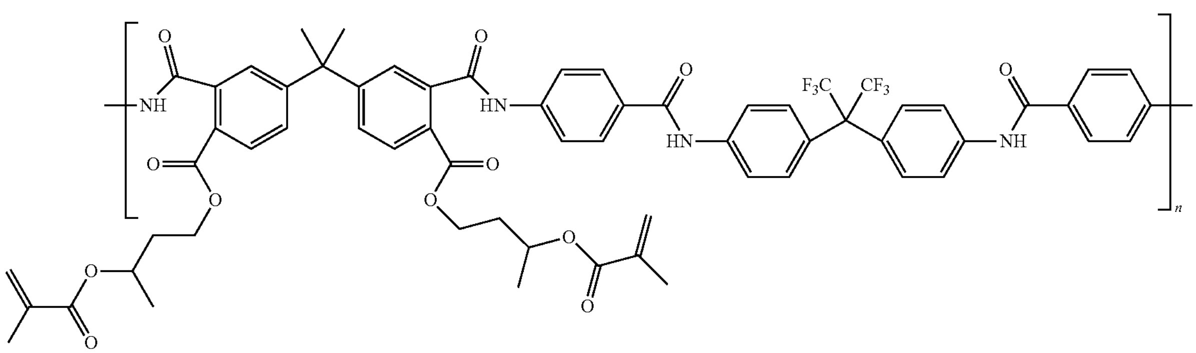
P1-208
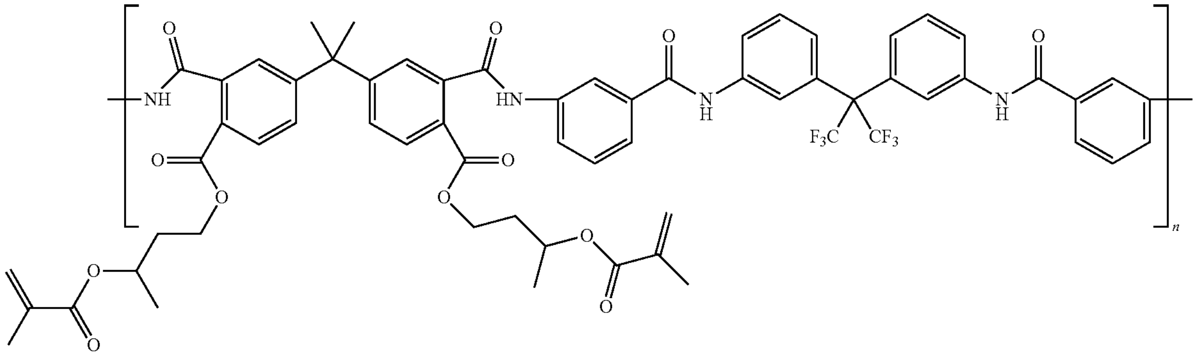

-continued
P1-209
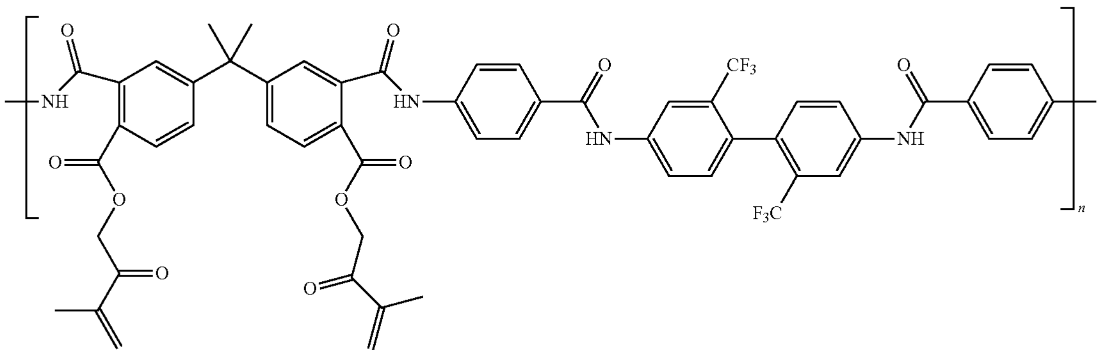
P1-210
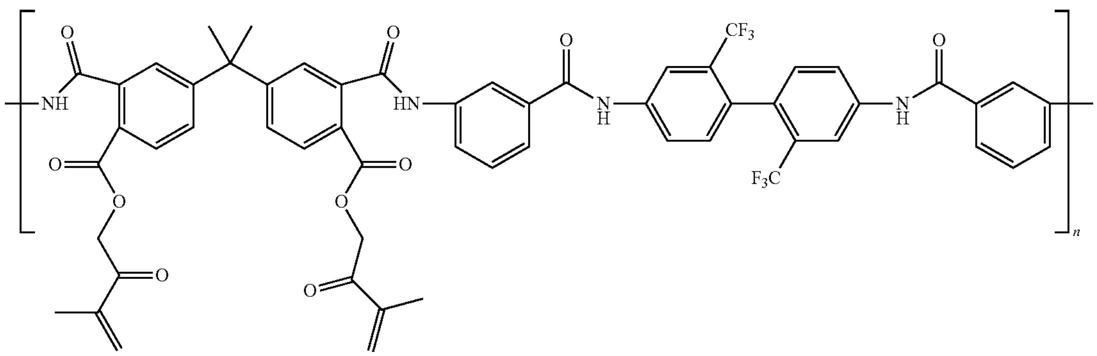
P1-211
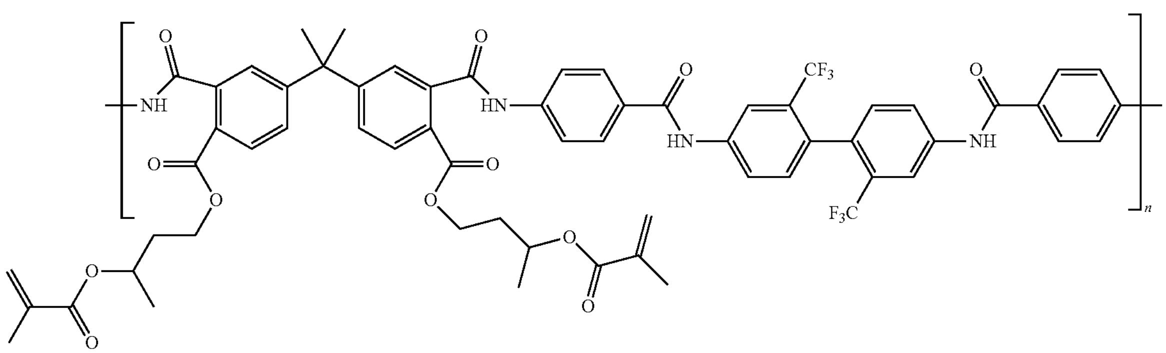
P1-212
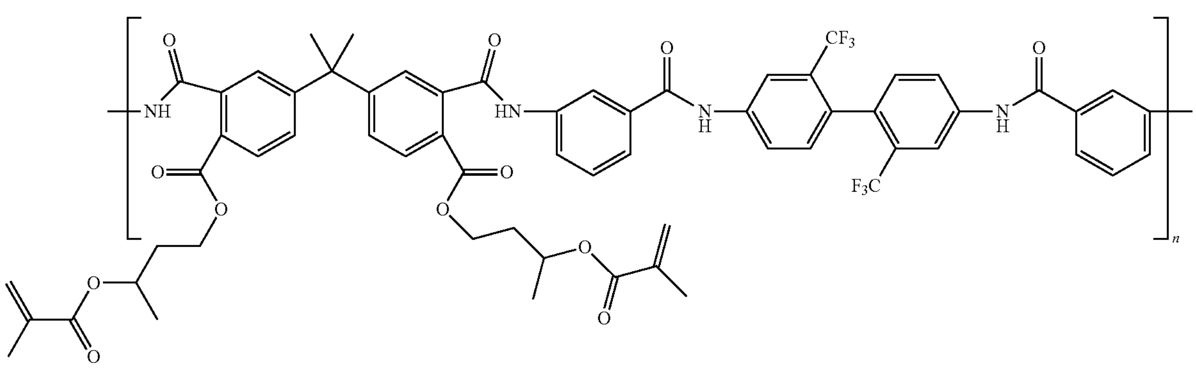

-continued
P1-213
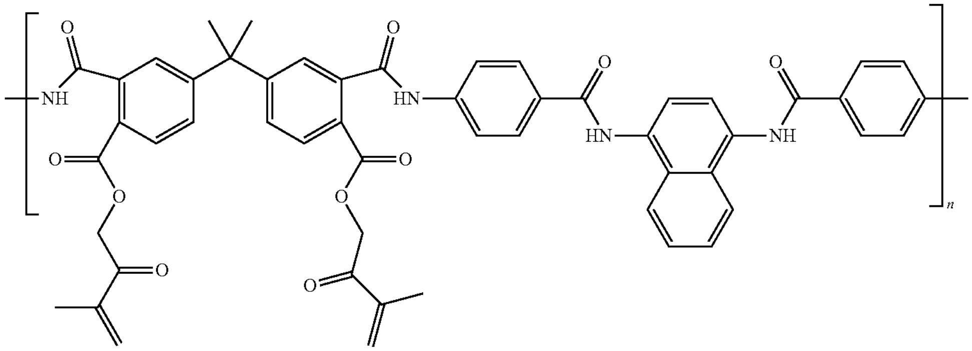
P1-214
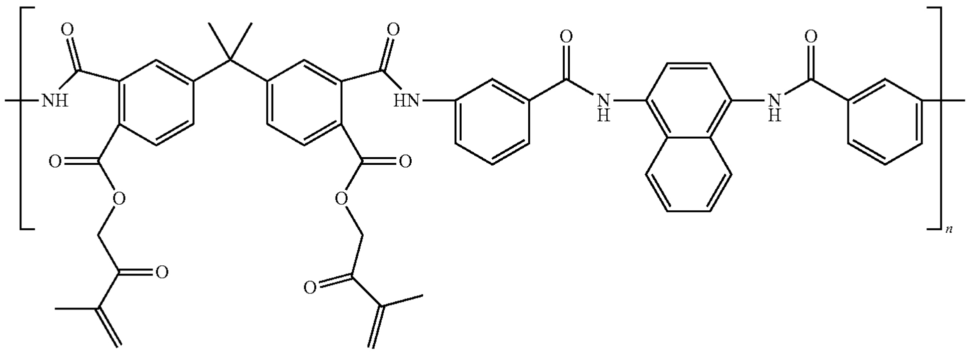
P1-215
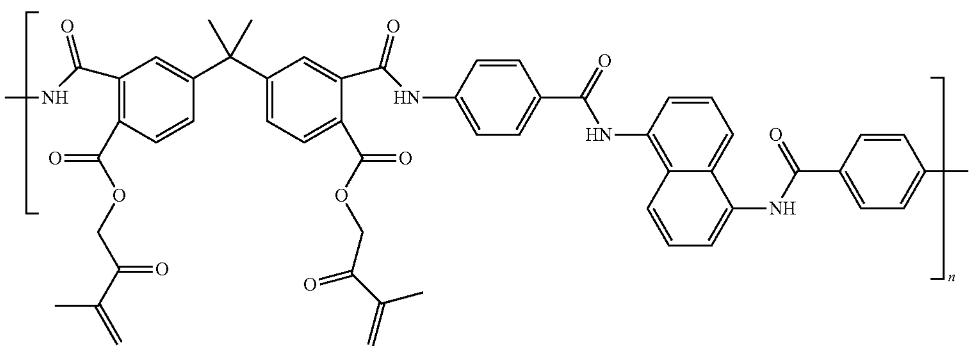
P1-216
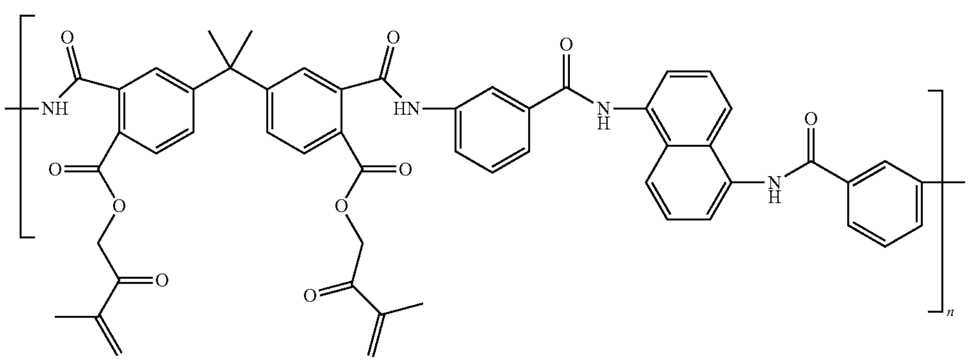

-continued
P1-217
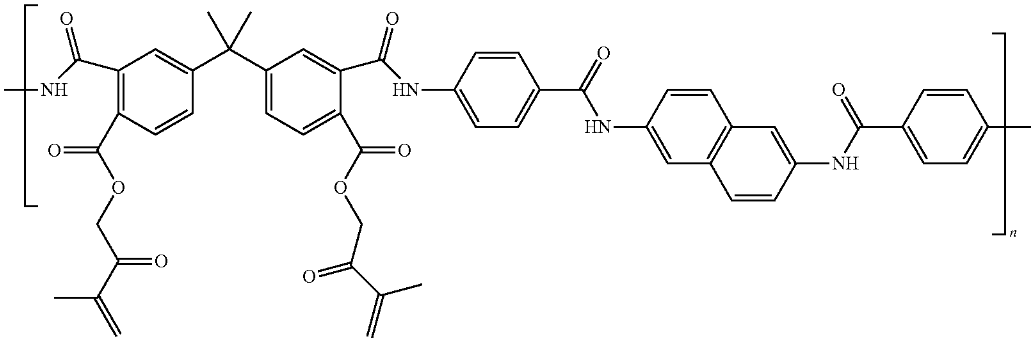
P1-218
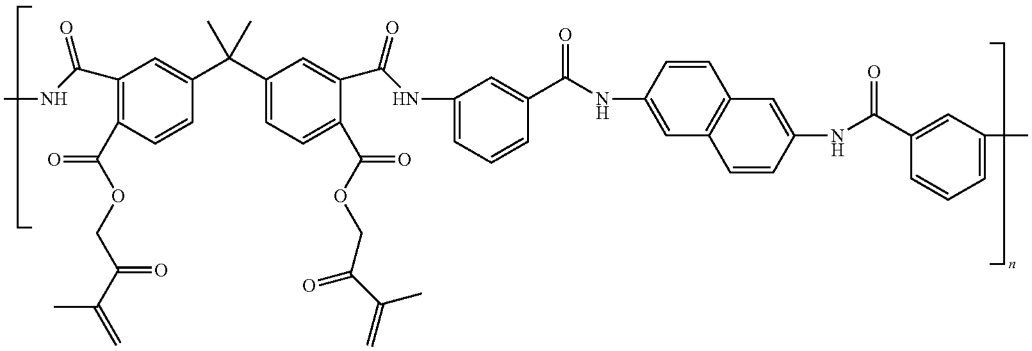
P1-219
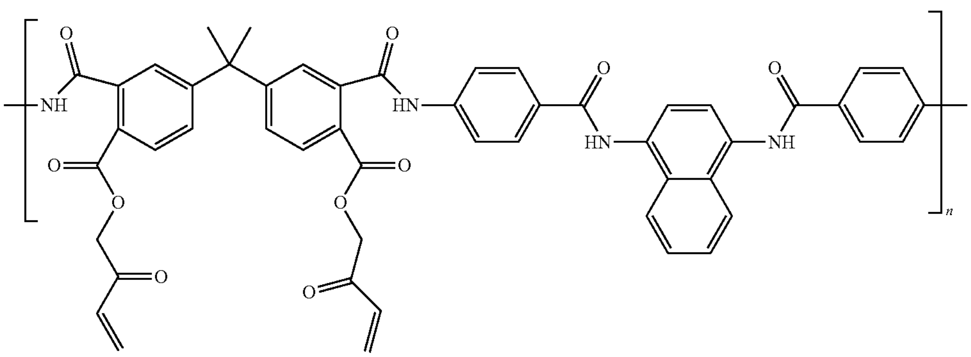
P1-220
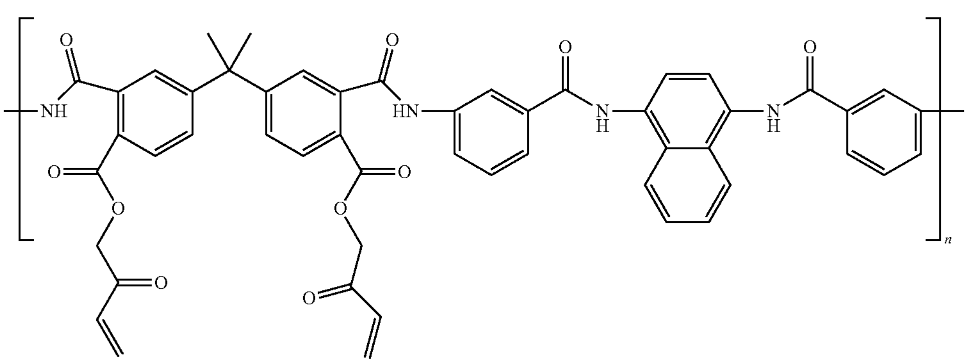

-continued
P1-221
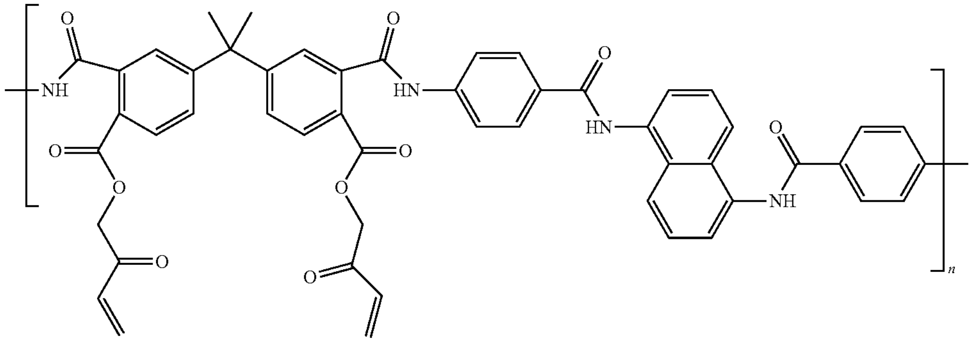
P1-222
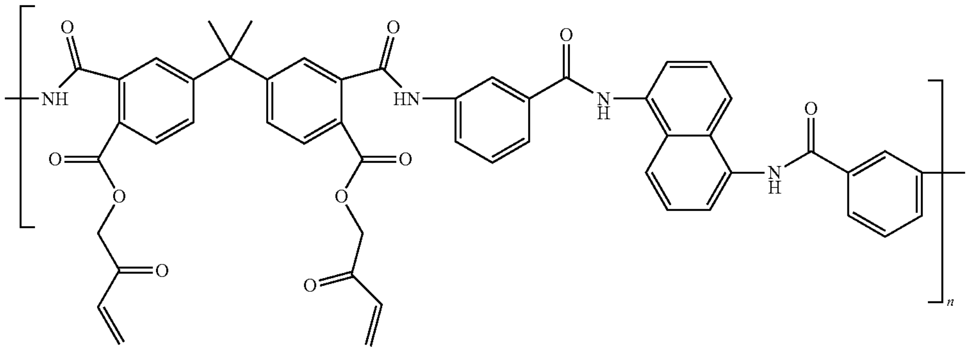
P1-223
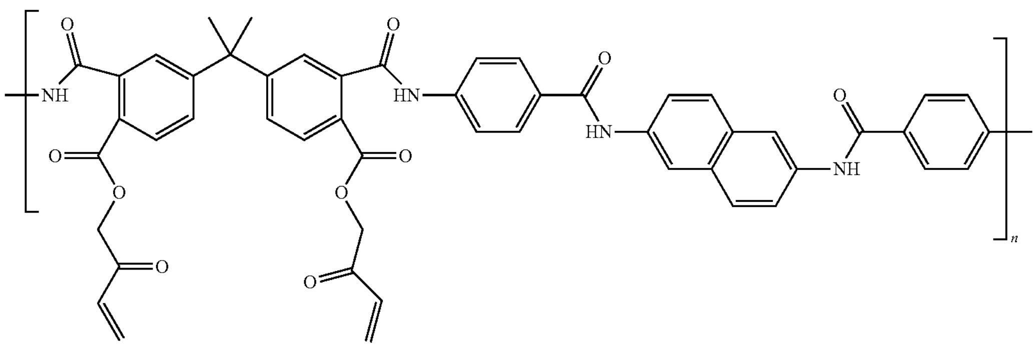
P1-224
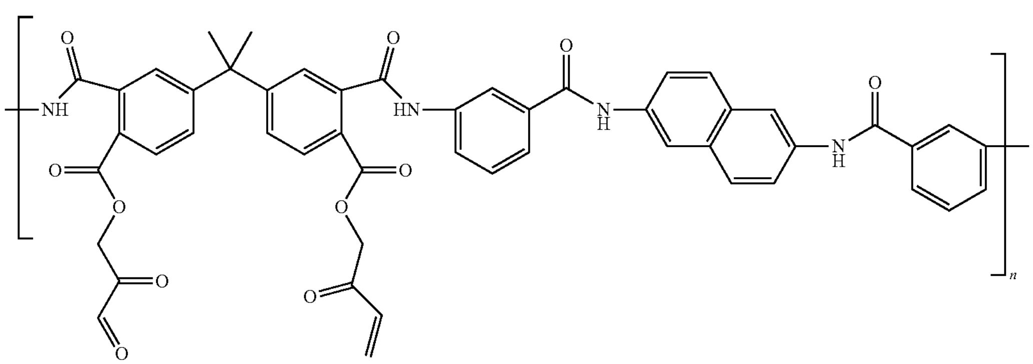

-continued
P1-225
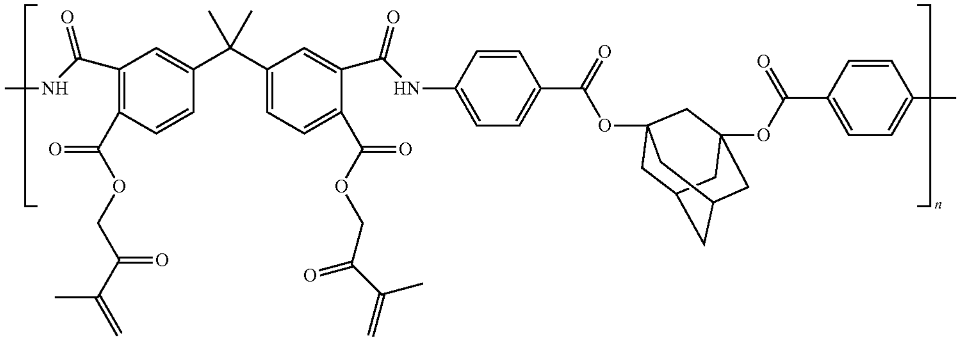
P1-226
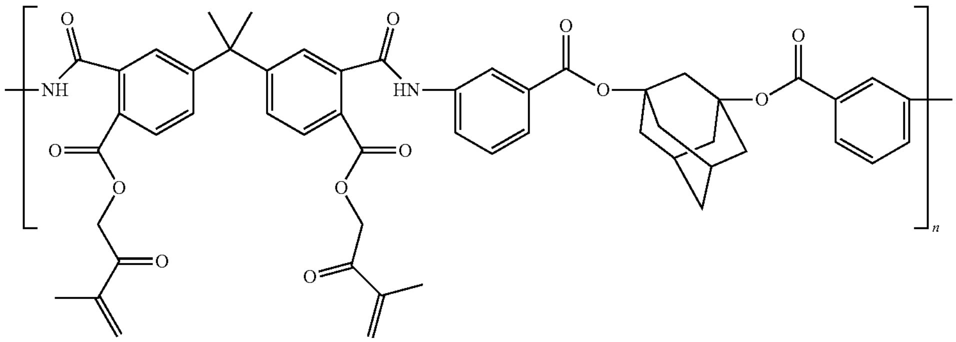
P1-227
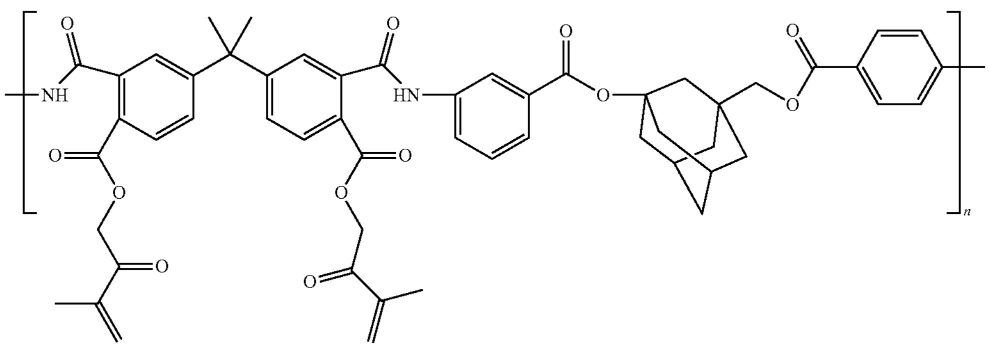
P1-228
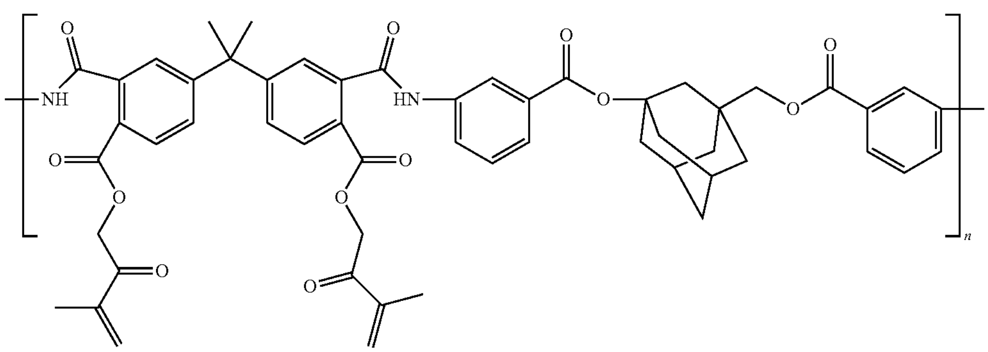

-continued
P1-229
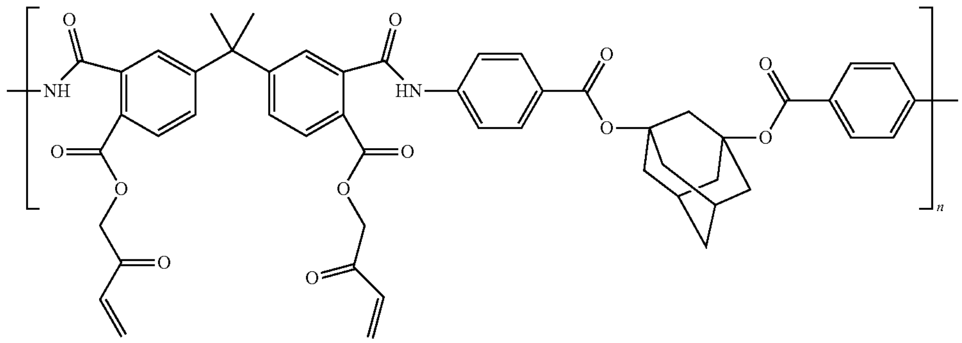
P1-230
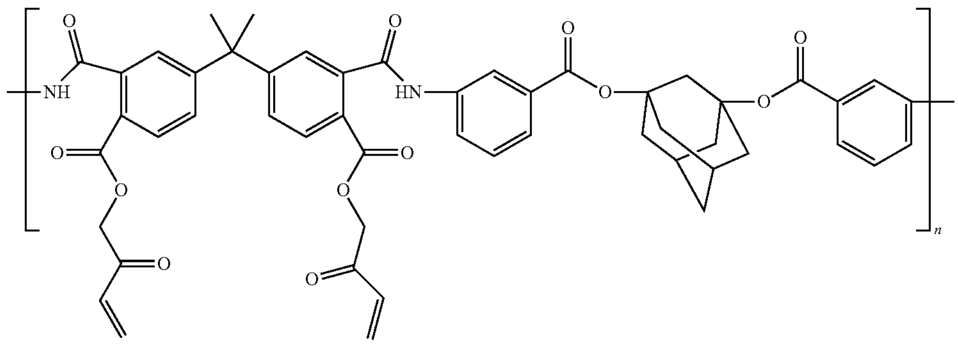
P1-231
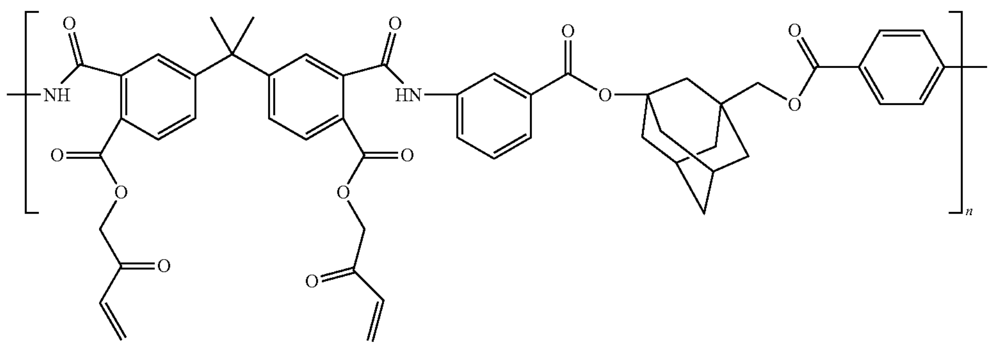
P1-232
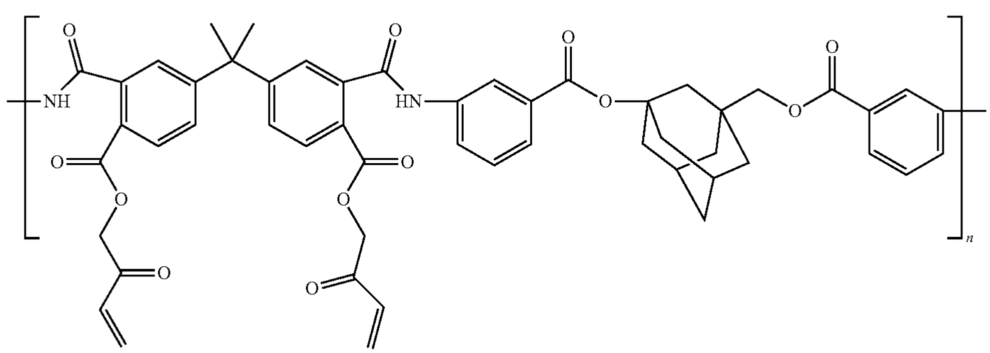

-continued
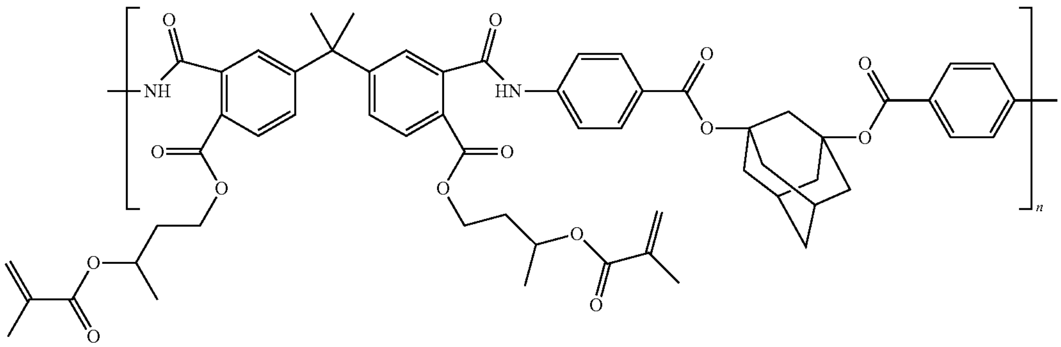
P1-233
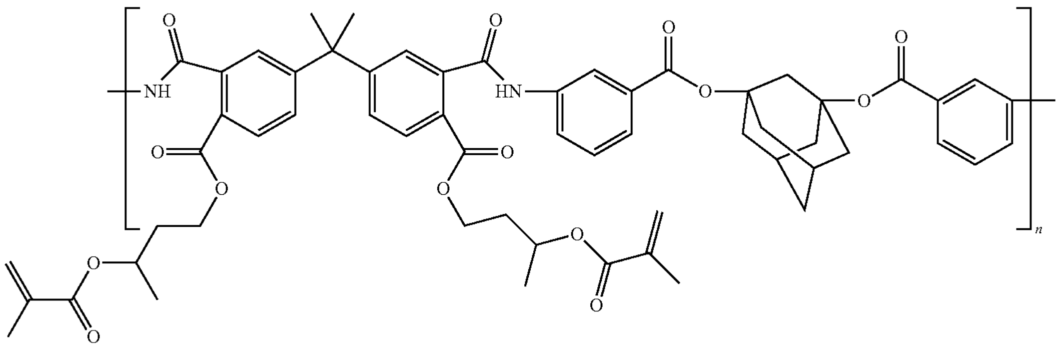
P1-234
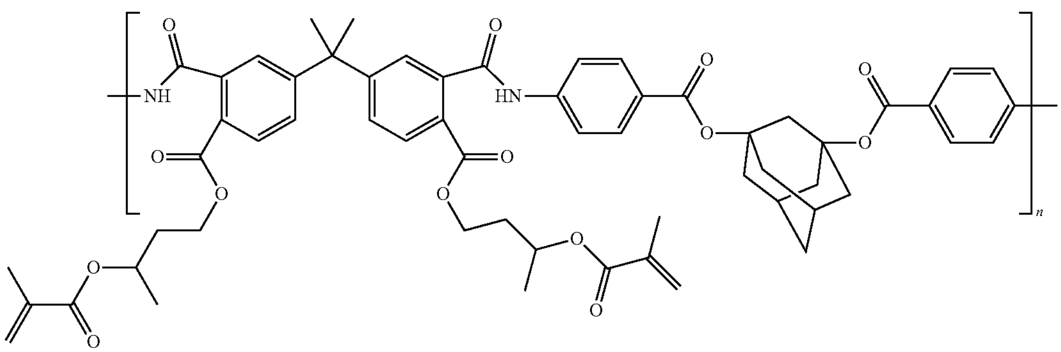
P1-235
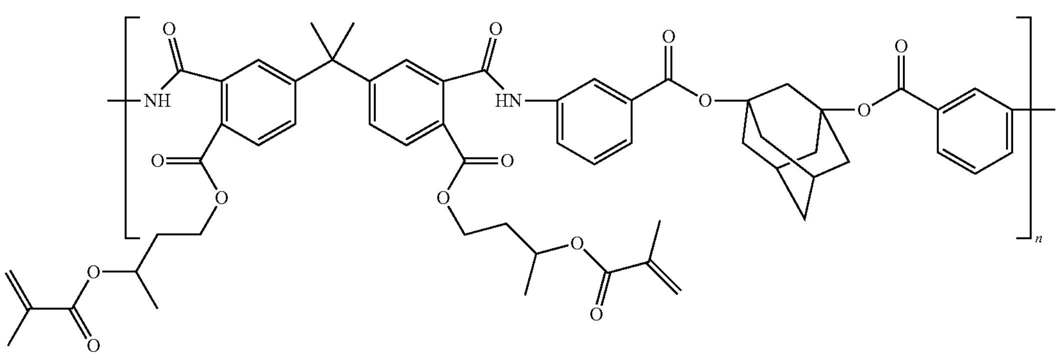
P1-236

-continued
P1-237
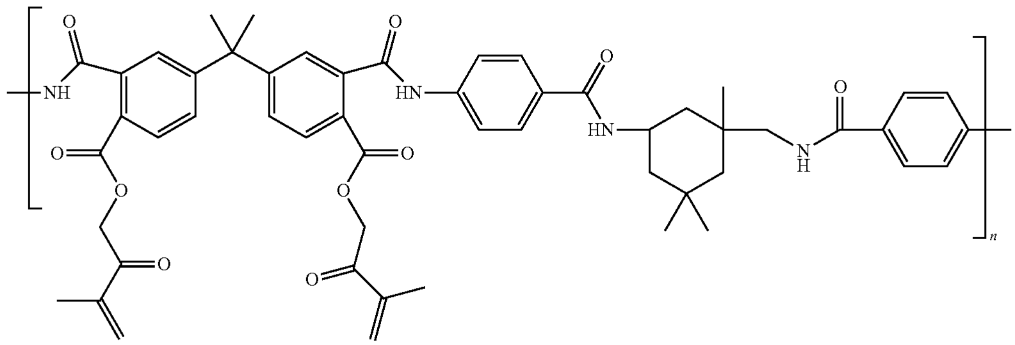
P1-238
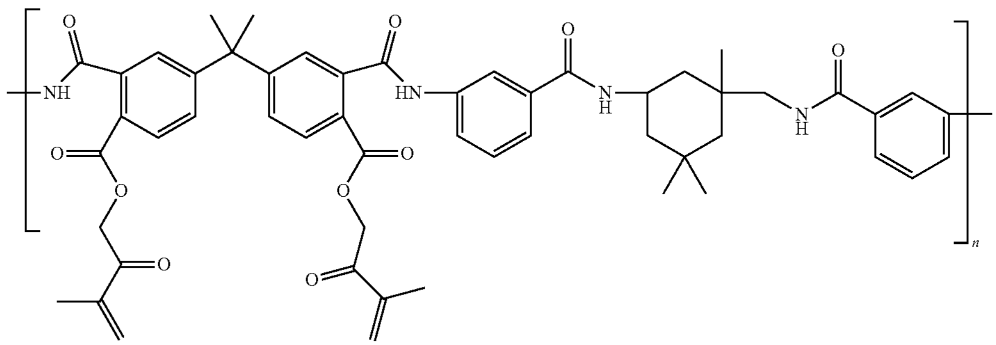
P1-239
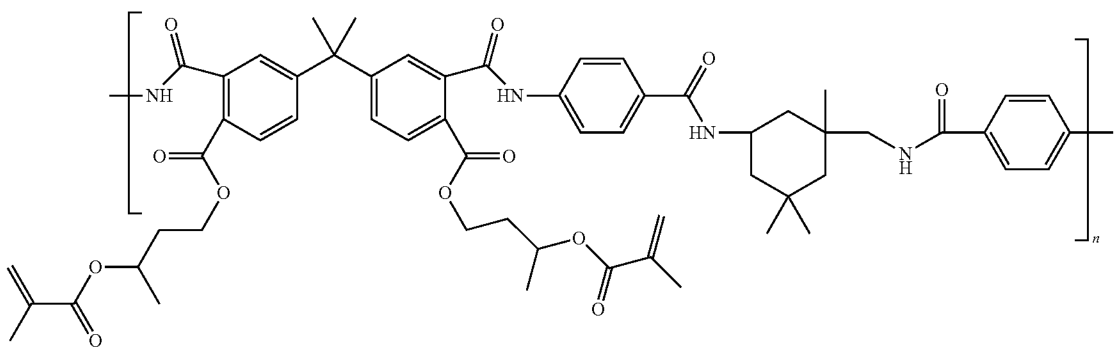
P1-240
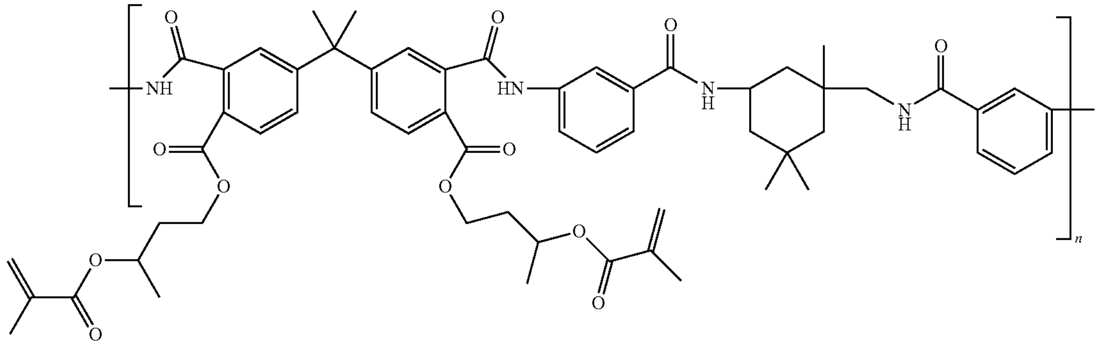

-continued
P1-241
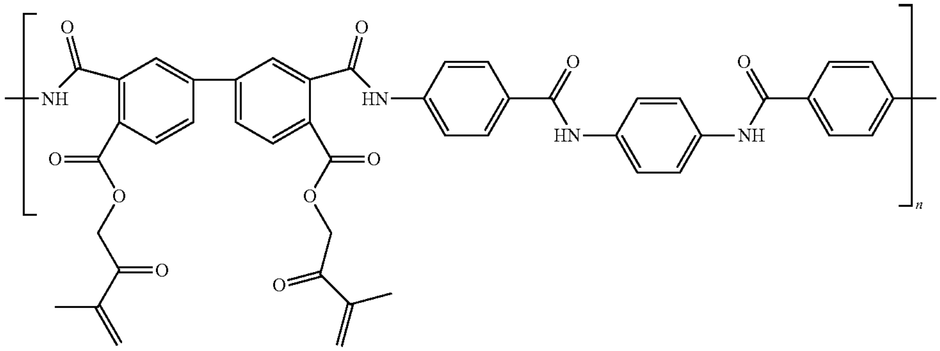
P1-242
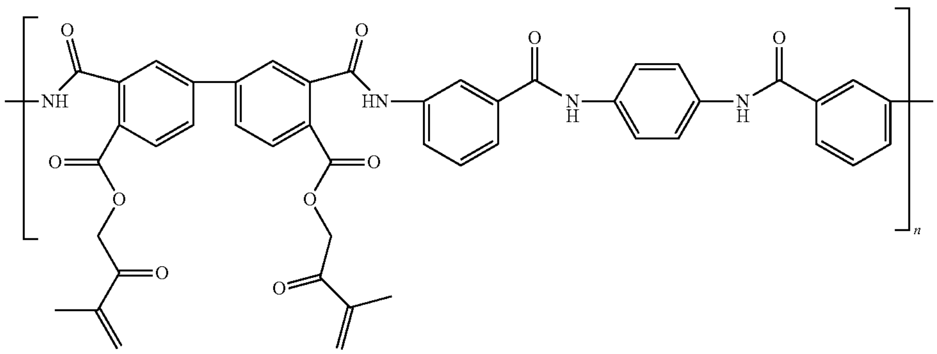
P1-243
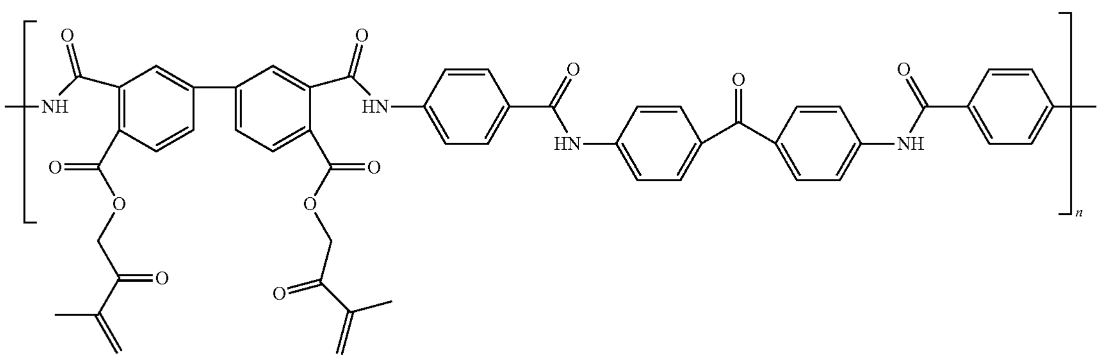
P1-244
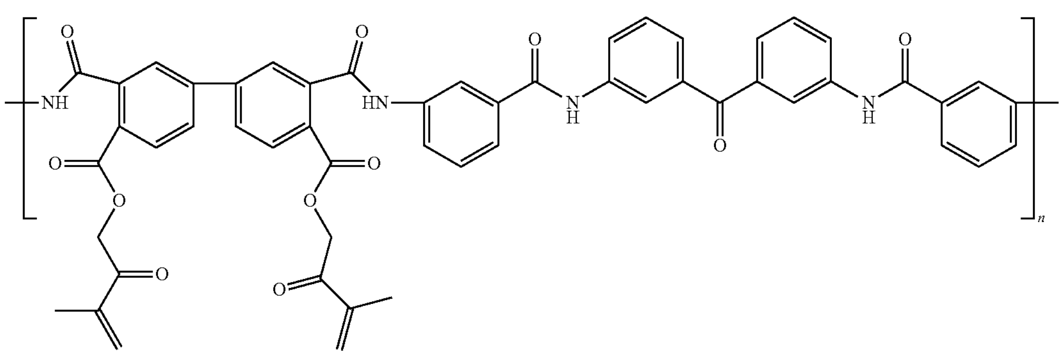

-continued
P1-245
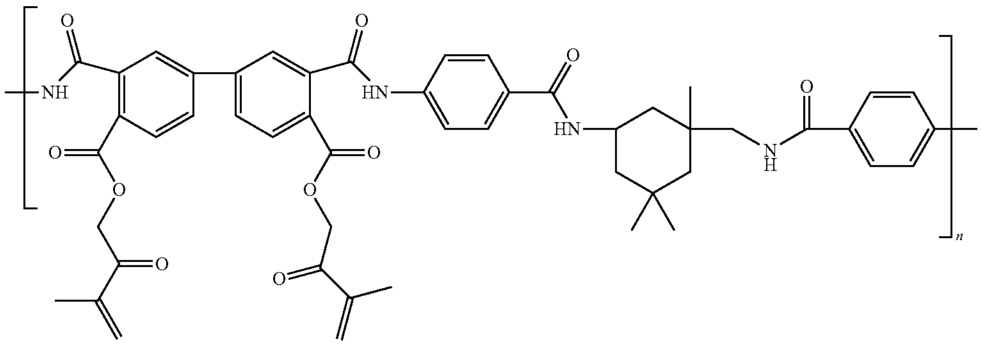
P1-246
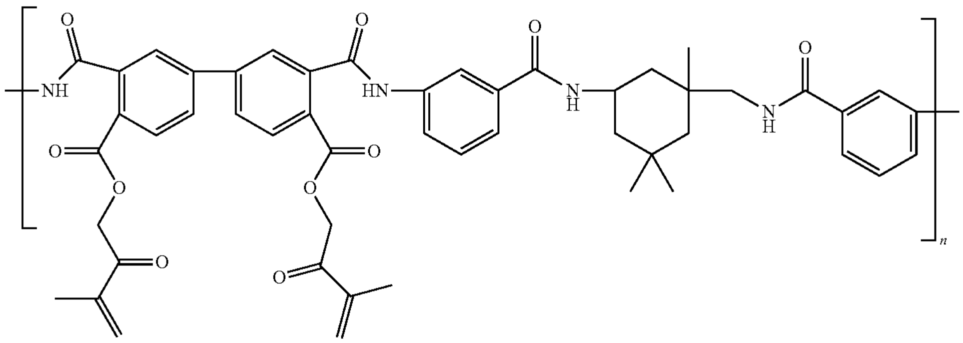
P1-247
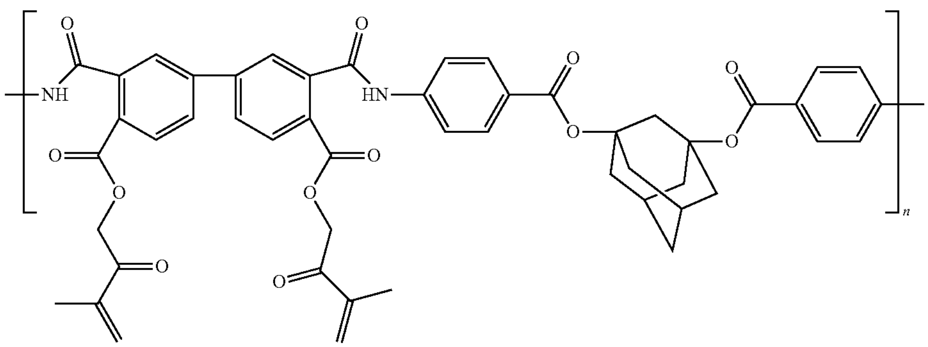
P1-248
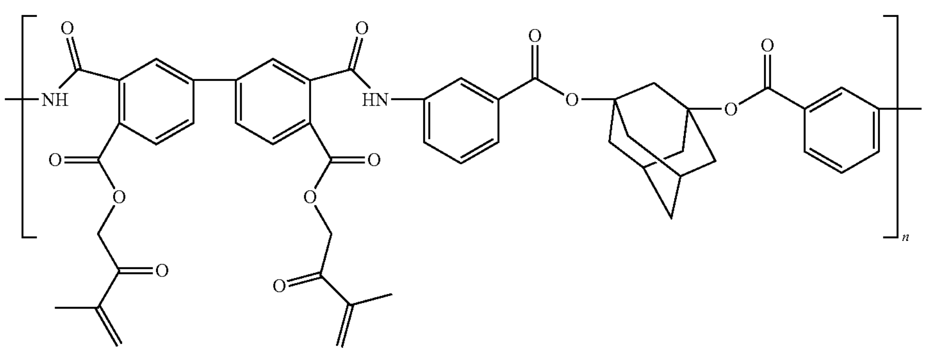

-continued
P1-249
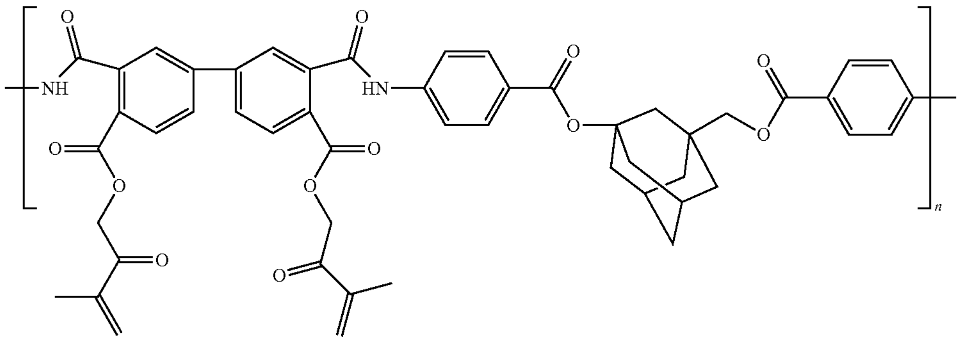
P1-250
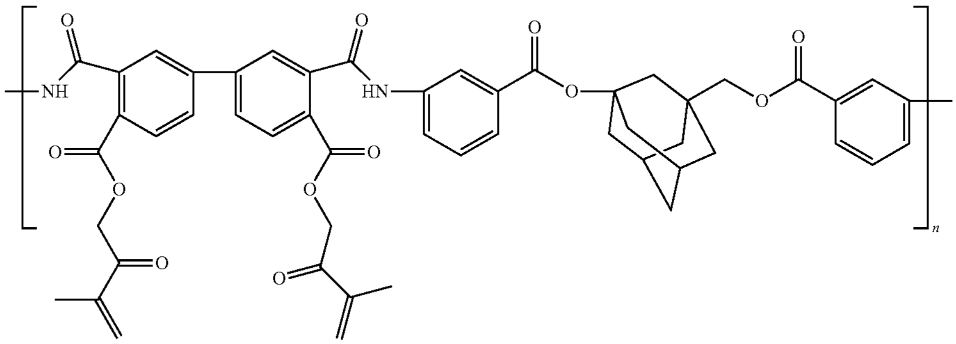
P1-251
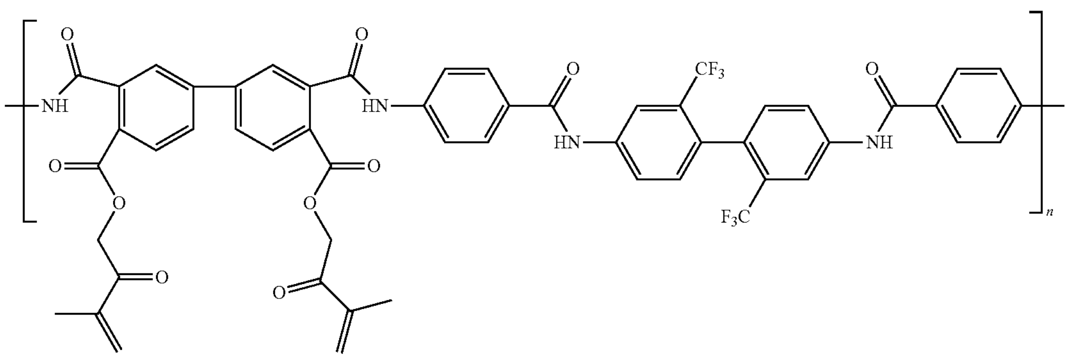
P1-252
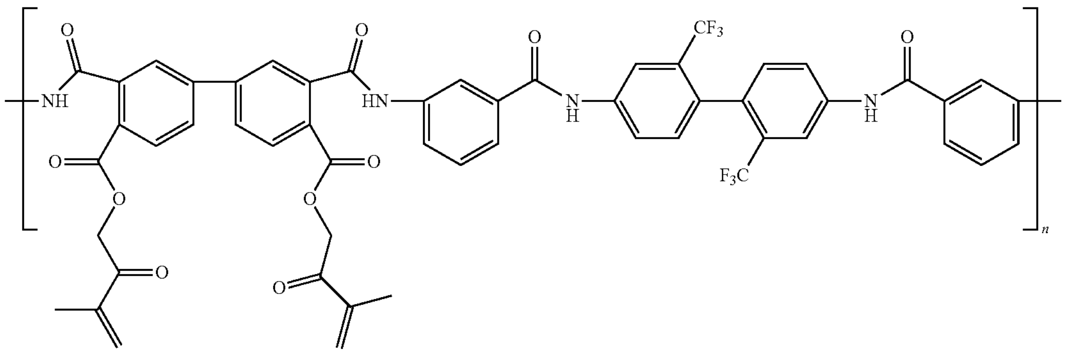

-continued
P1-253
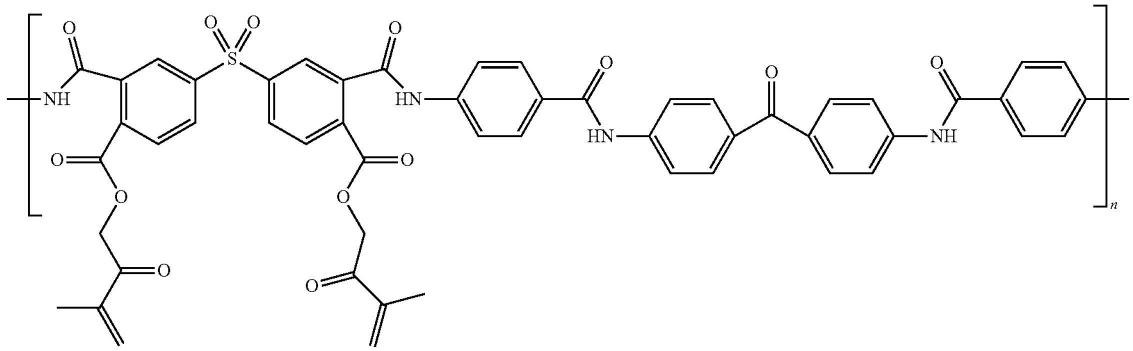
P1-254
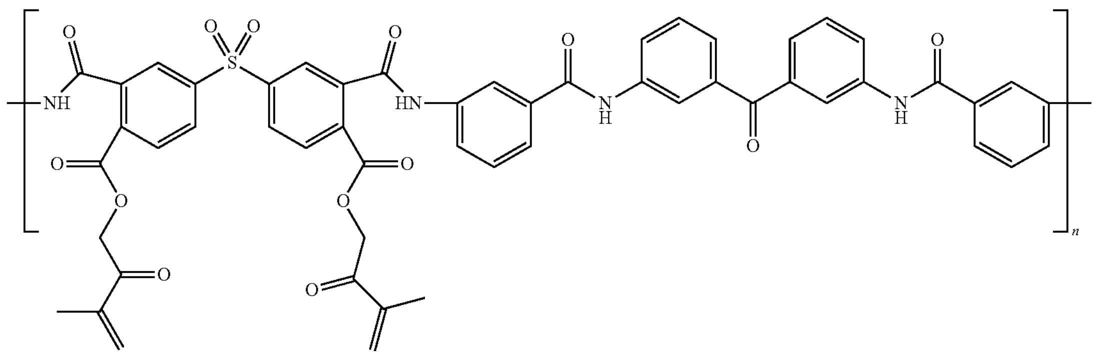
P1-255
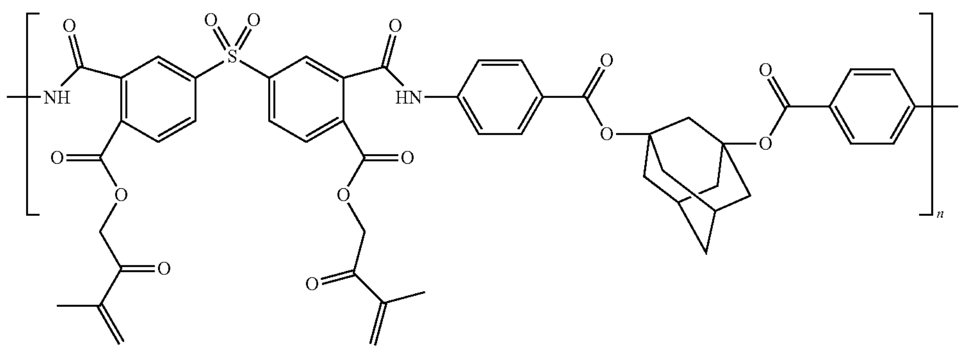
P1-256
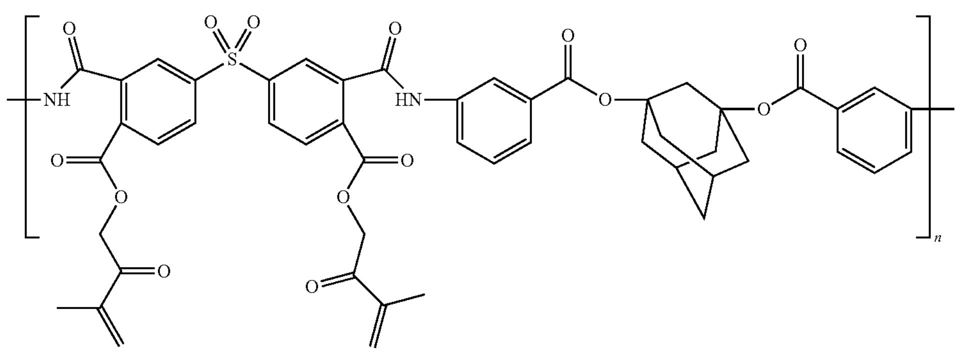

-continued
P1-257
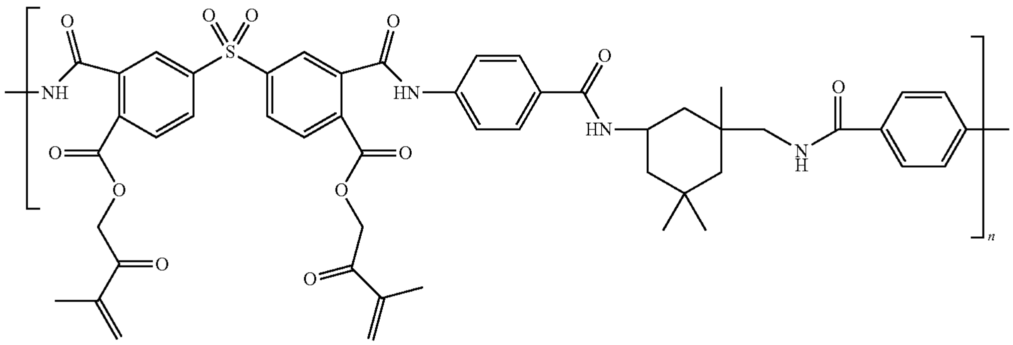
P1-258
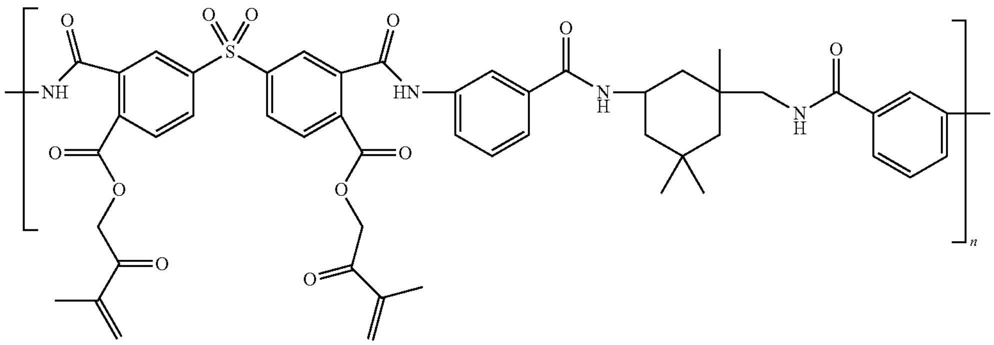
P1-259
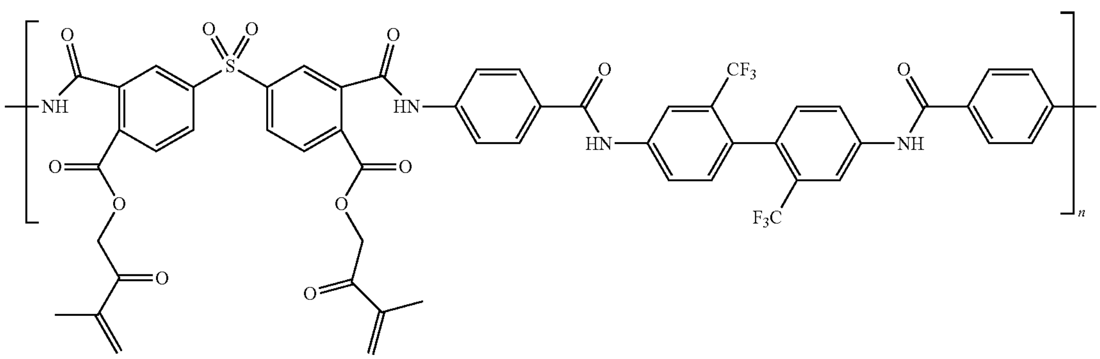
P1-260
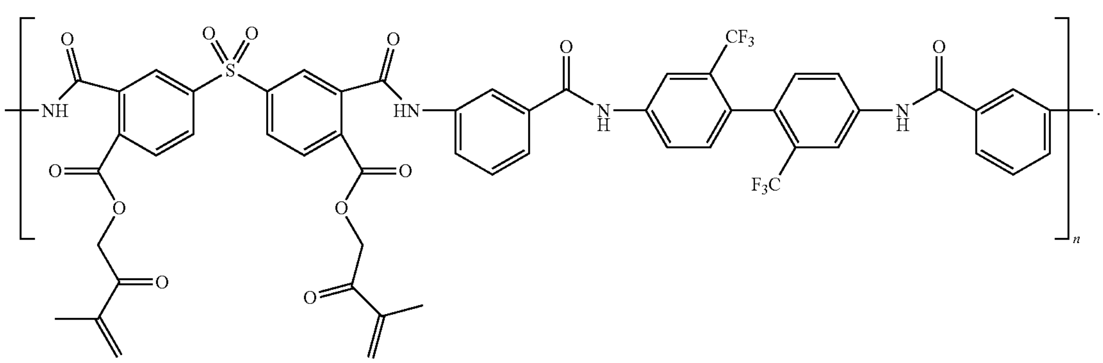

4. The photosensitive resin composition of claim 1, wherein the compound is a photosensitive resin composition having a weight average molecular weight of 5,000 to 200,000.

5. The photosensitive resin composition of claim 1, further comprising a polymeric binder containing a carboxyl group; photocrosslinking agent; a photoinitiator and an organic solvent.

6. The photosensitive resin composition of claim 5, the polymeric binder is an acrylate resin.

7. The photosensitive resin composition of claim 5, a photosensitive resin composition comprising 10% to 70% by weight of the compound represented by Formula 1 based on solid content.

8. A film comprising a cured product of the photosensitive resin composition of claim 1.

9. Electronic device, comprising:

a panel including an organic electronic element which includes the film of claim 8; and a driving circuit for driving the panel.

10. The electronic device of claim 9, wherein the organic electronic element is one of an organic light emitting diode, an organic solar cell, an organic photoconductor, an organic transistor, and a lighting device.

* * * * *